(12) United States Patent
Sakamoto et al.

(10) Patent No.: US 7,105,200 B2
(45) Date of Patent: Sep. 12, 2006

(54) METHOD OF PRODUCING THICK-FILM SHEET MEMBER

(75) Inventors: Susumu Sakamoto, Nagoya (JP);
Masayuki Hiroshima, Nagoya (JP);
Shigeo Mori, Nagoya (JP); Eiji Naraki, Nagoya (JP); Koichi Sato, Nagoya (JP); Hirotoshi Takechi, Nagoya (JP)

(73) Assignee: Noritake Co., Limited, Nagoya (JP)

( * ) Notice: Subject to any disclaimer, the term of this patent is extended or adjusted under 35 U.S.C. 154(b) by 60 days.

(21) Appl. No.: 10/488,836

(22) PCT Filed: Sep. 10, 2002

(86) PCT No.: PCT/JP02/09201

§ 371 (c)(1),
(2), (4) Date: Mar. 8, 2004

(87) PCT Pub. No.: WO03/032334

PCT Pub. Date: Apr. 17, 2003

(65) Prior Publication Data

US 2005/0122030 A1      Jun. 9, 2005

(30) Foreign Application Priority Data

| Sep. 10, 2001 | (JP) | ............................. 2001-274217 |
| Sep. 10, 2001 | (JP) | ............................. 2001-274218 |
| Sep. 10, 2001 | (JP) | ............................. 2001-274219 |
| Oct. 22, 2001 | (JP) | ............................. 2001-323320 |
| Jan. 16, 2002 | (JP) | ............................. 2002-007024 |
| Jan. 28, 2002 | (JP) | ............................. 2002-018358 |
| Jun. 28, 2002 | (JP) | ............................. 2002-189352 |

(51) Int. Cl.
*B05D 1/36* (2006.01)
*B05D 3/02* (2006.01)

(52) U.S. Cl. ................ 427/203; 427/71; 427/97.6; 427/202; 427/204; 427/205; 427/372.2

(58) Field of Classification Search ................ 427/203, 427/71, 97.6, 202, 204, 205, 372.2
See application file for complete search history.

(56) References Cited

U.S. PATENT DOCUMENTS 4,772,488 A * 9/1988 Pinch et al. .................. 216/13
4,865,875 A * 9/1989 Kellerman ................ 427/97.4

FOREIGN PATENT DOCUMENTS

| JP | 47-51538 | 12/1972 |
| JP | A 61-179016 | 8/1986 |

(Continued)

*Primary Examiner*—Fred J. Parker
(74) *Attorney, Agent, or Firm*—Oliff & Berridge, PLC

(57) ABSTRACT

A thick-film sheet member producing method including: (a) a support-body preparing step of preparing a support body having a film formation surface provided by a particle layer constituted by high-melting-point particles which are held together with a resin and which have a melting point higher than a predetermined temperature; (b) a paste-film forming step of forming a paste film on the film formation surface, by applying a paste onto the film formation surface; and (c) a firing step of subjecting the support body on which the paste film has been formed, to a heat treatment effected at the predetermined temperature, so as to burn the resin included in the particle layer, whereby the high-melting-point particles become unbound from each other in absence of the resin that has been burned. The paste film is sintered in the firing step, whereby a thick film is formed of the sintered paste film.

7 Claims, 63 Drawing Sheets

FOREIGN PATENT DOCUMENTS

| | | |
|---|---|---|
| JP | A 61-230296 | 10/1986 |
| JP | A 62-5848 | 1/1987 |
| JP | A 2-54895 | 2/1990 |
| JP | A 2-299138 | 12/1990 |
| JP | A 5-4868 | 1/1993 |
| JP | A 6-152134 | 5/1994 |
| JP | A 7-50197 | 2/1995 |
| JP | A 7-114896 | 5/1995 |
| JP | A 7-169389 | 7/1995 |
| JP | A 8-512170 | 12/1996 |
| JP | A 10-92298 | 4/1998 |
| JP | A 11-322445 | 11/1999 |
| JP | 2000-169244 | * 6/2000 |
| JP | A 2000-169244 | 6/2000 |
| JP | A 2002-280173 | 9/2002 |

* cited by examiner

FIG.10
(a) 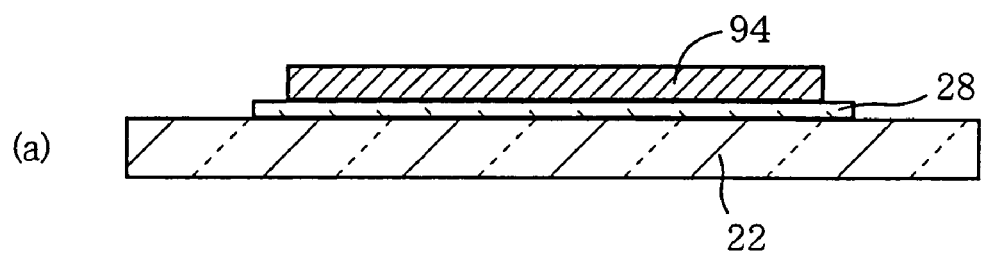
(b) 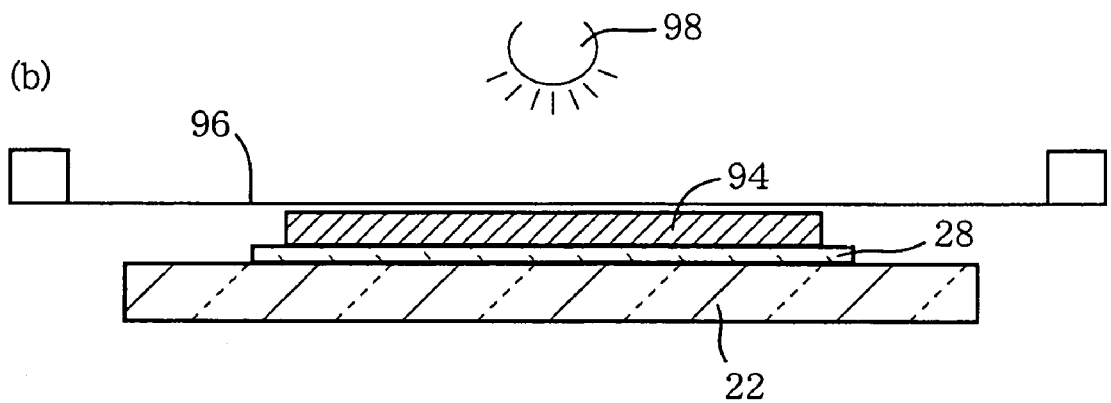
(c) 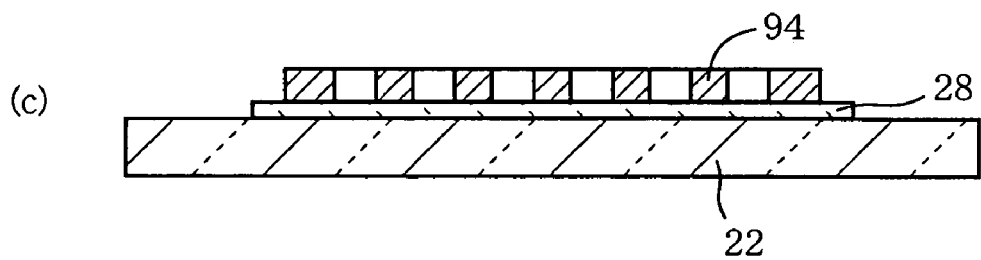

METHOD OF PRODUCING THICK-FILM SHEET MEMBER

TECHNICAL FIELD

The present invention relates to a thick-film sheet member which is obtained by forming a thick-film material into a sheet-like member, various devices such as a display device to which the thick-film sheet member is applied, and methods of producing them.

BACKGROUND ART

There is known a sheet member which is constituted by, for example, a single or plural kinds of inorganic materials, metallic materials or the like and which has a desired configuration and a thickness of about 1 (μm)–10 (mm). Where such a sheet member is constituted by the inorganic material, it is produced by first subjecting an unfired ceramic sheet prepared in accordance with a tape casting method or the like, to a machining operation such as drilling and patterning performed by, for example, laser, punching press, water/sand blasting or the like, and then firing the machined sheet, or alternatively, it is produced by first firing a ceramic sheet and then subjecting the fired sheet to a machining operating such as drilling and patterning performed by, for example, laser and sand blasting. Where such a sheet member is constituted by the metallic material, it is produced, for example, by chemically etching a sheet metal, or by first forming a film in an electroforming and then removing the film from a mold, or by pressing a sheet metal.

However, the conventional sheet member suffers from limitations in its thickness, dimension and configuration, due to above-described producing methods. Further, where the sheet member is made of a plurality of materials, an intermediate product has to be first formed from a single one of the plurality of materials, and the intermediate product has to be then subjected to additional operations. Further, any one of the producing methods requires a large-scaled installation, and provides a difficulty in handling the sheet member in the production process when the sheet member has a large surface area and a small thickness. For example, where a ceramic sheet is laser machined, it is necessary to employ a laser machine which is expensive, and there are limitations in quality of the machined surface since the sheet could suffer from its deterioration depending upon the used material. Further, the laser machining requires a large length of operation time. Where a sheet metal is chemically etched, it is likely to be deformed or wrinkled if the sheet metal has a large surface area. Further, where protrusions and recesses have to be formed on a surface of the sheet metal, it is necessary to carry out a half-etching operation whose process is so complicated that the quality tends to be variable. Further, where the sheet member is used for constituting electrodes, the sheet member has to be divided into sections corresponding to the respective electrodes, thereby considerably increasing a number of the components and complicating handling of the sheet member.

If the dimensional and configurational limitations due to the producing methods are alleviated, and if the formation with a plurality of materials becomes easy, the sheet member could be applied to various devices such as ozone generator, oxygen separator and display device.

DISCLOSURE OF INVENTION

The present invention was made in view of the above-described background circumstances. It is therefore an object of the invention to provide a sheet member which can be easily formed from a plurality of materials with a high degree of freedom in its pattern designing and which can be easily handled in its production process without requiring a complicated installation, and a method of producing such a sheet member. Further, it is also the object of the invention to provide devices to which the sheet member is applied, and methods of producing the devices.

The gist of a thick-film sheet member of a first invention for achieving the above-described object is that the sheet member is provided by a thick film which has a predetermined thickness and a predetermined plan configuration, without the thick film being fixed to a substrate.

The thick film providing the sheet member is produced by applying a thick-film paste onto a substrate or like so as to form a paste film, and then subjecting the paste film to drying and firing treatments, after laminating more paste film or films as needed. The sheet member consisting of the thick film can be formed from a desired single or plurality of materials into a desired pattern, by suitably determining, for example, a pattern of paste application, a printing thickness, a number of laminations and a kind of paste. The thick film can be easily made to have a large surface area, and easily handled during a stage in which it is disposed on the substrate or the like. In general, a thick film is eventually fixed to a substrate or the like on which a thick-film paste as a precursor of the thick film has been applied. However, in the present invention, the thick film is given a free status in which it is not fixed to the substrate or the like, so that the sheet member provided by such a thick film can be used, in place of a conventional sheet member, for various purposes. Thus, the invention provides the sheet member which can be easily formed from a plurality of materials with a high degree of freedom in its pattern designing and which can be easily handled in its production process without requiring a complicated installation.

It is noted that the term "thick film" in the description of the present patent application is interpreted to mean a film-shaped body which is constituted by inorganic material(s) or metallic material(s) bonded with inorganic binder, and which can be produced by drying and firing a paste film formed on a substrate with a thick film processing such as screen printing and dipping.

The thick-film sheet member is preferably produced by forming a paste film having a predetermined thickness, on a predetermined film formation surface in a predetermined pattern, and peeling the paste film from the predetermined film formation surface after subjecting the paste film to a firing treatment effected at a predetermined first temperature, wherein the paste film is constituted by a thick-film material in the form of particles which are bonded together with a resin and which are sintered at the predetermined first temperature. The thick-film sheet can be given a status in which the thick film is not fixed to the substrate, by thus peeling the paste film from the film formation surface.

The gist of a thick-film sheet member of a second invention for achieving the above-described object is that the thick-film sheet member includes: (a) a dielectric core body provided by a thin-plate-like thick-film dielectric body having a predetermined thickness; (b) a thick-film conductive body disposed on a surface of a part of the dielectric core body; and (c) a boundary-portion-reinforcing dielectric body constituted by a thick-film dielectric material, and disposed on the surface of the dielectric core body, with such a configuration thereof that permits the boundary-portion-reinforcing dielectric body to continuously extend and straddle a boundary between the dielectric core body and the thick-film conductive body.

Owing to this arrangement in which the thick-film sheet member is constituted by the dielectric core body and the thick-film conductive body that is disposed on the dielectric core body, the thick-film sheet can be used in place of a sheet metal, by forming the thick-film conductive body into a suitable configuration. Since the thick-film sheet member has a high mechanical property based on the dielectric core body, the conductive body is given a higher strength, as compared with a case where the conductive body is provided by a sheet metal. Further, since it is possible to form a plurality of thick-film conductive bodies which are electrically independent of each other, on the dielectric core body, the conductive bodies can be handled easier than where the conductive bodies are provided by mutually independent sheet metals. Further, owing to the provision of the boundary-portion-reinforcing dielectric body straddling the boundary between the dielectric core body and the thick-film conductive body, it is possible to advantageously restrain occurrence of crack or other damage in the boundary portion, thereby further increasing the mechanical strength of the thick-film sheet member. In a word, the thick-film sheet can be easily produced, and easily handled in its use as substitution of a sheet metal.

In general, due to difference between coefficient of thermal expansion of the thick-film dielectric body and that of the thick-film conductive body, the boundary portion therebetween is likely to suffer from a crack when they are heated in the production process or in the use after the production. In particular, where the thick-film conductive body contains a metallic component such as silver which is easily diffused into the thick-film dielectric body, the thick-film dielectric body suffers from change of its composition in the boundary portion, due to the diffusion of the metallic component, thereby reducing its mechanical strength and increasing a risk of cracking. The above-described boundary-portion-reinforcing dielectric body may be formed into such a suitable configuration that does not impede function of the thick-film conductive body. For example, where the thick-film conductive body serves as an electrode and has through-holes for permitting electrons to pass therethrough, the boundary-portion-reinforcing dielectric body is positioned such that the reinforcing dielectric body does not overlap with the through-holes. However, where a plurality of thick-film conductive bodies are disposed on the dielectric core body, it is not necessary to be anxious about an electrical independence of each of the conductive bodies since the boundary-portion-reinforcing dielectric body does not have an electrical conductivity.

A vertical relationship between the thick-film conductive body and the boundary-portion-reinforcing dielectric body is determined in view of, for example, required function, characteristics and production process. That is, each one of the conductive body and reinforcing dielectric body, which are "disposed on the surface of the dielectric core body" as described above, may be disposed directly on the dielectric core body, or may be disposed on the dielectric core body with the other of the conductive body and reinforcing dielectric body being interposed therebetween. No matter which one of the conductive body and reinforcing dielectric body is positioned above the other, occurrence of crack or other damage in the boundary portion between the thick-film conductive body and the dielectric core body is restrained owing to the boundary-portion-reinforcing dielectric body.

For example, in a flat-plate-type display device such as a FED (field emission display) or a flat type cathode ray tube, there are provided electrodes in the form of layers provided by a sheet metal, for controlling direction of flows of electrons. Such a sheet metal is produced, for example, by chemically etching a sheet metal having a thickness of about 1 ($\mu$m)–10 (mm), or by first forming a film in an electroforming and then removing the film from a mold, or by pressing a sheet metal.

However, where the electrodes as described above are provided by the sheet metal, the sheet metal has to be divided into sections corresponding to the respective electrodes, thereby considerably increasing a number of the components and complicating handling of the sheet metal. Further, even if the sheet metal is not divided into sections, where the sheet metal is formed to have a multiplicity of circular, lattice-shaped or strip-like holes, the production and handling become more difficult with an increase in a ratio of a total area of the holes with respect to an entire area of a surface of the sheet metal. Further, the above-described producing methods provide considerable limitations in the thickness, size and configuration, and also a difficulty in the handling of the sheet metal in the production process when the sheet metal has a large surface area and a small thickness. Particularly, where the sheet metal is chemically etched, it is likely to be deformed or wrinkled if the sheet metal has a large surface area. Such problems are encountered not only in a case where the sheet metal constitutes the electrodes used for the display device but also a case where it is necessary to provide the electrode or conductive film which is divided into a multiplicity of sections or has a multiplicity of holes formed therein. According to the second invention of the present patent application, in the thick-film sheet member, the thick-film conductive body is disposed on the dielectric core body while the boundary-portion-reinforcing dielectric body is provide to straddle the boundary between the dielectric core body and the thick-film conductive body. This construction is effective to advantageously restrain occurrence of the above-described problems, and to eliminate inconvenience arising from the difference between coefficient of thermal expansion of the dielectric core body and that of thick-film conductive body.

The thick-film sheet member preferably includes a peripheral-portion-reinforcing dielectric body constituted by a thick-film dielectric material, and disposed on a surface of a part of a peripheral portion of the dielectric core body in which part the thick-film conductive body is not disposed, such that the peripheral-portion-reinforcing dielectric body is contiguous to the boundary-portion-reinforcing dielectric body. In this arrangement, the above-described part of the dielectric core body, in which part the thick-film conductive body is not disposed, is given a strength which is increased by the peripheral-portion-reinforcing dielectric body. Further, since the peripheral-portion-reinforcing dielectric body is provided to be contiguous to the boundary-portion-reinforcing dielectric body, occurrence of crack or other damage at the boundary between the peripheral-portion-reinforcing dielectric body and dielectric core body is advantageously restrained by the boundary-portion-reinforcing dielectric body, even if there is difference in coefficient of thermal expansion or the like between the peripheral-portion-reinforcing dielectric body and dielectric core body. Therefore, even where the dielectric core body is constituted by a dielectric material which is fragile to be easily broken, occurrence of a breakage of its peripheral portion is advantageously restrained. It is noted the thick-film conductive body has a relatively high ductility owing to its metallic component, so that the thick-film sheet member has an increased mechanical strength in its portion in which the thick-film conductive body is disposed. Therefore, such a portion does not require to be particularly reinforced.

Further, the material of the boundary-portion-reinforcing dielectric body preferably has a softening point which is not higher than that of a material constituting the dielectric core body. In this arrangement, the boundary-portion-reinforcing dielectric body, whose softening point is equal to or lower than that of dielectric core body, is given a density equal to or higher than that of the dielectric core body, as a result a firing treatment. Thus, it is possible to further increase a reinforcing effect provided by the boundary-portion-reinforcing dielectric body.

Further, the boundary-portion-reinforcing dielectric body is preferably disposed on each of opposite surfaces of the dielectric core body, so that the mechanical strength of the dielectric core body is further increased.

Further, the boundary-portion-reinforcing dielectric body consists of a plurality of reinforcing members which are positioned in respective positions, wherein each of the reinforcing members has a width of about 0.1–3.0 (mm), for example, about 0.2 (mm). In this arrangement in which each reinforcing member of the boundary-portion-reinforcing dielectric body is given such a sufficiently small width, it is possible to further reduce possibility that function of the thick-film conductive body is affected. The above-described width of each reinforcing member is large enough to achieve its function, i.e., to reinforce the boundary portion. A thickness of each of the reinforcing members may be about 10–100 (μm).

The gist of a thick-film-sheet-member producing method of a third invention for achieving the above-described object is that the producing method includes: (a) a support-body preparing step of preparing a support body having a film formation surface provided by a high-melting-point particle layer which is constituted by particles held together with a resin, the particles having a melting point higher than a predetermined first temperature; (b) a paste-film forming step of forming a paste film on the film formation surface in a predetermined pattern, the paste film being constituted by a thick-film material in the form of particles which are bonded together with a resin and which are sintered at the predetermined first temperature; and (c) a firing step of subjecting the support body on which the paste film has been formed, to a heat treatment effected at the predetermined first temperature, so that the paste film is sintered without the high-melting-point particle layer being sintered, whereby a thick film is formed from the sintered paste film.

According to the present producing method, after the paste film constituted by the thick-film material has been formed in the predetermined pattern on the film formation surface which is provided by the high-melting-point particle layer whose melting point is higher than a sintering temperature (i.e., the first temperature) of the thick-film material, the paste film is subjected to the heat treatment at the first temperature that enables the thick-film material to be sintered, so that the thick film, i.e., the thick-film sheet member is formed. Therefore, the high-melting-point particle layer, which is not sintered at the heat treatment temperature, converts into a layer in which only the high-melting-point particles are arranged, as a result of burning of the resin, so that the formed thick film is not fixed to the support body, whereby the formed thick film can be easily separated from the film formation surface. In this instance, the paste film of the thick-film material can be formed on the film formation surface with a high degree of freedom in its pattern designing, in accordance with a method suitable for the material and purpose, by using a simple installation. Further, since the thick film is temporarily fixed to the film formation surface onto which the thick film in the form of the paste film has been applied, the thick film is easily handled. This feature leads to a high degree of freedom in designing the pattern of the thick-film sheet member, and an easy handling of the thick-film sheet member in the production process. Further, the production can be made with a simple installation.

In the present method, since the thick film is sintered on the layer in which only the high-melting-point particles are arranged, shrinkage of the thick film is not restricted by the formation surface, unlike in a standard method of the formation of the thick film. Thus, it is possible to restrain warp or other deformation of the thick film, which deformation arises from resistance applied from the formation surface to the shrinking thick film, and also to avoid crack arising from the warp or other deformation. Therefore, for example, where the thick film is formed on the substrate in a predetermined pattern, even if a firing shrinkage ratio of the thick film is so large that a dimensional change of the thick film is large, the thick film can be easily formed, by fixing the above-described thick-film sheet member previously prepared, onto the substrate. The thus formed thick film is advantageously free from its deformation, cracking or the like, and also is prevented from being peeled from the substrate due to its warp. That is, the thick-film sheet member of the present invention can be used not only as an independent thick-film member but also as a thick film that is to be formed on a substrate as a conventional thick film. In a conventional thick-film substrate, for example, where a lattice-shaped pattern 106 is formed on a substrate, as shown in FIG. 12, a porous material having a small shrinkage ratio has to be used for the pattern, in the interest of preventing cracks 110 in crosspoints 108 of the lattice. However, according to the present invention, there is an advantage that a dense material can be used for the pattern, since the pattern formed on the substrate does not suffer from crack due to its shrinkage. It is noted that the use of the porous material for the thick film, which is disposed within the vacuum space, causes a problem of outgas, namely, causes gas embedded in pores of the porous material, to be posteriorly removed from the porous material in a heat treatment.

The above-described paste-film forming step is implemented to form a plurality of paste films constituted by respective kinds of thick-film materials, in predetermined patterns which are determined depending upon the kinds of thick-film materials, such that the plurality of paste films are sequentially laminated on the film formation surface, wherein the first temperature is a temperature at which all of the plurality of paste films constituted by the respective kinds of thick-film materials are sintered. This arrangement advantageously makes it possible to obtain a thick-film sheet member constituted by plural kinds of materials. Where such a thick-film sheet member is used for constituting electrodes, the sheet member can be constructed to include a skeleton portion (sheet core) which is formed from a dielectric material, and a conductive layer which is suitably divided into sections (corresponding to respective voltage levels, for example) and which is disposed on a surface of the dielectric skeleton portion, so that a plurality of electrodes can be integrally provided in the single thick-film sheet member. This thick-film sheet member is advantageous over a case where the plurality of electrodes are prepared independently of each other, in that the electrodes can be positioned relative to each other and relative to other components.

The above-described paste-film forming step includes: a dielectric-core-paste-film forming step of forming a dielectric core paste film on the film formation surface such that the formed dielectric core paste film has a predetermined configuration, the dielectric core paste film being constituted by a thick-film dielectric material in the form of particles which are bonded together with a resin and which are sintered at the predetermined first temperature, a conductive-paste-film forming step of forming a conductive paste film on the film formation surface such that the formed conductive paste film has such a predetermined configuration that permits the formed conductive paste film to overlap with a part of the formed dielectric core paste film, the conductive paste film being constituted by a thick-film conductive material in the form of particles which are bonded together with a resin and which are sintered at the predetermined first temperature, and a reinforcing-dielectric-paste-film forming step of forming a reinforcing dielectric paste film on the film formation surface such that the formed reinforcing dielectric paste film has such a predetermined configuration that permits the formed reinforcing dielectric paste film to continuously extend and straddle a boundary between the dielectric core paste film and the conductive paste film. In this arrangement, the dielectric core paste film, conductive paste film and reinforcing dielectric paste film are formed on the film formation surface. By subjecting the films formed on the film formation surface, to a heat treatment effected at the first temperature, the films provide a dielectric core body, a thick-film conductive body and a boundary-portion-reinforcing dielectric body, such that the thick-film conductive body and the boundary-portion-reinforcing dielectric body are laminated on a surface of the dielectric core body, with the boundary-portion-reinforcing dielectric body being given such a configuration that permits the reinforcing dielectric body to continuously extend and straddle a boundary between the dielectric core body and the thick-film conductive body. The thick-film sheet member, which can be advantageously used in place of a sheet metal, can be obtained, by peeling the bodies form the film formation surface.

The above-described thick-film-sheet-member producing method preferably includes a post-peeling film-forming step which is implemented after implementation of the firing step, to form a predetermined film on an outer circumferential surface of the thick film which has been peeled from the support body. That is, the thick-film sheet member may be produced, by subjecting an outer circumferential surface of the thick film to a film formation treatment after the thick film has been peeled from the support body in the heat treatment (firing).

The sheet member has a thickness of preferably about 5 ($\mu$m)–10 (mm), more preferably about 10 ($\mu$m) or more. As long as the thickness is held within such a range, the sheet member can be easily produced by using a thick-film screen printing method such as a standard thick-film forming process. In particular, since the present invention provides little difficulty in handling the sheet member during its production and machining operation even where the thickness is small, such an advantage of the present invention becomes more significant as the thickness becomes thinner, as compared with a case where a sheet member having the similar dimensions and configuration is produced by a conventional etching, pressing or the like.

The gist of a cold-cathode display device of a fourth invention for achieving the above-described object is that the display device, including: a plurality of emitters disposed on a first substrate; a plurality of anodes disposed on a second substrate parallel with the first substrate, so as to be opposed to the plurality of emitters; and a plurality of gate electrodes disposed in a position between the emitters and anodes and having a plurality of through-holes, so that electrons flowing from the emitters toward the anodes pass through the through-holes, whereby fluorescent layers fixed to surfaces of respective anodes are activated by the electrons, to emit light, further including (a) a thick-film sheet member having a thick-film dielectric layer having the through-holes, and a plurality of thick-film conductive layers disposed on the thick-film dielectric layer and electrically independent of each other, so as to constitute the gate electrodes.

In this cold-cathode display device, the plurality of gate electrodes are respectively provided by the plurality of thick-film conductive layers of the thick-film sheet member. Since the thick-film sheet member is constituted by the thick-film dielectric layer and the thick-film conductive layers which are disposed on the surface of the thick-film dielectric layer, the sheet member has a high mechanical property based on the thick-film dielectric layer. Thus, the sheet member is given a sufficiently high mechanical strength, even if its thickness or the thickness of the thick-film dielectric layer is adapted to be extremely small. Therefore, as compared with a case where the gate electrodes are provided by sheet metals, the gate electrodes of the sheet member are less likely to be damaged, even if the thickness is reduced. Further, since the plurality of gate electrodes are formed integrally with the thick-film dielectric layer, the gate electrodes can be positioned without deteriorating the positional accuracy which is given in their formations, namely, can be positioned with a higher accuracy, than where the gate electrodes are provided by respective conductive bodies which are independent of each other. Thus, it is possible to obtain the cold-cathode display device equipped with the gate electrodes which are sufficiently thin and which have a high positional accuracy.

There is known a cold-cathode display device in which electrons are emitted from electron sources (emitters) into a vacuum space by a field emission and then directed toward anodes, whereby fluorescent bodies fixed to surfaces of the anodes are activated by the electrons, so that display device displays an image which is formed by lights emitted by the activated fluorescent bodies. The term "field emission (field electron emission)" herein is defined as an emission of electrons from a surface of a solid toward a vacuum level, caused by a strong electric field, with use of a tunnel phenomenon of quantum mechanics. An energy difference between the vacuum level and the surface of a metal or semiconductor is represented by a work function $\phi$. For example, in a case of a standard metallic material, since the work function $\phi$ is as large as several (eV), electrons are not emitted from the metal toward a vacuum space at a room temperature. However, with a reduction in a potential barrier as a result of application of a strong electric field from the exterior, the electrons are stochastically emitted toward the vacuum space stochastic, owing to the tunnel effect. This is the field emission in which the electrons can be emitted with a weaker electric field as the work function $\phi$ is reduced.

In the above-described cold-cathode display device, for example, the gate electrodes are disposed between the emitters and the anodes, for selecting at least one of the fluorescent bodies that is to be activated to emit light, so as to form a desired pattern of image. The gate electrodes, each having at least one electron passing-through hole which is located above the emitters, are produced as follows. Where each emitter is provided by a molybdenum corn or the like which is called "Spindt type" and has a sharpen distal end, for example, a cathode film, a resistance film constituted by amorphous silicon, an insulation film constituted by silicon dioxide, and a gate film are sequentially formed on a glass substrate, by a thin-film processing. The gate film and the insulation film are subjected to an ion etching or chemical etching to form the electron passing-through holes, and then a molybdenum film is formed after a nickel film has been formed on the gate film, whereby the above-described emitters and gate electrodes are formed. However, the cold-cathode display device of this type is expensive to produce because the thin-film processing is indispensable in its production process, and is difficult to be produced when the display device has to be given a large size such as several tens diagonal inches or larger.

On the other hand, there is proposed an arrangement in which the emitters are provided by a multiplicity of carbon nanotubes (hereinafter referred simply to as "nanotubes"). Such an arrangement is described, for example, in JP-A-H10-149760 and JP-A-H10-012124 which disclose a field-emission-type cold-cathode device and an electron emission element, respectively. The nanotube is a cylindrical body consisting of a combination of carbon atoms (C), and is a fine structure body having a diameter of about 1–50 (nm) and a length of about 100 ($\mu$m) or less and constituted by a plurality of graphite sheets (graphene sheets, i.e., graphite layers constituted principally by six-membered ring of carbon) which have respective different diameters and which are superposed on each other. The nanotube enables electrons to be efficiently emitted from a distal end of its micro-sized tube with an excellent emission characteristic, and has a high ion-impact resistance. Further, the nanotube, which is constituted by only the carbon atoms, has a high oxidation resistance in a vacuum atmosphere, and accordingly has an excellent chemical stability. Where the emitters are provided by such nanotubes, the gate electrodes are provided by a sheet metal which has electron passing-through holes formed by etching processing and which is fixed to a substrate by glass frit or the like, and are disposed above the emitters.

However, although it is preferable that the thickness of the gate electrodes is as small as possible, the thickness has to be about at least 100 ($\mu$m) for assuring a certain degree of strength of the sheet metal which is required in the etching processing and assembling operation in this method. Where the display device has to be given a large size such as 40 diagonal inches or larger, for example, the thickness has to be even larger. Further, when the gate electrodes are fixed to the substrate on which the emitters are formed, it is difficult to position the electrodes relative to the emitters, because of warp, upward displacement and disalignment which are caused due to difference among the substrate, fixing glass frit, terminals and connecting conductive material with respect to coefficient of thermal expansion. Further, since the gate electrodes are provided by strip-like members corresponding to respective units of voltage application in the activation, a size of each gate electrode and a number of the gate electrodes are inevitably reduced and increased, respectively, as the display device is required to provide a higher image quality. The size reduction and the number increase make the handling operation more cumbersome and the positioning operation more difficult. Even where the substrate is constituted by a soda lime glass while the gate electrodes are constituted by alloy 426 which has a coefficient of thermal expansion substantially equal to that of the soda lime glass, it is difficult to accurately fix the gate electrodes to the substrate, because the metallic material having a higher thermal conductivity is heated faster than the substrate during the heating process, and the temperature rise takes place first in the peripheral portion and then in the central portion. According to the present invention, since the thick-film conductive bodies provided in the thick-film sheet member serve as the gate electrodes, it is possible to obtain the cold-cathode display device equipped with the gate electrodes which have a sufficiently small thickness and are positioned with a high accuracy.

The above-described thick-film sheet member is fixed to the first substrate through a plurality of spherical bodies having predetermined particle sizes. In this arrangement, the thick-film sheet member is fixed to the first substrate provided with the emitters, through the spherical bodies each having the predetermined particle size, so that the thick-film conductive layers, i.e., the gate electrodes provided in the thick-film sheet member are positioned above the first substrate with a constant height position which corresponds to the particle size of the spherical bodies and its variation. Therefore, by suitably determining the particle size of the spherical bodies and its variation, a spacing distance between the emitters and the gate electrodes can be adapted to be extremely small and uniform. Thus, it is possible to obtain the cold-cathode display device in which the electrons can be easily and reliably controlled.

In a conventional cold-cathode display device, the spacing distance (gap) between the emitters and the gate electrodes is set to be, in general, about 50 ($\mu$m). Since a reduction in the spacing distance makes it possible to lower the voltage to be applied to the emitters and to facilitate control of emission of the electrons, the spacing distance is set to be preferably about 30 ($\mu$m) or less, more preferably about 20 ($\mu$m). However, since a large variation of the spacing distance in the display surface makes it impossible to obtain a display uniformity, the tolerable variation of the spacing distance is generally about 10(%). This means that the reduction in the spacing distance leads to a reduction in the tolerable variation amount. Therefore, where the gate electrodes are provided by a sheet metal fixed to a substrate by a glass frit or the like, even if alloy 426 or the like having a coefficient of thermal expansion close to that of a glass is used as the sheet metal and is fixed to the substrate by a low-softening-point glass, the sheet metal suffers form its deformation or warp arising from difference between the sheet metal and the substrate in thermal capacity, thereby making it difficult to obtain an uniformity of the above-described spacing distance, resulting in difficulty to sufficiently reduce the spacing distance.

The gist of a cold-cathode-display-device producing method of a fifth invention for achieving the above-described object is that, in the producing method of producing the cold-cathode display device in which fluorescent layers are activated by electrons which flow from a plurality of emitters disposed on a first substrate, toward a plurality of anodes disposed on a second substrate so that the fluorescent layers fixed to surfaces of the anodes are activated by the electrons, to emit light, the method including a step of parallelly superposing the first and second substrates on each other while positioning a plurality of gate electrodes, which have a plurality of through-holes permitting the flowing electrons to pass therethrough, between the first and second substrates, and a step of fixing the first and second substrates to each other, the method further includes (a) a thick-filmsheet-member fixing step of fixing a thick-film sheet member onto the first substrate provided with the emitters or the second substrate provided with the anodes, the thick-film sheet member having a thick-film dielectric layer having the through-holes, and a plurality of thick-film conductive layers disposed on the thick-film dielectric layer and electrically independent of each other, so as to constitute the gate electrodes.

In this producing method, when the cold-cathode display device is produced by superposing and fixing the first and second substrate to each other, the thick-film sheet member, which is provided by the thick-film dielectric layer and the plurality of thick-film conductive layers disposed on the surface of the dielectric layer, is fixed to the first substrate or the second substrate, so that the gate electrodes are disposed between the emitters and anodes. Since the thick-film sheet member is constituted by the thick-film dielectric layer and the thick-film conductive layers which are disposed on the surface of the thick-film dielectric layer, the sheet member has a high mechanical property based on the thick-film dielectric layer. Thus, the sheet member is given a sufficiently high mechanical strength, even if its thickness or the thickness of the thick-film dielectric layer is adapted to be extremely small. Therefore, as compared with a case where the gate electrodes are provided by sheet metals, the gate electrodes of the sheet member are less likely to be damaged, even if the thickness is reduced. Further, since the plurality of gate electrodes are formed integrally with the thick-film dielectric layer so as to constitute the thick-film sheet member while being electrically insulated from each other, there are not problems such as difficulty in positioning the gate electrodes relative to each other, unlike a case where the gate electrodes are provided by respective conductive bodies which are independent of each other. It is thus possible to easily produce the cold-cathode display device equipped with the gate electrodes having a sufficiently small thickness and positioned relative to each other with a high accuracy.

In the above-described cold-cathode-display-device producing method, the thick-film sheet member is produced by a process which includes: (b) a support-body preparing step of preparing a support body having a film formation surface provided by a high-melting-point particle layer which is constituted by particles held together with a resin, the particles having a melting point higher than a predetermined first temperature; (c) a dielectric-paste-film forming step of forming a dielectric paste film on the film formation surface in a predetermined pattern corresponding to the thick-film dielectric layer, the dielectric paste film being constituted by a thick-film dielectric material in the form of particles which are bonded together with a resin and which are sintered at the predetermined first temperature; (d) a conductive-paste-film forming step of forming a conductive paste film on a surface of the dielectric paste film in a predetermined pattern which defines a plurality of sections corresponding to the plurality of thick-film conductive layers, the conductive paste film being constituted by a thick-film conductive material in the form of particles which are bonded together with a resin and which are sintered at the predetermined first temperature; and (e) a firing step of subjecting the support body on which the dielectric paste film and the conductive paste film have been formed, to a heat treatment effected at the predetermined first temperature, so that the dielectric paste film and the conductive paste film are sintered without the high-melting-point particle layer being sintered, whereby the thick-film dielectric layer is formed from the dielectric paste film while the thick-film conductive layers are formed from the conductive paste film.

According to this producing method, after the paste films constituted by the thick-film dielectric material and thick-film conductive material have been formed in the predetermined patterns on the film formation surface which is provided by the high-melting-point particle layer whose melting point is higher than a sintering temperature (i.e., the first temperature) of the thick-film dielectric and conductive materials, the paste films are subjected to the heat treatment at the first temperature that enables the thick-film dielectric and conductive materials to be sintered, so that the thick-film sheet member in which the thick-film conductive layer is disposed on a surface of the thick-film dielectric layer is formed. Therefore, the high-melting-point particle layer, which is not sintered at the heat treatment temperature, converts into a layer in which only the high-melting-point particles are arranged, as a result of burning of the resin, so that the formed thick film is not fixed to the support body, whereby the formed thick film can be easily separated from the film formation surface. In this instance, the paste films of the thick-film dielectric and conductive materials can be formed on the film formation surface in desired patterns, in accordance with a method suitable for the materials and purpose, by using a simple installation. Further, since the thick film is temporarily fixed to the film formation surface onto which the thick film in the form of the paste films has been applied, the thick film is easily handled. This feature makes it possible to easily produce the thick-film sheet member which constitutes the gate electrodes and which is used in the production of the cold-cathode display device.

Further, since the thick film is sintered on the layer in which only the high-melting-point particles are arranged, shrinkage of the thick film is not restricted by the formation surface, unlike in a standard method of the formation of the thick film. Thus, it is possible to restrain warp or other deformation of the thick film, which deformation arises from resistance applied from the formation surface to the shrinking thick film, and also to avoid crack arising from the warp or other deformation.

In the above-described cold-cathode-display-device producing method, the dielectric-paste-film forming step is implemented is preferably implemented, after another conductive paste film has been formed from the same material as the above-described conductive paste film, in a pattern corresponding to the thick-film conductive layer, to form the dielectric paste film on the above-described another conductive paste film. That is, preferably, a first-conductive-paste-film forming step for forming the above-described another conductive paste film, the dielectric-paste-film forming step and a second-conductive-paste-film forming step for forming the conductive paste film on the dielectric paste film are sequentially implemented, so that the thick-film sheet member in which the thick-film conductive layers are disposed on opposite surfaces of the thick-film dielectric layer is obtained. In the obtained thick-film sheet member, the gate electrodes are provided by the thick-film conductive layers which are disposed on the opposite surfaces of the thick-film dielectric layer. In a heat treatment for the formation of such a thick-film sheet member, it is possible to restrain warp of the thick-film sheet member arising from the difference between the thick-film conductive layers and the thick-film dielectric layer in coefficient of thermal expansion. Further, where the thick-film conductive layers disposed on the opposite surfaces of the thick-film dielectric layer are connected to each other through inner surfaces of the above-described through-holes or the like, the two conductive layers can be given respective different roles, for example, such that the thick-film conductive layer positioned on the side of the anodes is arranged to serve as a wiring layer for connection with an external circuit, while the thick-film conductive layer positioned on the side of the emitters is arranged to serve as the gate electrodes. Therefore, the thick-film conductive layer on the side of the emitters can be easily given an optimized configuration that permits each gate electrode to selectively attract electrons from a desired one of the emitters while avoiding influence on adjacent cell (pixel).

Further, preferably, the above-described cold-cathode-display-device producing method includes: a connection-paste-film forming step of forming a connection paste film on a portion of the dielectric paste film on which portion the conductive paste film is not disposed, the connection paste film being constituted by a resin, spherical bodies which have predetermined particle sizes and inorganic material particles which are sintered at the predetermined first temperature, wherein the spherical bodies and the inorganic material particles are dispersed in the resin; and a superposing step of superposing the support body on which the dielectric paste film, conductive paste film and connection paste film are disposed, onto the first substrate on which the emitters are disposed, wherein the sintering step is implemented to sinter the connection paste film concurrently with the dielectric paste film and the conductive paste film, whereby the thick-film sheet member and the first substrate are connected by a connection layer which is formed from the sintered connection paste film.

In this producing method, the connection paste film, which includes the spherical bodies and the inorganic material particles sintered at the first temperature, is formed on the portion of the dielectric paste film which portion is distant from the conductive paste film, while the first substrate provided with the emitters is superposed on the substrate. Then, the firing step is implemented, whereby the thick-film dielectric and conductive layers are formed while at the same time the connection layer is formed from the connection paste film, so that the first substrate and the thick-film sheet member are connected to each other through the connection layer. Thus, since the thick-film sheet member is connected to the first substrate concurrently with the formation of the thick-film sheet member, it is possible to advantageously reduce a number of sintering, as compared with a case where the formation of the sheet member and the connection of the sheet member to the first substrate are made by respective firing treatments which are effected independently of each other.

Further, the above-described dielectric-paste-film forming step is implemented is preferably implemented, after another conductive paste film has been formed from the same material as the above-described conductive paste film, in a pattern corresponding to the thick-film conductive layer, to form the dielectric paste film on the above-described another conductive paste film. That is, preferably, a first-conductive-paste-film forming step for forming the above-described another conductive paste film, the dielectric-paste-film forming step and a second-conductive-paste-film forming step for forming the conductive paste film on the dielectric paste film are sequentially implemented, so that the thick-film sheet member in which the thick-film conductive layers are disposed on opposite surfaces of the thick-film dielectric layer is obtained. In the obtained thick-film sheet member, the gate electrodes are provided by the thick-film conductive layers which are disposed on the opposite surfaces of the thick-film dielectric layer. In a heat treatment for the formation of such a thick-film sheet member, it is possible to restrain warp of the thick-film sheet member arising from the difference between the thick-film conductive layers and the thick-film dielectric layer in coefficient of thermal expansion. Further, where the thick-film conductive layers disposed on the opposite surfaces of the thick-film dielectric layer are connected to each other through inner surfaces of the above-described through-holes or the like, the two conductive layers can be given respective different roles, for example, such that the thick-film conductive layer positioned on the side of the anodes is arranged to serve as a wiring layer for connection with an external circuit, while the thick-film conductive layer positioned on the side of the emitters is arranged to serve as the gate electrodes. Therefore, the thick-film conductive layer on the side of the emitters can be easily given an optimized configuration that permits each gate electrode to selectively attract electrons from a desired one of the emitters while avoiding influence on adjacent cell (pixel).

Further, the paste-film forming step is preferably implemented to form the dielectric paste film and the conductive paste film by using a thick-film screen printing method. The method of forming the paste film may be a suitable one that is selected, in view of cost, required degree of accuracy and other steps of the production process, from among various methods such as printing, sand blasting, lift off and photo processing with use of a photosensitive paste. Where the formation of the paste film is made by the printing method, as described above, the formation can be made without waste of the film composition material, since the material is not applied onto an unnecessary portion of the film formation surface. That is, as compared with other forming methods such as a pressing effected on a raw ceramic sheet, a laser machining effected on a ceramic sheet and a chemical etching effected on a metallic material, it is possible to save the material in the printing method in which an amount of material removed in the forming process is extremely small.

Where the thick-film screen printing method is employed as described above, it is further preferable that the second-conductive-paste-film forming step is implemented to form the thick-film conductive paste by using a screen different from that used in the first-conductive-paste-film forming step, such that the screen used in the second-conductive-paste-film forming step has a pattern which defines slightly larger opening portions corresponding to the respective electron passing-through holes, as compared with the screen used in the first-conductive-paste-film forming step. This arrangement enables the thick-film conductive paste to be applied onto also inner wall surfaces of through-holes, i.e., the electron passing-through holes formed through the dielectric paste film, thereby advantageously further improving performance of the gate electrodes which control the emitted electrons.

Further, preferably, the above-described sheet member is provided by a thick-film dielectric layer having a thickness of about 20–50 ($\mu$m) and a thick-film conductive layer having a thickness of about 7–10 ($\mu$m) and disposed on one or each of opposite surfaces of the thick-film dielectric layer, so that the sheet member has an entire thickness of about 30–70 ($\mu$m). The sheet member having such a thickness can be advantageously used as a component member of the gate electrodes which are required to be as thin as possible. Further, such a sheet member can be easily produced by using a standard thick-film processing such as thick-film screen printing method. In particular, since the present invention provides little difficulty in handling the sheet member during its production and machining operation even where the thickness is small, such an advantage of the present invention becomes more significant as the thickness becomes thinner, as compared with a case where a sheet member having the similar dimensions and configuration is produced by a conventional etching, pressing or the like.

Further, preferably, the thick-film-sheet-member fixing step is implemented to fix the thick-film sheet member to the first substrate through a plurality of spherical bodies having predetermined particle sizes. In this method, when the first and second substrates are superposed on and fixed to each other to produce the cold-cathode display device, the thick-film sheet member is fixed to the first substrate through the spherical bodies each having the predetermined particle size. Therefore, the thick-film conductive layers, i.e., the gate electrodes provided in the thick-film sheet member are positioned above the first substrate with a constant height position which corresponds to the particle size of the spherical bodies and its variation. Thus, by suitably determining the particle size of the spherical bodies and its variation, a spacing distance between the emitters and the gate electrodes can be adapted to be extremely small and uniform. Thus, it is possible to produce the cold-cathode display device in which the electrons can be easily and reliably controlled.

Further, preferably, at least one of mutually opposed surfaces of the first substrate and the thick-film sheet member has a recess located in a fixing portion thereof in which the first substrate and the thick-film sheet member are fixed to each other with the spherical bodies interposed therebetween, so that an adhesive for fixing the first substrate and the thick-film sheet member is accommodated in the recess. In this arrangement, where there is a surplus of the adhesive in an interface between the first substrate and the thick-film sheet member, the adhesive surplus is received in the recess, whereby it is possible to restrain the adhesive from affecting the function of the spherical bodies which control the spacing distance between the first substrate and the thick-film sheet member, i.e., the spacing distance between the gate electrodes and the emitters.

The gist of an inorganic-EL-device producing method of a sixth invention for achieving the above-described object is that, in the producing method of producing the inorganic EL device which has a luminous layer constituted by an inorganic material, a first dielectric layer provided by a translucent layer disposed on one of opposite surfaces of the luminous layer, a second dielectric layer disposed on the other of the opposite surfaces of the luminous layer, a first electrode layer disposed on a surface of the first dielectric layer, and a second electrode layer disposed on a surface of the second dielectric layer, so that light generated by the luminous layer with application of electric current between the first and second electrode layers, is observed or seen through the first dielectric layer, the method includes: (a) a thick-film-sheet-member preparing step of preparing a thick-film sheet member provided by a thick-film dielectric body for constituting the second dielectric layer; (b) an one-side-surface film forming step of disposing the second electrode layer on one of opposite surfaces of the thick-film sheet member; and (c) an other-side-surface film forming step of sequentially disposing the luminous layer, the first dielectric layer and the first electrode layer on the other of the opposite surfaces of the thick-film sheet member.

In the present producing method, the second electrode layer is disposed on the above-described one of the opposite surfaces of the thick-film sheet member which has been prepared in the thick-film-sheet-member preparing step, while the luminous layer and other layers are disposed on the other surface of the thick-film sheet member, whereby the inorganic EL device is obtained. Therefore, the second dielectric layer is not disposed on a substrate constituting the inorganic EL device, when its film is formed. Rather, the second dielectric layer is provided by the thick-film sheet member which is constituted by the thick-film dielectric body prepared independently of the other components such as the second electrode layer and luminous layer. Thus, the material composing the inorganic EL device is not required to have a heat resistance corresponding to the composition material of the second dielectric layer. Therefore, the second dielectric layer can be made of a material which has a high specific inductive capacity and which requires to be fired at a high temperature, whereby the inorganic EL device is given a large electrostatic capacity and a high performance. Further, there is another advantage that the substrate which is a component of the inorganic EL display device is not required to have a high heat resistance.

There is known an EL display device having a structure in which a transparent electrode layer, a first dielectric layer, a luminous layer, a second dielectric layer and a back face electrode layer are sequentially laminated on a glass substrate, and utilizing a phenomenon (EL) of light emission by a fluorescent body with an electric field applied thereto. The EL display device is advantageous for its small thickness, its excellent properties as to operating temperature and impact resistance owing to its solid form, its wide angle of visibility owing to its spontaneous light emission and its high response speed. The EL display device is categorized, based on material composing the fluorescent body, into an organic EL and an inorganic EL. The organic EL is difficult to have a large size and is easily deteriorated thereby resulting in a short service life. On the other hand, the inorganic EL display device dose not have such drawbacks, and is operable by a smaller electric current, than the organic EL, so that the inorganic EL display device is expected to be widely used, in place of a CRT, for a large-scaled image display device such as television receiver. As an example of such an inorganic EL, an inorganic EL display is described in pages 822–825 of "2001 FPD Technologies Handbook" (published in Oct. 25, 2000).

In the inorganic EL display device described in the above document, all the layers disposed on the substrate are formed by thin-film processing. Meanwhile, there is proposed a technique for constituting a second dielectric layer, which is one of the layers disposed on the substrate, by a thick film having a thickness of about 20 (μm). As an example of such a technique, a thick-film dielectric EL display device is described in pages 931–936 of "J. Appl. Phys., Vol. 81, No. 2" (published in Jan. 15, 1997). In such a thick-film dielectric EL, it is less likely to suffer from a dielectric breakdown or the like due to contamination by impurities, than a convention EL in which the thickness of the second dielectric layer is not larger than 1 (μm). Therefore, the thick-film dielectric EL has an advantage that its size can be easily increased, since it is unlikely to be defective due to the contamination by impurities even where the thick-film dielectric EL having a large surface area is produced.

The electrostatic capacity Q between the first and second electrodes is represented by $Q=\in S/D$. Thus, in the thick-film dielectric body EL, the electrostatic capacity Q is reduced with an increase of the thickness of the second dielectric layer, i.e., an increase of the distance D between the first and second electrodes. Since the electrode surface S is constant, it is necessary to use a material having a large specific inductive capacity $\in$, for increasing the electrostatic capacity Q. The electrostatic capacity Q has to be increased as much as possible, for improving an operating characteristic of the EL display device, particularly, for reducing a threshold voltage (upon initiation of light emission) while increasing a luminance in its activation. However, a glass, which is conventionally used as a material of the substrate, has a heat resistance as low as about 600–700(° C.), while a firing temperature of a material having a large specific inductive capacity ∈ is as high as about 1000(° C.). Thus, the material of large specific inductive capacity ∈ can not be used, since the firing temperature of such a material is higher than the heat resistance temperature of the substrate. It might be possible to use, as the material of the substrate, a ceramic material such as alumina having a high heat resistance. However, for obtaining a ceramic substrate having a high degree of flatness with sufficiently small amount of warp, a finishing work such as grinding is required. Therefore, an increase of the size leads to not only a considerably high production cost but also a difficulty in establishing a satisfactory degree of flatness. According to the present invention, since the second dielectric layer is provided by the thick-film sheet member constituted by the thick-film dielectric body which is prepared independently of the other components such as the second electrode layers and the luminous layer, it is possible to eliminate the inconvenience due to the insufficient heat resistance of the substrate material.

The above-described thick-film-sheet-member preparing step includes: a support-body preparing step of preparing a support body having a film formation surface provided by a high-melting-point particle layer which is constituted by particles held together with a resin, the particles having a melting point higher than a predetermined first temperature; a dielectric-paste-film forming step of forming a dielectric paste film on the film formation surface, the dielectric paste film being constituted by a thick-film dielectric material in the form of particles which are bonded together with a resin and which are sintered at the predetermined first temperature; and a firing step of subjecting the support body to a heat treatment effected at the predetermined first temperature, so that the dielectric paste film is sintered without the high-melting-point particle layer being sintered, whereby the thick-film dielectric body is formed from the dielectric paste film. According to this producing method, after the dielectric paste film has been formed on the film formation surface which is provided by the high-melting-point particle layer whose melting point is higher than a sintering temperature (i.e., the first temperature) of the thick-film dielectric material, the paste film is subjected to the heat treatment at the first temperature that enables the thick-film dielectric material to be sintered, so that the thick-film sheet member provided by the thick-film dielectric body is formed. Therefore, the high-melting-point particle layer, which is not sintered at the heat treatment temperature, converts into a layer in which only the high-melting-point particles are arranged, as a result of burning of the resin, so that the formed thick film is not fixed to the support body, whereby the formed thick film can be easily separated from the film formation surface. Thus, it is possible to easily produce the thick-film sheet member which constitutes the second dielectric layer and which is used in the production of the inorganic El device. The above-described dielectric-paste-film forming step can be implemented by applying the dielectric paste, for example, with a thick-film screen printing method.

Further, preferably, the above-described one-side-surface film forming step includes: a second-electrode-layer forming step of forming the second electrode layer on a predetermined substrate; and a fixing step of superposing the substrate and the thick-film sheet member on each other such that the second electrode layer is located on one of opposite sides of the substrate closer to the thick-film sheet member, and subjecting the superposed substrate and thick-film sheet member to a heat treatment effected at a predetermined second temperature, so that the second electrode layer and the thick-film sheet member react with each other, for thereby fixing the substrate and the thick-film sheet member to each other.

Further, preferably, the above-described second-electrode-layer forming step is implemented to apply a thick-film conductive paste on the substrate in a predetermined pattern, and subjecting the thick-film conductive paste to a firing treatment effected at a predetermined third temperature, so as to form the second electrode layer.

The gist of an inorganic-EL-device producing method of a seventh invention for achieving the above-described object is that, in the above-described inorganic-EL-device producing method, the method includes: (a) a thick-film-sheet-member preparing step of preparing a thick-film sheet member which is provided by a thick-film dielectric body and a thick-film conductive body for constituting the second dielectric layer and the second electrode layer, respectively, wherein the thick-film conductive body is fixed to one of opposite surfaces of the thick-film dielectric body; and (b) an other-side-surface film forming step of sequentially disposing the luminous layer, the first dielectric layer and the first electrode layer on the other of the opposite surfaces of the thick-film sheet member.

In the present producing method, the luminous layer and other layers are disposed on the above-described other surface of the thick-film sheet member which has been prepared in the thick-film-sheet-member preparing step, whereby the inorganic EL device is obtained. Therefore, the second dielectric layer is not disposed on a substrate constituting the inorganic EL device, when its film is formed. Rather, the second dielectric layer is provided by the thick-film sheet member which is constituted by the thick-film dielectric body and the second electrode layer prepared independently of the other components such as the luminous layer. Thus, the material composing the inorganic EL device except the second electrode layer is not required to have a heat resistance corresponding to the composition material of the second dielectric layer. Therefore, the second dielectric layer can be made of a material which has a high specific inductive capacity and which is required to be fired at a high temperature, whereby the inorganic EL device is given a large electrostatic capacity and a high performance. Further, there is another advantage that the substrate which is a component of the inorganic EL display device is not required to have a high heat resistance.

The above-described thick-film-sheet-member preparing step includes: a support-body preparing step of preparing a support body having a film formation surface provided by a high-melting-point particle layer which is constituted by particles held together with a resin, the particles having a melting point higher than a predetermined first temperature; a conductive-paste-film forming step of forming a conductive paste film on the film formation surface in a predetermined pattern, the conductive paste film being constituted by a thick-film conductive material in the form of particles which are bonded together with a resin and which are sintered at the predetermined first temperature; a dielectric-paste-film forming step of forming a dielectric paste film on the film formation surface such that the conductive paste film is covered with the dielectric paste film, the dielectric paste film being constituted by a thick-film dielectric material in the form of particles which are bonded together with a resin and which are sintered at the predetermined first temperature; and a firing step of subjecting the support body to a firing treatment effected at the predetermined first temperature, so that the conductive paste film and the dielectric paste film are sintered without the high-melting-point particle layer being sintered, whereby the thick-film conductive body and the thick-film dielectric body are formed from the conductive paste film and the dielectric paste film, respectively, so that the thick-film sheet member is obtained. According to this producing method, after the conductive paste film and the dielectric paste film have been formed on the film formation surface which is provided by the high-melting-point particle layer whose melting point is higher than a sintering temperature (i.e., the first temperature) of the thick-film dielectric material, the paste films are subjected to the heat treatment at the first temperature that enables the thick-film dielectric and conductive materials to be sintered, so that the thick-film sheet member in which the thick-film conductive body is disposed on a surface of the thick-film dielectric body is obtained. Therefore, the high-melting-point particle layer, which is not sintered at the heat treatment temperature, converts into a layer in which only the high-melting-point particles are arranged, as a result of burning of the resin, so that the formed thick film is not fixed to the support body, whereby the formed thick film can be easily separated from the film formation surface. Thus, it is possible to easily produce the thick-film sheet member which constitutes the second electrode layer and the second dielectric layer and which is used in the production of the inorganic El device. The above-described paste-film forming step can be implemented by applying the paste, for example, with a thick-film screen printing method.

The above-described sheet-member preparing step includes: an unfired-sheet preparing step of preparing an unfired ceramic sheet constituted by a dielectric material which is sintered at a predetermined first temperature; a support-body preparing step of preparing a support body having a film formation surface provided by a high-melting-point particle layer which is constituted by particles held together with a resin, the particles having a melting point higher than the predetermined first temperature; a conductive-paste-film forming step of forming a conductive paste film on the film formation surface in a predetermined pattern, the conductive paste film being constituted by a thick-film conductive material in the form of particles which are bonded together with a resin and which are sintered at the predetermined first temperature; and a firing step of mounting the unfired ceramic sheet onto the conductive paste film, and subjecting the unfired ceramic sheet and the conductive paste film to a firing treatment effected at the predetermined first temperature, whereby the thick-film conductive body and the thick-film dielectric body are formed from the conductive paste film and the unfired ceramic sheet, respectively, and the thick-film conductive body is fixed to a surface of the thick-film dielectric body, without the high-melting-point particle layer being sintered, so that the thick-film sheet member is obtained. According to this producing method, after the conductive paste film has been formed on the film formation surface which is provided by the high-melting-point particle layer whose melting point is higher than a sintering temperature (i.e., the first temperature) of the thick-film dielectric material, the unfired ceramic sheet constituted by the dielectric material is mounted on the conductive paste film, and the unfired ceramic sheet and the conductive paste film are then subjected to the heat treatment at the first temperature that enables the thick-film dielectric and conductive materials to be sintered, so that the thick-film sheet member in which the thick-film conductive body is disposed on a surface of the thick-film dielectric body is obtained. Therefore, the high-melting-point particle layer, which is not sintered at the heat treatment temperature, converts into a layer in which only the high-melting-point particles are arranged, as a result of burning of the resin, so that the formed thick film is not fixed to the support body, whereby the formed thick film can be easily separated from the film formation surface. Thus, it is possible to easily produce the thick-film sheet member which constitutes the second electrode layer and the second dielectric layer and which is used in the production of the inorganic EL device. Further, since the unfired ceramic sheet is prepared independently of the other components, the dielectric film can be formed with higher degrees of uniformity of its thickness and surface smoothness, as compared with a case where the dielectric paste film is formed by a screen printing method or the like. Further, it is possible to easily prevent the dielectric film from being contaminated by foreign matters, as compared with the case where the dielectric paste film is formed by the screen printing method or the like. It is noted that the higher degree of surface smoothness of the dielectric film serves to advantageously increase adhesiveness of the dielectric film to the fluorescent layer when the dielectric film is posteriorly fixed to the fluorescent layer. The above-described unfired ceramic sheet can be produced by, for example, a tape casting method such as doctor blade method and calender method.

Further, preferably, the above-described other-side-surface film forming step is implemented to sequentially form the luminous layer, the first dielectric layer and the first electrode layer, by using a thin-film forming technique.

The gist of a fluorescent display tube of an eighth invention for achieving the above-described object is that the fluorescent display tube, including: a plurality of fluorescent layers which are fixed to respective anodes disposed on a display surface of a substrate; a filament cathode which is disposed above the fluorescent layers; and a plurality of control electrodes which are disposed in a height position between the fluorescent layers and the cathode, so that electrons generated from the filament cathode are controlled by the control electrodes, to strike selected at least one of the fluorescent layers, whereby the selected at least one of the fluorescent layers is activated to emit light, includes (a) a thick-film sheet member which is fixed to the display surface of the substrate, and which has a thin-plate-shaped thick-film dielectric body and a plurality of thick-film conductive electrodes, wherein the thick-film dielectric body has a predetermined thickness and a plurality of opening portions each of which is positioned in a position located above a corresponding one of the fluorescent layers and has such a size that permits an entirety of the corresponding fluorescent layer to be observed or seen through each of the opening portions, and wherein each of the thick-film conductive electrodes is fixed to a surface of the thick-film dielectric body, and extends along a periphery of a corresponding one of the opening portions, so as to constitute a corresponding one of the control electrodes.

The gist of a fluorescent-display-tube producing method of a ninth invention for achieving the above-described object is that, in the method of producing the fluorescent display tube in which electrons generated from a filament cathode are controlled by a plurality of control electrodes, to strike selected at least one of a plurality of fluorescent layers, whereby the at least one of the fluorescent layers is activated to emit light, the method including a step of disposing a plurality of anodes on a display surface of a substrate, a step of fixing the plurality of fluorescent layers onto the respective anodes, a step of disposing the plurality of control electrodes above the plurality of fluorescent layers, and a step of disposing the filament cathode above the control electrodes, the method includes: (a) a thick-film-sheet-member fixing step of fixing a thick-film sheet member which has a thin-plate-shaped thick-film dielectric body and a plurality of thick-film conductive electrodes, to the display surface of the substrate, wherein the thick-film dielectric body has a predetermined thickness and a plurality of opening portions each of which has such a size that permits an entirety of a corresponding one of the fluorescent layers to be seen through each of the opening portions, wherein each of the thick-film conductive electrodes is fixed to a surface of the thick-film dielectric body, and extends along a periphery of a corresponding one of the opening portions, so as to constitute a corresponding one of the control electrodes, and wherein the thick-film sheet member is fixed to the display surface of the substrate such that each of the plurality of opening portions is positioned in a position located above a corresponding one of the fluorescent layers.

In the fluorescent display tube produced in accordance with the present method, the control electrodes are provided by the thick-film conductive electrodes each of which is formed along the periphery of a corresponding one of the opening portions of the thick-film sheet member fixed to the display surface of the substrate. Thus, the control electrodes are established by simply fixing the thick-film sheet, in which the thick-film conductive electrodes are fixed to the surface of the thin-plate-shaped thick-film dielectric body having the opening portions, onto the display surface of the substrate. This arrangement advantageously solves drawbacks encountered in a case where the control electrodes are disposed on tops portions of rib walls, namely, inconveniences such as a increased length of time required for the production, an increased cost for the materials and a contamination of the fluorescent layers by the thick-film dielectric material which is disposed after the formation of the fluorescent layers. Further, since each of the opening portions is adapted to have such a size that permits a corresponding one of the fluorescent layers to be seen through the opening portion, light emitted from the fluorescent layer is not blocked by the control electrode, like in the case where the control electrodes are disposed on the tops portions of the rib walls. These features make it possible to obtain the fluorescent display tube which has a large open area ratio and can be produced by a simple production process and in which the florescent layers are not substantially contaminated.

Each of the above-described opening portions is positioned in the position located above the corresponding one of the fluorescent layers, and has an inner periphery which is substantially aligned with an outer periphery of the corresponding fluorescent layer. The above-described size of each opening portion that "permits an entirety of a corresponding one of the fluorescent layers to be observed or seen" should be interpreted to mean also a size that permits substantially the entirety of the corresponding fluorescent layer to be observed or seen. That is, a portion of the fluorescent layer ignorable in view of its display quality, or a portion of the fluorescent layer unnecessary for its display may be located outwardly of the inner periphery of the opening portion.

In a fluorescent display tube including: a plurality of fluorescent layers are fixed to respective anodes disposed on a display surface of a substrate; a filament cathode which is disposed above the fluorescent layers within a vacuum space; and a plurality of control electrodes (grid electrodes) which are disposed between the fluorescent layers and the cathode, so that thermo-electrons generated from the filament cathode are controlled by the control electrodes, to strike selected at least one of the fluorescent layers, whereby the selected at least one of the fluorescent layers is activated to emit light, the fluorescent layers are disposed in the vicinity of the cathode, so that a desired pattern of image can be clearly displayed with a low operating voltage. Further, this type of fluorescent display tube can be adapted to display a color image, with provision of plural kinds of fluorescent bodies for emitting lights having respective different colors. Thus, this type of fluorescent display tube is widely used as a display part such as a display panel of audio device, automobile or aircraft.

As an example of the above-described type of fluorescent display tube, there is a fluorescent display tube having a rib grind structure in which the grid electrodes are provided by a conductive film fixed to top portions of rib walls which surrounds the fluorescent layers and has a height larger than the fluorescent layers. Owing to this structure in which the grid electrodes do not take the form of a mesh-like structure covering the fluorescent layers, the display tube does not suffer from a display defect, such as uneven luminance and short-circuit, which is caused by thermal deformation of the grid electrodes where they are enlarged as a result of enlargement of display pattern of the fluorescent layers, and does not suffer from lowered luminance in relation with the open area ratio of the grid electrodes.

However, for forming the above-described rib walls having a predetermined height, it is necessary to repeatedly implement steps of printing a thick-film dielectric paste onto a substrate and drying the dielectric paste. Thus, as compared with a case where the grid electrodes of the mesh-like structure are used, it requires a longer time for the production and a higher cost for the materials. Further, since the fluorescent layers are formed in an early stage during the lamination formation of the rib walls in its production process, the formed fluorescent layers are likely to be contaminated during the printing, drying and firing steps for the formation of the rib walls. This is problematic because the luminance is lowered or substantially eliminated in a contaminated portion of each fluorescent layer which is close to the rib walls. It is noted that the contamination in the firing step arises from, for example, a gas or the like originating from an organic component contained in the thick-film dielectric paste. According to the eight and ninth inventions, the control electrodes are provided by fixing the thick-film sheet member to the display surface, it is possible to easily obtain the fluorescent display tube in which the open area ratio is large while the fluorescent layers are little contaminated.

Further, preferably, the above-described thick-film sheet member is fixed to the display surface of the substrate through a plurality of spherical bodies having predetermined particle sizes. This arrangement makes it possible to fix the thick-film sheet member to the display surface with a sufficiently small spacing distance therebetween, while preventing short-connection between the thick-film conductive electrodes and the fluorescent layers.

Further, preferably, the above-described fluorescent display tube including thick-film conductive wires which are connected to the thick-film conductive electrodes and which are disposed inside the thick-film sheet member and/or on a surface of the thick-film sheet member facing the display surface. In this arrangement, the wires are provided on the thick-film sheet member to connect the thick-film conductive electrodes serving as the control electrodes, to an external circuit. This arrangement facilitates formation of the wires and connection of the control electrodes with the external circuit. Further, as compared with an arrangement in which the wiring for the control electrodes, together with the wiring for the anodes, is provided on the display surface of the substrate, it is possible to establish the wirings more easily.

Further, preferably, the above-described fluorescent display tube includes a negative electrode which is constituted by a thick-film conductive material and which is given the same electric potential as the filament cathode, wherein the negative electrode is disposed on another surface of the thick-film sheet member facing the filament cathode such that the negative electrode is located in a portion of the surface of the thick-film sheet member in which the thick-film conductive electrodes are not disposed. In this arrangement, the electrons generated from the filament cathode are restrained from striking portions of the thick-film sheet member which are outside the control electrodes, i.e., which are other than the opening portion, thereby advantageously increasing the luminous efficiency.

Further, preferably, the above-described fluorescent display tube includes an anode and a fluorescent layer which is fixed to the anode, wherein the anode and the fluorescent layer are disposed on another surface of the thick-film sheet member. This arrangement makes it possible to enable the fluorescent layer disposed on the thick-film sheet member, in addition to the fluorescent layers disposed on the display surface of the substrate, to emit light, thereby advantageously increasing the display variety without particularly complicating installation of the wiring.

Further, preferably, the above-described thick-film sheet member has a through hole which is formed therethrough in its thickness direction and which is positioned in a position distant from the fluorescent layers, and the above-described fluorescent display tube includes a supporter uprightly extends through the through-hole such that its end is positioned on the substrate while its other end is positioned on a front face plate which is disposed above the substrate to form a vacuum space. Even where the fluorescent display tube is constructed such that an area of the display surface is increased to such a degree that makes the front face plate and the substrate easily deflexed or makes their mechanical strengths insufficient, such an inconvenience is restrained by the supporter.

Further, preferably, a getter is fixed to a surface of the thick-film sheet member, for maintaining a vacuum state within the fluorescent display tube. This arrangement provides an advantage that the getter can be provided simultaneously with fixing of the thick-film sheet member to the display surface of the substrate. It is noted that the getter can be fixed to the surface of the thick-film sheet member, for example, by a glass frit.

Further, preferably, the above-described fluorescent display tube includes another thick-film sheet member which has opening portions positioned in substantially the same positions as those of the above-described opening portions, and thick-film conductive electrodes serving as second control electrodes, wherein this another thick-film sheet member is fixed to the above-described thick-film sheet member such that the second control electrodes are insulated from the control electrodes disposed on the above-described thick-film sheet member. This arrangement permits one or ones of the fluorescent layers to be selected to emit light, by cooperation of the above-described control electrodes and the second control electrodes, thereby making it possible to reduce a number of the wires to be connected to the control electrodes. That is, the fluorescent display tube can be operated by a so-called multi-grid matrix.

Further, preferably, in the above-described method of producing the fluorescent display tube, the thick-film sheet member is produced by a process which includes: a support-body preparing step of preparing a support body having a film formation surface provided by a high-melting-point particle layer which is constituted by particles held together with a resin, the particles having a melting point higher than a predetermined first temperature; a dielectric-paste-film forming step of forming a dielectric paste film on the film formation surface in a predetermined pattern corresponding to the thin-plate-shaped thick-film dielectric body, the dielectric paste film being constituted by a thick-film dielectric material in the form of particles which are bonded together with a resin and which are sintered at the predetermined first temperature; a conductive-paste-film forming step of forming a conductive paste film on the film formation surface in a predetermined pattern corresponding to the thick-film conductive electrodes, the conductive paste film being constituted by a thick-film conductive material in the form of particles which are bonded together with a resin and which are sintered at the predetermined first temperature; and a firing step of subjecting the support body to a heat treatment effected at the predetermined first temperature, so that the dielectric paste film and the conductive paste film are sintered without the high-melting-point particle layer being sintered, whereby the thin-plate-shaped thick-film dielectric body and the thick-film conductive electrodes are formed.

According to this producing method, after the paste films constituted by the thick-film dielectric material and thick-film conductive material have been formed in the predetermined patterns on the film formation surface which is provided by the high-melting-point particle layer whose melting point is higher than a sintering temperature (i.e., the first temperature) of the thick-film dielectric and conductive materials, the paste films are subjected to the heat treatment at the first temperature that enables the thick-film dielectric and conductive materials to be sintered, so that the thick-film sheet member in which the thick-film conductive layer is disposed on a surface of the thick-film dielectric layer is formed. Therefore, the high-melting-point particle layer, which is not sintered at the heat treatment temperature, converts into a layer in which only the high-melting-point particles are arranged, as a result of burning of the resin, so that the formed thick film is not fixed to the support body, whereby the formed thick film can be easily separated from the film formation surface. In this instance, the paste films of the thick-film dielectric and conductive materials can be formed on the film formation surface in desired patterns, in accordance with a method suitable for the materials and purpose, by using a simple installation. Further, since the thick film is temporarily fixed to the film formation surface onto which the thick film in the form of the paste films has been applied, the thick film is easily handled. This feature makes it possible to easily produce the thick-film sheet member which constitutes the control electrodes and which is used in the production of the fluorescent display tube.

An implementation order of the above-described conductive-paste-film forming step and dielectric-paste-film forming step is determined depending upon the construction of the thick-film sheet member. Where the thick-film conductive electrodes are disposed on the opposite side surfaces of the thin-plate-like thick-film dielectric body, the conductive-paste-film forming step is implemented before and after the dielectric-paste-film forming step. Where the thick-film conductive electrodes are disposed on only one of the opposite side surfaces, the conductive-paste-film forming step is implemented before or after the dielectric-paste-film forming step. Further, in this producing method, since the thick film is sintered on the layer in which only the high-melting-point particles are arranged, shrinkage of the thick film is not restricted by the formation surface, unlike in a standard method of the formation of the thick film. Thus, it is possible to restrain warp or other deformation of the thick film, which deformation arises from resistance applied from the formation surface to the shrinking thick film, and also to avoid crack arising from the warp or other deformation.

The gist of a thin CRT of a tenth invention for achieving the above-described object is that the thin CRT, including: an electron source; a plurality of first electrodes extending along a predetermined direction; a plurality of second electrodes extending along another direction crossing the predetermined direction; and a fluorescent surface on which a predetermined fluorescent layer is disposed, and defining a vacuum space in which electrons generated from the electron source are controlled by the first and second electrodes, so that the electrons passing through the second electrodes are permitted to strike a desired portion of the fluorescent surface, whereby the fluorescent layer emits light which is seen through the fluorescent surface, the thin CRT being characterized by including a thick-film sheet member which has: (a) a dielectric support layer provided by a thick-film dielectric body having a multiplicity of electron passing-through holes; and (b) a thick-film conductive layer provided by a plurality of conductive films which are elongated along the above-described another direction and are disposed on a surface of the dielectric support layer, for constituting the second electrodes, wherein the thick-film sheet member is disposed between the first electrodes and the fluorescent surface, such that the thick-film sheet member is parallel with the fluorescent surface.

In the thin CRT constructed as described above, the plurality of second electrodes are provided by the thick-film conductive layer which is disposed on a surface of the thick-film sheet member having the multiplicity of electron passing-through holes. Thus, the second electrodes can be easily installed by simply interposing the thick-film sheet member between the first electrodes and the fluorescent surface, and are not distorted unlike a case where they are provided by a sheet metal. Owing to the thick-film sheet member in which the mutually-separated electrodes are disposed on the dielectric support layer integrally with each other, it is easy to control a spacing distance between the electrodes. Further, where the thick-film sheet member is fixed to another component of the CRT by a frit, it is possible to reduce a variation in the spacing distance caused in a drying process because of a small difference between a degree of thermal conductivity of the thick-film sheet member and that of the frit. Further, where the dielectric support layer is provided by a porous body layer, the variation is not likely to be caused by a condition of application of the frit and a condition of attachment of the metallic sheet, because the solvent can be embedded in pores of the dielectric support layer. It is therefore possible to alleviate difficulty in handling and assembling operations for the formation of the electrodes and to facilitate an appropriate control of the electron beam.

There is known a CRT including: an electron source; a plurality of first electrodes extending along a predetermined direction; a plurality of second electrodes extending along another direction crossing the predetermined direction; and a fluorescent surface on which a predetermined fluorescent layer is disposed, and defining a vacuum space in which electrons generated from the electron source are controlled by the first and second electrodes, so that the electrons passing through the second electrodes are permitted to strike a desired portion of the fluorescent surface, whereby the fluorescent layer emits light which is seen through the fluorescent surface. As an example of this type of CRT, a MDS-type flat matrix display is described in pages 75–76 of "Advanced Display Technology" (whose first edition was published by Kyoritsu Publishing Company in Feb. 28, 1998). Such a type of CRT is advantageous, over one having a construction in which the electrons emitted from an electron gun are deflected, in that it can be constructed to have a small thickness.

In a conventional thick CRT, since the first and second electrodes are divided into a multiplicity of strips so as to take a reed-screen-like shape, a multiplicity of strips of sheet metal are fixed to a glass vessel by a low-melting-point frit or the like, for constituting the first and second electrodes. This arrangement leads to an increased number of components, thereby providing difficulty in handling and assembling the components.

As the sheet metal requiring the difficult assembling operation, alloy 426 or the like, whose coefficient of thermal expansion is closed to that of a glass, is commonly used. However, even if the coefficient of thermal expansion of the sheet metal is equal to that of the glass, the sheet metal has a higher thermal conductivity and a smaller thermal capacity than those of the glass, so that a temperature of the sheet metal rises faster than that of the glass in a heat treatment of a fixing process. Therefore, the sheet metal can not be fixed to the glass with a high stability. The sheet metal is likely to be fixed to the glass while being expanded, thereby causing warp and distortion of the sheet metal. Further, where metallic electrode thin plates, into which a sheet metal is divided according to potential levels, are fixed to a substrate or other metallic electrodes by a frit, it is common that the frit in the form of a paste is applied onto the substrate or other metallic electrodes by a dispenser or the like. In this instance, it is difficult to evenly control the electrode gaps and control the paste-applied area. Further, evaporation of solvent contained in the paste applied between the metallic plates is impeded by an upper one of the metallic plates. Further, if heat is transmitted to each metallic sheet much more than to the paste, distortion between the paste and the metallic sheet is eventually left after the paste is dried (cooled). The distortion is not alleviated even if the frit is softened in a heat treatment in the subsequent step, and causes warp of the metallic sheet, leading to an uneven assembly. The adjacent metallic electrodes exhibit different behaviors due to variations in the condition of application and drying of the frit and in the condition of the heat treatment. There is no means for controlling them.

In a construction, as in the above-described MDS type, using a total of five sheet metals including the above-described first and second electrodes (the other three are a signal modulation electrode, a convergence electrode (focus electrode) and an electron-beam control electrode, for example), a heat treatment has to be effected five times, for connecting the five sheet metals with each other and fixing the sheet metals to the glass vessel. A required number of times of the heat treatment is inevitably increased since three or more sheet metals can not be simultaneously fixed to each other. This is because it is difficult to accurately fix separated sheet metals to each other with a predetermined spacing distance therebetween in a production field. That is, in this instance, at least one sheet metal has to be put on a support substrate such as a setter, for controlling its flatness. Consequently, the repeatedly effected heat treatment makes it difficult to position the sheet metals relative to each other, and accordingly makes it difficult to produce a CRT having a large display area. According to the tenth invention, the second electrodes are provided by simply interposing the thick-film sheet member, which is equipped with the plurality of conductive films, between the first electrodes and the fluorescent surface, wherein the conductive films, i.e., the second electrodes are integrally provided in the thick-film sheet member while being electrically insulated from each other. The integral provision of the conductive films in the thick-film sheet member facilitates handling of the conductive films and appropriate controlling of electron beam.

The above-described thin CRT preferably includes a second thick-film sheet member having: a dielectric support layer provided by a thick-film dielectric body having a multiplicity of electron passing-through holes; and a thick-film conductive layer provided by a plurality of conductive films which are elongated along the predetermined direction and are disposed on a surface of the dielectric support layer, for constituting the first electrodes, wherein the second thick-film sheet member is disposed between the electron source and the thick-film sheet member, such that the second thick-film sheet member is parallel with the thick-film sheet member. This arrangement makes it possible to provide the first electrodes provided by the thick-film conductive layer, by simply disposing the second thick-film sheet member between the electron source and the thick-film sheet member which constitutes the second electrodes. This feature is effective to alleviate difficulty in handling and assembling operations for the formation of the electrodes and to facilitate an appropriate control of the electron beam in the thin CRT of MDS type or the like equipped with the plurality of first and second electrodes which extend along the mutually perpendicular directions and which are disposed between the electron source and the fluorescent surface.

Further, preferably, the above-described thin CRT includes an electrode, such as an electron-beam control electrode and a convergence electrode, which is common to the entirety of the display surface, wherein the electrode common to the entirety of the display surface is provided by a sheet metal having a plurality of through-holes positioned in suitable portions thereof. In this construction in which the electrodes of the thin CRT are provided by the thick-film sheet member and the sheet metal which are fixed to each other, the electrodes are given relatively high mechanical strengths, whereby handling of the electrodes is further facilitated, as compared with a case where all the electrodes are provided by the sheet members.

Further, preferably, the above-described thin CRT is equipped with signal modulation electrodes in addition to the above-described first and second electrodes, and includes a third thick-film sheet member having: a dielectric support layer provided by a thick-film dielectric body having a multiplicity of electron passing-through holes; and a thick-film conductive layer provided by a plurality of conductive films which are elongated along the above-described predetermined direction or the above-described another direction and are disposed on a surface of the dielectric support layer, for constituting the signal modulation electrodes, wherein the third thick-film sheet member is disposed between the electron source and the fluorescent surface, such that the third thick-film sheet member is parallel with the above-described thick-film sheet member. In this arrangement, the signal modulation electrodes provided by the thick-film conductive layer are established by simply disposing the third thick-film sheet member in a predetermined position. Therefore, even with the provision of the signal modulation electrodes, it is possible to obtain the thin CRT which alleviates difficulty in handling and assembling operations and facilitates an appropriate control of the electron beam.

The gist of a thin-CRT producing method of an eleventh invention for achieving the above-described object is that, in the method of producing the thin CRT including: an electron source; a plurality of first electrodes extending along a predetermined direction; a plurality of second electrodes extending along another direction crossing the predetermined direction; and a fluorescent surface on which a predetermined fluorescent layer is disposed, and defining a vacuum space in which electrons generated from the electron source are controlled by the first and second electrodes, so that the electrons passing through the second electrodes are permitted to strike a desired portion of the fluorescent surface, whereby the fluorescent layer emits light which is seen through the fluorescent surface, the method includes a thick-film-sheet-member fixing step of fixing a thick-film sheet member between the first electrodes and the fluorescent surface, such that the thick-film sheet member is parallel with the fluorescent surface, the thick-film sheet member having: (a) a dielectric support layer provided by a thick-film dielectric body having a multiplicity of electron passing-through holes; and (b) a thick-film conductive layer provided by a plurality of conductive films which are elongated along the above-described another direction and are disposed on a surface of the dielectric support layer, for constituting the second electrodes.

According the present method, in the production of the thin CRT which is produced by laminating a plurality of layers as electrodes including the first and second electrodes, the second electrodes are provided in the vacuum space, by fixing the thick-film sheet member, in which the thick-film conductive layer is disposed on the surface of the dielectric support layer, between the first electrodes and the fluorescent surface. That is, since the thick-film conductive layer constituting the second electrodes is disposed on the thick-film sheet member, the second electrodes can be established by simply disposing the thick-film sheet member between the first electrodes and the fluorescent surface. As compared with a case where all the electrodes are constituted by sheet metals, it is possible to advantageously restrain distortion of the second electrodes arising from a heat treatment which is effected for fixing the second electrodes in predetermined positions, and also possible to simplify the production process.

The above-described thin-CRT producing method preferably includes a step of fixing a second thick-film sheet member between the electron source and the above-described thick-film sheet member, such that the second thick-film sheet member is parallel with the above-described thick-film sheet member, the second thick-film sheet member having: a dielectric support layer provided by a thick-film dielectric body having a multiplicity of electron passing-through holes; and a thick-film conductive layer provided by a plurality of conductive layers which are elongated along the predetermined direction and are disposed on a surface of the dielectric support layer, for constituting the first electrodes.

Further, preferably, in the above-described thin-CRT producing method, at least one of the above-described thick-film sheet member and the second thick-film sheet member is produced by a process which includes: a support-body preparing step of preparing a support body having a film formation surface provided by a high-melting-point particle layer which is constituted by particles held together with a resin, the particles having a melting point higher than a predetermined first temperature; a dielectric-paste-film forming step of forming a dielectric paste film on the film formation surface in a predetermined pattern corresponding to the dielectric support layer, the dielectric paste film being constituted by a thick-film dielectric material in the form of particles which are bonded together with a resin and which are sintered at the predetermined first temperature; a conductive-paste-film forming step of forming a conductive paste film on the film formation surface in a predetermined pattern which defines a plurality of sections corresponding to the thick-film conductive layer, the conductive paste film being constituted by a thick-film conductive material in the form of particles which are bonded together with a resin and which are sintered at the predetermined first temperature; and a firing step of subjecting the support body to a heat treatment effected at the predetermined first temperature, so that the dielectric paste film and the conductive paste film are sintered without the high-melting-point particle layer being sintered, whereby the dielectric support layer and the thick-film conductive layer are formed of the sintered dielectric paste film and conductive paste film, respectively.

According to this producing method, after the paste films constituted by the thick-film dielectric material and thick-film conductive material have been formed in the predetermined patterns on the film formation surface which is provided by the high-melting-point particle layer whose melting point is higher than a sintering temperature (i.e., the first temperature) of the thick-film dielectric and conductive materials, the paste films are subjected to the heat treatment at the first temperature that enables the thick-film dielectric and conductive materials to be sintered, so that the thick-film sheet member in which the thick-film conductive layer is disposed on a surface of the thick-film dielectric layer is formed. Therefore, the high-melting-point particle layer, which is not sintered at the heat treatment temperature, converts into a layer in which only the high-melting-point particles are arranged, as a result of burning of the resin, so that the formed thick film is not fixed to the support body, whereby the formed thick film can be easily separated from the film formation surface. In this instance, the paste films of the thick-film dielectric and conductive materials can be formed on the film formation surface in desired patterns, in accordance with a method suitable for the materials and purpose, by using a simple installation. Further, since the thick film is temporarily fixed to the film formation surface onto which the thick film in the form of the paste films has been applied, the thick film is easily handled. This feature makes it possible to easily produce the thick-film sheet members which constitute the first and second electrodes and which are used in the production of the thin CRT.

Further, since the thick film is sintered on the layer in which only the high-melting-point particles are arranged, shrinkage of the thick film is not restricted by the formation surface, unlike in a standard method of the formation of the thick film. Thus, it is possible to restrain warp or other deformation of the thick film, which deformation arises from resistance applied from the formation surface to the shrinking thick film, and also to avoid crack arising from the warp or other deformation. Accordingly, the first and second electrodes are advantageously further restrained from being distorted or otherwise deformed.

In the above-described third, fifth, sixth, seventh, ninth and eleventh inventions, preferably, the above-described support-body preparing step is implemented to form the high-melting-point particle layer on a surface of a predetermined substrate. In this arrangement, since the paste film is formed on the substrate, the shape of the support body is maintained even after the heat treatment, thereby providing an advantage that the thick-film sheet member can be handled easier than an arrangement in which the support body is constituted by only the high-melting-point-particle layer (for example, in an arrangement in which the support body is constituted by a raw ceramic sheet). Further, where such a support body is used, since the high-melting-point-particle layer is interposed between the paste film and the substrate, the paste film is not bound by the substrate during the heat treatment. The surface smoothness of the paste film is affected by only the surface roughness of the high-melting-point-particle layer. That is, the quality of the thick-film sheet member is little affected by the flatness, surface roughness, coefficient of thermal expansion and other factors of the substrate, so that the substrate is not required to have a high quality.

In the above-described third, fifth, sixth, seventh, ninth and eleventh inventions, preferably, the above-described substrate is provided by a member which is not deformed at the firing temperature. In this arrangement, even where the substrate is subjected to a heat treatment for forming the thick-film dielectric layer and the thick-film conductive layer, the film formation surface can maintain its original shape. Therefore, the substrate can be repeatedly used, by newly disposing the high-melting-point-particle layer on its surface. As the substrate, a suitable one satisfying the above-described condition is selected. For example, as the substrate, it is possible to use a standard glass, heat-resistant glass, ceramic plate, metallic plate or the like.

In the above-described third, fifth, sixth, seventh, ninth and eleventh inventions, preferably, the above-described paste-film forming step is implemented to form the dielectric paste film and the conductive paste film by using a thick-film screen printing method. The method of forming the paste film may be a suitable one that is selected, in view of cost, required degree of accuracy and other steps of the production process, from among various methods such as printing, sand blasting, lift off and photo processing with use of a photosensitive paste. Where the formation of the paste film is made by the printing method, as described above, the formation can be made without waste of the film composition material, since the material is not applied onto an unnecessary portion of the film formation surface. That is, as compared with other forming methods such as a pressing effected on a raw ceramic sheet, a laser machining effected on a ceramic sheet and a chemical etching effected on a metallic material, it is possible to save the material in the printing method in which an amount of material removed in the forming process is extremely small. It is noted that, in an embodied form in which the above-described dielectric-core-paste-film forming step, conductive-paste-film forming step and reinforcing-dielectric-paste-film forming step are implemented, these forming steps are implemented to form the above-described dielectric core paste film, conductive paste film and reinforcing dielectric paste film, respectively, by using the thick-film screen printing method.

In the above-described third, fifth, sixth, seventh, ninth and eleventh inventions, preferably, the above-described high-melting-point particles are formed from an inorganic material such as ceramics and glass frit. As the high-melting-point particles, a suitable inorganic material can be used, as long as the particles are not softened at all after burning of the resin cooperating with the particles to constitute the high-melting-point-particle layer. It is noted that a specific selection of the material is made depending upon, for example, kind of the thick-film material constituting the thick-film sheet member and its firing temperature.

BRIEF DESCRIPTION OF DRAWINGS

FIGS. 10(a)–(c) are views for explaining states of the thick film in main stages of the production process of FIG. 9.

BEST MODE FOR CARRYING OUT THE INVENTION

Figure 1:
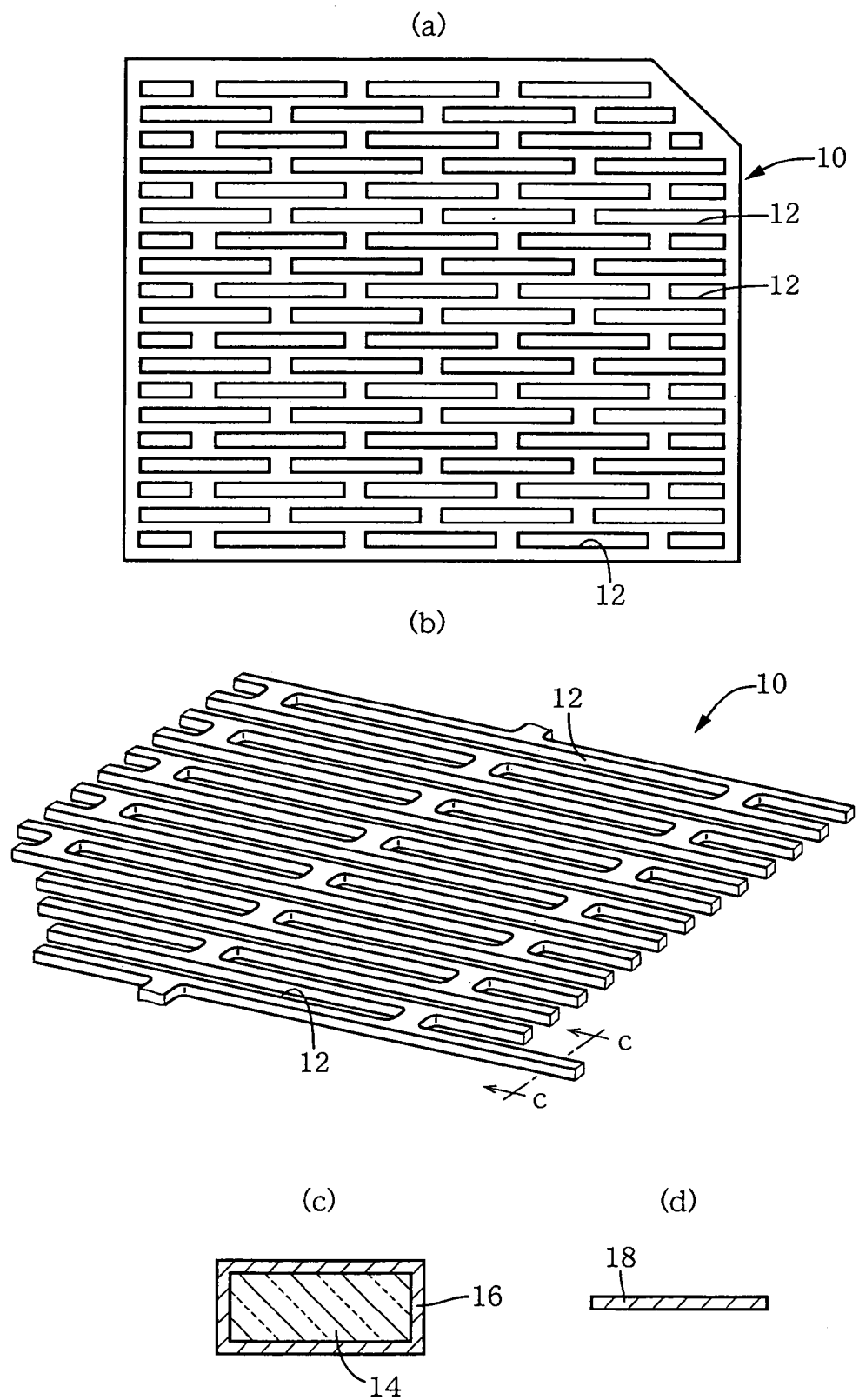
FIG. 1 is a set of views showing a thick-film sheet according to one embodiment of a first invention, wherein (a) is a plan view, (b) is a perspective view, and (c) and (d) are cross sectional views showing examples of a cross sectional structure of the thick-film sheet.

There will be described in detail one embodiment of the present invention, with reference to the drawings.

FIRST EMBODIMENT

FIG. 1(a) is a plan view showing a thick-film sheet 10 as one applied example of the thick-film sheet member of the first invention, which is produced with application of the producing method of the third invention. FIG. 1(b) is a perspective view showing in enlargement a main part of the thick-film sheet 10. Each of FIG. 1(c) and FIG. 1(d) is a view showing an internal structure of the thick-film sheet 10 in a cross section taken along line C—C of FIG. 1(b). The thick-film sheet 10 shown in FIGS. 1(a)–(d) is a thin plate having a substantially square shape as a whole in its plan configuration and a size of about 150×150 (mm). A multiplicity of elongated holes 12 are provided in an entirety of the thick-film sheet 10 such that the elongated holes 12 are equally spaced apart from each other as viewed in a direction parallel with a side of the sheet 10 and also as viewed in a direction parallel with another side of the sheet 10 that is perpendicular to the above-described side. Each pair of the elongated holes 12 adjacent to each other as viewed in a direction of width of each hole 12 are positioned relative to each other such that one of the pair is offset, as viewed in a direction of length of each hole 12, from the other of the pair by a distance corresponding to substantially a half of its length. Each elongated hole 12 has, for example, a width of about 0.8 (mm) and a length of about 9.8 (mm). A spacing distance between longitudinally adjacent holes 12 is about 10 (mm) as measured in the longitudinal direction, while a spacing distance between widthwise adjacent holes 12 is about 1 (mm) as measured in the widthwise direction. It is noted that each hole 12 is illustrated in enlargement although the thick-film sheet 10 is provided with a considerably large number of elongated holes 12.

The above-described thick-film sheet 10 has a cross sectional structure, in an example whose cross section is shown in FIG. 1(c), which is provided by a two-layer structure consisting of a skeleton portion 14 as its inner portion and a coating portion. 16 covering an entirety of outer circumferential surface of the skeleton portion 14. The skeleton portion 14, providing a skeleton of the thick-film sheet 10, is constituted by, for example, a thick-film dielectric material or the like which is a mixture of low-softening-point glass and ceramic filler such as alumina and zirconia. On the other hand, the coating portion 16 is constituted by, for example, a thick-film conductive material such as thick-film silver. The skeleton portion 14 has a thickness of, for example, about 30–300 (μm), while the coating portion 16 has a thickness of, for example, about 3–20 (μm), which is substantially uniform over the entire outer circumferential surface of the skeleton portion 14, so that the thick-film sheet 10 has an entire thickness of about 36–340 (μm). That is, the thick-film sheet 10 is provided by the skeleton portion 14 which does not have an electric conductivity and which is coated at its surface with the coating portion 16 having a high degree of electric conductivity. The thick-film sheet 10 is used as a spacer or the like, like a sheet metal having the similar shape and a thickness of about 0.1 (mm).

Figure 2:
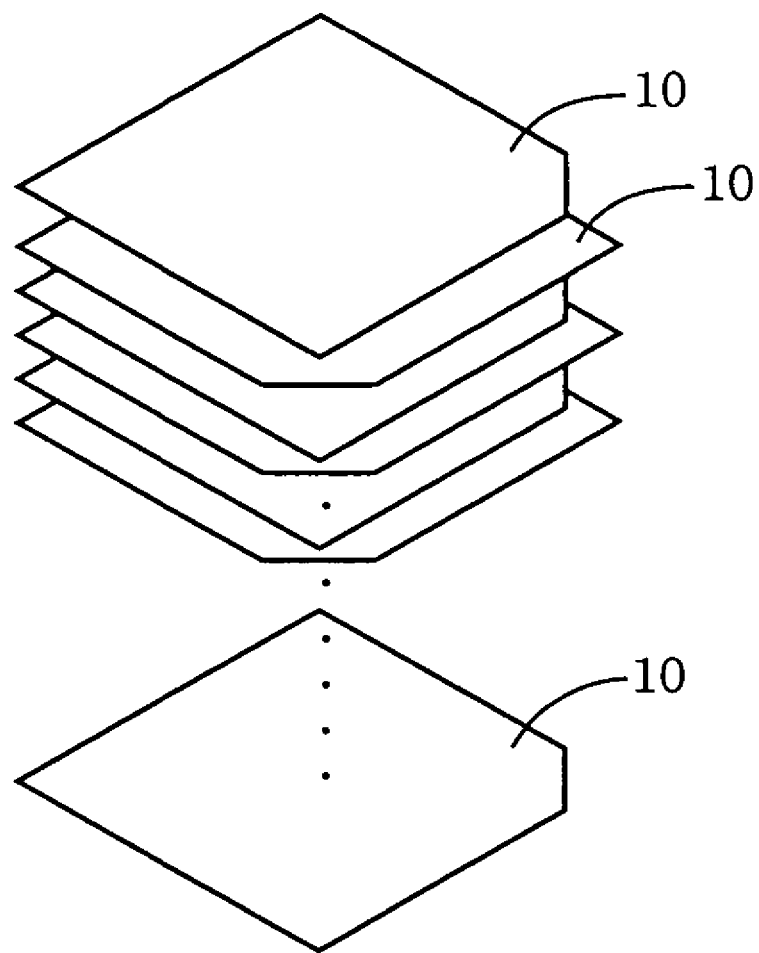
FIG. 2 is a view of a main part of an oxygen separator constituted by lamination of a plurality of sheets each provided by the thick-film sheet of FIG. 1(d).

On the other hand, in an example whose cross section is shown in FIG. 1(*d*), the thick-film sheet 10 is constituted by only a single thick film 18. Although this thick film 18 is constituted by cerium oxide ($CeO_2$) or titanium oxide ($TiO_2$) as its main component, the thick film 18 may be constituted by the thick-film dielectric or thick-film silver as described above. In this case, a thickness of the thick film 18 or thick-film sheet is, for example, about 10–15 (μm). Even the sheet having such a cross sectional structure is used like a sheet metal having the similar shape and a thickness of about 10–15 (μm). Where the thick-film sheet 10 is constituted by, for example, titanium oxide, it can be used as a part of a filter or the like of an oxygen separator. In this case, as shown in FIG. 2, a plurality of thick-film sheets 10 are superposed on each other such that the longitudinal direction of the elongated holes 12 of each sheet 10 is angularly offset from that of the adjacent sheet 10 by 90 degrees, and the laminated sheets 10 are sealed at their respective peripheral portions.

In the thick-film sheet 10 of the present embodiment, irrespective of whether which one of the above-described cross sectional structures the sheet 10 has, any deformation or wrinkle is not found and is accordingly given a sufficiently high degree of patterning accuracy, although the sheet 10 has a large surface area as a whole as described above. Further, the sheet 10 does not have any defect which is encountered in a case where a sheet metal having the similar size and configuration is produced by a chemical etching.

Figure 3:
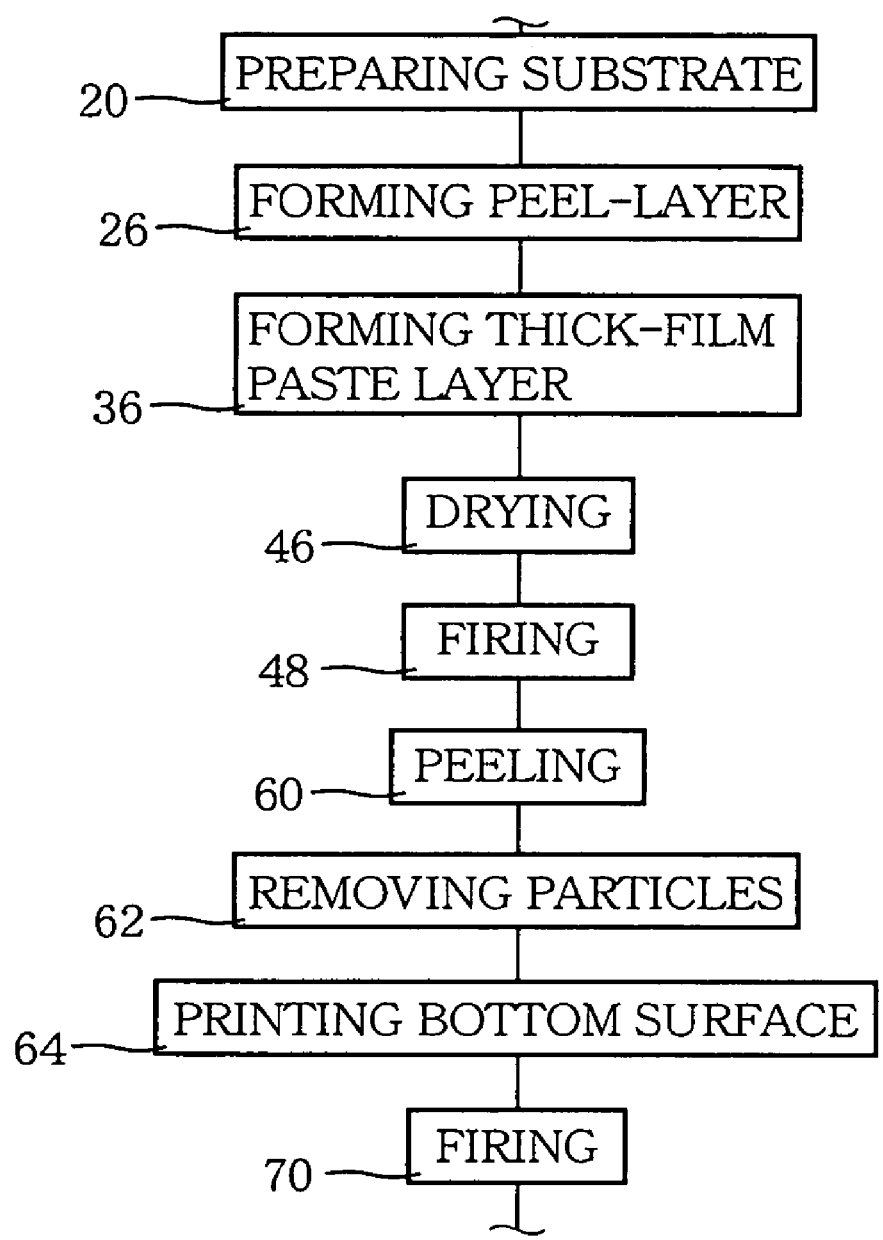
FIG. 3 is a process chart for explaining a method according to one embodiment of a third invention, which is for producing the thick-film sheet of FIG. 1.

The above-described thick-film 10 is produced in a manner to which a conventionally known thick-film printing technique is applied. The film 10 is produced, for example, in accordance with a process which is indicated in FIG. 3. There will be described a method of producing the thick-film sheet 10 having the cross section as shown in FIG. 1(*c*), on the basis of FIG. 3, with reference to FIGS. 4(*a*)–(*f*) which represent states in respective main stages of the production process.

The process is initiated with a substrate-preparing step 20 implemented to prepare a substrate 22 (see FIG. 4) which is to be subjected to a thick-film printing, and then effect a suitable cleaning treatment on a surface 24 of the substrate 22. This substrate 22 is provided by a member which does not suffer from considerable deformation and deterioration in a heat treatment which is described below. For example, it is preferable to use, as this substrate 22, a glass substrate or the like such as soda lime glass which has a coefficient of thermal expansion of about $85 \times 10^{-7}$(/° C.), a softening point of about 740(° C.) and a distortion point of about 510(° C.). It is noted that the substrate 22 has a thickness of about 3 (mm) and that its surface 24 has a size of 200×200 (mm) that is sufficiently larger than the thick-film sheet 10.

Figure 4:
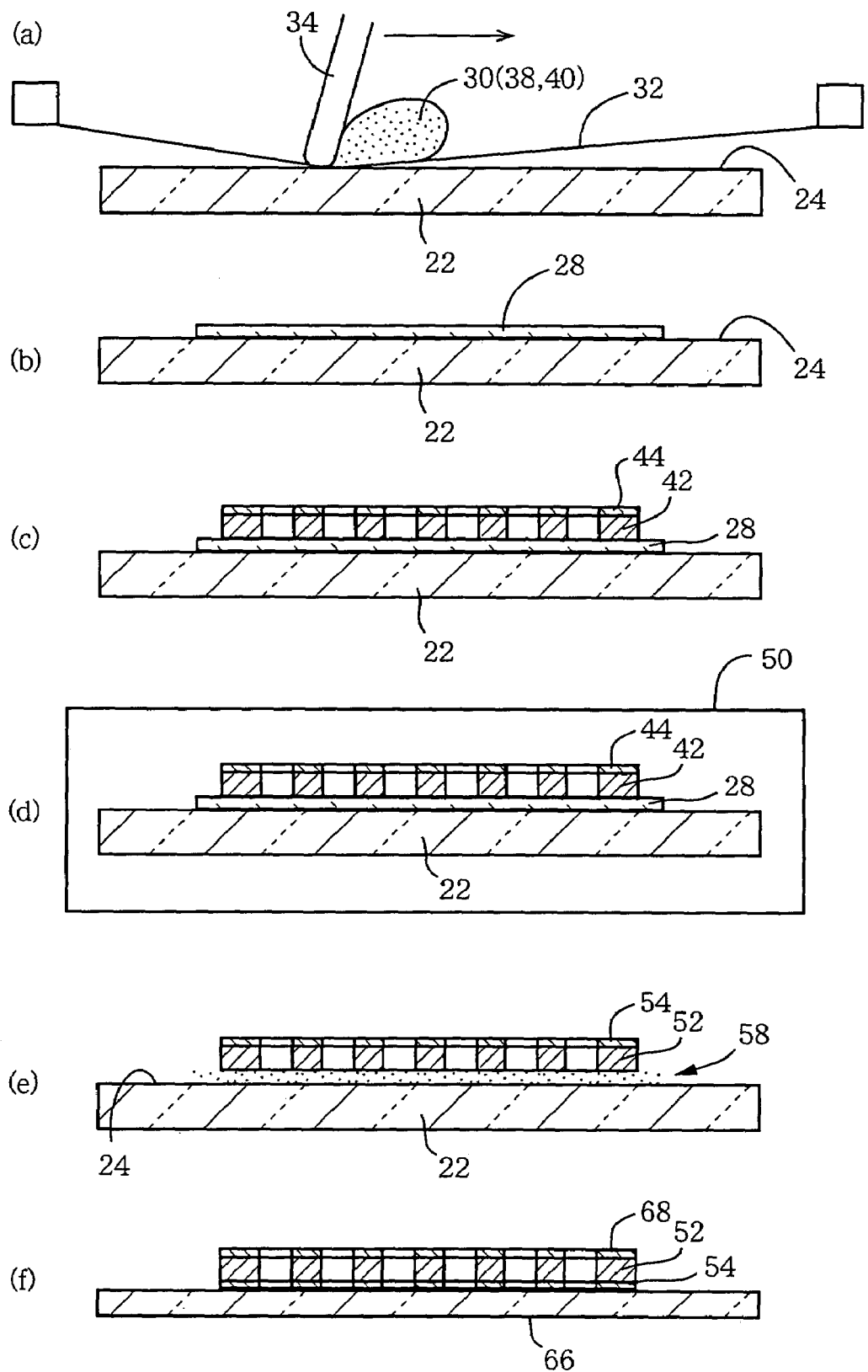
FIGS. 4(a)–(d) are views showing states of substrate and thick film in main stages of the production process of FIG. 3.

A peel-layer forming step 26 is then implemented to dispose a peel layer 28 constituted by high-melting-point particles which are bonded together with a resin, on the surface 24 of the substrate 22 such that the peel layer 28 has a thickness of about 5–50 (μm). The high-melting-point particles are provided by a mixture of high-softening-point glass frit whose average particle size is about 0.5–3 (μm) and ceramic filler such as alumina and zirconia whose average particle size is about 0.01–5 (μm). The high-softening-point glass has a softening point of about 550(° C.) or higher. The high-melting-point particles consisting of the mixture has a melting point of about 550(° C.) or higher. The resin is provided by ethyl cellulose resin or the like which is burnt at about 350(° C.). The peel layer 28 is disposed on the surface 24 of the substrate 22, for example, by applying an inorganic material paste 30 which is constituted by the above-described high-melting-point particles and resin which are dispersed in an organic solvent such as butyl carbitol acetate (BCA), onto substantially the entire surface of the substrate 22 with a screen printing method as shown in FIG. 4(*a*), and then drying the applied paste 30 at a room temperature. However, the peel layer 28 may be disposed on the surface 24 of the substrate 22, by sticking a coater or film laminate onto the surface of the substrate 22. FIG. 4(*b*) shows a stage in which the peel layer 28 is formed as described above. It is noted that reference signs 32 and 34 denote a screen and a squeegee, respectively, in FIG. 4(*a*). In the present embodiment, the substrate 22 provided with the peel layer 28 corresponds to a support body. A surface of the peel layer 28 corresponds to a film formation surface. The substrate preparing step 20 and peel layer forming step 26 correspond to a support-body preparing step.

A thick-film-paste-layer forming step 36 is then implemented to sequentially apply a thick-film dielectric paste 38 forming the above-described skeleton portion 14 and a thick-film conductive paste 40 forming the above-described coating portion 16, in a predetermined pattern on the peel layer 28, in the same manner as the application of the inorganic material paste 30, namely, with the screen printing method (see FIG. 4(*a*)). In this instance, the used screen 32 has an aperture pattern corresponding to the configuration of the thick-film sheet 10 as shown in FIG. 1(*a*), while the thick-film dielectric paste 38 and the thick-film conductive paste 40 are applied to have thicknesses of about 30 (μm) and 10 (μm), respectively. The thick-film dielectric paste 38 is constituted by dielectric material powders such as alumina and zirconia, glass frit and resin which are dispersed in an organic solvent. The thick-film conductive paste 40 is constituted by conductive material powders such as silver powders, glass frit and resin which are dispersed in an organic solvent. As the glass frit, for example, $PbO$—$B_2O_3$—$SiO_2$—$Al_2O_3$—$TiO_2$ based material is used. As the resin and solvent, for example, material similar to the inorganic material paste 30 is used. FIG. 4(*c*) shows a state in which a printed dielectric layer 42 and a printed conductive layer 44 (which are referred to as thick-film paste layers 42, 44 where they do not have to be distinguished from each other) are laminated. In the present embodiment, each of the thick-film paste layers 42, 44 corresponds to a paste layer.

Although the printed dielectric layer 42 and the printed conductive layer 44 are illustrated in FIG. 4(*c*) as if the two layers 42, 44 had the same pattern, the aperture pattern of the screen 32 for printing the. thick-film conductive paste 40 is adapted to be slightly larger than the aperture pattern for printing the thick-film dielectric paste. 38, for covering the printed dielectric layer 42 with the printed conductive layer 44 as shown in FIG. 1(*c*). Where the thick-film sheet 10 is constituted by only the thick film 18, as shown in FIG. 1(*d*), the above-described thick-film-paste-layer forming step 36 is constituted by only a step of applying one kind of thick-film paste.

After the thick-film paste layers 42, 44 have been formed as described above, a drying step 46 is implemented to dry the paste layers 42, 44 so as to remove the solvent. The drying step 46 is followed by a firing step 46 in which the substrate 22 is disposed in a furnace chamber 50 so that the substrate 22 is subjected to a heat treatment which is carried out at a firing temperature of about 550(° C.) that is suitable for kinds of the thick-film dielectric paste 38 and thick-film conductive paste 40. FIG. 4(d) shows a state in a process of the heat treatment.

In the process of the heat treatment, the resin component of each of the thick-film paste layers 42, 44 is burnt, while the dielectric material, conductive material and glass frit are sintered since the sintering temperature is about 550(° C.), so that a thick-film dielectric layer 52 and a thick-film conductive layer 54 are formed. FIG. 4(e) shows this state. This thick-film dielectric layer 52 is a layer for constituting the above-described skeleton portion 14. In this instance, since the inorganic component particles of the peel layer 28 have the softening point of 550(° C.) or higher, the high-melting-point particles (glass powders and ceramic filler) are not sintered while the resin component is burnt in the peel layer 28. Therefore, after the burning of the resin component as a result of progress of the heat treatment, the peel layer 28 converts into a particle layer 58 consisting of only the high-melting-point particles 56 (see FIG. 5).

Figure 5:
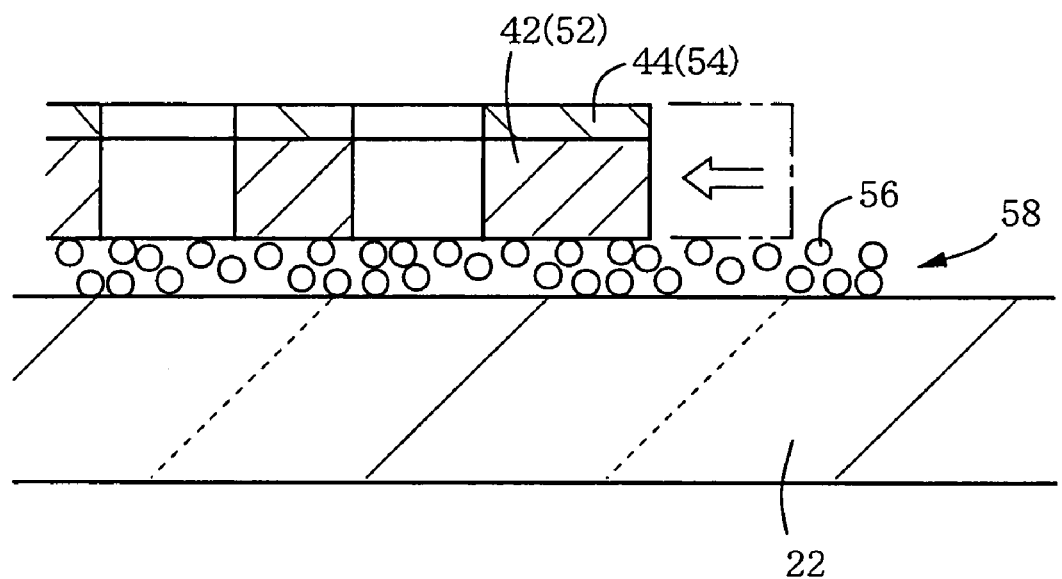
FIG. 5 is a view for explaining a shrinkage behavior in a firing step of FIG. 3.

FIG. 5 is an enlarged view of a part of a right end of FIG. 4(e), schematically showing a state in progress of the sintering in the above-described heat treatment. The particle layer 58, which has been formed as a result of burning of the resin component of the peel layer 28, is a layer constituted by the high-melting-point particles 56 which are merely superposed on each other and which are not bound to each other. Therefore, when the thick-film paste layers 42, 44 shrink as indicated in FIG. 5 in which their end portions before the sintering are represented by one-dot chain line, the high-melting-point particles 56 function as rollers. Owing to the roller function of the particles 56, between a lower portion of a set of the thick-film paste layers 42, 44 and the substrate 22, there is not generated a force impeding the shrinkage of the layers 42, 44. Thus, the lower and upper portions of the set of the layers 42, 44 equally shrink, so that the set of the layers 42, 44 is free from density variation and warp arising from difference in the shrinkage amount.

In the present embodiment, the coefficient of thermal expansion of the substrate 22 is substantially equal to that of the dielectric material, and there is no substantial difference therebetween in amount of thermal expansion in a stage before initiation of the sintering of the thick-film paste layers 42, 44, namely, in a temperature range in which the burning of the resin component has been completed while the dielectric material powders and conductive powders have a bonding strength that is still small. When the sintering of the thick-film paste layers 42, 44 is initiated, the firing shrinkage of the layers 42, 44 is not impeded by the substrate 22 owing to the above-described function of the particle layer 58. Therefore, the quality of the formed thick film is not practically affected by the thermal expansion of the substrate 22. It is noted that the substrate 22 may be provided by a heat resistant glass having a further high distortion point (for example, Pyrex glass ("Pyrex" is a registered trademark of Corning Incorporated, U.S.) which has a coefficient of thermal expansion of about $32 \times 10^{-7}$(/° C.) and a softening point of about 820(° C.), or a quartz glass having a coefficient of thermal expansion of about $5 \times 10^{-7}$(/° C.) and a softening point of about 1580(° C.)), where the substrate 22 is repeatedly used, or where the heat treatment temperature is considerably high. In this case, too, the thermal expansion amount of the substrate 22 is extremely small in the temperature range in which the dielectric material powders have a small bonding strength. That is, in this case, either, the quality of the formed thick film is not affected by the thermal expansion of the substrate 22.

Referring back to FIG. 3, a peeling step 60 is implemented to peel the formed thick film, i.e., a laminated body consisting of the thick-film dielectric layer 52 and thick-film conductive layer 54, from the substrate 22. Since the particle layer 58 interposed therebetween is constituted by the high-melting-point particles 56 which are merely superposed on each other, the peeling can be easily made without using any chemical and device. In this instance, some of the high-melting-point particles 56 cooperating to have a thickness corresponding to that of one layer might adhere to a bottom surface of the laminated body. The adhering particles are removed by using an adhesive tape or an air blow as needed in a particle removing step 62 following to the peeling step 60. It is noted that the substrate 22 from which the thick film has been peeled is repeatedly used for the similar purpose since the substrate 22 is not easily deformed or deteriorated at the above-described sintering temperature.

A bottom-surface printing step 64 is then implemented to mount the laminated body peeled from the substrate 22, onto a suitable substrate 66 such that the bottom surface (which is provided by the surface of the dielectric layer 52) faces upwardly, and then apply the thick-film conductive paste 40 on the bottom surface (facing upwardly in the same manner as in the formation of the printed conductive layer 44. In this instance, too, the screen 32 having a large aperture area is used so that the side surfaces of the dielectric layer 52 are covered with the paste 40. FIG. 4(f) shows a state in which a printed conductive layer 68 is provided on the dielectric layer 52. A firing step 70 is implemented in substantially the same condition as described above, whereby the above-described thick-film sheet 10 is obtained.

In the present embodiment, after the printed dielectric layer 42 and printed conductive layer 44 have been formed in the predetermined pattern on the film formation surface which is constituted by the peel layer 28 having the melting point higher than the sintering temperature of the thick-film dielectric paste 38 and thick-film conductive paste 40, the printed dielectric layer 42 and printed conductive layer 44 are subjected to the heat treatment at the temperature enabling them to be sintered, whereby the thick-film sheet 10 is formed. The peel layer 28, which is not sintered at the heat treatment temperature, converts into the particle layer 58 constituted by only the high-melting-point particles 56, as a result of burning of the resin. Therefore, the formed thick film is not fixed to the substrate 22, whereby the thick film can be easily peeled from the surface 24 of the substrate 22. This feature leads to a high degree of freedom in designing the pattern of the thick-film sheet 10, and an easy handling of the sheet 10 in the production process. Further, the production can be made with a simple installation.

Further, in the present embodiment, the support body onto which the thick-film pastes 38, 40 are applied is constituted by the substrate 22 and the peel layer 28 formed on the surface of the substrate 22, so that the shape of the support body is maintained even after the heat treatment. This arrangement provides an advantage that the formed thick-film sheet 10 can be handled easier than an arrangement in which the support body is constituted by only the peel layer 28. Further, since the peel layer 28 is interposed between the thick-film paste layers 42, 44 and the substrate 22, the thick-film paste layers 42, 44 are not bound by the substrate 22 during the heat treatment, it is not problematic even if the substrate 22 does not have high degrees of flatness and surface smoothness. For example, if the substrate surface 24 is warped to be concaved downwardly as shown in FIG.

Figure 6:
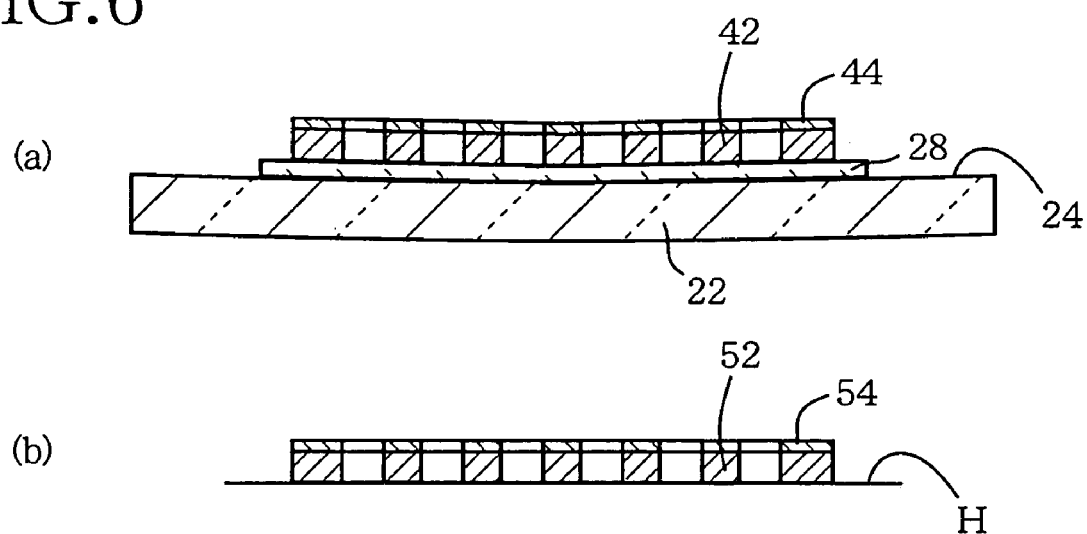
FIGS. 6(a),(b) are views for explaining an influence of warp of the substrate.

6(a), the thick-film paste layers 42, 44 are formed to be warped in conformity to the warped surface 24. However, where the formed thick film (thick-film sheet 10) is thin enough to be flexible even after the firing, the thick-film sheet 10 can be flattened, by putting the sheet 10 onto a flat surface H as shown in FIG. 6(b). Further, where the substrate 22 has a low degree of surface smoothness, it is not problematic since the surface smoothness of the thick-film sheet 10 is influenced by only a surface condition of the peel layer 28 which is in contact with the sheet 10.

Further, in the present embodiment in which the thick-film-paste-layer forming step 36 is implemented to sequentially laminate the thick-film paste layers 42, 44 which are provided by the respective different thick-film materials, in the respective predetermined patterns, the above-described sintering temperature is set to be such a temperature that enables both of the paste layers 42, 44 to be sintered. Thus, the thick-film sheet 10 constituted by the plurality of different materials is easily obtained.

Further, in the present embodiment, since the thick-film paste layers 42, 44 are formed with the thick-film screen printing method, the formation can be made by a simple device without waste of large amount of material, thereby resulting in advantageous reduction in the producing cost.

SECOND EMBODIMENT

Figure 7:
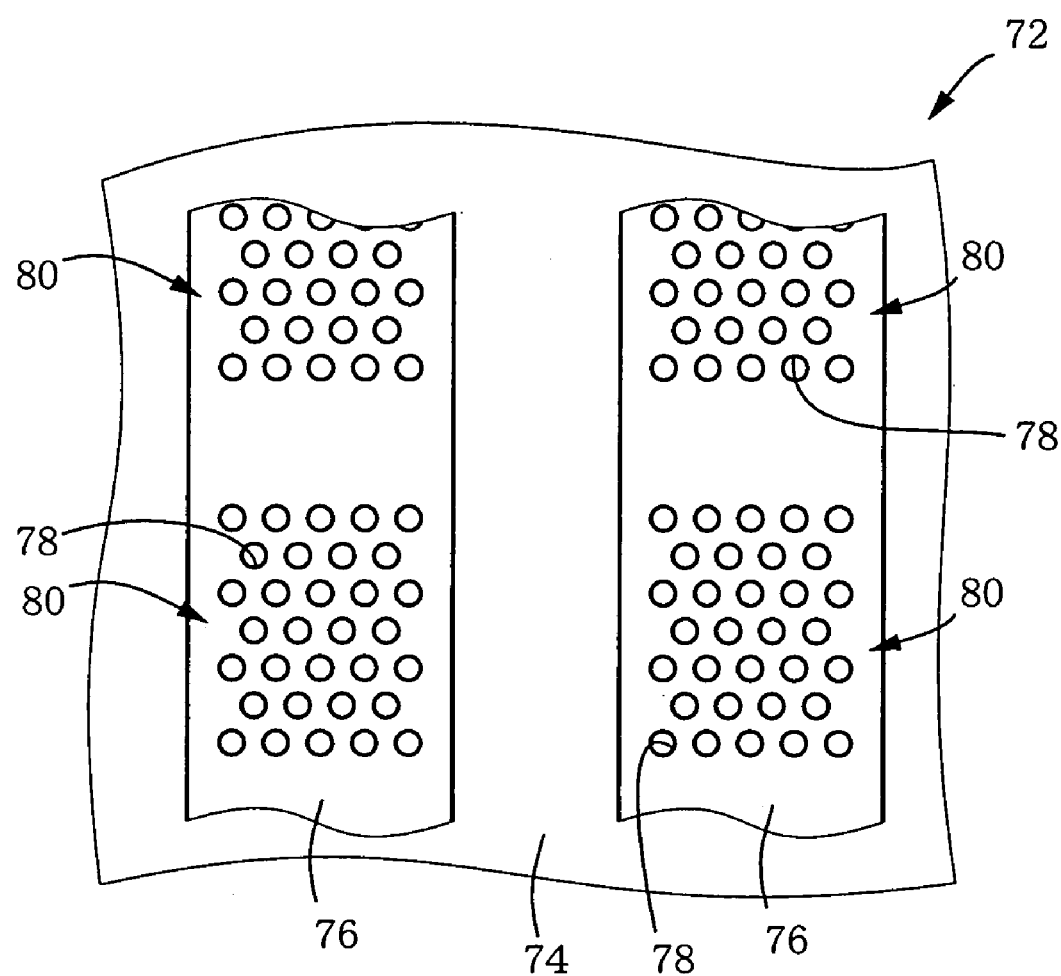
FIG. 7 is a plan view showing a gate electrode of FED according to another embodiment of the first invention.

Next, there will be described other embodiments. FIG. 7 is a plan view showing a main part of a gate electrode 72 which is disposed between emitter and anode of an electric-field-emission-type display device (Field Emission Display: FED). As shown in FIG. 7, the gate electrode 72 is constituted by a thin-plate-like dielectric layer 74, and a plurality of strip-like electrode layers 76 which are disposed on top and bottom surfaces of the dielectric layer 74 such that the electrode layers 76 are parallel with each other and spaced apart from each other at a predetermined spacing interval. The dielectric layer 74 and electrode layers 76 are provided by thick films. The dielectric layer 74 is formed from substantially the same material as the above-described thick-film dielectric layer 52, while each of the electrode layers 76 is formed from substantially the same material as the above-described thick-film conductive layer 54.

Each of the electrode layers 76 is provided by a film or the like which has a substantially constant thickness of about 7–10 ($\mu$m). Each electrode layer 76 has gate hole sections 80 which are arranged to be spaced apart from each other at a constant spacing distance. In each of the gate hole sections 80 of the electrode layer 76, a plurality of openings 78 each having a diameter of about 100 ($\mu$m) are arranged with a high density, and are spaced apart from each other at a constant spacing distance of about 150 ($\mu$m). The electrode layers 76 disposed on the top surface of the dielectric layer 74 are positioned relative to the respective electrode layers 76 disposed on the bottom surface of the dielectric layer 74 such that the openings 78 of each electrode layer 76 disposed on the top surface overlap with, or opposed to the respective openings 78 of the corresponding electrode layer 76 disposed on the bottom surface through the dielectric layer 74. Further, the dielectric layer 74 has a substantially constant thickness about 30 ($\mu$m) or less, and through-holes which are positioned right below the openings 78 and have substantially the same diameter as the openings 78. That is, the openings 78 and the through-holes cooperate to provide through-holes formed through the gate electrode 72 in a thickness direction of the gate electrodes 72. The openings 78 serve to guide and accelerate electrons emitted from the emitter of the FED which is provided by a sheet-like electrode, carbon nanotube or the like, toward the anode disposed on one of opposite sides of the gate electrode 72 which is remote from the emitter. No detailed description as to construction of the FED will be provided, since it is not dispensable for understanding of the present embodiment. It is noted that the gate electrode 72 has, in its entirety, a thickness of about 50 ($\mu$m).

Figure 8:
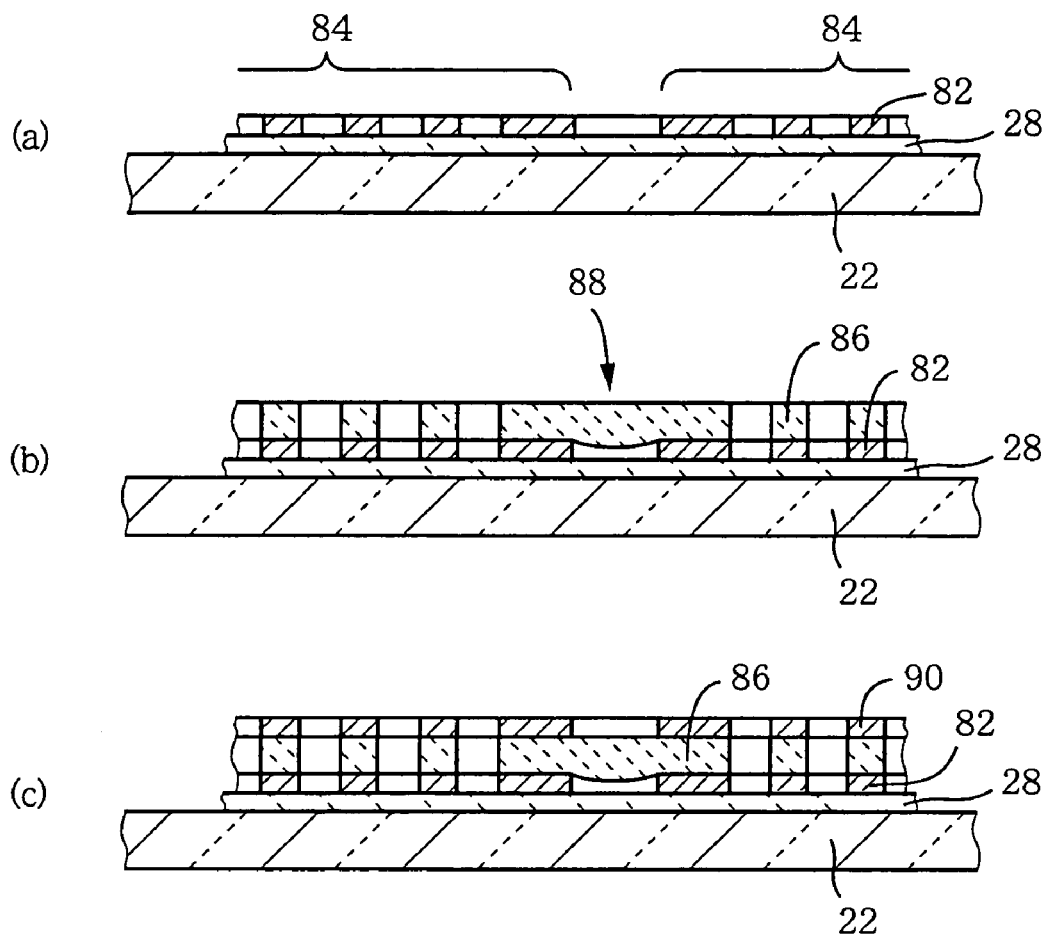
FIGS. 8(a)–(c) are views for explaining states of the thick film in main stages of the production process of the gate electrode of FIG. 7.

The gate electrode 72 is produced as shown in FIGS. 8(a)–(c) which represents cross section states in respective main stages of the production process, namely, in substantially the same method as the above-described thick-film sheet 10. The thick-film-paste-layer forming step 36 is implemented to apply the thick-film conductive paste 40 onto the surface (film formation surface) of the support body provided by the substrate 22 and peel layer 28 which are respectively produced in the above-described substrate preparing step 20 and peel-layer forming step 26, with the screen printing method, so as to form a printed conductive layer 82 in predetermined holed-strip-shaped patterns 84 (see FIG. 7). FIG. 8(a) shows this stage.

Next, the thick-film dielectric paste 38 is applied onto the printed conductive layer 82 with the screen printing method, so as to form a printed dielectric layer 86 in a predetermined pattern. FIG. 8(b) shows this stage. In this instance, the dielectric paste 38 is applied also between the adjacent holed-strip-shaped patterns 84. Thus, the paste 38 flows into a space 88 between the adjacent strip-shaped patterns 84 of the printed conductive layer 82, so that the space is filled with the printed dielectric layer 86, or so that the printed dielectric layer 86 is convexed downwardly, as shown in the figure. On the printed dielectric layer 86, another printed conductive layer 90 is formed by using the screen which is used in the formation of the printed conductive layer 82, whereby the thick-film-paste-layer forming step 36 is completed. The substrate 22 on which the printing operation has been effected is then subjected to drying and sintering treatments, and the laminated body is then peeled from the substrate 22. Thus, the gate electrode 72 is obtained.

The gate electrode 72 can be easily produced as described above, and has a high precision although it has the large number of openings 78 each having the diameter of about 100 ($\mu$m) and arranged with the spacing interval of about 150 ($\mu$m) and the thickness as small as 50 ($\mu$m) in its entirety. Further, since the plurality of strip-like electrode layers 76 are connected with each other through the dielectric layer 74, namely, since the plurality of electrode layers 76 are formed integrally with each other while being electrically independent of each other, the gate electrode 72 is advantageous over a conventional gate electrode which is constituted by only a metallic material and accordingly has to be provided by a plurality of mutually independent thin plates for respective control units, i.e., the respective strip-like electrodes 76, in that the gate electrode 72 can be easily handled and that the electrode layers can be positioned relative to each other and relative to the other components of the gate electrode 72 with high accuracy.

THIRD EMBODIMENT

Figure 9:
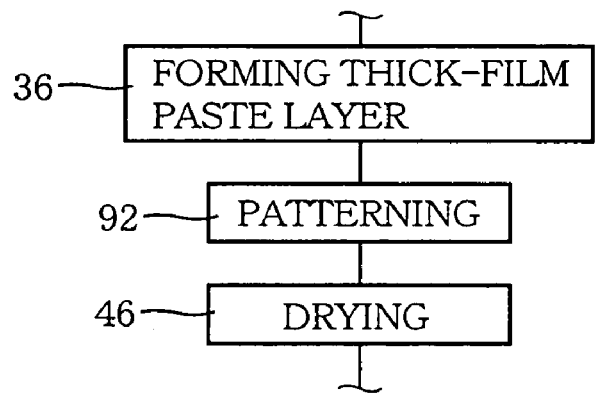
FIG. 9 is a process chart for explaining a producing method according to another embodiment of the third invention.

FIGS. 9 and 10 are a process chart for explaining another example of the method of producing the sheet member of the present invention, and a view illustrating main stages of the producing method, respectively. In the present embodiment, a patterning step 92 is provided between the thick-film-paste-layer forming step 36 and the drying step 46. FIG. 10(a) is a view showing a state after implementation of the thick-film-paste-layer forming step 36. As shown in this figure, a thick-film paste layer 94 is formed in a simple solid form without being particularly patterned. The thick-film paste layer 94 is constituted by a photosensitive resin, and is formed with, for example, a coater, film laminate or the like.

In the subsequent patterning step 92, the thick-film paste layer 94 is subjected to an exposure treatment by using an exposure mask 96 having a predetermined pattern, and is then subjected to a washing or other processing. FIG. 10(b) shows a state during the exposure treatment. The reference sign 98 denotes an exposure lamp in the figure. FIG. 10(c) shows a state after the processing or patterning. Then, the drying step 40 and other steps following to the drying step 40 are implemented, whereby a sheet member which is substantially the same as the thick-film sheet 10 is obtained. Thus, the present invention is applicable also to such a method in which the patterning is effected independently of the application of the thick-film paste.

FOURTH EMBODIMENT

Figure 11:
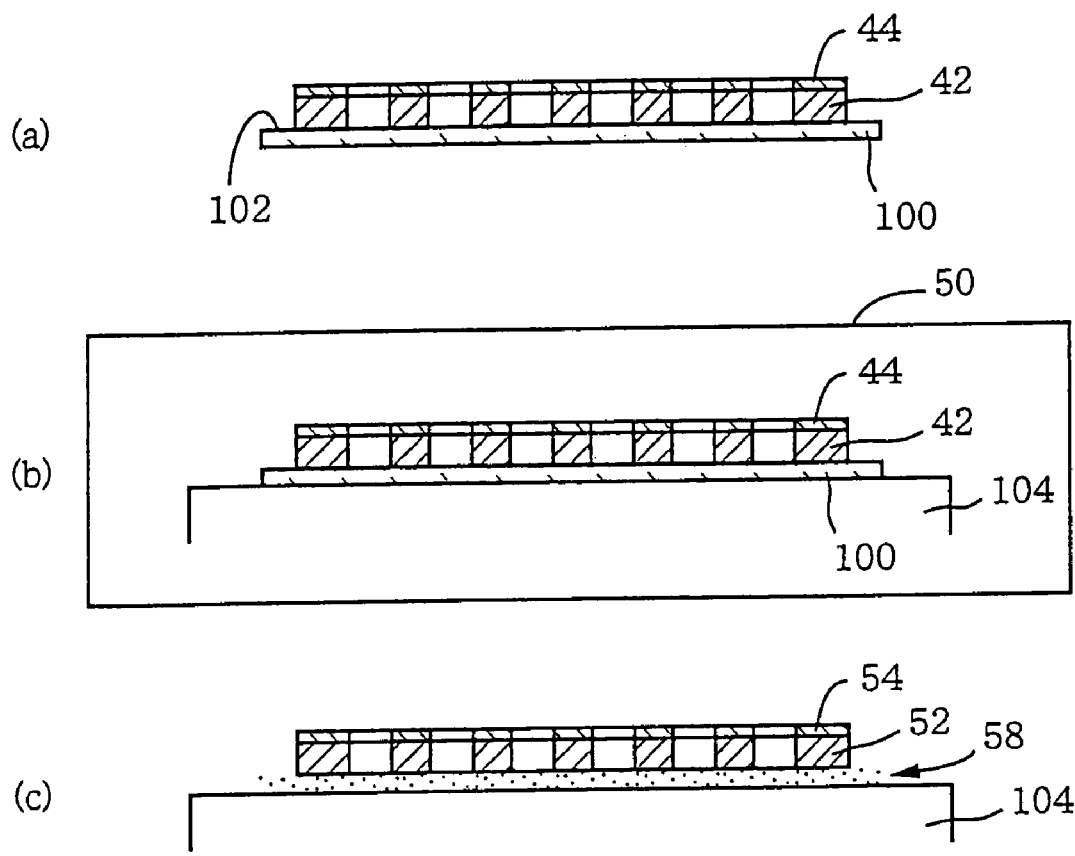
FIGS. 11(a)–(c) are views for explaining states of the thick film in main stages of a production process according to still another embodiment of the third invention.
Figure 12:
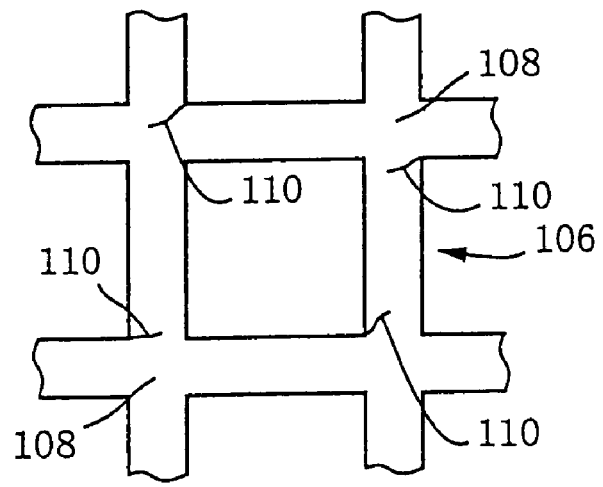
FIG. 12 is a view for explaining a problem encountered in a conventional thick film.

FIGS. 11(a)–(c), corresponding to FIGS. 4(c)–(e), are views for explaining a case where a raw ceramic sheet 100 is used as the support body. In the present embodiment, the printed dielectric layer 42 and printed conductive layer 44 are formed by applying the thick-film paste onto a surface 102 of the raw ceramic sheet 100. The raw ceramic sheet 100 on which the printed layers 42, 44 are disposed is introduced into the furnace chamber 50, so that the raw ceramic sheet 100 is subjected to a firing treatment while being mounted on a setter 104. As a result of the firing treatment, the thick-film sheet (the thick-film dielectric layer 52 and thick-film conductive layer 54) is mounted on the setter 104 with the particle layer 58 being interposed between the thick-film sheet and the setter 104. As long as there is no particular problem as to the surface state and reactivity of the setter 104, the thick-film sheet 10 can be thus produced. Needless to say, it is also possible to fire the raw ceramic sheet 100 by mounting the ceramic sheet 100 on the substrate 22 or the like.

In the above-described first through fourth embodiments, the present invention is applied to the methods of producing the thick-film sheet 10 and the gate electrode 72 of the FED each of which is used in place of a metallic sheet. However, the first through third inventions are applicable for other various purposes or cases in which the thick-film sheet member is useful, for example, for productions of various kinds of display device components (e.g., spacer, rib (partition wall), color filter, electrode, and grid), gate electrode of flat CRT, high dielectric sheet of inorganic EL, and various kinds of filters (e.g., ozone generator, oxygen separator and deodorizer).

FIFTH EMBODIMENT

Figure 13:
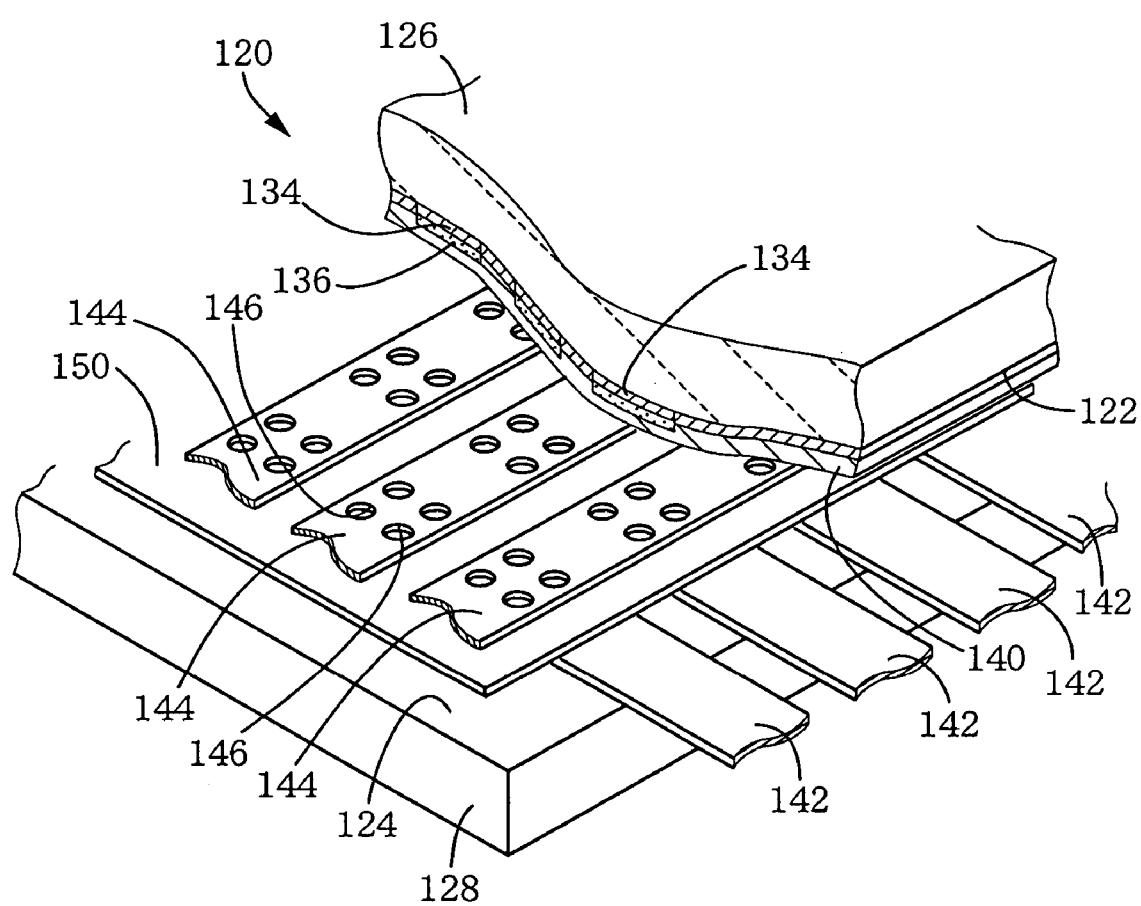
FIG. 13 is a perspective view partially in cross section of FED which is one example of a cold-cathode display device according to a fourth invention.

FIG. 13 is a perspective view partially in cross section of a FED 120 which is one example of a cold-cathode display device of a fourth invention. The FED 120 is produced with a production process to which a producing method of a fifth invention is applied. The FED 120 is equipped with front and back face plates 126, 128 which are substantially identical with each other in size and shape and which are disposed in parallel with each other with a predetermined spacing distance therebetween such that their respective substantially flat surfaces 122, 124 are opposed to each other. The front and back face plates 126, 128 are gas-tightly sealed at their respective peripheral portions, whereby a gastight space is formed in their inside. This gastight space is adapted to be evacuated have a reduced pressure of about $6.7 \times 10^{-5}$ (Pa) [$5 \times 10^{-7}$ (Torr)]. In the present embodiment, the back face plate 128 corresponds to a first substrate while the front face plate 126 corresponds to a second substrate.

Each of the front and back face plates 126, 128 is provided by a translucent substrate which is constituted by, for example, soda lime glass, high-distortion-point glass or the like having a softening point of about 600 (° C.), and has an outside dimension of about 800×500 (mm) and a substantially constant thickness of about 3 (mm). The spacing distance between the plates 126, 128 is set to be about 1–2 (mm).

On the surface 122 (opposed to the back face plate 128) of the front face plate 126, there are disposed a plurality of stripe-like transparent anodes 134. Each of the stripe-like transparent anodes 134 is formed from ITO (indium tin oxide) or the like, and extends along a predetermined direction. On surfaces of the respective anodes 134, fluorescent layers 136, each adapted to emit a light having one of three colors, i.e., R (red), G (green) and B (blue), are disposed, such that R, G and B are repeatedly arranged in this order as viewed in a direction perpendicular to the above-described predetermined direction. Each of the fluorescent layers 136 is divided into mutually independent sections which are arranged in a longitudinal direction of the anodes 134, i.e., in the above-described predetermined direction such that each section corresponds to a unit of the light emission. However, each fluorescent layer 136 does not have to be necessarily divided into the sections, but may be formed to have a stripe-like shape so as to continuously extend along the corresponding anode 134. Each anode 134 is formed by sputtering or other thin-film forming method, so as to have a thickness of about 1 (μm) and a relatively high degree of electric conductivity with a sheet resistivity of about 10 ($\Omega/\square$) or less. Each fluorescent layer 136 is constituted by material such as ZnO:Zn, ZnS:Ag+In$_2$O$_3$ which emits a visible light through an electron beam, and is formed by a thick-film screen printing method or the like to have a thickness of about 10–20 (μm) whereby the fluorescent layer 136 is given a certain degree of electric conductivity corresponding to an area resistivity of about 500 ($\Omega/cm^2$) or less.

Figure 14:
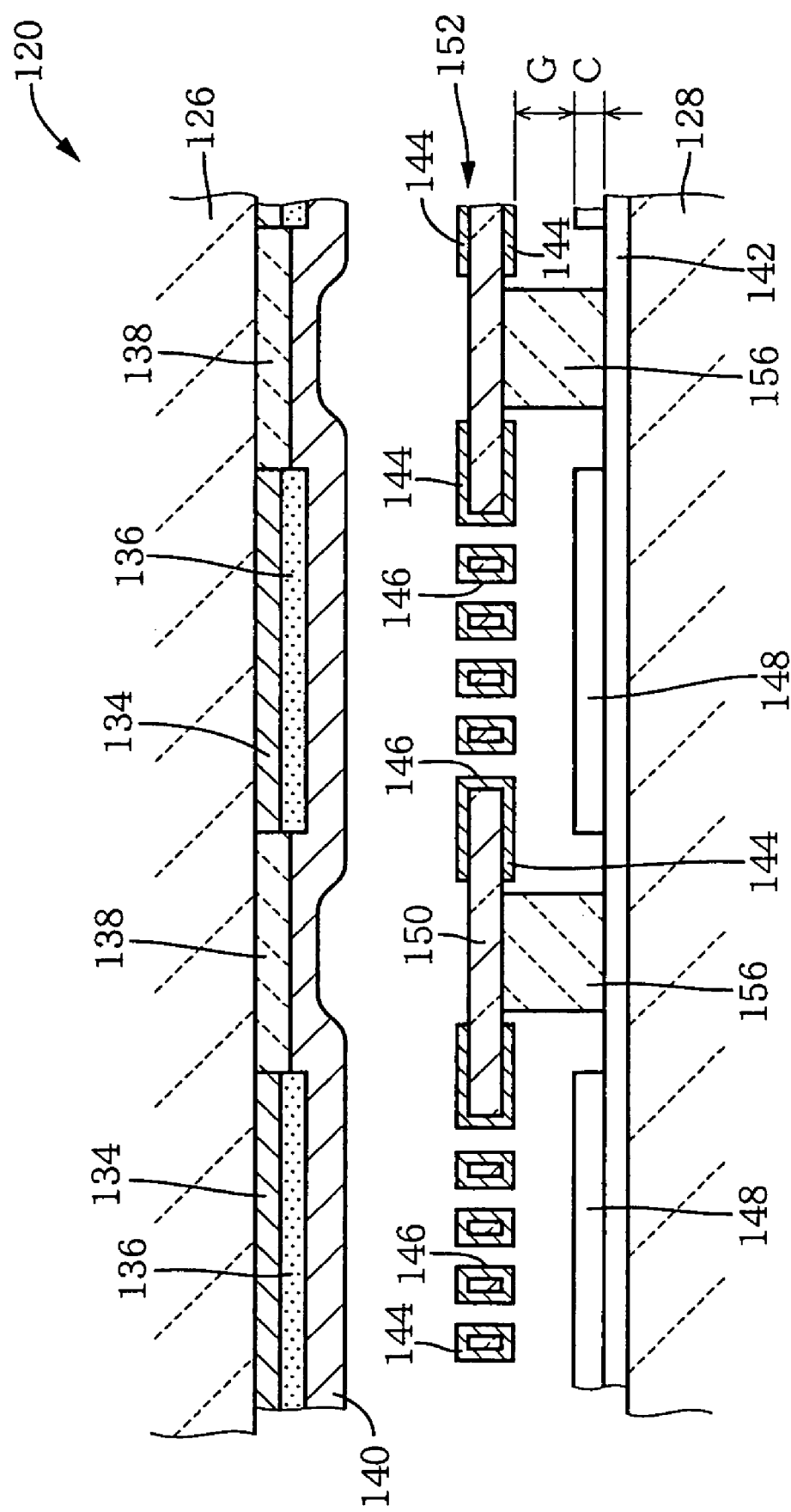
FIG. 14 is a view for explaining in detail a cross section of the FED of FIG. 13.

FIG. 14 is a view showing in enlargement a cross section of the FED 12. A black matrix (black mask) 138, which consists of a glass including black pigment, is provided in portions of the surface 122 of the front face plate 126 in which portions the fluorescent layers 136 are not disposed, such that the black matrix 138 has a thickness of about 15–20 (μm). The fluorescent layers 136 and the black matrix 138, cooperating to cover the entirety of the surface 122 of the front face plate 126, are covered at their surfaces with a metal back 140 which is formed to profile surface contours of the fluorescent layers 136 and the black matrix 138 and have a thickness of about 100–200 (μm). The black matrix 138 is formed, by a thick-film screen printing method or the like, in a lattice so as to bridge each adjacent pair of the fluorescent layers 136 which are arranged in a matrix. Where the fluorescent layers 136 are formed to have stripe-like shapes, the black matrix 138 is replaced by a black mask which consists of a plurality of stripe-like portions. In this case, the stripe-like-shaped fluorescent layers 136 and the plurality of stripe-like portions of the black mask are alternately arranged. The metal back 140 is formed, for example, by deposition of aluminum thin film, and has a relatively smooth surface and such a thickness that enables electrons to be easily transmitted therethrough.

As show in FIGS. 13 and 14, on the surface 124 (opposed to the front face plate 126) of the back face plate 128, there are disposed a plurality of cathode and gate electrodes 142, 144, such that the cathode electrodes 142 and the gate electrodes 144 perpendicularly intersect with each other and are electrically insulated from each other. Each of the gate electrodes 144 has, in its portions in which the gate electrode 144 intersect with the cathode electrodes 142, a plurality of electron passing-through holes (gate holes) 146 which pass therethrough in its thickness direction. Each of the electron passing-through holes 146 has an opening diameter which is determined based on a trade-off relationship between an electron emission effect and an emission area (open area ratio), and which is set to be about 100 (μm) where a dot size of the holes 146 is about 3 (mm). Emitters (cold cathodes) 148 are disposed on respective portions of each cathode electrode 142 which correspond to the electron passing-through holes 146.

Each cathode electrode 142 is made of gold (Au), thick-film silver or other conductive material which is formed by a thin film processing such as sputtering or a thick film processing such as printing, while each gate electrode 144 is made of thick-film silver or other thick-film conductive material. Each emitter 148 is provided by a mass of a multiplicity of nanotubes (CNT) which are oriented toward the gate electrodes 144, and has a thickness C of about 20 (μm). A distance G between the emitters 148 and gate electrodes 144 is about 27–30 (μm). It is noted that each emitter 148 may be provided by also a so-called "Spindt-type" cone-shaped cold cathode made of molybdenum (Mo) and having a height of about 1 (μm).

The gate electrodes 144, made of the thick-film conductive material, are provided by holed-strip-like thick films formed on opposite side surfaces of a thin-plate-like dielectric layer 150 which has a thickness of about 20–50 (μm) and a size of about 320×430 (mm). The holed-strip-like thick films providing the gate electrodes 144 are positioned in the same positions of the opposite side surfaces of the layer 150, and have a constant thickness of about 7–10 (μm) and are arranged in parallel with each other with a predetermined spacing distance therebetween. The dielectric layer 150 is made of a thick-film dielectric material which is a mixture of PbO—$B_2O_3$—$SiO_2$—$Al_2O_3$—$TiO_2$ based low-softening-point glass of and ceramic filler such as alumina, and has substantially the same coefficient of thermal expansion as the soda lime glass which constitutes the back face plate 128. That is, in the present embodiment, the FED 120 is provided with a sheet member 152 which is constituted by the thick-film dielectric layer 150 and thick-film conductive layers fixedly laminated on the surface of the dielectric layer 150 and which has a thickness of about 50 (μm), while the gate electrodes 144 are provided by the laminated thick-film conductive layers.

Figure 15:
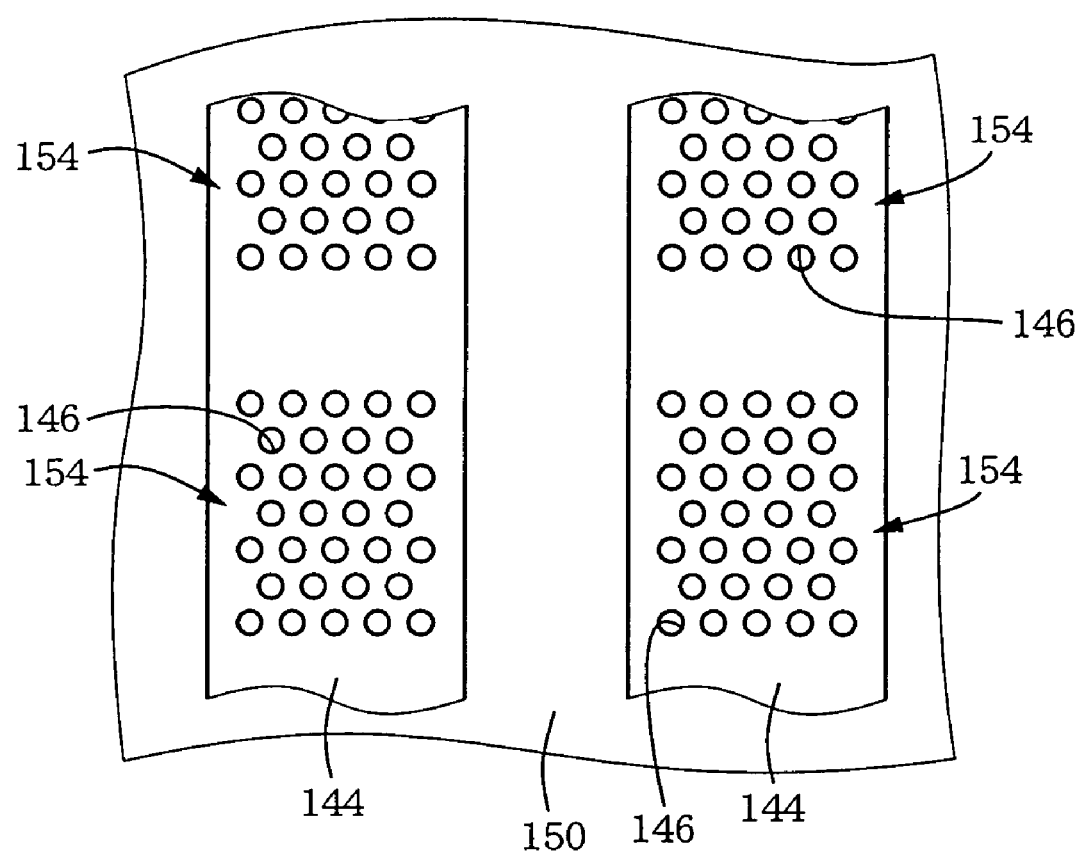
FIG. 15 is a plan view showing a sheet member provided in the FED of FIG. 13.

FIG. 15 is a plan view showing in enlargement a part of the sheet member 152. The dielectric layer 150 is provided by a rectangular thin plate in which the electron passing-through holes 146 are formed in respective positions as shown in the figure, i.e., in the same positions as in the gate electrodes 144. The plurality of gate electrodes 144 are disposed on the dielectric layer 150 such that the gate electrodes 144 are electrically insulated from each other. Each of the gate electrodes 144 has opening sections 154 which are spaced apart from each other in a longitudinal direction of the gate electrode 144 and which are positioned in the intersections of the gate electrode 144 with the respective cathode electrodes 142. In each of the opening sections 154 of the gate electrode 144, the electron passing-through holes 146 are positioned with a high density. Although only four electron passing-through holes 146 appear in each of the intersections in FIG. 13, a number of the holes 146 positioned in each intersection is actually as large as shown in FIG. 15 or even larger. A spacing distance between the holes 146 is adapted to be about 150 (μm). It is noted that the gate electrodes 144 which are disposed on the opposite surfaces of the dielectric layer 150 are connected to each other via the thick-film conductive layer which is disposed also on an inner wall surface of each of the passing-through holes 146. Thus, only the gate electrodes 144, which are disposed on one of the opposite surfaces of the layer 150 close to the anodes 134, are directly connected to an external circuit (not shown). That is, in the present embodiment, a portion of the thick-film conductive layer close to the emitters 148 functions as the gate electrode for controlling the electrons, while a portion of the thick-film conductive layer close to the anodes 134 functions as a wire. The dielectric layer 150 is supported, at its portions at which the gate electrodes 144 are not fixed, by spacers 156, so that the gate electrodes 144 are positioned in a predetermined height position distant from the emitters 148. Each of the spacers 156 has a thickness of about 20–50 (μm).

As described above, in the present embodiment, the plurality of gate electrodes 144 are respectively provided by the plurality of thick-film conductive layers of the sheet member 152. Since the sheet member 152 is constituted by the dielectric layer 150 and the gate electrodes 144 which are disposed on the surfaces of the dielectric layer 150, the sheet member 152 has a high mechanical property based on the dielectric layer 150. Thus, the sheet member 152 is given a sufficiently high mechanical strength, even if its thickness or the thickness of the gate electrodes 144 is adapted to be extremely small. Therefore, as compared with a case where the gate electrodes 144 are provided by sheet metals, the gate electrodes 144 of the sheet member 152 are less likely to be damaged, even if the thickness is reduced. Further, since the plurality of gate electrodes 144 are formed integrally with the dielectric layer 150, the gate electrodes 144 can be positioned relative to each other with a higher accuracy, than where the gate electrodes are provided by respective conductive bodies which are independent of each other.

When predetermined amounts of voltages as a signal voltage and a scan voltage are respectively applied to the cathode electrodes 142 and the gate electrodes 144, electrons are emitted from the emitters 148 as a result of field emission caused based on a large voltage gradient between the cathode electrodes 142 and the gate electrodes 144. With a predetermined amount of positive voltage being applied to the anodes 134 which are disposed on the front face plate 126, the electrons are driven to fly toward the anodes 134 through the electron passing-through holes 146. The electrons then strike the fluorescent layers 136 disposed on the anodes 134, so that the stricken fluorescent layers 136 emit light. In this instance, the electrons, which are emitted from the emitters 148 and attracted by the anodes 134, pass through the metal back 140 and then strike fluorescent bodies of the fluorescent layers 136. Although the fluorescent layers 136 are covered with the metal back 140, the metal back 140 is provided by the thin film formed by the deposition and having such a thickness that enables the electrons to be easily transmitted therethrough, as described above. The light generated in the fluorescent layers 136 advances in a direction toward the back face plate 128 as well as in a direction toward the front face plate 126. The light advancing in the direction toward the back face plate 128 is reflected by the metal back 140, so as to advance in the opposite direction, i.e., in the direction toward the front face plate 126. Thus, almost all the emitted light is transmitted through the front face plate 126 so as to be ejected through the front face plate 126, thereby making it possible to increase the emission efficiency. The light emission of the fluorescent layers 138 is not observed from the side of the back face plate 128. The FED 120 thus constitutes a so-called transmission-type display device in which the light transmitted through the fluorescent layers 136 is observed from the side of the front face plate 126.

Figure 16:
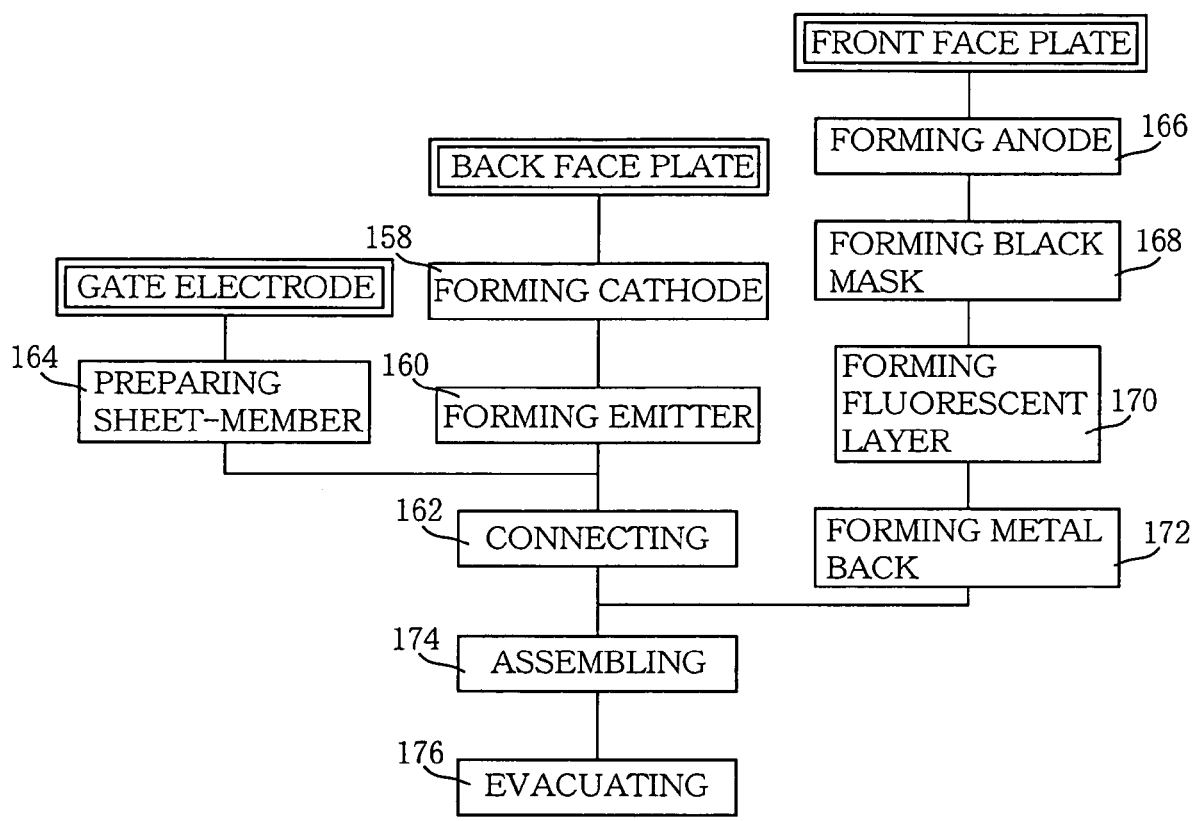
FIG. 16 is a process chart for explaining a producing method according to one embodiment of a fifth invention, which is for producing the FED of FIG. 13.

The above-described FED 120 is produced by assembling the gate electrodes 144, the back face plate 128 and the front face plate 126, which are processed (or produced) independently of each other in accordance with a process chart shown in FIG. 16. In a process of producing the back face plate 128, a cathode forming step 158 is first implemented to form a conductive film constituted by gold or the like with, for example, a sputtering method and then subject the formed conductive film to a patterning operation, so as to provide the above-described cathode electrodes 142 on the surface 124 of the back face plate 128. In the subsequent emitter forming step 160, the plurality of emitters 148 each consisting of the separately produced CNT are fixed to predetermined portions of each cathode electrode 142 (the intersections of each cathode electrode 142 with the respective gate electrodes 144), by using conductive adhesive or the like. In a connecting step 162, the above-described sheet member 152, which is prepared in a sheet-member preparing step 164 of a process of producing the gate electrodes 144, is superposed on the back face plate 128 through the spacers 156, and the sheet member 152 is connected to the back face plate 128 through the spacers 156 by using glass frit or the like.

On the other hand, in a process of producing the front face plate 126, an anode forming step 166 is implemented to form the anodes 134 made of the ITO, on the surface 122 of the plate 126 by a thin-film forming method such as sputtering. A black mask forming step 168 is then implemented to print an insulated glass paste including black pigments, onto the surface 122 by a thick-film printing method or the like, and then subject the printed glass paste to a firing treatment at a temperature of about 450(° C.), whereby the above-described black mask 138 is formed. In the subsequent fluorescent-layer forming step 170, one of three kinds of fluorescent pastes corresponding to the three colors R, G and B is applied to each of sections defined by the lattice of the black mask 138 such that the three kinds of fluorescent pastes are disposed on the assigned sections. The thus applied fluorescent pastes are then subjected to a firing treatment at a temperature of about 450(° C.), whereby the fluorescent layers 136 are formed. A metal-back forming step 172 is then implemented to form the metal back 140 covering the surfaces of the fluorescent layers 136 and the black matrix 138, by deposition of aluminum thin film onto the surfaces, with some preliminary treatments as needed.

In the subsequent assembling step 172, the back face plate 128 and front face plate 126, which have being processed as described above, are superposed on each other through a spacer which has been separately prepared, such that their surfaces 124, 122 are opposed to each other, and then subjected to a heat treatment, so that the plates 128, 126 are gas-tightly connected through a sealer such as seal glass which is applied to the spacer or the surfaces 122, 124. An evacuating step 176 is then implemented to evacuate a gas from a gas-tight space through an evacuation hole (not shown), whereby the FED 120 shown in FIG. 1 is obtained.

Figure 17:
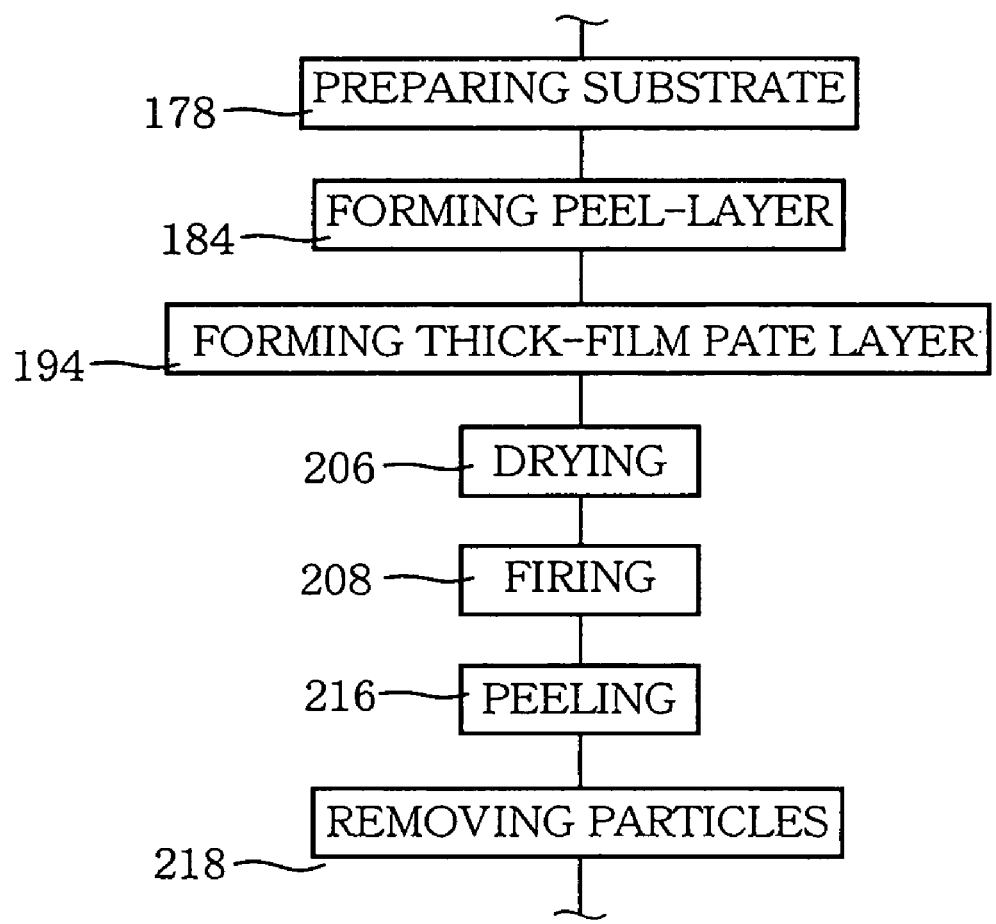
FIG. 17 is a process chart for explaining a producing method of producing a thick-film sheet of FIG. 15.

In the above-described producing process, the sheet-member preparing step 164 is implemented in accordance with a process shown in FIG. 17 to which a well-known thick-film printing technique is applied. There will be described a method of producing the sheet member 152, with reference to FIGS. 18(a)–(e) and FIGS. 19(f)–(g) which represent states in main stages of the production process.

The process is initiated with a substrate-preparing step 178 implemented to prepare a substrate 180 (see FIG. 18) which is to be subjected to a thick-film printing, and then effect a suitable cleaning treatment on a surface 182 of the substrate 180. This substrate 180 is provided by a member which does not suffer from considerable deformation and deterioration in a heat treatment which is described below. For example, it is preferable to use, as this substrate 180, a glass substrate or the like such as soda lime glass which has a coefficient of thermal expansion of about $87 \times 10^{-7}$(/° C.), a softening point of about 740(° C.) and a distortion point of about 510(° C.). It is noted that the substrate 180 has a thickness of about 2.8 (mm) and that its surface 182 has a size of 400×450 (mm) that is sufficiently larger than the above-described sheet member 152.

A peel-layer forming step 184 is then implemented to dispose a peel layer 186 constituted by high-melting-point particles which are bonded together with a resin, on the surface 182 of the substrate 180 such that the peel layer 186 has a thickness of about 5–50 (µm). The high-melting-point particles are provided by a mixture of high-softening-point glass frit whose average particle size is about 0.5–3 (µm) and ceramic filler such as alumina and zirconia whose average particle size is about 0.01–5 (µm). The high-softening-point glass has a softening point of about 550(° C.) or higher. The high-melting-point particles consisting of the mixture has a softening point of about 550(° C.) or higher. The resin is provided by ethyl cellulose resin or the like which is burnt at about 350(° C.). The peel layer 186 is disposed on the surface 182 of the substrate 180, for example, by applying an inorganic material paste 188 which is constituted by the above-described high-melting-point particles and resin which are dispersed in an organic solvent such as butyl carbitol acetate (BCA), onto substantially the entire surface of the substrate 180 with a screen printing method as shown in FIG. 18(a), and then drying the applied paste 188 at a room temperature. However, the peel layer 186 may be disposed on the surface 182 of the substrate 180, by sticking a coater or film laminate onto the surface of the substrate 180. FIG. 18(b) shows a stage in which the peel layer 186 is formed as described above. It is noted that reference signs 190 and 192 denote a screen and a squeegee, respectively, in FIG. 18(a). In the present embodiment, the substrate 180 provided with the peel layer 186 corresponds to a support body. A surface of the peel layer 186 corresponds to a film formation surface. The substrate preparing step 178 and peel layer forming step 184 correspond to a support-body preparing step.

A thick-film-paste-layer forming step 194 is then implemented to sequentially apply a thick-film conductive paste 196 forming the above-described gate electrodes 144 and a thick-film dielectric paste 198 forming the above-described dielectric layer 150, in predetermined patterns on the peel layer 186, in the same manner as the application of the inorganic material paste 188, namely, with the screen printing method (see FIG. 18(a)). In this instance, each of the thick-film conductive paste 196 and the thick-film dielectric paste 198 is applied to have such a thickness that provides the above-described thickness after the firing shrinkage, by using the screen 190 having an aperture pattern corresponding to the configuration of the gate electrodes 144 or the dielectric layer 150 as shown in FIG. 15. That is, the thick-film conductive paste 196 is applied in a holed-strip-shaped pattern which defines holes and divides the applied paste into a plurality of strip-like shaped sections, while the thick-film dielectric paste 198 is applied in a continuous pattern which defines holes without dividing the applied paste into sections. FIGS. 18(c)–(e) are views showing stages in which a printed conductive layer 200, printed dielectric layer 202 and printed conductive layer 204 are formed by the application of the thick-film conductive paste 196, application of the thick-film dielectric paste 198 and application of the thick-film conductive paste 196, respectively, which are made in this order. It is noted that the formation of the printed conductive layer 204 is made by using the screen 190 having an aperture pattern diameter made larger than that of the screen 190 used in the formation of the printed conductive layer 200, so that the applied conductive paste 196 flows down along an inner wall surface of each electron passing-through hole 146, whereby the conductive layer is formed also on the inner wall surface of each hole 146. In FIG. 18(e), the paste within each electron passing-through hole 146 is not illustrated. In the present embodiment, the thick-film-paste-layer forming step 194 is provided by a printed conductive layer forming step implemented two times, and a printed dielectric layer forming step implemented one time. The thick-film dielectric paste 198 is constituted by dielectric material powders such as alumina and zirconia, glass frit and resin which are dispersed in an organic solvent. The thick-film conductive paste 196 is constituted by conductive material powders such as silver powders, glass frit and resin which are dispersed in an organic solvent. As the glass frit, for example, a PbO—$B_2O_3$—$SiO_2$—$Al_2O_3$—$TiO_2$ based low-softening-point glass or the like is used. As the resin and solvent, for example, material similar to the inorganic material paste 188 is used.

Figure 18:
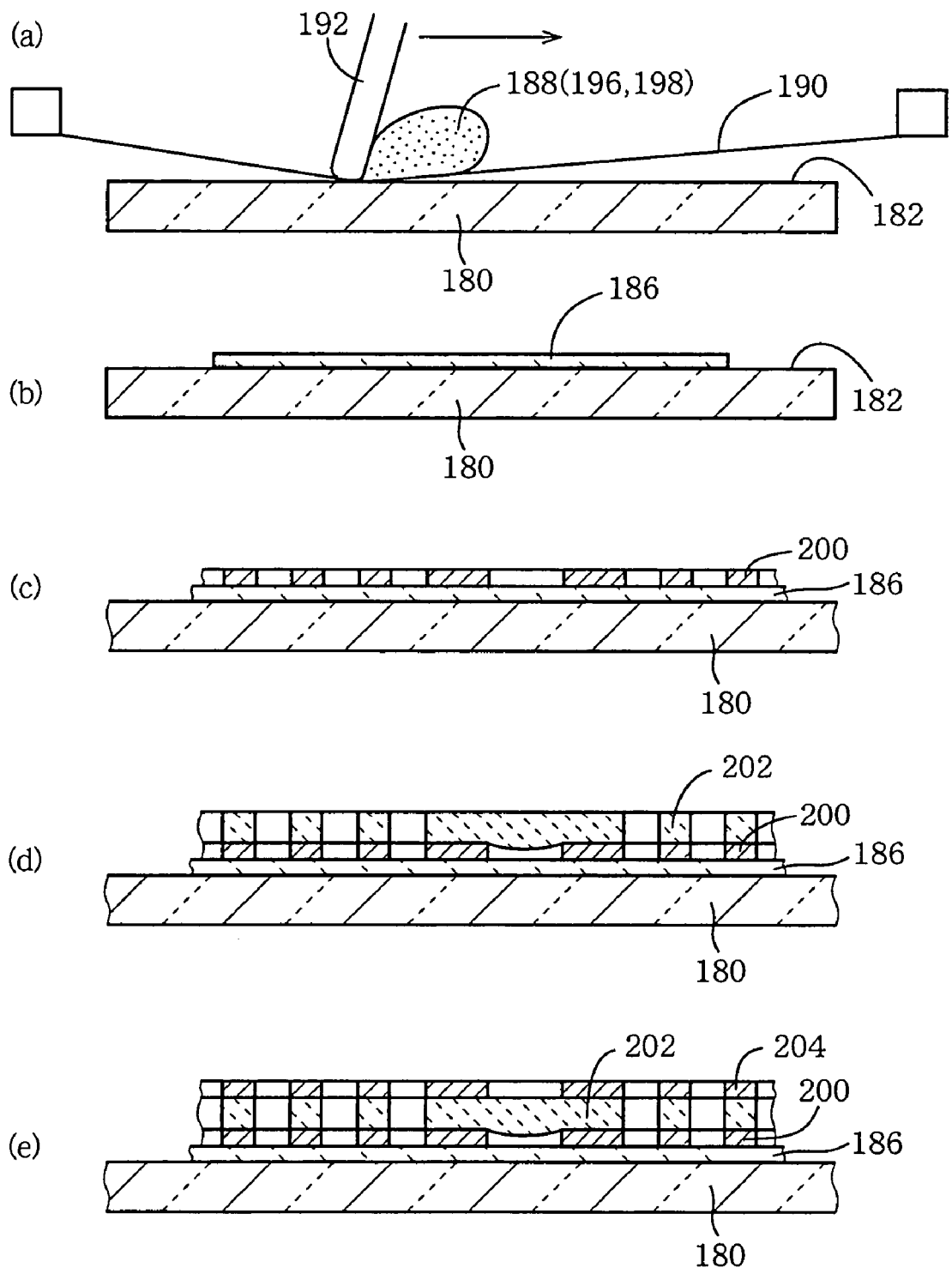
FIGS. 18(a)–(e) are views showing states of substrate and thick film in main stages of the production process of FIG. 17.
Figure 19:
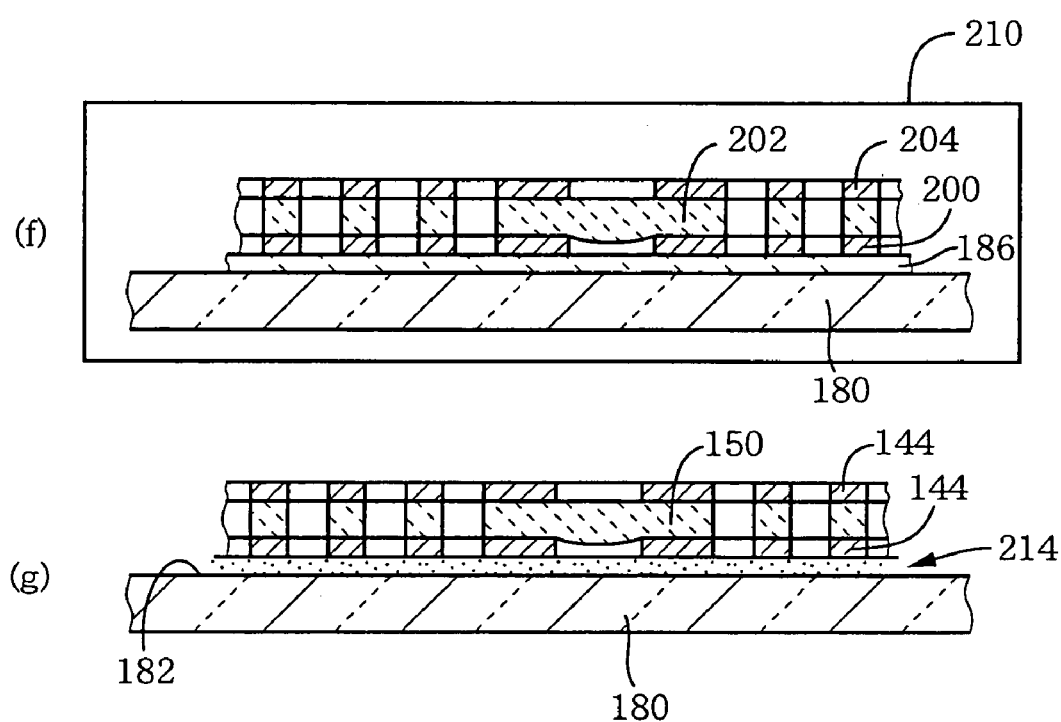
FIGS. 19(f)–(g) are views following to FIGS. 18(a)–(e), and showing states of the substrate and thick film in main stages of the production process of FIG. 17.

Since the thick-film dielectric paste 198 is applied also to the portions in which the thick-film conductive paste 196 is not applied, as described above, the paste 198 flows into a space between the adjacent strip patterns of the printed conductive layer 200, so that the space is filled with the printed dielectric layer 202, or so that the printed dielectric layer 202 is convexed downwardly owing to a surface tension which keeps a lower surface of the paste 198 to be separated from the surface of the peel layer 186. FIGS. 18 and 19 show the latter case.

After the printed thick-film layers 200–204 have been formed as described above, a drying step 206 is implemented to dry the layers so as to remove the solvent. The drying step 206 is followed by a firing step 208 in which the substrate 180 is disposed in a furnace chamber 210 so that the substrate 180 is subjected to a heat treatment which is carried out at a firing temperature of about 550(° C.) that is suitable for kinds of the thick-film conductive paste 196 and thick-film dielectric paste 198. FIG. 19(f) shows a state in a process of the heat treatment.

In the process of the heat treatment, the resin component of each of the printed thick-film layers 200–204 is burnt, while the dielectric material, conductive material and glass frit are sintered since the sintering temperature is about 550(° C.), so that the dielectric layer 150 and the thick-film conductive layer (gate electrodes 144), i.e., the sheet member 152 is formed. FIG. 19(g) shows this state. In this instance, since the inorganic component particles of the peel layer 186 have the softening point of 550(° C.) or higher, the high-melting-point particles (glass powders and ceramic filler) are not sintered while the resin component is burnt in the peel layer 186. Therefore, after the burning of the resin component as a result of progress of the heat treatment, the peel layer 186 converts into a particle layer 214 consisting of only the high-melting-point particles 212 (see FIG. 20).

Figure 20:
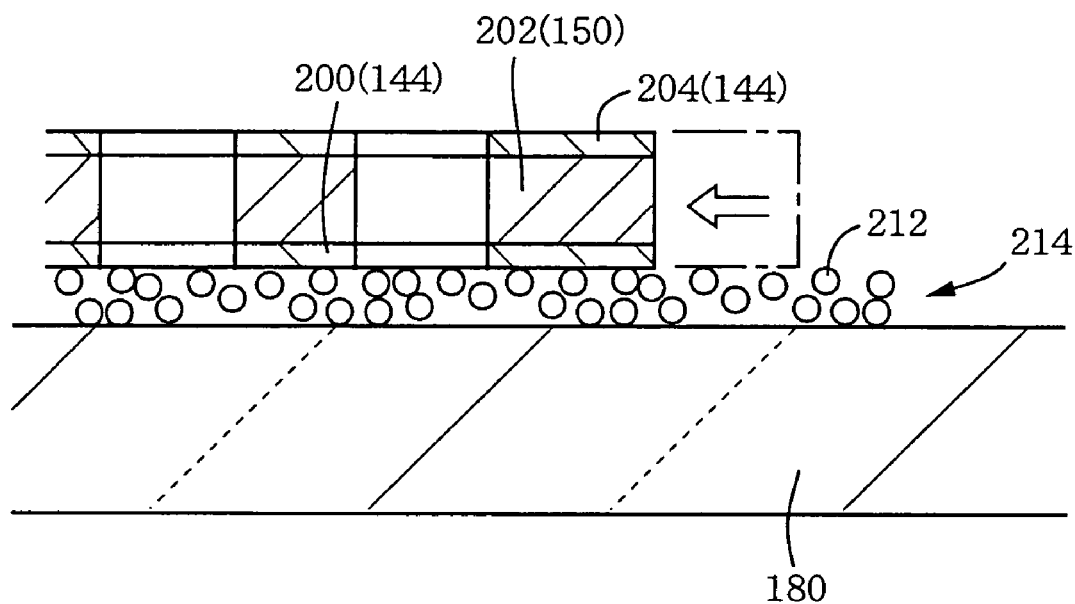
FIG. 20 is a view showing in enlargement a part of FIG. 19(g), for explaining a shrinkage behavior in a firing step of FIG. 17.

FIG. 20 is an enlarged view of a part of a right end of FIG. 19(e), schematically showing a state in progress of the sintering in the above-described heat treatment. The particle layer 214, which has been formed as a result of burning of the resin component of the peel layer 186, is a layer constituted by the high-melting-point particles 212 which are merely superposed on each other and which are not bound to each other. Therefore, when the printed thick-film layers 200–204 shrink as indicated in FIG. 20 in which their end portions before the sintering are represented by one-dot chain line, the high-melting-point particles 212 function as rollers. Owing to the roller function of the particles 212, between a lower portion of a set of the printed thick-film layers 200–204 and the substrate 180, there is not generated a force impeding the shrinkage of the layers 200–204. Thus, the lower and upper portions of the set of the layers 202–204 equally shrink, so that the set of the layers 200–204 is free from density variation and warp arising from difference in the shrinkage amount.

In the present embodiment, the coefficient of thermal expansion of the substrate 180 is substantially equal to that of the dielectric material, and there is no substantial difference therebetween in amount of thermal expansion in a stage before initiation of the sintering of the printed thick-film layers 200–204, namely, in a temperature range in which the burning of the resin component has been completed while the dielectric material powders and conductive powders have a bonding strength that is still small. When the sintering of the printed thick-film layers 200–204 is initiated, the firing shrinkage of the layers 200–204 is not impeded by the substrate 180 owing to the above-described function of the particle layer 214. Therefore, the quality of the formed thick film is not practically affected by the thermal expansion of the substrate 180. It is noted that the substrate 180 may be provided by a heat resistant glass having a further high distortion point (for example, Pyrex glass ("Pyrex" is a registered trademark of Corning Incorporated, U.S.) which has a coefficient of thermal expansion of about $32 \times 10^{-7}$(/° C.) and a softening point of about 820(° C.), or a quartz glass having a coefficient of thermal expansion of about $5 \times 10^{-7}$(/° C.) and a softening point of about 1580(° C.)), where the substrate 180 is repeatedly used, or where the heat treatment temperature is considerably high. In this case, too, the thermal expansion amount of the substrate 180 is extremely small in the temperature range in which the dielectric material powders have a small bonding strength. That is, in this case, either, the quality of the formed thick film is not affected by the thermal expansion of the substrate 180.

Referring back to FIG. 17, a peeling step 216 is implemented to peel the formed thick film, i.e., a laminated body consisting of the dielectric layer 150 and gate electrodes 144, from the substrate 180. Since the particle layer 214 interposed therebetween is constituted by the high-melting-point particles 212 which are merely superposed on each other, the peeling can be easily made without using any chemical and device. In this instance, some of the high-melting-point particles 212 cooperating to have a thickness corresponding to that of one layer might adhere to a bottom surface of the laminated body. The adhering particles are removed by using an adhesive tape or an air blow as needed in a particle removing step 218 following to the peeling step 216. It is noted that the substrate 180 from which the thick film has been peeled is repeatedly used for the similar purpose since the substrate 180 is not easily deformed or deteriorated at the above-described sintering temperature.

In the present embodiment in which the FED 120 is produced by fixing the back face plate 128 and the front face plate 126 which are superposed on each other, the sheet member 152 constituted by the dielectric layer 150 and the plurality of thick-film conductive layers disposed on the dielectric layer 150 is fixed to the back face plate 128, whereby the gate electrodes 144 are provided between the emitters 148 and the anodes 134. Since the sheet member 152 is constituted by the dielectric layer 150 and the thick-film conductive layers (providing the gate electrodes 144) which are disposed on the surfaces of the dielectric layer 150, the sheet member 152 has a high mechanical property based on the dielectric layer 150. Thus, the sheet member 152 is given a sufficiently high mechanical strength, even if its thickness or the thickness of the thick-film conductive layers is adapted to be extremely small. Therefore, as compared with a case where the gate electrodes 144 are provided by sheet metals, the gate electrodes 144 of the sheet member 152 are less likely to be damaged, even if the thickness is reduced. Further, since the plurality of gate electrodes 144 are formed integrally with the dielectric layer 150 so as to constitute the sheet member 152 while being electrically insulated from each other, the gate electrodes 144 can be handled easier and positioned relative to each other with a higher accuracy, than where the gate electrodes are provided by respective conductive bodies which are independent of each other. It is thus possible to easily produce the FED 120 equipped with the gate electrodes 144 having a sufficiently small thickness and positioned relative to each other with a high accuracy.

In the present embodiment, after the printed dielectric layer 202 and printed conductive layers 200, 204 have been formed in the predetermined patterns on the film formation surface which is constituted by the peel layer 28 having the melting point higher than the sintering temperature of the thick-film dielectric paste 198 and thick-film conductive paste 196, the printed dielectric layer 202 and printed conductive layers 200, 204 are subjected to the heat treatment at the temperature enabling them to be sintered, whereby the sheet member 152 in which the thick-film conductive layers providing the gate electrodes 144 are formed on the opposite surfaces of the dielectric layer 150 is formed. The peel layer 186, which is not sintered at the heat treatment temperature, converts into the particle layer 214 constituted by only the high-melting-point particles 212, as a result of burning of the resin. Therefore, the formed thick film is not fixed to the substrate 180, whereby the thick film can be easily peeled from the surface 182 of the substrate 180. This feature makes it possible to easily produce the sheet member 152 which constitutes the gate electrodes 144 and which is used in the production of the FED 12.

Figure 21:
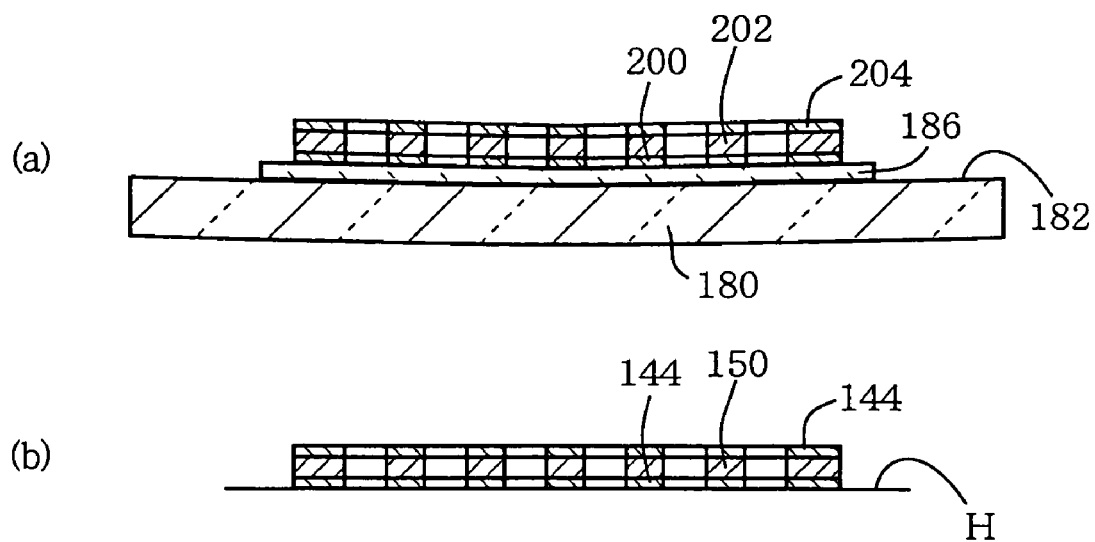
FIGS. 21(a),(b) are views for explaining an influence of warp of the substrate.

Further, in the present embodiment, the support body onto which the thick-film pastes 196, 198 are applied is constituted by the substrate 180 and the peel layer 186 formed on the surface of the substrate 180, so that the shape of the support body is maintained even after the heat treatment. This arrangement provides an advantage that the formed sheet member 152 can be handled easier than an arrangement in which the support body is constituted by only the peel layer 186. Further, since the peel layer 186 is interposed between the printed thick-film layers 200–204 and the substrate 180, the printed thick-film layers 200–204 are not bound by the substrate 180 during the heat treatment, it is not problematic even if the substrate 180 does not have high degrees of flatness and surface smoothness. For example, if the substrate surface 182 is warped to be concaved downwardly as shown in FIG. 21(a), the printed thick-film layers 200–204 are formed to be warped in conformity to the warped surface 182. However, where the formed thick film (sheet member 152) is thin enough to be flexible even after the firing, the sheet member 152 can be flattened, by putting the sheet member 152 onto a flat surface H as shown in FIG. 21(b). Further, where the substrate 180 has a low degree of surface smoothness, it is not problematic since the surface smoothness of the sheet member 152 is influenced by only a surface condition of the peel layer 186 which is in contact with the sheet member 152.

Further, in the present embodiment, since the printed thick-film layers 200–204 are formed with the thick-film screen printing method, the formation can be made by a simple device without waste of large amount of material, thereby resulting in advantageous reduction in the producing cost.

Further, in the present embodiment in which the gate electrodes 144 are provided in the form of the sheet member 152, each of the gate electrodes 144 is given a heat capacity close to that of the back face plate 128 and that of the glass frit or the like serving for the connection, as compared with a case where each gate electrode is constituted by only a metallic material. Therefore, there is an advantage that the gate electrodes 144 are not easily deformed due to difference in the heat capacity even if the gate electrodes 144 are subjected to various heat treatments in the production process.

Further, in the present embodiment in which the film formation is made in the thick-film screen print method without a so-called wet process, there is also an advantage that waste water is easily treated. The wet process might cause a solution to penetrate into the film and remain in the film, thereby causing outgas after the formation of the vacuum vessel constituted by the mutually fixed front and back face plates 126, 128. For avoiding this, the component material has to have an increased heat resistance so that the evacuating step is implemented at a higher temperature or for a larger length of time. That is, it is necessary to take such a procedure that increases load in the process. Further, where the conductive layer such as the gate electrodes 144 are constituted by thick-film silver, there is also a problem of reduction in the reliability due to penetration or diffusion of the silver into the dielectric layer 150.

SIXTH EMBODIMENT

Figure 22:
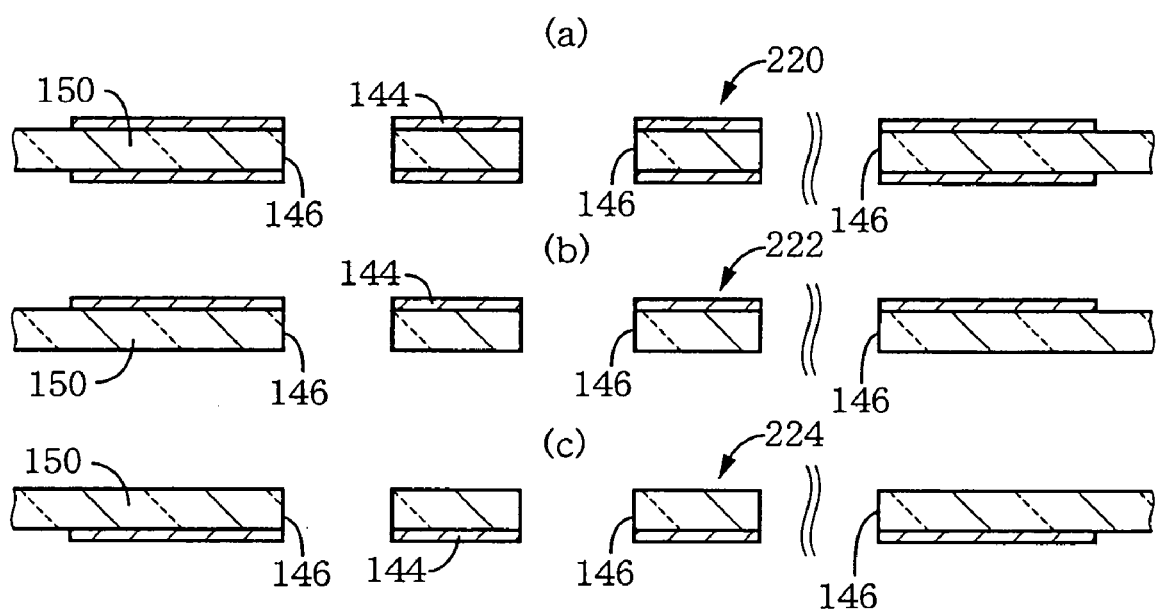
FIGS. 22(a)–(c) are cross sectional views for explaining other examples of the sheet member constituting the gate electrode.

FIGS. 22(a)–(c) are views for explaining other examples of film construction of the sheet member 152. In a sheet member 220 shown in FIG. 22(a), the thick-film conductive layer is not formed on the inner wall surface of each electron passing-through hole 146, so that the gate electrodes 144, i.e., the thick-film conductive layers provided on the opposite surfaces of the dielectric layer 150 are not connected to each other. In the production of such a sheet member 220, the formation of the upper printed conductive layer 204 as shown in FIG. 18(e) is made by application of the thick-film conductive paste 196 with use of the same screen 190 as in the formation of the printed conductive layer 200. In a sheet member 222 shown in FIG. 22(b), the gate electrodes 144 are provided on only the upper surface of the dielectric layer 150, i.e., one of its opposite surfaces close to the anodes 134. In a sheet member 224 shown in FIG. 22(c), the gate electrodes 144 are provided on only the lower surface of the dielectric layer 150, i.e., one of its opposite surfaces close to the emitters 148. The sheet members 222, 224 can be produced by omitting the steps shown in FIG. 18(*e*) and FIG. 18(*c*), respectively. Thus, the thick-film conductive layer can be formed to take a suitable configuration on the dielectric layer 150. It is possible to produce a cold-cathode display device substantially the same as the above-described FED 120, by using any one of the above-described sheet members 220–224 which can be selected depending upon its drive condition such as applied voltage and display area.

SEVENTH EMBODIMENT

Figure 23:
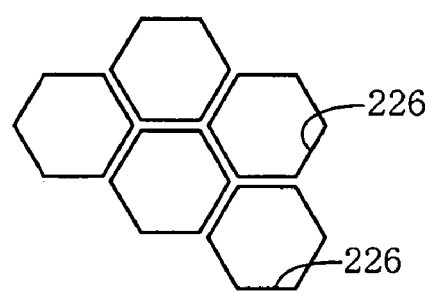
FIG. 23 is a view for explaining another example of shape of electron passing-through hole provided in the gate electrode.

FIG. 23 is a view showing another example of shape of each of the electron passing-through holes 146 formed though the gate electrodes 144. In the example shown in the figure, each electron passing-through hole 226 has a hexagonal shape. The plurality of electron passing-through holes 226 are arranged such that an outer periphery of each hole 226 is spaced apart from that of the adjacent hole 226 by a constant spacing distance. The hexagonal shape of the holes 226 advantageously provides a larger open area ratio than the circular shape of the holes 146. Since the dielectric layer 150 and the gate electrodes 144 are formed in the thick-film screen print method, the opening shape can be relatively freely determined. Thus, the opening shape may be suitably designed depending upon required electronic control functions.

EIGHTH EMBODIMENT

Figure 24:
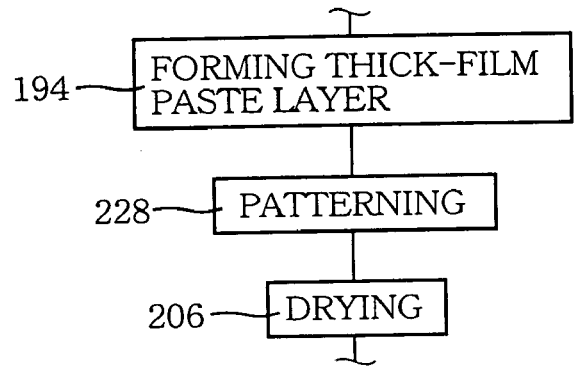
FIG. 24 is a process chart for explaining another producing method of producing the sheet member shown in FIG. 15, to which method the producing method according to the fifth invention is applied.
Figure 25:
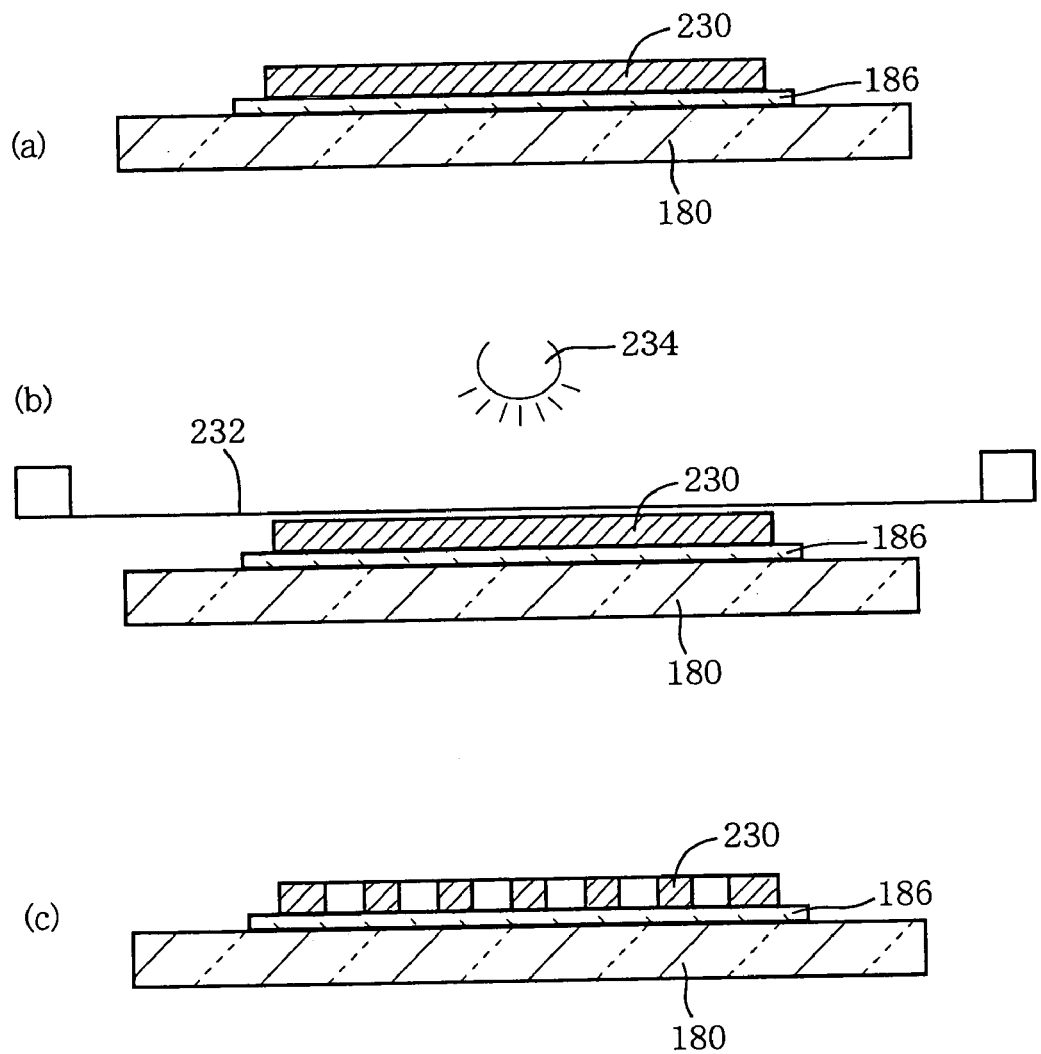
FIGS. 25(a)–(c) are views showing states of the thick film in main stages of the production process of FIG. 24.

FIGS. 24 and 25 are a process chart for explaining another example of the method of producing the sheet member of the fifth invention, and a view illustrating main stages of the producing method, respectively. In the present embodiment, a patterning step 228 is provided between the thick-film-paste-layer forming step 194 and the drying step 206. FIG. 25(*a*) is a view showing a state after implementation of the thick-film-paste-layer forming step 194. As shown in this figure, a thick-film paste layer (printed conductive layer or printed dielectric layer) 230 is formed in a simple solid form without being particularly patterned. The thick-film paste layer 230 is constituted by a photosensitive resin, and is formed with, for example, a coater, film laminate or the like.

In the subsequent patterning step 228, the thick-film paste layer 230 is subjected to an exposure treatment by using an exposure mask 232 having a predetermined pattern, and is then subjected to a development treatment such as washing. FIG. 25(*b*) shows a state during the exposure treatment. The reference sign 234 denotes an exposure lamp in the figure. FIG. 25(*c*) shows a state after the processing or patterning. Then, the drying step 206 and other steps following to the drying step 206 are implemented, whereby a sheet member which is substantially the same as the thick-film sheet member 152 is obtained. Thus, the fifth invention is applicable also to such a method in which the patterning is effected, independently of the application of the thick-film paste, depending upon required configuration and dimensional and configurational accuracies of the gate electrodes 144. The layers (e.g., dielectric and conductive layers) made of plural kinds of materials and constituting the sheet member 152 can be formed by applying the respective pastes, or by laminating the sheets, and the formed layers can be simultaneously subjected to exposure and development treatments. This arrangement advantageously eliminates a cumbersome positioning operation and facilitates a finer patterning.

NINTH EMBODIMENT

Figure 26:
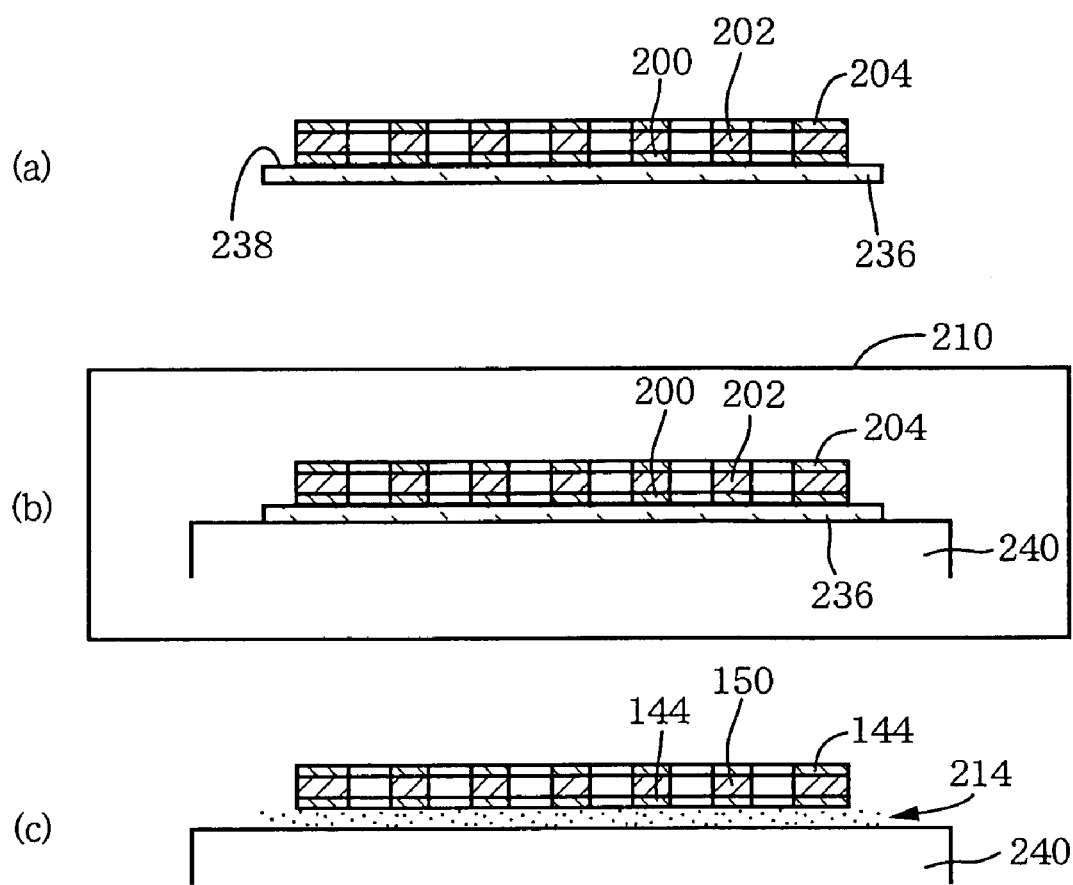
FIGS. 26(a)–(c) are views showing states of the thick film in main stages of the production process according to another embodiment of the fifth invention.

FIGS. 26(*a*)–(*c*), corresponding to FIGS. 18(*e*) and 19(*f*), (*g*), are views for explaining a case where a raw ceramic sheet 236 is used as the support body. In the present embodiment, the printed dielectric layer 202 and printed conductive layers 200, 204 are formed by applying the thick-film paste onto a surface 238 of the raw ceramic sheet 236. The raw ceramic sheet 236 on which the printed layers 200–204 are disposed is introduced into the furnace chamber 210, so that the raw ceramic sheet 236 is subjected to a firing treatment while being mounted on a setter 240. As a result of the firing treatment, the thick-film sheet (the dielectric layer 150 and gate electrodes 144) is mounted on the setter 240 with the particle layer 214 being interposed between the thick-film sheet and the setter 240. As long as there is no particular problem as to the surface state and reactivity of the setter 240, the sheet member 152 can be thus produced. Needless to say, it is also possible to fire the raw ceramic sheet 236 by mounting the ceramic sheet 236 on the substrate 180 or the like.

In the above-described fifth through ninth embodiments, the present invention is applied to the FED 120 in which each emitter 148 is constituted by the CNT. However, the present invention is equally applicable for also other cold-cathode display devices equipped with Spindt-type, Pencil-type or other emitters having various shapes, as long as each of the other cold-cathode display devices requires the gate electrodes 144 to be disposed between the emitters 148 and the anodes 134.

While the FED 120 of the fifth through ninth embodiments is of a type equipped with the three-color fluorescent layers 136 to achieve full-color display, the present invention is equally applicable to a FED equipped with a single-color or two-color fluorescent layers.

While the thickness of the sheet member 152 is adapted to be about 50 (μm) in the fifth and other embodiments, the thickness of the sheet member 152 may be suitably changed depending upon, for example, the spacing distance between the anodes 134 and the emitters 148 and the required mechanical strength. The thickness of the sheet member 152 can be changed by changing the thickness of the conductive layers (gate electrodes 144) and/or the thickness of the dielectric layer 150 depending upon the required degree of conductivity and thickness. The thickness of the dielectric layer 150, the thickness of the conductive layers and the entire thickness of the sheet member 152 are preferably changed in view of fact that the mechanical strength is increased with an increase of the thickness of the dielectric layer 150 and that the conductivity is increased with an increase of the thickness of the conductive layers.

The sheet member 152 having the conductive layers serving as the gate electrodes 144 is fixedly disposed on the back face plate 128 in the fifth and other embodiments. However, the sheet member 152 may be fixedly disposed on either of the front and back face plates 126, 128, as long as the sheet member 152 is fixed in a predetermined position between the front and back face plates 126, 128, since the sheet member 152 is provided for disposing the gate electrodes 144 in a height position between the emitters 148 and the anodes 134.

TENTH EMBODIMENT

Figure 27:
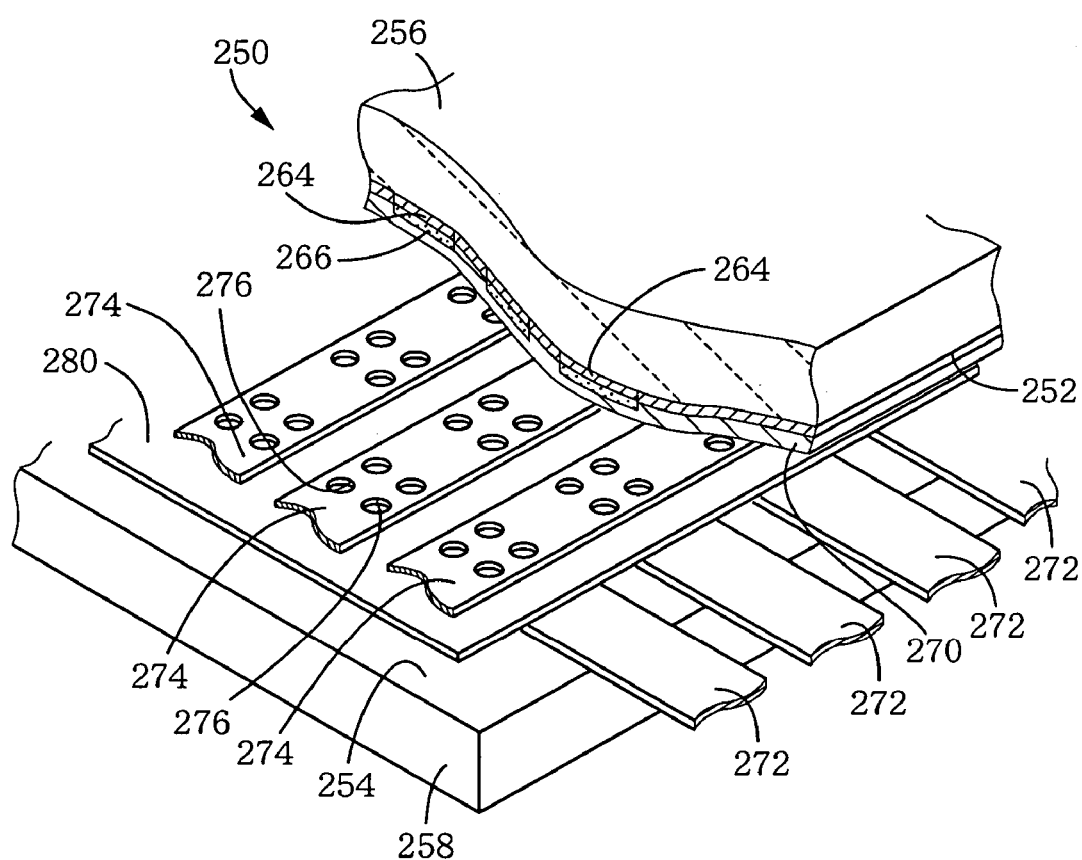
FIG. 27 is a perspective view partially in cross section of FED which is one example of the cold-cathode display device according to the fourth invention.

FIG. 27 is a perspective view partially in cross section of a FED 250 which is another example of the cold-cathode display device of the fourth invention. The FED 250 is equipped with front and back face plates 256, 258 which are substantially identical with each other in size and shape and which are disposed in parallel with each other with a predetermined spacing distance therebetween such that their respective substantially flat surfaces 252, 254 are opposed to each other. The front and back face plates 256, 258 are gas-tightly sealed at their respective peripheral portions, whereby a gastight space is formed in their inside. This gastight space is adapted to be evacuated have a reduced pressure of about $6.7 \times 10^{-5}$ (Pa) [$5 \times 10^{-7}$ (Torr)]. In the present embodiment, the back face plate 258 corresponds to a first substrate while the front face plate 256 corresponds to a second substrate.

Each of the front and back face plates 256, 258 is provided by a translucent substrate which is constituted by, for example, soda lime glass, high-distortion-point glass or the like having a softening point of about 600(° C.), and has an outside dimension of about 800×500 (mm) and a substantially constant thickness of about 3 (mm). The spacing distance between the plates 256, 258 is set to be about 1–2 (mm).

On the surface 252 (opposed to the back face plate 258) of the front face plate 256, there are disposed a plurality of stripe-like transparent anodes 264. Each of the stripe-like transparent anodes 264 is formed from ITO (indium tin oxide) or the like, and extends along a predetermined direction. On surfaces of the respective anodes 264, fluorescent layers 266, each adapted to emit a light having one of three colors, i.e., R (red), G (green) and B (blue), are disposed, such that R, G and B are repeatedly arranged in this order as viewed in a direction perpendicular to the predetermined direction. Each of the fluorescent layers 266 is divided into mutually independent sections which are arranged in a longitudinal direction of the anodes 264, i.e., in the above-described predetermined direction such that each section corresponds to a unit of the light emission. However, each fluorescent layer 266 does not have to be necessarily divided into the sections, but may be formed to have a stripe-like shape so as to continuously extend along the corresponding anode 264. Each anode 264 is formed by sputtering or other thin-film forming method, so as to have a thickness of about 1 (μm) and a relatively high degree of electric conductivity with a sheet resistivity of about 10 (Ω/□) or less. Each fluorescent layer 266 is constituted by material such as ZnO:Zn, ZnS:Ag+$In_2O_3$ which emits a visible light through an electron beam, and is formed by a thick-film screen printing method or the like to have a thickness of about 10–20 (μm) whereby the fluorescent layer 266 is given a certain degree of electric conductivity corresponding to an area resistivity of about 500 (Ω/$cm^2$) or less.

Figure 28:
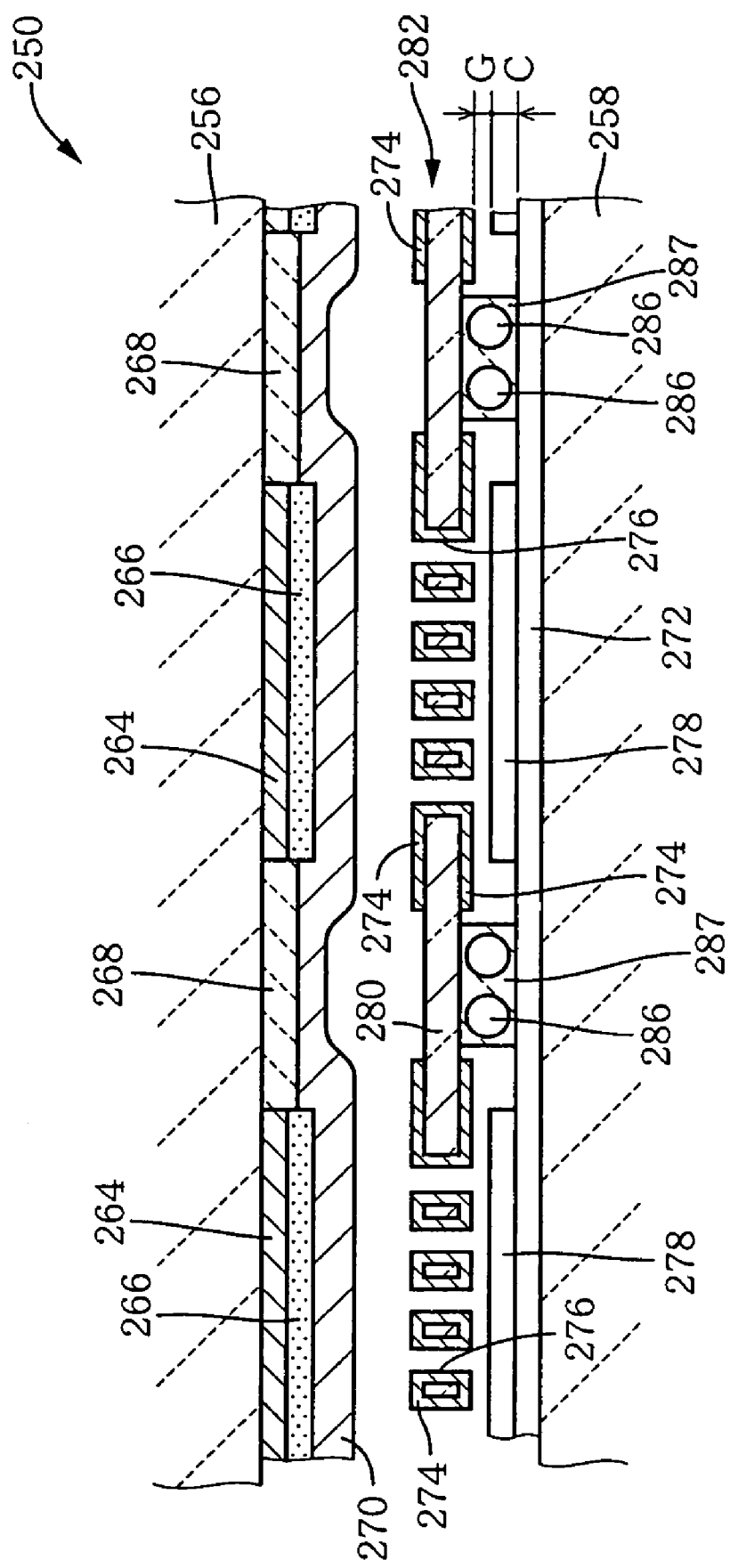
FIG. 28 is a view for explaining in detail a cross section of the FED of FIG. 27.

FIG. 28 is a view showing in enlargement a cross section of the FED 250. A black matrix (black mask) 268, which consists of a glass including black pigment, is provided in portions of the surface 252 of the front face plate 256 in which portions the fluorescent layers 266 are not disposed, such that the black matrix 268 has a thickness of about 15–20 (μm). The fluorescent layers 266 and the black matrix 268, cooperating to cover the entirety of the surface 252 of the front face plate 256, are covered at their surfaces with a metal back 270 which is formed to profile surface contours of the fluorescent layers 266 and the black matrix 268 and have a thickness of about 100–200 (μm). The black matrix 268 is formed, by a thick-film screen printing method or the like, in a lattice so as to bridge each adjacent pair of the fluorescent layers 266 which are arranged in a matrix. Where the fluorescent layers 266 are formed to have stripe-like shapes, the black matrix 268 is replaced by a black mask which consists of a plurality of stripe-like portions. In this case, the stripe-like-shaped fluorescent layers 266 and the plurality of stripe-like portions of the black mask are alternately arranged. The metal back 270 is formed, for example, by deposition of aluminum thin film, and has a relatively smooth surface and such a thickness that enables electrons to be easily transmitted there through.

As show in FIGS. 27 and 28, on the surface 254 (opposed to the front face plate 256) of the back face plate 258, there are disposed a plurality of cathode and gate electrodes 272, 274, such that the cathode electrodes 272 and the gate electrodes 274 perpendicularly intersect with each other and are electrically insulated from each other. Each of the gate electrodes 274 has, in its portions in which the gate electrode 274 intersect with the cathode electrodes 272, a plurality of electron passing-through holes (gate holes) 276 which pass therethrough in its thickness direction. Each of the electron passing-through holes 276 has an opening diameter which is determined based on a trade-off relationship between an electron emission effect and an emission area (open area ratio), and which is set to be about 100 (μm) where a dot size of the holes 276 is about 3 (mm). Emitters (cold cathodes) 278 are disposed on respective portions of each cathode electrode 272 which correspond to the electron passing-through holes 276.

Each cathode electrode 274 is made of gold (Au), thick-film silver or other conductive material which is formed by a thin film processing such as sputtering or a thick film processing such as printing, while each gate electrode 274 is made of thick-film silver or other thick-film conductive material. Each emitter 278 is provided by a mass of a multiplicity of nanotubes (CNT) which are oriented toward the gate electrodes 274, and has a thickness C of about 20 (μm). A distance G between the emitters 278 and gate electrodes 274 is about 27–30 (μm). It is noted that each emitter 278 may be provided by also a so-called "Spindt-type" cone-shaped cold cathode made of molybdenum (Mo) and having a height of about 1 (μm).

The gate electrodes 274, made of the thick-film conductive material, are provided by holed-strip-like thick films formed on opposite side surfaces of a thin-plate-like dielectric layer 280 which has a thickness of about 20–50 (μm) and a size of about 320×430 (mm). The holed-strip-like thick films providing the gate electrodes 274 are positioned in the same positions of the opposite side surfaces of the layer 280, and have a constant thickness of about 7–10 (μm) and are arranged in parallel with each other with a predetermined spacing distance therebetween. The dielectric layer 280 is made of a thick-film dielectric material which is a mixture of $PbO$—$B_2O_3$—$SiO_2$—$Al_2O_3$—$TiO_2$ based low-softening-point glass and ceramic filler such as alumina, and has substantially the same coefficient of thermal expansion as the soda lime glass which constitutes the back face plate 258. That is, in the present embodiment, the FED 250 is provided with a sheet member 282 which is constituted by the thick-film dielectric layer 280 and thick-film conductive layers fixedly laminated on the surface of the dielectric layer 280 and which has a thickness of about 50 (μm), while the gate electrodes 274 are provided by the laminated thick-film conductive layers.

Figure 29:
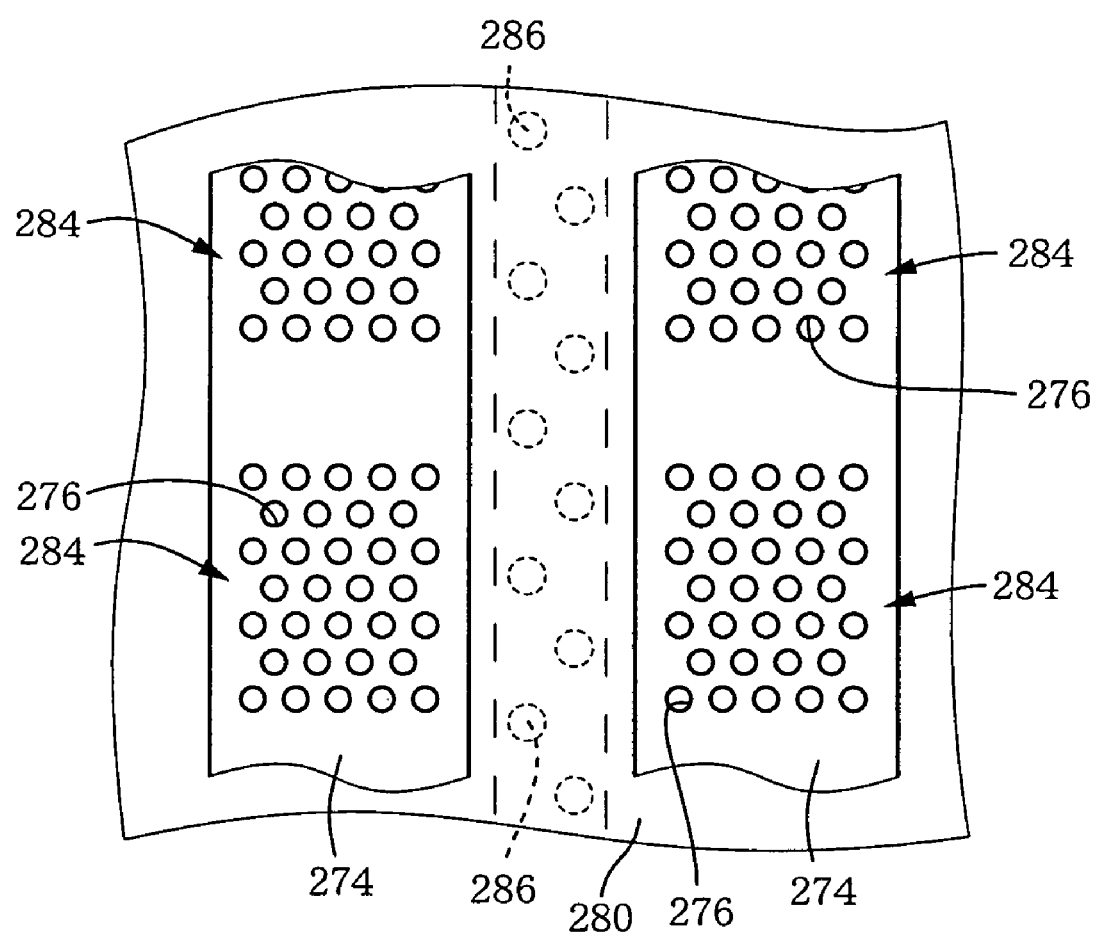
FIG. 29 is a plan view showing a sheet member provided in the FED of FIG. 27.

FIG. 29 is a plan view showing in enlargement a part of the sheet member 282. The dielectric layer 280 is provided by a rectangular thin plate in which the electron passing-through holes 276 are formed in respective positions as shown in the figure, i.e., in the same positions as in the gate electrodes 274. The plurality of gate electrodes 274 are disposed on the dielectric layer 280 such that the gate electrodes 274 are electrically insulated from each other. Each of the gate electrodes 274 has opening sections 284 which are spaced apart from each other in a longitudinal direction of the gate electrode 274 and which are positioned in the intersections of the gate electrode 274 with the respective cathode electrodes 272. In each of the opening sections 284 of the gate electrode 274, the electron passing-through holes 276 are positioned with a high density. Although only four electron passing-through holes 276 appear in each of the intersections in FIG. 27, a number of the holes 276 positioned in each intersection is actually as large as shown in FIG. 29 or even larger. A spacing distance between the holes 276 is adapted to be about 150 (μm). It is noted that the gate electrodes 274 which are disposed on the opposite surfaces of the dielectric layer 280 are connected to each other via the thick-film conductive layer which is disposed also on an inner wall surface of each of the passing-through holes 276. Thus, only the gate electrodes 274, which are disposed on one of the opposite surfaces of the layer 280 close to the anodes 264, are directly connected to an external circuit (not shown). That is, in the present embodiment, a portion of the thick-film conductive layer close to the emitters 278 functions as the gate electrode for controlling the electrons, while a portion of the thick-film conductive layer close to the anodes 264 functions as a wire.

The dielectric layer 280 is supported, at its portions at which the gate electrodes 274 are not fixed, by spherical spacers 286 which are substantially evenly distributed, so that the gate electrodes 274 are positioned in a predetermined height position distant from the emitters 278. Each of the spherical spacers 286 is provided by a glass bead, ceramic ball or the like whose maximum diameter is adjusted to have a substantially constant value that is about 30–50 (μm), and is covered at its substantially entire surface with an adhesive layer 287 which is provided by molten glass frit or the like. That is, the sheet member 282 is fixed to the back face plate 258 by this adhesive layer 287. A height position of the sheet member 282, i.e., a gap between the emitters 278 and the gate electrodes 274 is substantially defined by the maximum diameter of the spherical spacers 286 interposed between the substrate 258 and the sheet member 282. The spherical spacers 286 can be obtained from a group of glass beads or ceramic balls which has a suitable particle size distribution. That is, large particles contained in the group are removed by using a filter (mesh) which has perforations whose size corresponds to the predetermined maximum diameter, so that non-removed particles are used as the spherical spacers 286. Thus, it is possible to prevent particles larger than the predetermined maximum diameter, from being used as the spherical spacers 286, and also possible to increase the percentage of ones having the predetermined maximum diameter, in all of the spherical spacers 286.

As described above, in the present embodiment, the plurality of gate electrodes 274 are respectively provided by the plurality of thick-film conductively layers of the sheet member 282. Since the sheet member 282 is constituted by the dielectric layer 280 and the gate electrodes 274 which are disposed on the surfaces of the dielectric layer 280, the sheet member 282 has a high mechanical property based on the dielectric layer 280. Thus, the sheet member 282 is given a sufficiently high mechanical strength, even if its thickness or the thickness of the gate electrodes 274 is adapted to be extremely small. Therefore, as compared with a case where the gate electrodes 274 are provided by sheet metals, the gate electrodes 274 of the sheet member 282 are less likely to be damaged, even if the thickness is reduced. Further, since the plurality of gate electrodes 274 are formed integrally with the dielectric layer 280, the gate electrodes 274 can be positioned relative to each other with a higher accuracy, than where the gate electrodes are provided by respective conductive bodies which are independent of each other. Further, in the present embodiment in which the spherical spacers 286 are interposed between the sheet member 282 and the back face plate 258, the spacing distance G between the emitters 278 and the gate electrodes 274 is an extremely small value which substantially corresponds to the diameter of the spherical spacers 286, and a variation in the spacing distance G substantially corresponds to a variation in the diameter of the spherical spacers 286. Therefore, in the FED 250 in which it is desirable that the spacing distance G is minimized, the spacing distance G is given a uniformity while being extremely reduced.

When predetermined amounts of voltages as a signal voltage and a scan voltage are respectively applied to the cathode electrodes 272, and the gate electrodes 274, electrons are emitted from the emitters 278 as a result of field emission caused based on a large voltage gradient between the cathode electrodes 272 and the gate electrodes 274. With a predetermined amount of positive voltage being applied to the anodes 264 which are disposed on the front face plate 256, the electrons are driven to fly toward the anodes 264 through the electron passing-through holes 276. The electrons then strike the fluorescent layers 266 disposed on the anodes 264, so that the stricken fluorescent layers 266 emit light. In this instance, the electrons, which are emitted from the emitters 278 and attracted by the anodes 264, pass through the metal back 270 and then strike fluorescent bodies of the fluorescent layers 266. Although the fluorescent layers 266 are covered with the metal back 270, the metal back 270 is provided by the thin film formed by the deposition and having such a thickness that enables the electrons to be easily transmitted therethrough, as described above. The light generated in the fluorescent layers 266 advances in a direction toward the back face plate 258 as well as in a direction toward the front face plate 256. The light advancing in the direction toward the back face plate 258 is reflected by the metal back 270, so as to advance in the opposite direction, i.e., in the direction toward the front face plate 256. Thus, almost all the emitted light is transmitted through the front face plate 256 so as to be ejected through the front face plate 256, thereby making it possible to increase the emission efficiency. The light emission of the fluorescent layers 266 is not observed from the side of the back face plate 258. The FED 250 thus constitutes a so-called transmission-type display device in which the light transmitted through the fluorescent layers 266 is observed from the side of the front face plate 256.

Figure 30:
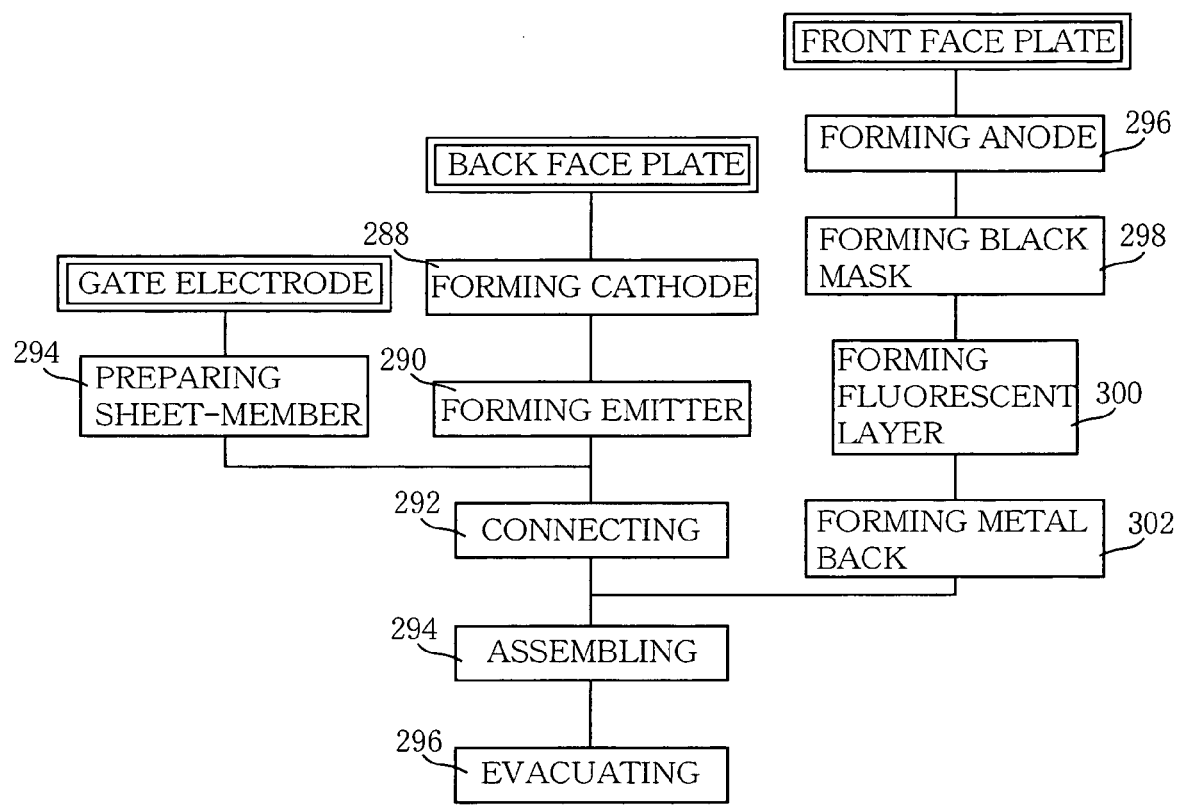
FIG. 30 is a process chart for explaining a method of producing the FED of FIG. 27.

The above-described FED 250 is produced by assembling the gate electrodes 274, the back face plate 258 and the front face plate 256, which are processed (or produced) independently of each other in accordance with a process chart shown in FIG. 30. In a process of producing the back face plate 258, a cathode forming step 288 is first implemented to form a conductive film constituted by gold or the like with, for example, a sputtering method and then subject the formed conductive film to a patterning operation, so as to provide the above-described cathode electrodes 272 on the surface 254 of the back face plate 258. In the subsequent emitter forming step 290, the plurality of emitters 278 each consisting of the separately produced CNT are fixed to predetermined portions of each cathode electrode 272 (the intersections of each cathode electrode 272 with the respective gate electrodes 274), by using conductive adhesive or the like. In a connecting step 292, the above-described sheet member 282 which is prepared in a sheet-member preparing step 294 of a process of producing the gate electrodes 274, or its intermediate product is superposed on the back face plate 258 through the spherical spacers 286, and the sheet member 152 is connected to the back face plate 258 through the spacers 156 by using glass frit or the like.

On the other hand, in a process of producing the front face plate 256, an anode forming step 296 is implemented to form the anodes 264 made of the ITO, on the surface 252 of the plate 256 by a thin-film forming method such as sputtering. A black mask forming step 298 is then implemented to print an insulated glass paste including black pigments, onto the surface 252 by a thick-film printing method or the like, and then subject the printed glass paste to a firing treatment at a temperature of about 450($°$ C.), whereby the above-described black mask 268 is formed. In the subsequent fluorescent-layer forming step 300, one of three kinds of fluorescent pastes corresponding to the three colors R, G and B is applied to each of sections defined by the lattice of the black mask 268 such that the three kinds of fluorescent pastes are disposed on the assigned sections. The thus applied fluorescent pastes are then subjected to a firing treatment at a temperature of about 450($°$ C.), whereby the fluorescent layers 266 are formed. A metal-back forming step 302 is then implemented to form the metal back 270 covering the surfaces of the fluorescent layers 266 and the black matrix 268, by deposition of aluminum thin film onto the surfaces, with some preliminary treatments as needed.

In the subsequent assembling step 304, the back face plate 258 and front face plate 256, which have being processed as described above, are superposed on each other through a spacer which has been separately prepared, such that their surfaces 252, 254 are opposed to each other, and then subjected to a heat treatment, so that the plates 258, 256 are gas-tightly connected through a sealer such as seal glass which is applied to the spacer or the surfaces 252, 254. An evacuating step 306 is then implemented to evacuate a gas from a gas-tight space through an evacuation hole (not shown), whereby the FED 250 shown in FIG. 27 is obtained.

Figure 31:
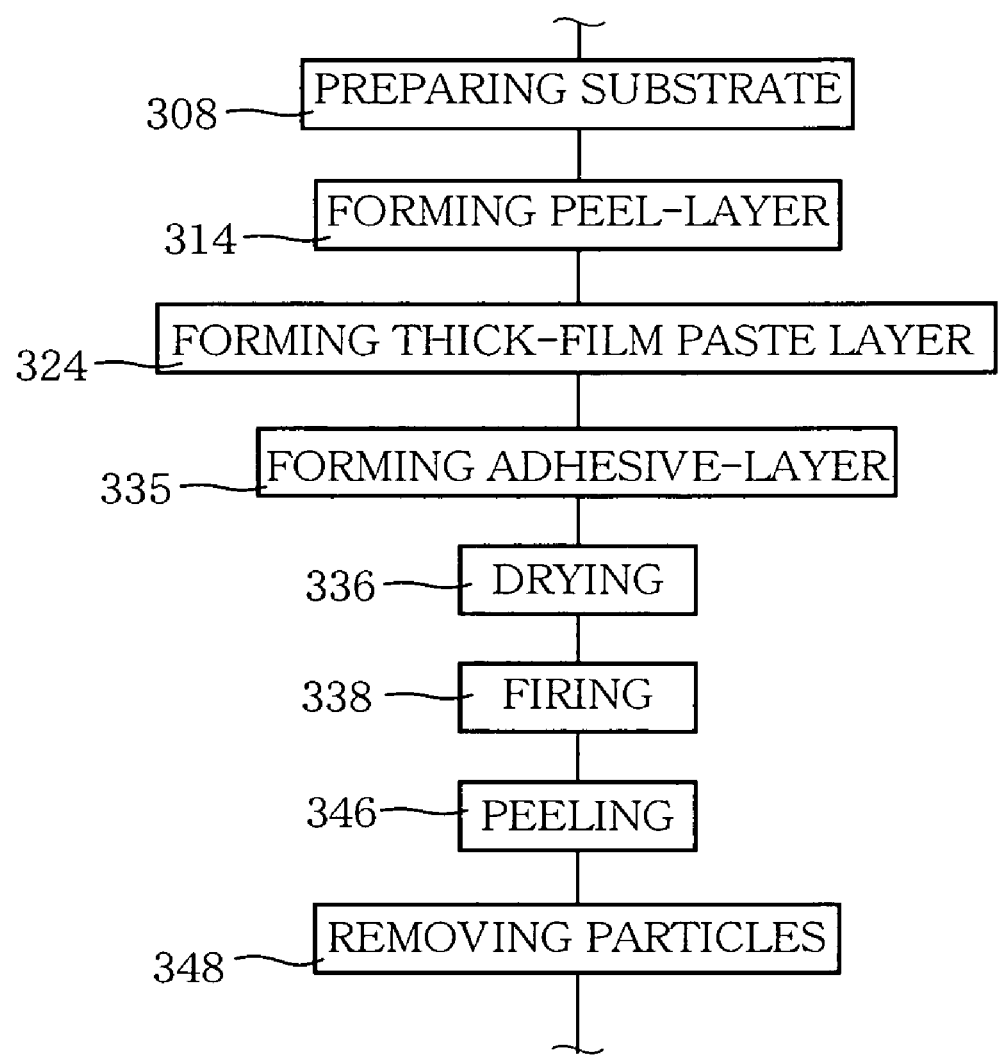
FIG. 31 is a process chart for explaining a method of producing a thick-film sheet of FIG. 29.

In the above-described producing process, the sheet-member preparing step 294 is implemented in accordance with a process shown in FIG. 31 to which a well-known thick-film printing technique is applied. There will be described a method of producing the sheet member 282, with reference to FIGS. 32($a$)–($e$) and FIGS. 33($f$)–($g$) which represent states in main stages of the production process.

The process is initiated with a substrate preparing step 308 implemented to prepare a substrate 310 (see FIG. 32) which is to be subjected to a thick-film printing, and then effect a suitable cleaning treatment on a surface 312 of the substrate 310. This substrate 310 is provided by a member which does not suffer from considerable deformation and deterioration in a heat treatment which is described below. For example, it is preferable to use, as this substrate 310, a glass substrate or the like such as soda lime glass which has a coefficient of thermal expansion of about $87 \times 10^{-7}$(/$°$ C.), a softening point of about 740($°$ C.) and a distortion point of about 510($°$ C.). It is noted that the substrate 310 has a thickness of about 2.8 (mm) and that its surface 312 has a size of 400×450 (mm) that is sufficiently larger than the above-described sheet member 282.

Figure 32:
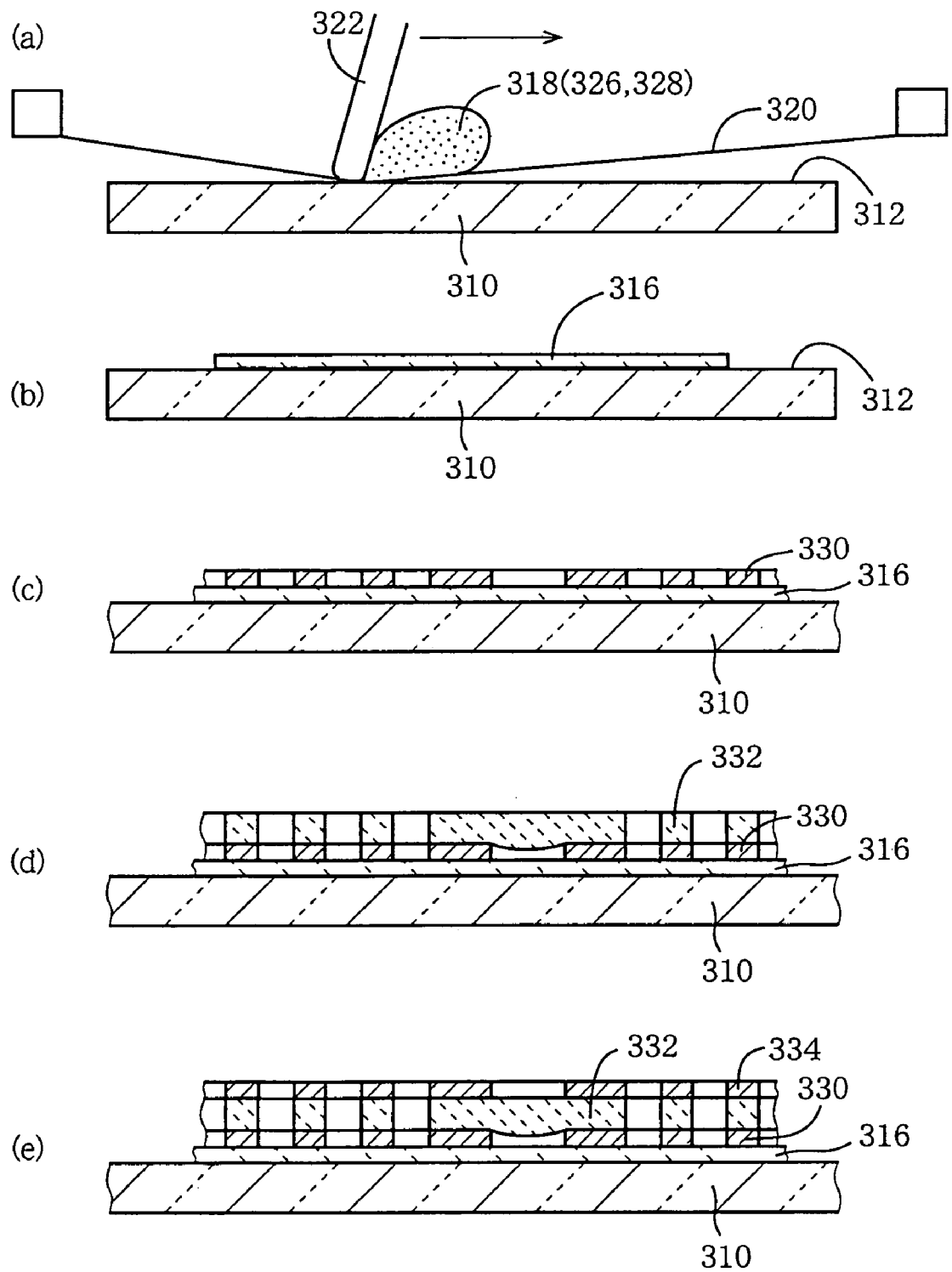
FIGS. 32(a)–(e) are views showing states of substrate and thick film in main stages of the production process of FIG. 31.

A peel-layer forming step 314 is then implemented to dispose a peel layer 316 constituted by high-melting-point particles which are bonded together with a resin, on the surface 312 of the substrate 310 such that the peel layer 316 has a thickness of about 5–50 (µm). The high-melting-point particles are provided by a mixture of high-softening-point glass frit whose average particle size is about 0.5–3 (µm) and ceramic filler such as alumina and zirconia whose average particle size is about 0.01–5 (µm). The high-softening-point glass has a softening point of about 550($°$ C.) or higher. The high-melting-point particles consisting of the mixture has a softening point of about 550($°$ C.) or higher. The resin is provided by ethyl cellulose resin or the like which is burnt at about 350($°$ C.). The peel layer 316 is disposed on the surface 312 of the substrate 310, for example, by applying an inorganic material paste 318 which is constituted by the above-described high-melting-point particles and resin which are dispersed in an organic solvent such as butyl carbitol acetate (BCA), onto substantially the entire surface of the substrate 310 with a screen printing method as shown in FIG. 32($a$), and then drying the applied paste 318 at a room temperature. However, the peel layer 316 may be disposed on the surface 312 of the substrate 310, by sticking a coater or film laminate onto the surface of the substrate 310. FIG. 32($b$) shows a stage in which the peel layer 316 is formed as described above. It is noted that reference signs 320 and 322 denote a screen and a squeegee, respectively, in FIG. 32($a$). In the present embodiment, the substrate 310 provided with the peel layer 316 corresponds to a support body. A surface of the peel layer 316 corresponds to a film formation surface. The substrate preparing step 308 and peel layer forming step 314 correspond to a support-body preparing step.

A thick-film-paste-layer forming step 324 is then implemented to sequentially apply a thick-film conductive paste 326 forming the above-described gate electrodes 274 and a thick-film dielectric paste 328 forming the above-described dielectric layer 280, in predetermined patterns on the peel layer 316, in the same manner as the application of the inorganic material paste 318, namely, with the screen printing method (see FIG. 32($a$)). In this instance, each of the thick-film conductive paste 326 and the thick-film dielectric paste 328 is applied to have such a thickness that provides the above-described thickness after the firing shrinkage, by using the screen 320 having an aperture pattern corresponding to the configuration of the gate electrodes 274 or the dielectric layer 280 as shown in FIG. 29. That is, the thick-film conductive paste 326 is applied with a holed strip pattern which defines holes and divides the applied paste into a plurality of strip-like shaped sections, while the thick-film dielectric paste 328 is applied with a continuous pattern which defines holes without dividing the applied paste into sections. FIGS. 32($c$)–($e$) are views showing stages in which a printed conductive layer 330, printed dielectric layer 332 and printed conductive layer 334 are formed by the application of the thick-film conductive paste 326, application of the thick-film dielectric paste 328 and application of the thick-film conductive paste 326, respectively, which are made in this order. It is noted that the formation of the printed conductive layer 334 is made by using the screen 320 having an aperture pattern diameter made larger than that of the screen 320 used in the formation of the printed conductive layer 330, so that the applied conductive paste 326 flows down along an inner wall surface of each electron passing-through hole 276, whereby the conductive layer is formed also on the inner wall surface of each hole 276. In FIG. 32($e$), the paste within each electron passing-through hole 276 is not illustrated. In the present embodiment, the thick-film-paste-layer forming step 324 is provided by a printed conductive layer forming step implemented two times, and a printed dielectric layer forming step implemented one time. The thick-film dielectric paste 328 is constituted by dielectric material powders such as alumina and zirconia, glass frit and resin which are dispersed in an organic solvent. The thick-film conductive paste 326 is constituted by conductive material powders such as silver powders, glass frit and resin which are dispersed in an organic solvent. As the glass frit, for example, a PbO—$B_2O_3$—$SiO_2$—$Al_2O_3$—$TiO_2$ based low-softening-point glass or the like is used. As the resin and solvent, for example, material similar to the inorganic material paste 318 is used.

Figure 33:
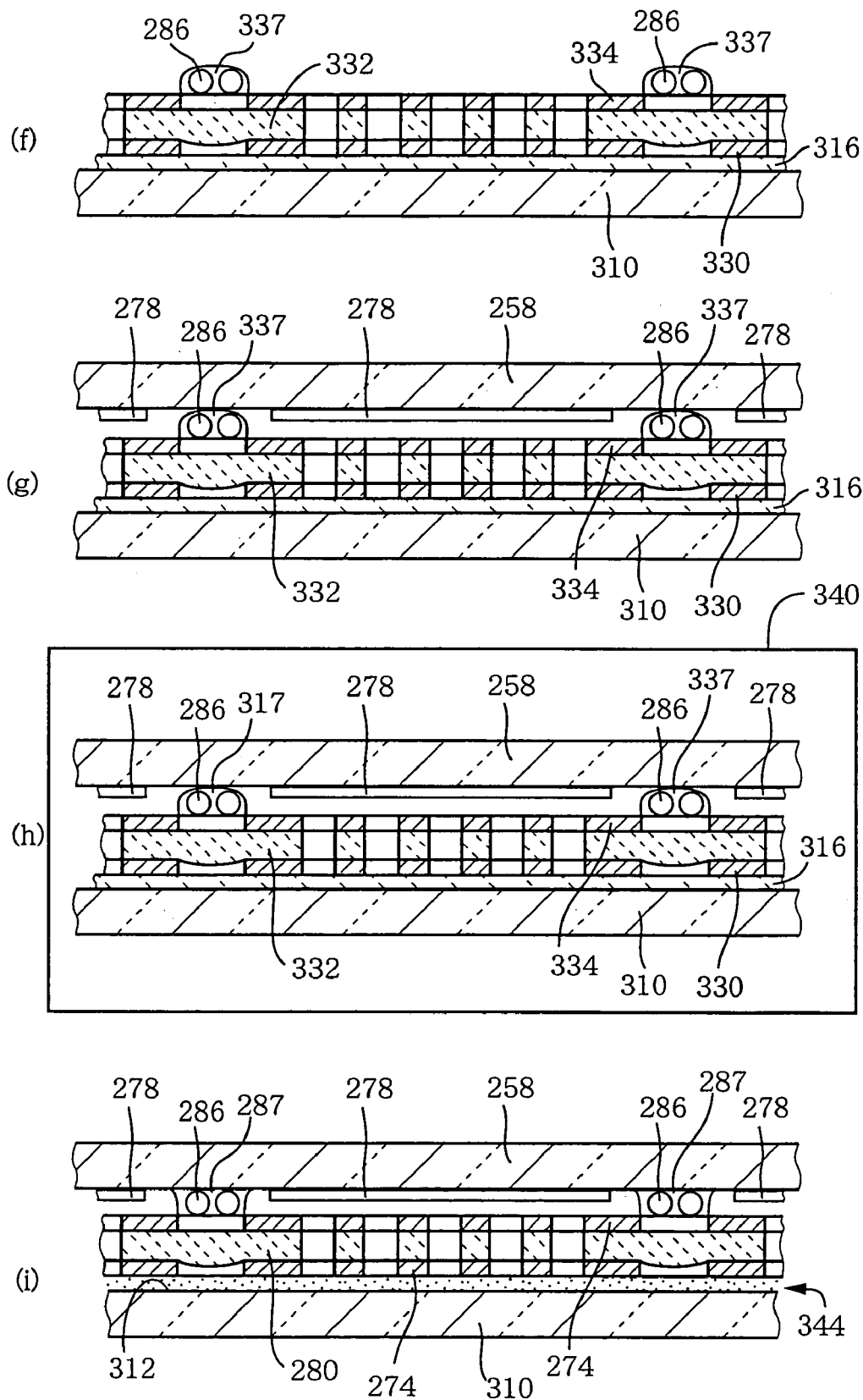
FIGS. 33(f)–(i) are views following to FIGS. 31(a)–(e), and showing states of the substrate and thick film in main stages of the production process of FIG. 31.

Since the thick-film dielectric paste 328 is applied also to the portions in which the thick-film conductive paste 326 is not applied, as described above, the paste 328 flows into a space between the adjacent strip patterns of the printed conductive layer 330, so that the space is filled with the printed dielectric layer 332, or so that the printed dielectric layer 332 is convexed downwardly owing to a surface tension which keeps a lower surface of the paste 328 to be separated from the surface of the peel layer 318. FIGS. 32 and 33 show the latter case.

Then, an adhesive-layer forming step 335 is implemented as needed. In this step 335, printed adhesive layers 337 are formed, by applying an adhesive paste onto portions of the printed dielectric layer 332 which are not covered with the printed conductive layer 334. This adhesive paste is constituted by a low-softening-point glass frit, the above-described spherical spacers 286 and resin which are dispersed in a solvent. Each of the spherical spacers 286 are constituted by, for example, a glass whose softening point is sufficiently higher than that of the above-described glass frit, or a ceramic such as alumina. The application of the adhesive paste is made by using a dispenser or the like. FIG. 33(*f*) shows this stage.

After the printed thick-film layers 330–334 have been formed, or after the layers 333–334 and the printed adhesive layers 337 have been formed as described above, a drying step 336 is implemented to dry the layers so as to remove the solvent. Where the printed adhesive layers 337 are formed, the drying step 336 is followed by the connecting step 292 shown in FIG. 30. Where the printed adhesive layers 337 are not formed, the drying step 336 is followed by a firing step 338 and other following steps as shown in FIG. 31.

In the former case, the connecting step 292 is implemented to superpose the back face plate 258 processed as described above, on the printed adhesive layers 337 such that the emitters 278 face downwardly, and then to put the substrate 310 in a furnace chamber 340 so that the substrate 310 is subjected to a heat treatment which is carried out at a firing temperature of about 550(° C.) that is suitable for kinds of the thick-film conductive paste 326 and thick-film dielectric paste 328. FIG. 33(*g*) shows a state in which the back face plate 258 is superposed on the printed adhesive layers 337, while FIG. 33(*h*) shows a state in a process of the heat treatment.

In the process of the heat treatment, the resin component of each of the printed thick-film layers 330–334 is burnt, while the dielectric material, conductive material and glass frit are sintered since the sintering temperature is about 550(° C.), so that the dielectric layer 280 and the thick-film conductive layer (gate electrodes 274), i.e., the sheet member 282 is formed. FIG. 33(*i*) shows this state. That is, as a result of the formation of the printed adhesive layers 337 on the printed layers 330–334 which cooperate to form the sheet member 282, the spherical spacers 286 are provided between the sheet member 282 and the back face plate 258. In this instance, since the inorganic component particles of the peel layer 316 have the softening point of 550(° C.) or higher, the high-melting-point particles (glass powders and ceramic filler) are not sintered while the resin component is burnt in the peel layer 316. Therefore, after the burning of the resin component as a result of progress of the heat treatment, the peel layer 316 converts into a particle layer 344 consisting of only the high-melting-point particles 342 (see FIG. 34).

Figure 34:
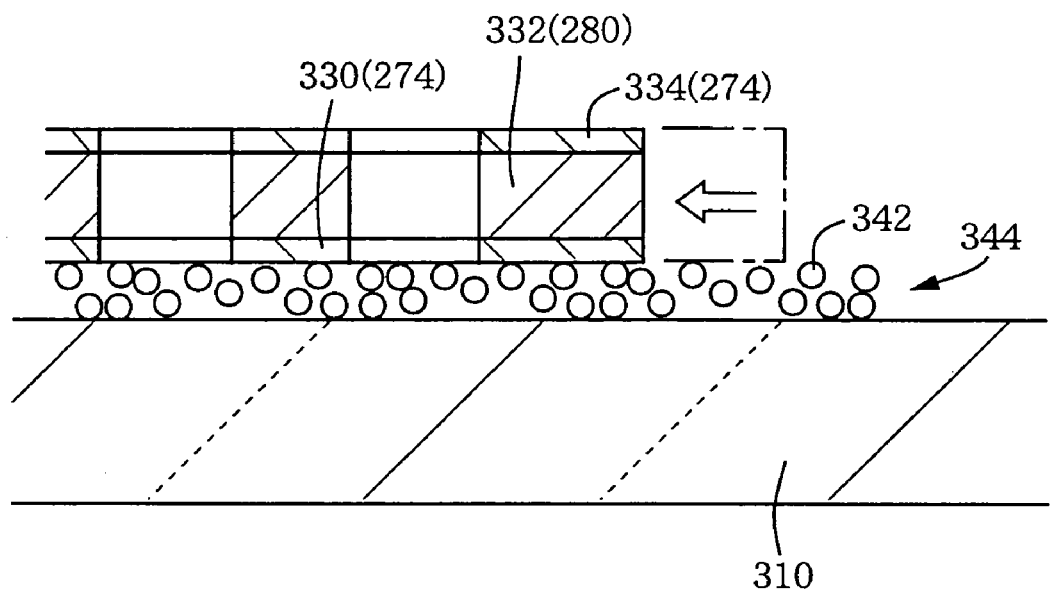
FIG. 34 is a view showing in enlargement a part of FIG. 31(i), for explaining a shrinkage behavior in a firing step of FIG. 31.

FIG. 34 is an enlarged view of a part of a right end of FIG. 33(*i*), schematically showing a state in progress of the sintering in the above-described heat treatment. In the figure, the back face plate 258 is not illustrated since the plate 258 is not necessary for the description. The particle layer 344, which has been formed as a result of burning of the resin component of the peel layer 316, is a layer constituted by the high-melting-point particles 342 which are merely superposed on each other and which are not bound to each other. Therefore, when the printed thick-film layers 330–334 shrink as indicated in FIG. 34 in which their end portions before the sintering are represented by one-dot chain line, the high-melting-point particles 342 function as rollers. Owing to the roller function of the particles 342, between a lower portion of a set of the printed thick-film layers 330–334 and the substrate 310, there is not generated a force impeding the shrinkage of the layers 330–334. Thus, the lower and upper portions of the set of the layers 330–334 equally shrink, so that the set of the layers 330–334 is free from density variation and warp arising from difference in the shrinkage amount. After the sheet member 282 is thus produced without connecting the sheet member 282 with the substrate 310, the substrate 310 is peeled from the sheet member 282 which is connected with the back face plate 258. Then, if necessary, the high-melting-point particles 342 are removed from the gate electrodes 274 formed of the printed conductive layer 330 which has been located on the lower side, whereby the connecting step 292 is completed.

In the present embodiment, the coefficient of thermal expansion of the substrate 310 is substantially equal to that of the dielectric material, and there is no substantial difference therebetween in amount of thermal expansion in a stage before initiation of the sintering of the printed thick-film layers 330–334, namely, in a temperature range in which the burning of the resin component has been completed while the dielectric material powders and conductive powders have a bonding strength that is still small. When the sintering of the printed thick-film layers 330–334 is initiated, the firing shrinkage of the layers 330–334 is not impeded by the substrate 310 owing to the above-described function of the particle layer 344. Therefore, the quality of the formed thick film is not practically affected by the thermal expansion of the substrate 310. It is noted that the substrate 310 may be provided by a heat resistant glass having a further high distortion point (for example, Pyrex glass ("Pyrex" is a registered trademark of Corning Incorporated, U.S.) which has a coefficient of thermal expansion of about $32 \times 10^{-7}$(/° C.) and a softening point of about 820(° C.), or a quartz glass having a coefficient of thermal expansion of about $5 \times 10^{-7}$(/° C.) and a softening point of about 1580(° C.)), where the substrate 180 is repeatedly used, or where the heat treatment temperature is considerably high. In this case, too, the thermal expansion amount of the substrate 310 is extremely small in the temperature range in which the dielectric material powders have a small bonding strength. That is, in this case, either, the quality of the formed thick film is not affected by the thermal expansion of the substrate 310.

Referring back to FIG. 31, where the adhesive-layer forming step 335 is not implemented, the substrate 310 on which the printed layers 330–334 are disposed is subjected to a firing treatment in the firing step 338 which is implemented after implementation of the drying step 336. This firing step 338 is implemented in substantially the same manner as in the above-described connecting step 292 which is implemented where the printed adhesive layer 337 is provided, except for absence of the printed adhesive layer 337 and the back face plate 258. That is, in the firing step 338, the dielectric layer 280 and the gate electrodes 274 are formed from the printed layers 330–334 while the peel layer 316 converts into the particle layer 344, as shown in FIG. 33(i), so that the sheet member 282 is obtained without connecting the sheet member 282 with the substrate 310. The firing step 338 is followed by a peeling step 346 which is implemented to peel the formed thick film, i.e., a laminated body consisting of the dielectric layer 280 and gate electrodes 274, from the substrate 310. Since the particle layer 344 interposed therebetween is constituted by the high-melting-point particles 342 which are merely superposed on each other, the peeling can be easily made without using any chemical and device. In this instance, some of the high-melting-point particles 342 cooperating to have a thickness corresponding to that of one layer might adhere to a bottom surface of the laminated body. The adhering particles are removed by using an adhesive tape or an air blow as needed in a particle removing step 348 following to the peeling step 346. It is noted that the substrate 310 from which the thick film has been peeled is repeatedly used for the similar purpose since the substrate 310 is not easily deformed or deteriorated at the above-described sintering temperature. Where the sheet member 282 is independently formed as described above, the above-described connecting step 292 is implemented by providing a film substantially the same as the printed adhesive layer 337, on a surface of the sheet member 282 or a surface of the back face plate 258.

In the present embodiment in which the FED 250 is produced by fixing the back face plate 258 and the front face plate 256 which are superposed on each other, the sheet member 282 constituted by the dielectric layer 280 and the plurality of thick-film conductive layers disposed on the dielectric layer 280 is fixed to the back face plate 258 via the spherical spacers 286, whereby the gate electrodes 274 are provided between the emitters 278 and the anodes. 264. Since the sheet member. 282 is constituted by the dielectric layer 280 and the thick-film conductive layers (providing the gate electrodes 274) which are disposed on the surfaces of the dielectric layer 280, the sheet member 282 has a high mechanical property based on the dielectric layer 280. Thus, the sheet member 282 is given a sufficiently high mechanical strength, even if its thickness or the thickness of the thick-film conductive layers is adapted to be extremely small. Therefore, as compared with a case where the gate electrodes 274 are provided by sheet metals, the gate electrodes 274 of the sheet member 282 are less likely to be damaged, even if the thickness is reduced. Further, since the plurality of gate electrodes 274 are formed integrally with the dielectric layer 280 so as to constitute the sheet member 282 while being electrically insulated from each other, the gate electrodes 274 can be handled easier and positioned relative to each other with a higher accuracy, than where the gate electrodes are provided by respective conductive bodies which are independent of each other. It is thus possible to easily produce the FED 250 equipped with the gate electrodes 274 having a sufficiently small thickness and positioned relative to each other with a high accuracy. Further, since the sheet member 282 is fixed to the back face plate 258 provided with the emitters 278, via the spherical spacers 286, the gate electrodes 274 disposed on the sheet member 282 can be positioned in a constant height position relative to the back face plate 258, which position is dependent on the particle diameter of the spherical spacers 286 and its variation. Thus, it is possible to obtain the FED 250 in which the spacing distance G between the emitters 278 and the gate electrodes 274 is extremely small and uniform so that the electrons are easily and reliably controlled.

In the present embodiment, after the printed dielectric layer 332 and printed conductive layers 330, 334 have been formed in the predetermined patterns on the film formation surface which is constituted by the peel layer 316 having the melting point higher than the sintering temperature of the thick-film dielectric paste 328 and thick-film conductive paste 326, the printed dielectric layer 322 and printed conductive layers 330, 334 are subjected to the heat treatment at the temperature enabling them to be sintered, whereby the sheet member 282 in which the thick-film conductive layers providing the gate electrodes 274 are formed on the opposite surfaces of the dielectric layer 280 is formed. The peel layer 316, which is not sintered at the heat treatment temperature, converts into the particle layer 344 constituted by only the high-melting-point particles 342, as a result of burning of the resin. Therefore, the formed thick film is not fixed to the substrate 310, whereby the thick film can be easily peeled from the surface 312 of the substrate 310. This feature makes it possible to easily produce the sheet member 282 which constitutes the gate electrodes 274 and which is used in the production of the FED 250.

Figure 35:
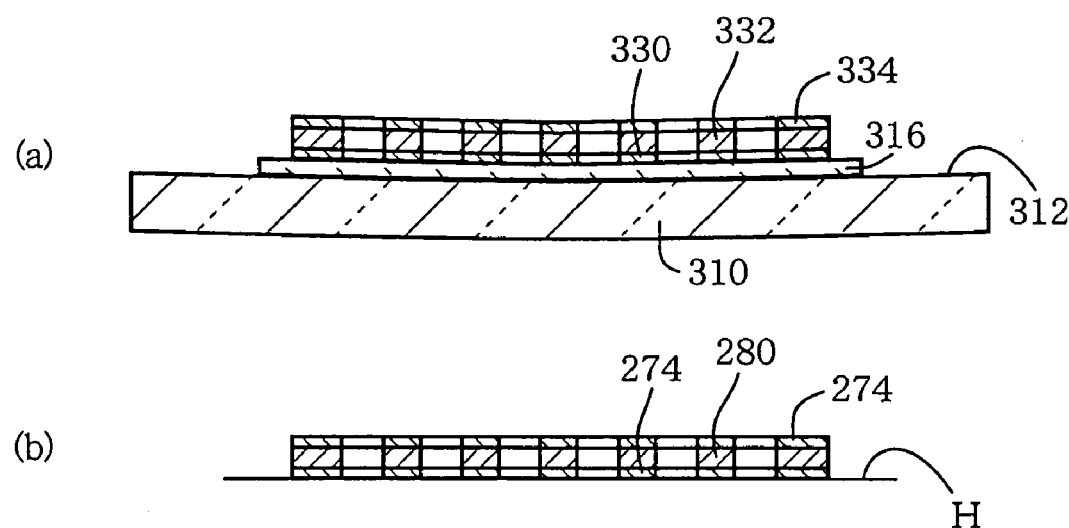
FIGS. 35(a),(b) are views for explaining an influence of warp of the substrate.

Further, in the present embodiment, the support body onto which the thick-film pastes 326, 328 are applied is constituted by the substrate 310 and the peel layer 316 formed on the surface of the substrate 310, so that the shape of the support body is maintained even after the heat treatment. This arrangement provides an advantage that the formed sheet member 282 can be handled easier than an arrangement in which the support body is constituted by only the peel layer 316. Further, since the peel layer 316 is interposed between the printed thick-film layers 330–340 and the substrate 310, the printed thick-film layers 330–340 are not bound by the substrate 310 during the heat treatment, it is not problematic even if the substrate 310 does not have high degrees of flatness and surface smoothness. For example, if the substrate surface 312 is warped to be concaved downwardly as shown in FIG. 35(a), the printed thick-film layers 330–334 are formed to be warped in conformity to the warped surface 312. However, where the formed thick film (sheet member 282) is thin enough to be flexible even after the firing, the sheet member 282 can be flattened, by putting the sheet member 282 onto a flat surface H as shown in FIG. 35(b). Further, where the substrate 310 has a low degree of surface smoothness, it is not problematic since the surface smoothness of the sheet member 282 is influenced by only a surface condition of the peel layer 316 which is in contact with the sheet member 282.

Further, in one form of the present embodiment, the printed adhesive layer 337, which includes the spherical spacers 286 and the glass frit sintered at the firing temperature of the sheet member 282, is formed in the portions of the printed dielectric layer 332 in which portions the printed conductive layers 334 are not formed, and the back face plate 258 provided with the emitters 278 is superposed on the substrate 310. After the back face plate 258 is superposed on the substrate 310, the firing step is implemented so that the dielectric layer 280 and the gate electrodes 274 are formed while at the same time the adhesive layers 287 are formed from the printed adhesive layers 337, whereby the back face plate 258 and the sheet member 282 are connected to each other through the adhesive layers 287. That is, the formation of the sheet member 282 and the connection of the sheet member 282 with the back face plate 258 are concurrently made, thereby advantageously reducing a number of times of the firing, as compared with a case where the formation and the connection are made in respective firing treatments.

Further, in the present embodiment, since the printed thick-film layers 330–334 are formed with the thick-film screen printing method, the formation can be made by a simple device without waste of large amount of material, thereby resulting in advantageous reduction in the producing cost.

Further, in the present embodiment in which the gate electrodes 274 are provided in the form of the sheet member 282, each of the gate electrodes 274 is given a heat capacity close to that of the back face plate 258 and that of the glass frit or the like serving for the connection, as compared with a case where each gate electrode is constituted by only a metallic material. Therefore, there is an advantage that the gate electrodes 274 are not easily deformed due to difference in the heat capacity even if the gate electrodes 274 are subjected to various heat treatments in the production process.

Further, in the present embodiment in which the film formation is made in the thick-film screen print method without a so-called wet process, there is also an advantage that waste water is easily treated. The wet process might cause a solution to penetrate into the film and remain in the film, thereby causing outgas after the formation of the vacuum vessel constituted by the mutually fixed front and back face plates 256, 258. For avoiding this, the component material has to have an increased heat resistance so that the evacuating step is implemented at a higher temperature or for a larger length of time. That is, it is necessary to take such a procedure that increases load in the process. Further, where the conductive layer such as the gate electrodes 274 are constituted by thick-film silver, there is also a problem of reduction in the reliability due to penetration or diffusion of the silver into the dielectric layer 280.

ELEVENTH EMBODIMENT

Figure 36:
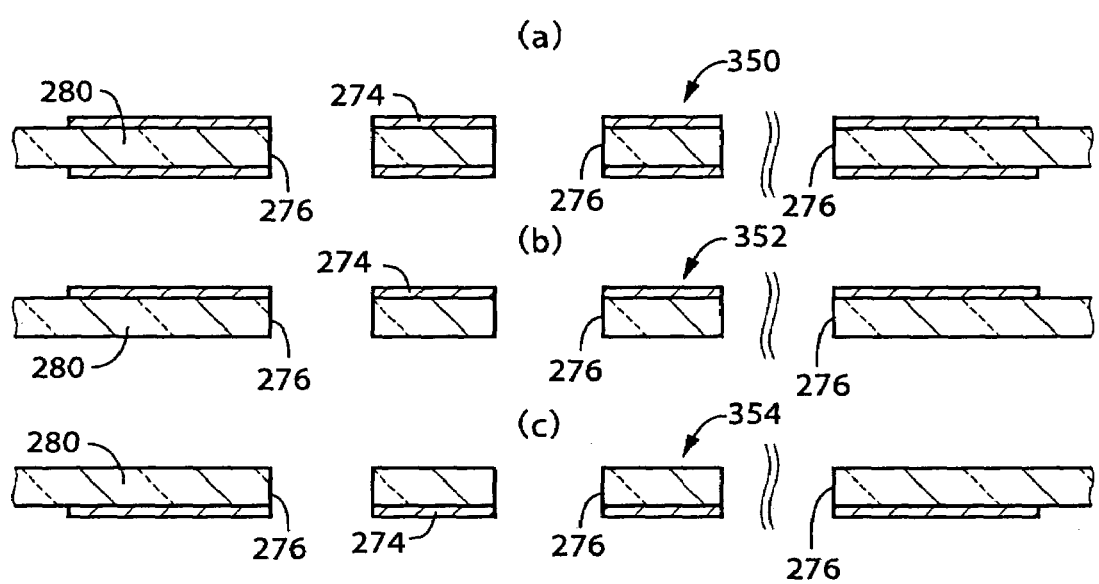
FIGS. 36(a)–(c) are cross sectional views for explaining other examples of the sheet member constituting the gate electrode.

FIGS. 36(a)–(c) are views for explaining other examples of film construction of the sheet member 282. In a sheet member 350 shown in FIG. 36(a), the thick-film conductive layer is not formed on the inner wall surface of each electron passing-through hole 276, so that the gate electrodes 274, i.e., the thick-film conductive layers provided on the opposite surfaces of the dielectric layer 280 are not connected to each other. In the production of such a sheet member 350, the formation of the upper printed conductive layer 334 as shown in FIG. 32(e) is made by application of the thick-film conductive paste 326 with use of the same screen 320 as in the formation of the printed conductive layer 330. In a sheet member 352 shown in FIG. 36(b), the gate electrodes 274 are provided on only the upper surface of the dielectric layer 280, i.e., one of its opposite surfaces close to the anodes 264. In a sheet member 354 shown in FIG. 36(c), the gate electrodes 274 are provided on only the lower surface of the dielectric layer 280, i.e., one of its opposite surfaces close to the emitters 278. The sheet members 352, 354 can be produced by omitting the steps shown in FIG. 32(e) and FIG. 32(c), respectively. Thus, the thick-film conductive layer can be formed to take a suitable configuration on the dielectric layer 280. It is possible to produce a cold-cathode display device substantially the same as the above-described FED 250, by using any one of the above-described sheet members 350–354 which can be selected depending upon its drive condition such as applied voltage and display area.

TWELFTH EMBODIMENT

Figure 37:
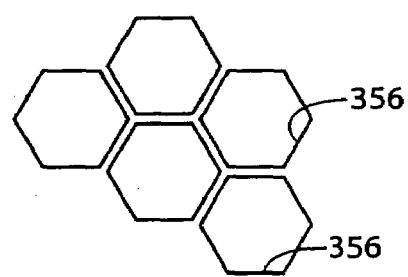
FIG. 37 is a view for explaining another example of shape of electron passing-through hole provided in the gate electrode.

FIG. 37 is a view showing another example of shape of each of the electron passing-through holes 276 formed though the gate electrodes 274. In the example shown in the figure, each electron passing-through hole 356 has a hexagonal shape. The plurality of electron passing-through holes 356 are arranged such that an outer periphery of each hole 356 is spaced apart from that of the adjacent hole 356 by a constant spacing distance. The hexagonal shape of the holes 356 advantageously provides a larger open area ratio than the circular shape of the holes 276. Since the dielectric layer 280 and the gate electrodes 274 are formed in the thick-film screen print method, the opening shape can be relatively freely determined. Thus, the opening shape may be suitably designed depending upon required electronic control functions.

THIRTEENTH EMBODIMENT

Figure 38:
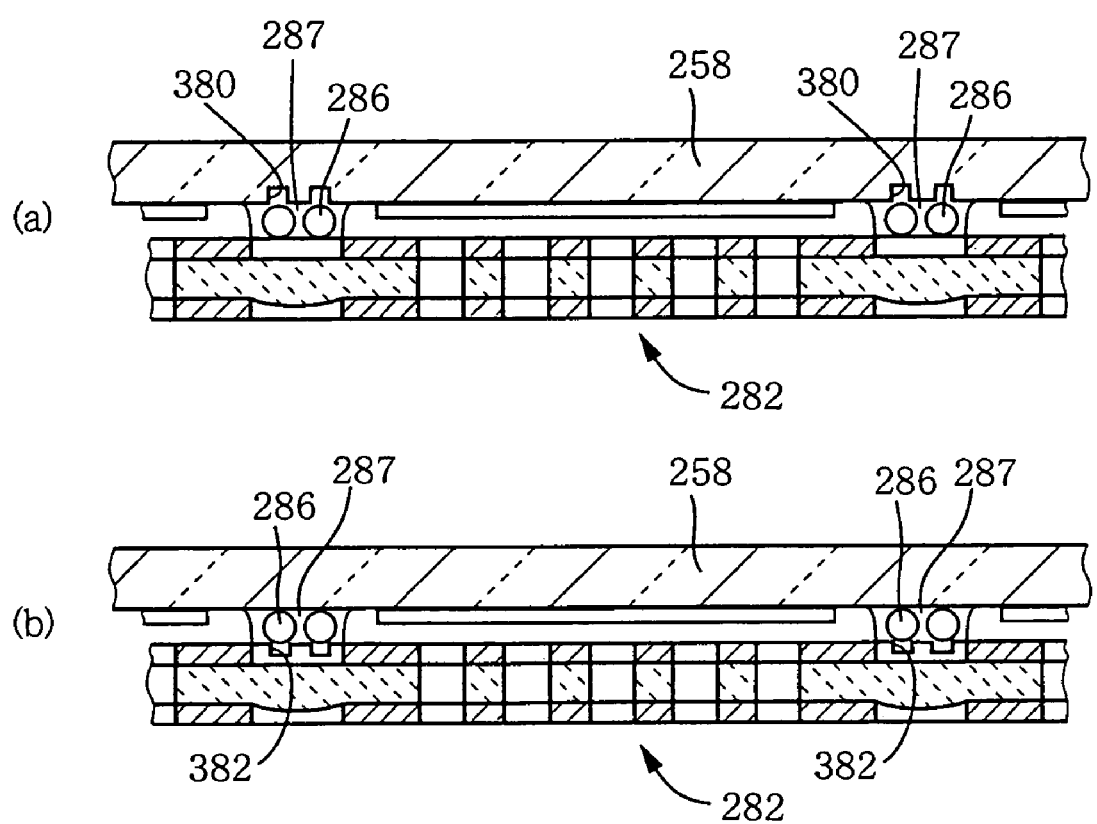
FIGS. 38(a),(b) are cross sectional views showing examples of construction in the connection of the sheet member and the back face plate.

FIGS. 38(a),(b) are cross sectional views showing examples of construction in the connection of the back face plate 258 and the sheet member 282. In the construction shown in FIG. 38(a), a recess 380 in the form of two slots is formed in each of portions of an inside surface of the back face plate 258 at which the back face plate 258 is connected with the sheet member 282. In the construction shown in FIG. 38(b), a recess 382 in the form of two slots is formed in each of portions of the sheet member 282 at which the sheet member 282 is connected with the back face plate 258. The recess 380 or 382 serves as a space for accommodating the glass frit which is melted upon connection of the sheet member 282 and the back face plate 258 with each other, so that a surplus portion of the glass frit is prevented from entering between the spherical spacer 286 and the back face plate 258 or sheet member 282, thereby advantageously avoiding loss or reduction of the function of the spherical spacer 286, namely, reduction of its function of controlling the spacing distance G. It is noted that both of the recess 380, 382 may be provided although one of the recesses 380, 382 is provided in the examples shown in the figures. Further, while each of the recesses 380, 382 takes the form of two slots whose cross sections are shown in the figures, each of the recesses 380, 382 may be provided by one slot or at least three slots which are parallel with each other, or may be provided by sprinkled circular or rectangular recesses.

FOURTEENTH EMBODIMENT

Figure 39:
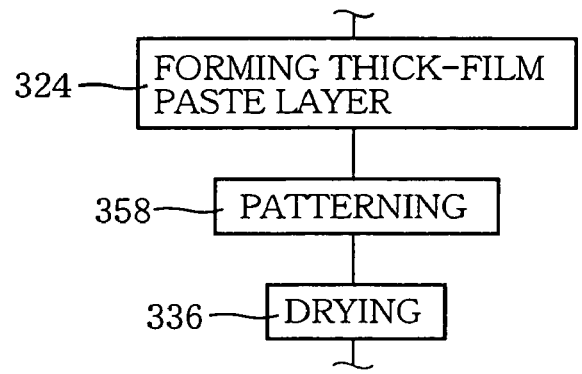
FIG. 39 is a process chart for explaining another producing method of producing the sheet member shown in FIG. 29, to which method the producing method according to the fifth invention is applied.
Figure 40:
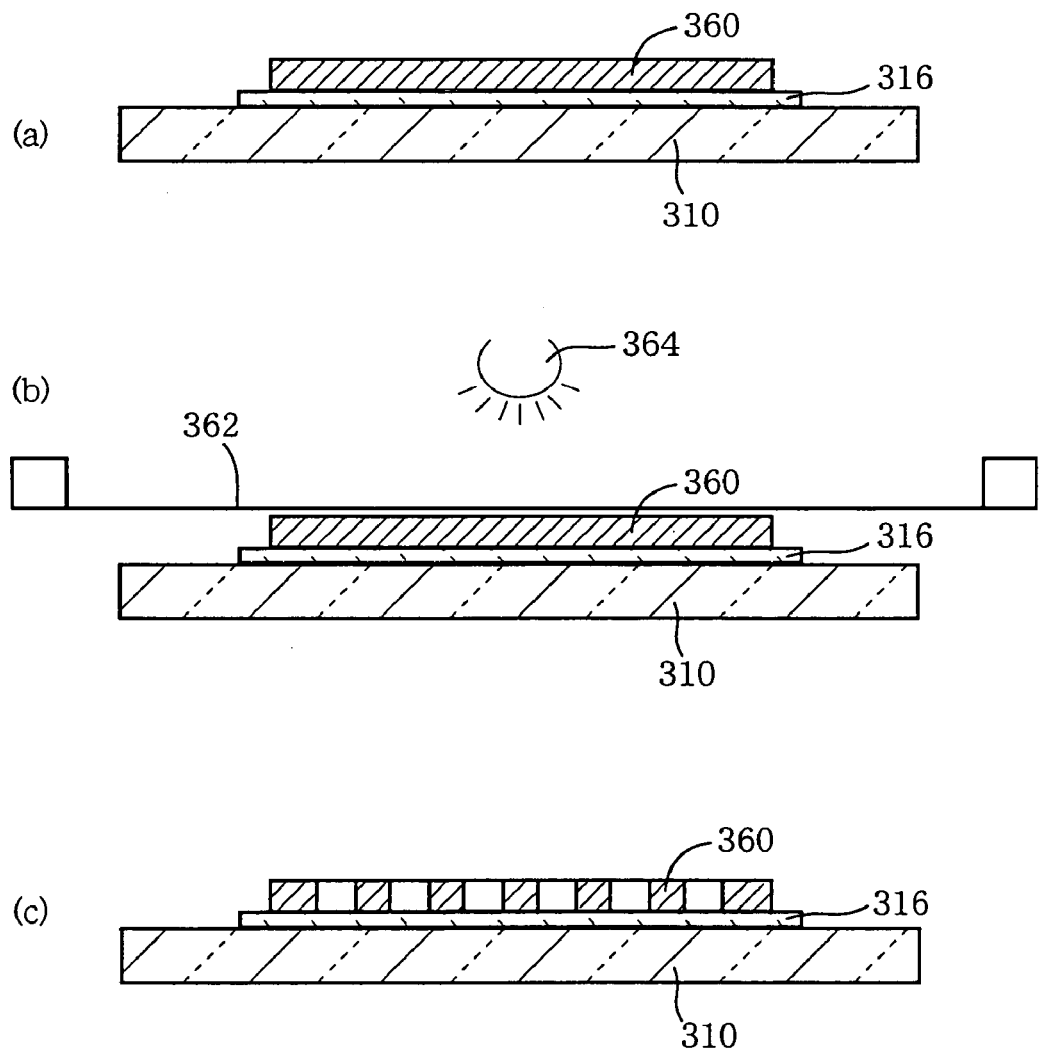
FIGS. 40(a)–(c) are views showing states of the thick film in main stages of the production process of FIG. 39.

FIGS. 39 and 40 are a process chart for explaining still another example of the method of producing the sheet member, and a view illustrating main stages of the producing method, respectively. In the present embodiment, a patterning step 358 is provided between the thick-film-paste-layer forming step 324 and the drying step 336. FIG. 40(a) is a view showing a state after implementation of the thick-film-paste-layer forming step 324. As shown in this figure, a thick-film paste layer (printed conductive layer or printed dielectric layer) 360 is formed in a simple solid form without being particularly patterned. The thick-film paste layer 360 is constituted by a photosensitive resin, and is formed with, for example, a coater, film laminate or the like.

In the subsequent patterning step 358, the thick-film paste layer 360 is subjected to an exposure treatment by using an exposure mask 362 having a predetermined pattern, and is then subjected to a washing or other processing. FIG. 40(b) shows a state during the exposure treatment. The reference sign 364 denotes an exposure lamp in the figure. FIG. 40(c) shows a state after the processing or patterning. Then, the drying step 336 and other steps following to the drying step 336 are implemented, whereby a sheet member which is substantially the same as the thick-film sheet member 282 is obtained. Thus, the fifth invention is applicable also to such a method in which the patterning is effected, independently of the application of the thick-film paste, depending upon required configuration and dimensional and configurational accuracies of the gate electrodes 274. The layers (e.g., dielectric and conductive layers) made of plural kinds of materials and constituting the sheet member 282 can be formed by applying the respective pastes, or by laminating the sheets, and the formed layers can be simultaneously subjected to exposure and development treatments, This arrangement advantageously eliminates a cumbersome positioning operation and facilitates a finer patterning.

FIFTEENTH EMBODIMENT

Figure 41:
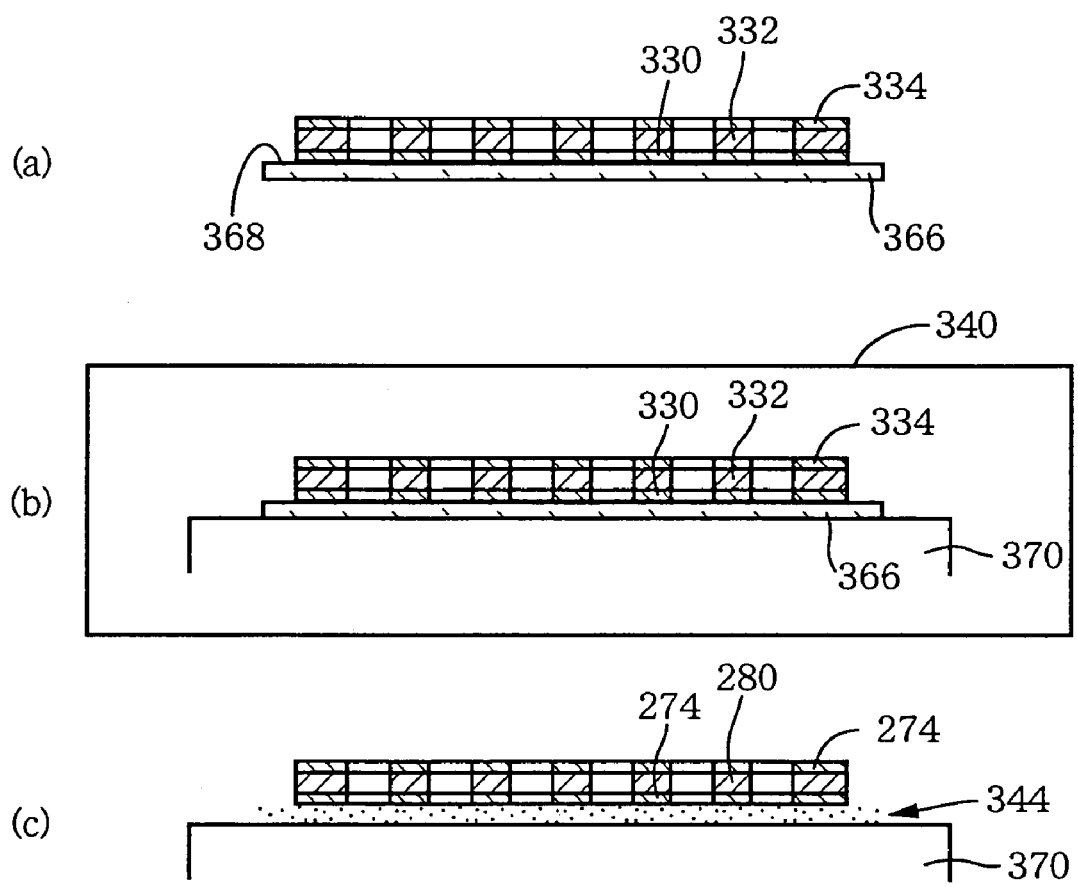
FIGS. 41(a)–(c) are views showing states of the thick film in main stages of the production process according to another embodiment of the fifth invention.

FIGS. 41(a)–(c), corresponding to FIGS. 32(e) and 33, are views for explaining a case where a raw ceramic sheet 366 is used as the support body. In the present embodiment, the printed dielectric layer 332 and printed conductive layers 330, 334 are formed by applying the thick-film paste onto a surface 368 of the raw ceramic sheet 366. The raw ceramic sheet 366 on which the printed layers 330–334 are disposed is introduced into the furnace chamber 340, so that the raw ceramic sheet 366 is subjected to a firing treatment while being mounted on a setter 370. As a result of the firing treatment, the thick-film sheet (the dielectric layer 280 and gate electrodes 274) is mounted on the setter 370 with the particle layer 344 being interposed between the thick-film sheet and the setter 370. As long as there is no particular problem as to the surface state and reactivity of the setter 370, the sheet member 282 can be thus produced. Needless to say, it is also possible to fire the raw ceramic sheet 366 by mounting the ceramic sheet 366 on the substrate 310 or the like. While the figures show a case where the sheet member 282 is prepared independently of the provision of the printed adhesive layer 337, the above-described method is equally applicable to a case, as shown in FIGS. 33(f)–(i), where the sheet member 282 is connected to the back face plate 258 simultaneously with refining of the sheet member 282.

In the above-described tenth through fifteenth embodiments, the present invention is applied to the FED 250 in which each emitter 278 is constituted by the CNT. However, the present invention is equally applicable for also other cold-cathode display devices equipped with Spindt-type, Pencil-type or other emitters having various shapes, as long as each of the other cold-cathode display devices requires the gate electrodes 274 to be disposed between the emitters 278 and the anodes 264.

While the FED 250 shown in FIG. 27 and other figures is of a type equipped with the three-color fluorescent layers 266 to achieve full-color display, the fourth and fifth inventions are equally applicable to a FED equipped with a single-color or two-color fluorescent layers.

While the thickness of the sheet member 282 is adapted to be about 50 (μm) in the embodiment shown in FIGS. 27–29 and other figures, the thickness of the sheet member 282 may be suitably changed depending upon, for example, the spacing distance between the anodes 264 and the emitters 278 and the required mechanical strength. The thickness of the sheet member 282 can be changed by changing the thickness of the conductive layers (gate electrodes 274) and/or the thickness of the dielectric layer 280 depending upon the required degree of conductivity and thickness. The thickness of the dielectric layer 280, the thickness of the conductive layers and the entire thickness of the sheet member 282 are preferably changed in view of fact that the mechanical strength is increased with an increase of the thickness of the dielectric layer 280 and that the conductivity is increased with an increase of the thickness of the conductive layers.

The sheet member 282 having the conductive layers serving as the gate electrodes 274 is fixedly disposed on the back face plate 258 in the embodiment shown in FIG. 28 and other figures. However, the sheet member 282 may be fixedly disposed on either of the front and back face plates 256, 258, as long as the sheet member 282 is fixed in a predetermined position between the front and back face plates 256, 258, since the sheet member 282 is provided for disposing the gate electrodes 274 in a height position between the emitters 278 and the anodes 264.

SIXTEENTH EMBODIMENT

Figure 42:
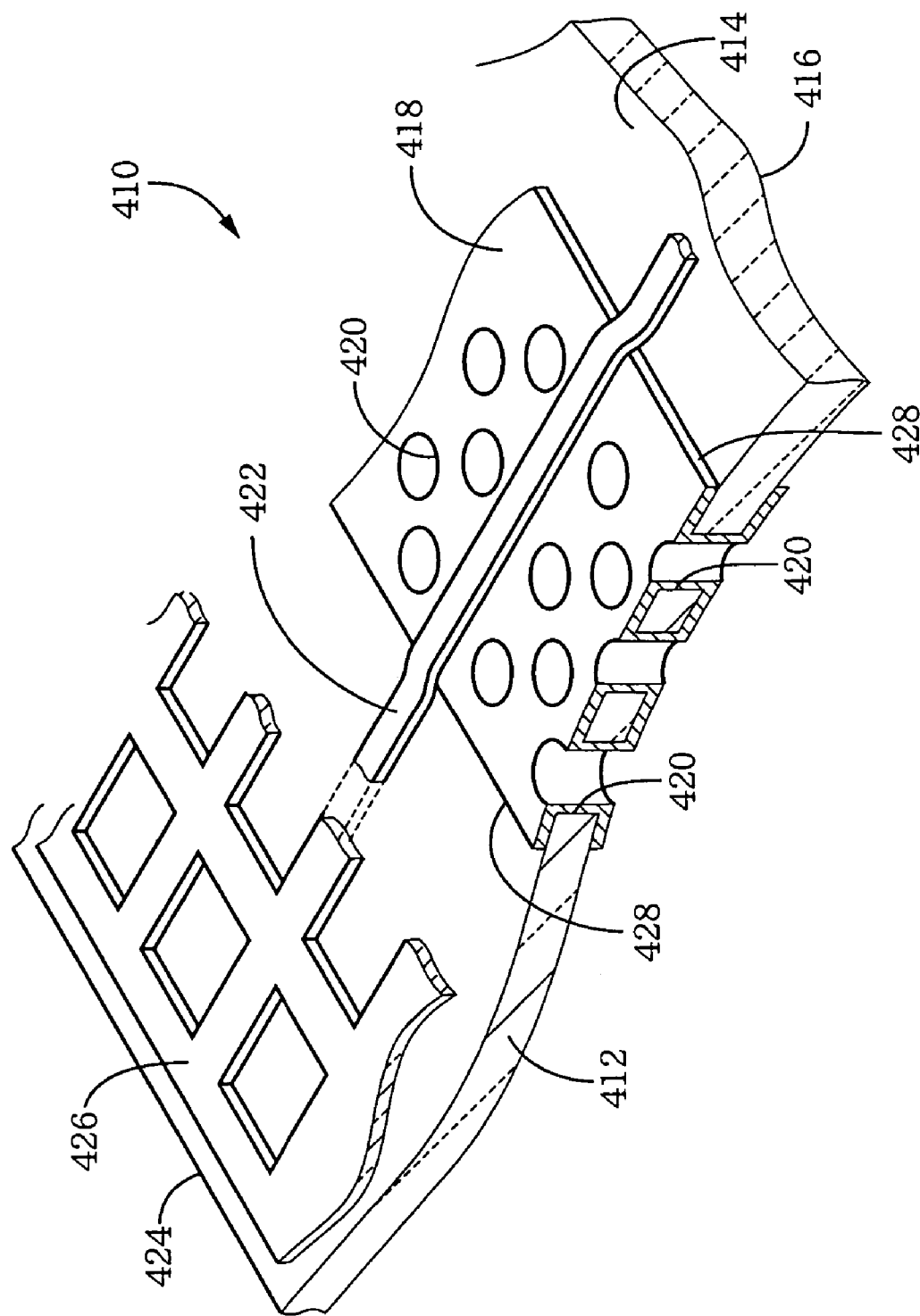
FIG. 42 is a perspective view showing a thick-film sheet according to one embodiment of a second invention.

FIG. 42 is a perspective view showing a main part of a thick-film sheet 410 as one example to which a thick-film sheet member of a second invention is applied. The thick-film sheet 410 shown in the figure is a rectangular thin plate member which has a thickness of about 50 (μm) and a size of about 320×430 (mm). The thick-film sheet 410 is equipped with a dielectric core body (dielectric layer) 412 provided by a thin plate, and conductive layers 418 fixedly laminated on a part of its surface, for example, in the same position of respective upper and lower surfaces 414, 416 of the core body 412. This thick-film sheet 410 is used, for example, for constituting gate electrodes of a FED as described below.

The dielectric core body 412 is constituted, for example, by thick-film dielectric material which includes a low-softening-point glass having a main component in the form of $PbO$—$B_2O_3$—$SiO_2$ and a ceramic filler such as alumina and zirconia, such that the dielectric core body 412 has a thickness of about 20–50 (μm). The dielectric core body 412 has a multiplicity of through-holes 420 which pass therethrough in its thickness direction and which are arranged with a suitable spacing distance therebetween. An opening diameter of each through-hole 420 is, for example, about 100 (μm). The spacing distance between each pair of adjacent holes 420 is, for example, about 150 (μm).

Each of the conductive layers 418 is formed from thick-film conductive material such as thick film silver, and is given a substantially constant thickness of about 7–10 (μm). The conductive layer 418 is formed also in an inner wall surface of each through-hole 420, with the above-described substantially constant thickness, so that a surface of the dielectric core body 412 is covered with the conductive layer 418.

On the conductive layers 418, there are fixedly disposed belt-like reinforcing layers 422 each of which continuously extends and straddles boundaries between the conductive layers 418 and exposed portions of the dielectric core body 412. The belt-like reinforcing layers 422 are disposed directly on a surface of the dielectric core body 412, or disposed on the surface of the dielectric core body 412 via the conductive layers 418. Each of the belt-like reinforcing layers 422 is made of a dielectric material which is substantially the same as that of the dielectric core body 412, or a thick-film dielectric material which is adapted to be softened in a lower temperature range, by using a glass whose composition is adjusted to lower its softening point, or by reducing an amount of ceramic filler as an additive. Each of the belt-like reinforcing layers 422 has a width of about 100 (μm) and a thickness of about 10–20 (μm), and is positioned such that the belt-like reinforcing layers 422 do not intersect with the multiplicity of through-holes 420 which are formed through the dielectric core body 412. The width of each belt-like reinforcing layer 422 is adapted to be small as described above, in the interest of avoiding intersection of the reinforcing layers 422 with the through-holes 420. While FIG. 42 shows the belt-like reinforcing layers 422 disposed on the upper surface 414 of the dielectric core body 412, the belt-like reinforcing layers 422 may be disposed also on the lower surface 416 of the dielectric core body 412. In the present embodiment, each of the belt-like reinforcing layers 422 corresponds to a boundary-portion-reinforcing dielectric body.

A reinforcing layer 426 having a lattice shape is disposed in a peripheral portion of the surface of the dielectric core body 412, such as a portion close to a side 424 located in an upper part as seen in FIG. 42, on which the conductive layers 418 are not disposed. This lattice-shaped reinforcing layer 426 is made of the same material as the belt-like reinforcing layers 422, and has a thickness of about 10–20 (μm). The belt-like reinforcing layers 422 and the lattice-shaped reinforcing layer 426 lie on the same plane, and are mutually connected at their respective connection portions which are positioned to be distant from the conductive layers 418, namely, which are positioned on the dielectric core body 412. That is, the belt-like and lattice-shaped reinforcing layers 422, 426 constitute respective portions of a reinforcing layer disposed on the dielectric core body 412. It is noted that the lattice-shaped reinforcing layer 426 also may be disposed on the lower surface 416 of the dielectric core body 412. In this case, too, the lattice-shaped reinforcing layer 426 is formed to be contiguous to the belt-like reinforcing layers 422.

As described above, the thick-film sheet 410 is a composite member consisting of a plurality of materials. i.e., the thick-film dielectric material and thick-film conductive material which are laminated on each other. However, the conductive layers 418 and the dielectric core body 412 do not suffer from any crack even in their boundary portions such as a portion close to an end portion 428 of each conductive layer 418.

Figure 43:
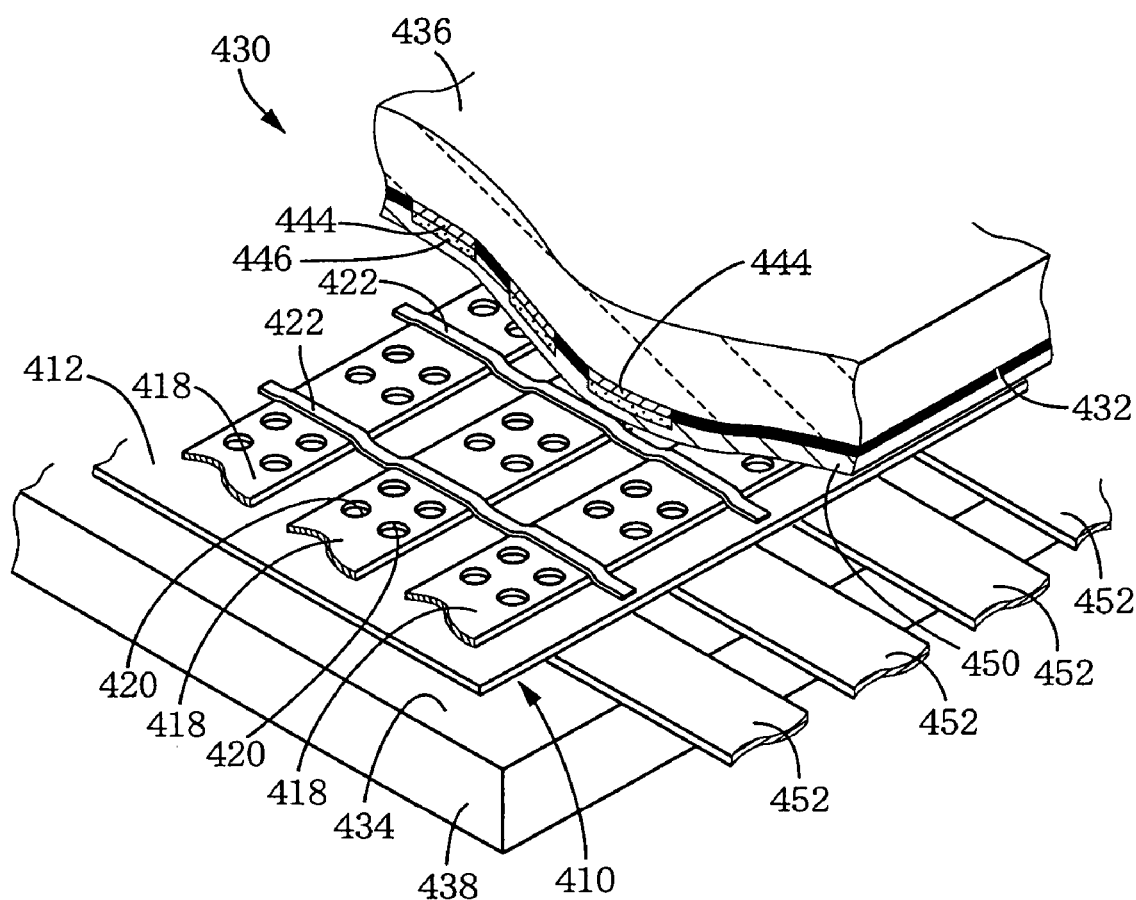
FIG. 43 is a perspective view partially in cross section of FED to which the thick-film sheet of FIG. 42 is applied.

FIG. 43 is a view for explaining a construction of a FED 430 in which the above-described thick-film sheet 410 is used for constituting gate electrodes. The FED 430 is equipped with front and back face plates 436, 438 which are substantially identical with each other in size and shape and which are disposed in parallel with each other with a predetermined spacing distance therebetween such that their respective substantially flat surfaces 432, 434 are opposed to each other. The front and back face plates 436, 438 are gas-tightly sealed at their respective peripheral portions, whereby a gastight space is formed in their inside. The thick-film sheet 410 is provided between the front and back face plates 436, 438, so that the conductive layers 418 of the thick-film sheet 410 constitute the gate electrodes for controlling electrons. It is noted that the plurality of belt-like reinforcing layers 422 are arranged in parallel with each other with a constant spacing distance therebetween although only one of the reinforcing layers 422 is shown in FIG. 42. Each of the belt-like reinforcing layers 422 is provided by a plurality of portions which straddle the respective gate electrodes 418 and which are contiguous to each other in a direction perpendicular to a longitudinal direction of the gate electrodes 418. It is also noted that the lattice-shaped reinforcing layer 426 is not illustrated in FIG. 43. The gastight space is adapted to be evacuated have a reduced pressure of about $6.7 \times 10^{-5}$ (Pa) [$5 \times 10^{-7}$ (Torr)].

Each of the front and back face plates 436, 438 is provided by a translucent substrate which is constituted by, for example, soda lime glass, high-distortion-point glass or the like having a softening point of about 600 (° C.), and has an outside dimension of about 800×500 (mm) and a substantially constant thickness of about 3 (mm). The spacing distance between the plates 436, 438 is set to be about 1–2 (mm). The dielectric core body 412 constituting the thick-film sheet 410 is made of such a material having substantially the same coefficient of thermal expansion as the substrates 436, 438 made of the soda lime glass.

On the surface 432 (opposed to the back face plate 438) of the front face plate 436, there are disposed a plurality of stripe-like transparent anodes 444. Each of the stripe-like transparent anodes 444 is formed from ITO (indium tin oxide) or the like, and extends along a predetermined direction. On surfaces of the respective anodes 444, fluorescent layers 446, each adapted to emit a light having one of three colors, i.e., R (red), G (green) and B (blue), are disposed, such that R, G and B are repeatedly arranged in this order as viewed in a direction perpendicular to the predetermined direction. Each of the fluorescent layers 446 is divided into mutually independent sections which are arranged in a longitudinal direction of the anodes 444, i.e., in the above-described predetermined direction such that each section corresponds to a unit of the light emission. Each anode 444 is formed by sputtering or other thin-film forming method, so as to have a thickness of about 1 (μm) and a relatively high degree of electric conductivity with a sheet resistivity of about 10 ($\Omega/\square$) or less. Each fluorescent layer 446 is constituted by material such as ZnO:Zn, ZnS:Ag+ $In_2O_3$ which emits a visible light through an electron beam, and is formed by a thick-film screen printing method or the like to have a thickness of about 10–20 (μm) whereby the fluorescent layer 446 is given a certain degree of electric conductivity corresponding to an area resistivity of about 500 ($\Omega/cm^2$) or less.

Figure 44:
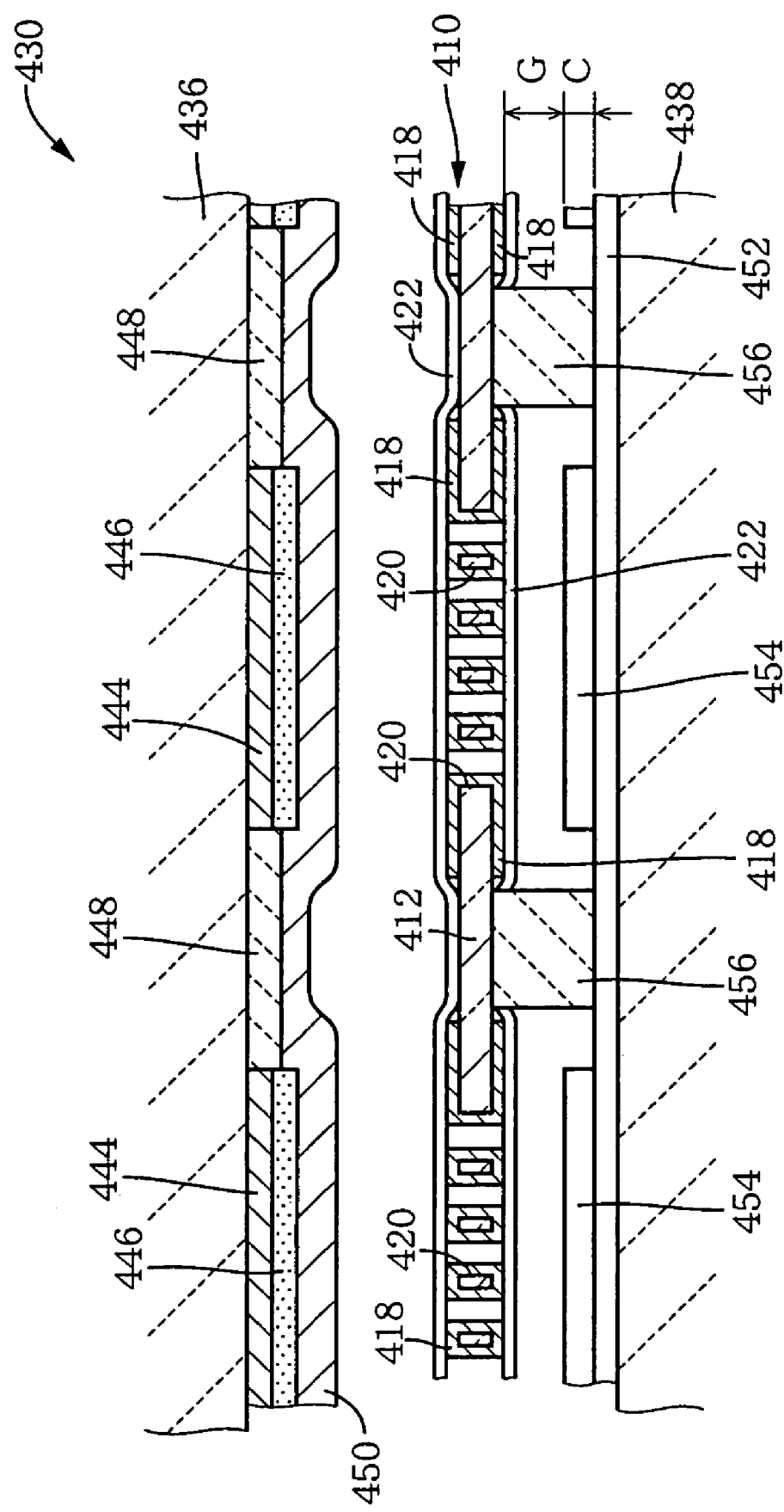
FIG. 44 is a view for explaining constriction in a cross section of the FED of FIG. 43.

FIG. 44 is a view showing in enlargement a cross section of the FED 430. A black matrix (black mask) 448, which consists of a glass including black pigment, is provided in portions of the surface 432 of the front face plate 436 in which portions the fluorescent layers 446 are not disposed, such that the black matrix 448 has a thickness of about 15–20 (μm). The fluorescent layers 446 and the black matrix 448, cooperating to cover the entirety of the surface 432 of the front face plate 436, are covered at their surfaces with a metal back 450 which is formed to profile surface contours of the fluorescent layers 446 and the black matrix 448 and have a thickness of about 100–200 (μm). The black matrix 448 is formed, by a thick-film screen printing method or the like, in a lattice so as to bridge each adjacent pair of the fluorescent layers 446 which are arranged in a matrix. Where the fluorescent layers 446 are formed to have stripe-like shapes, the black matrix 448 is replaced by a black mask which consists of a plurality of stripe-like portions. In this case, the stripe-like-shaped fluorescent layers 446 and the plurality of stripe-like portions of the black mask are alternately arranged. The metal back 450 is formed, for example, by deposition of aluminum thin film, and has a relatively smooth surface and such a thickness that enables electrons to be easily transmitted therethrough.

As show in FIGS. 43 and 44, on the surface 434 (opposed to the front face plate 436) of the back face plate 438, there are disposed a plurality of cathode electrodes 452, such that the cathode electrodes 452 perpendicularly intersect with the conductive layers of the thick-film sheet 410, i.e., the gate electrodes 418 and are electrically insulated from the gate electrodes 418. The cathode electrodes 452 and the gate electrodes 418 are positioned relative to each other such that the above-described through-holes 420 are positioned in intersections of the cathode and gate electrodes 452, 418. The through-holes 420 serve as electron passing-through holes (gate holes), so that the electrons, emitted from emitters (cold cathode) 454 which are disposed on the cathode electrodes 452, pass through the holes toward the fluorescent layers 446. Each of the gate holes 446 has an opening diameter which is determined based on a trade-off relationship between an electron emission effect and an emission area (open area ratio), and which is set to be about 100 (μm) in the present embodiment wherein a dot size of the holes 446 is about 3 (mm).

Each cathode electrode 452 is made of gold (Au), thick-film silver or other conductive material which is formed by a thin film processing such as sputtering or a thick film processing such as printing. Each emitter 454 is provided by a mass of a multiplicity of nanotubes (CNT) which are oriented toward the gate electrodes 418, and has a thickness C of about 20 (μm). A distance G between the emitters 454 and gate electrodes 418 is about 27–30 (μm). It is noted that each emitter 454 may be provided by also a so-called "Spindt-type" cone-shaped cold cathode made of molybdenum (Mo) and having a height of about 1 (μm).

It is noted that the thick-film sheet 410 is supported, at its portions at which the conductive layers 418 are not fixed, by spacers 456, so that the gate electrodes 418 are positioned in a predetermined height position distant from the emitters 454. Each of the spacers 456 has a thickness of about 20–50 (μm).

As described above, in the present embodiment, the plurality of gate electrodes 418 are respectively provided by the plurality of thick-film conductively layers of the thick-film sheet 410. Since the thick-film sheet 410 is constituted by the dielectric core body 412 and the gate electrodes 418 which are disposed on the surfaces of the dielectric core body 412, the thick-film sheet 410 has a high mechanical property based on the dielectric core body 412. Thus, the thick-film sheet 410 is given a sufficiently high mechanical strength, even if its thickness or the thickness of the gate electrodes 418 is adapted to be extremely small. Therefore, as compared with a case where the gate electrodes 418 are provided by sheet metals, the gate electrodes 418 of the thick-film sheet 410 are less likely to be damaged, even if the thickness is reduced. Further, since the plurality of gate electrodes 418 are formed integrally with the dielectric core body 412, the gate electrodes 418 can be positioned relative to each other with a higher accuracy, than where the gate electrodes are provided by respective conductive bodies which are independent of each other.

The FED 430 constructed as described above is activated by respectively applying predetermined amounts of voltages as a signal voltage and a scan voltage to the cathode electrodes 452 and the gate electrodes 418, so that electrons are emitted from the emitters 454 as a result of field emission caused based on a large voltage gradient between the cathode electrodes 452 and the gate electrodes 418. With a predetermined amount of positive voltage being applied to the anodes 444 which are disposed on the front face plate 436, the electrons are driven to fly toward the anodes 444 through the electron passing-through holes 420. The electrons then strike the fluorescent layers 446 disposed on the anodes 444, so that the stricken fluorescent layers 446 emit light. In this instance, the electrons, which are emitted from the emitters 454 and attracted by the anodes 444, pass through the metal back 450 and then strike fluorescent bodies of the fluorescent layers 446. Although the fluorescent layers 466 are covered with the metal back 450, the metal back 450 is provided by the thin film formed by the deposition and having such a thickness that enables the electrons to be easily transmitted therethrough, as described above. The light generated in the fluorescent layers 446 advances in a direction toward the back face plate 438 as well as in a direction toward the front face plate 436. The light advancing in the direction toward the back face plate 438 is reflected by the metal back 450, so as to advance in the opposite direction, i.e., in the direction toward the front face plate 436. Thus, almost all the emitted light is transmitted through the front face plate 436 so as to be ejected through the front face plate 436, thereby making it possible to increase the emission efficiency. The light emission of the fluorescent layers 446 is not observed from the side of the back face plate 438. The FED 430 thus constitutes a so-called transmission-type display device in which the light transmitted through the fluorescent layers 446 is observed from the side of the front face plate 436.

In the activation of the FED 430, the gate electrodes 418 are heated, by drive currents passing therethrough, to have an elevated temperature, whereby the gate electrodes 418 are thermally expanded. In this instance, owing to the provision of the belt-like reinforcing layers 422 which straddle the boundaries between the gate electrodes 418 and the dielectric core body 412 in the present embodiment, the FED 430 does not suffer from crack of the dielectric core body 412 and other components during its activation, although the dielectric core body 412 made of the thick-film dielectric material and the gate electrodes 418 made of the thick-film conductive material are different in coefficient of thermal expansion from each other. That is, the crack due to the difference in the coefficient of thermal expansion is advantageously prevented by the belt-like reinforcing layers 422.

Figure 45:
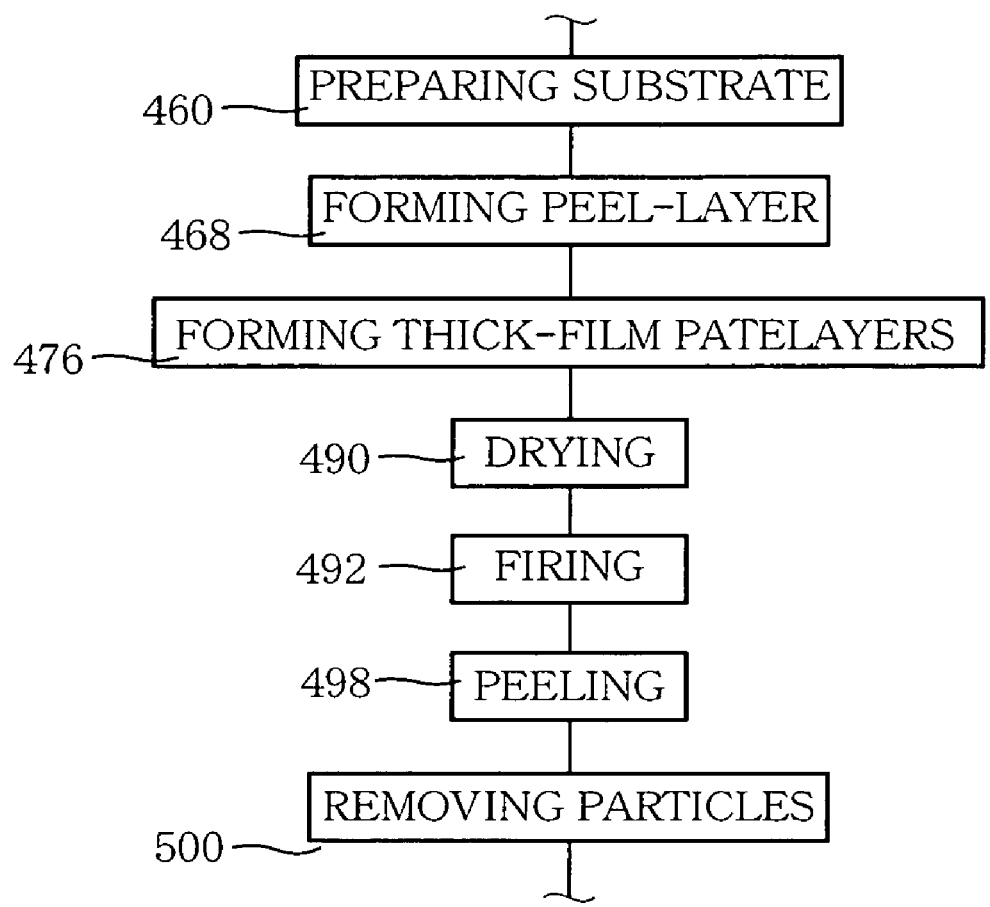
FIG. 45 is a process chart for explaining a method of producing the thick-film sheet of FIG. 42.

The above-described thick-film sheet 410 is produced in accordance with a process shown in FIG. 45 to which a conventionally known thick-film printing technique is applied. There will be described a method of producing the thick-film sheet 410, with reference to FIGS. 46(a)–(f) which represent states in main stages of the production process.

The process is initiated with a substrate preparing step 460 implemented to prepare a substrate 462 (see FIG. 46) which is to be subjected to a thick-film printing, and then effect a suitable cleaning treatment on a surface 464 of the substrate 462. This substrate 462 is provided by a member which does not suffer from considerable deformation and deterioration in a heat treatment which is described below. For example, it is preferable to use, as this substrate 462, a glass substrate or the like such as soda lime glass which has a coefficient of thermal expansion of about $85 \times 10^{-7}$(/° C.), a softening point of about 740(° C.) and a distortion point of about 510(° C.). It is noted that the substrate 462 has a thickness of about 3 (mm) and that its surface 464 has a size which is sufficiently larger than the above-described thick-film sheet 410.

Figure 46:
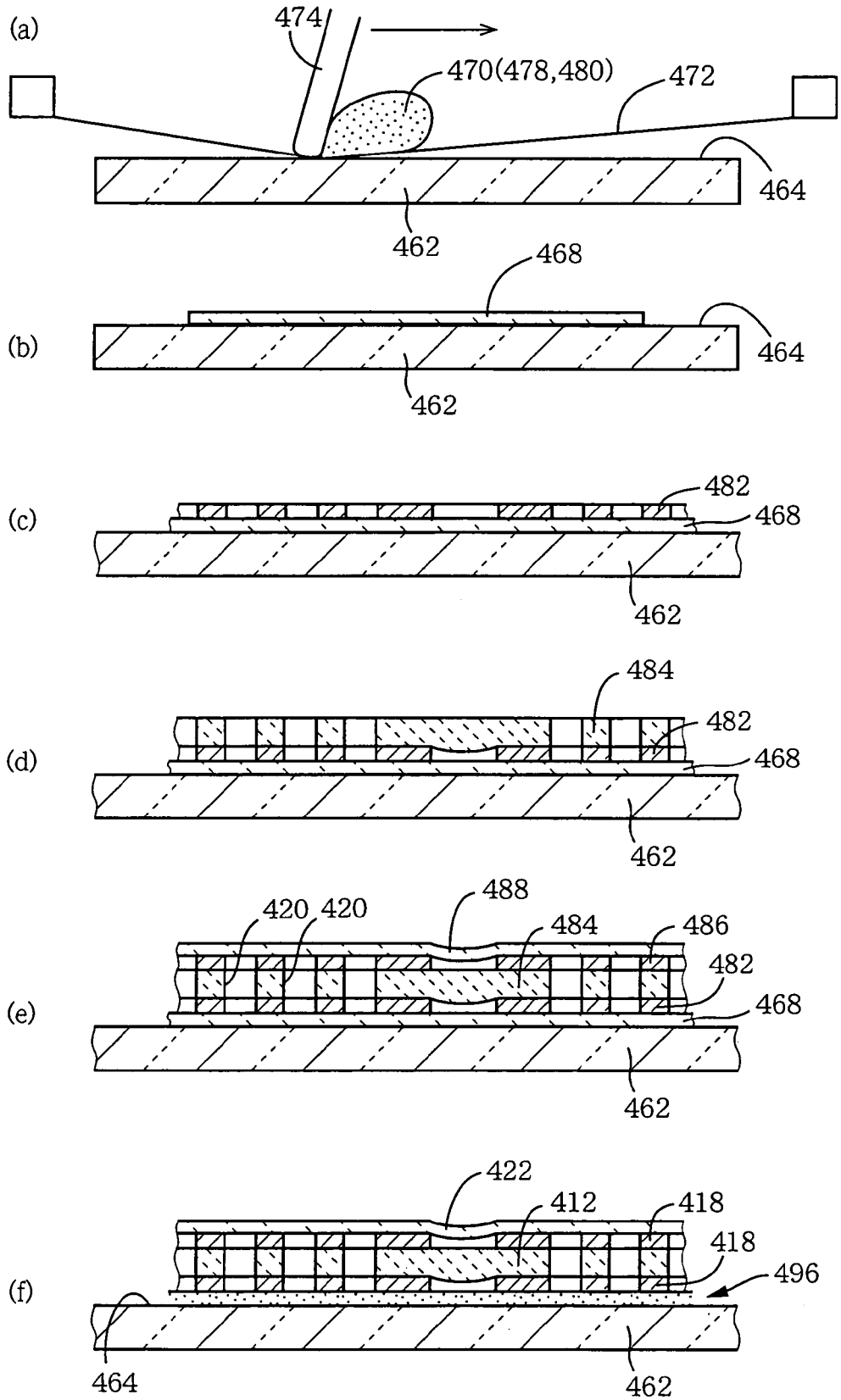
FIGS. 46(a)–(f) are views showing states of the substrate and thick film in main stages of the production process of FIG. 45.

A peel-layer forming step 466 is then implemented to dispose a peel layer 468 constituted by high-melting-point particles which are bonded together with a resin, on the surface 464 of the substrate 462 such that the peel layer 468 has a thickness of about 5–50 (μm). The high-softening-point particles are provided by a mixture of high-softening-point glass frit whose average particle size is about 0.5–3 (μm) and ceramic filler such as alumina and zirconia whose average particle size is about 0.01–5 (μm). The high-softening-point glass has a softening point of about 550(° C.) or higher. The high-melting-point particles consisting of the mixture has a softening point of about 550(° C.) or higher. The resin is provided by ethyl cellulose resin or the like which is burnt at about 350(° C.). The peel layer 468 is disposed on the surface 464 of the substrate 462, for example, by applying an inorganic material paste 470 which is constituted by the above-described high-melting-point particles and resin which are dispersed in an organic solvent such as butyl carbitol acetate (BCA), onto substantially the entire surface of the substrate 462 with a screen printing method as shown in FIG. 46(*a*), and then drying the applied paste 470 at a room temperature. However, the peel layer 468 may be disposed on the surface 464 of the substrate 462, by sticking a coater or film laminate onto the surface of the substrate 462. FIG. 46(*b*) shows a stage in which the peel layer 468 is formed as described above. It is noted that reference signs 472 and 474 denote a screen and a squeegee, respectively, in FIG. 46(*a*). In the present embodiment, the substrate 462 provided with the peel layer 468 corresponds to a support body. A surface of the peel layer 468 corresponds to a film formation surface. The substrate preparing step 460 and peel layer forming step 466 correspond to a support-body preparing step.

A thick-film-paste-layer forming step 476 is then implemented to sequentially apply a thick-film dielectric paste 478 forming the above-described dielectric core body 412 and reinforcing layers 422, 426 and a thick-film conductive paste 480 forming the above-described gate electrodes (conductive layers) 418, in predetermined patterns on the peel layer 468, in the same manner as the application of the inorganic material paste 470, namely, with the screen printing method (see FIG. 46(*a*)). The thick-film dielectric paste 478 is constituted by dielectric material powders such as alumina and zirconia, glass frit and resin which are dispersed in an organic solvent. The thick-film conductive paste 480 is constituted by conductive material powders such as silver powders, glass frit and resin which are dispersed in an organic solvent. As the glass frit, for example, PbO—$B_2O_3$—$SiO_2$ based material or PbO—$B_2O_3$—$SiO_2$—$Al_2O_3$—$TiO_2$ based material is used. As the resin and solvent, for example, material similar to the inorganic material paste 470 is used. FIGS. 46(*c*)–(*e*) are views showing stages in which a printed conductive layer 482 forming ones of the conductive layers 418 disposed on the lower surface 416 of the dielectric core body 412, a printed dielectric layer 484 forming the dielectric core body 412, a printed conductive layer 486 forming ones of the conductive layers 418 disposed on the upper surface 414 of the dielectric core body 412, and a printed dielectric layer 488 forming the reinforcing layers 424, 426 are sequentially laminated. (Hereinafter, the layers 482–488 are referred to as printed thick-film layers 482–488 where they do not have to be distinguished from each other). In the present embodiment, the printed thick-film layers 482–488 correspond to paste films (dielectric paste film and conductive paste film).

In FIG. 46(*e*), the printed conductive layer 486 and the printed conductive layer 482 are illustrated as if they had the same configuration. However, for covering the inner wall surfaces of the through-holes 420 with the conductive layers 418, as described above, it is necessary to allow the thick-film conductive paste 480 to flow down along the inner wall surfaces of the through-holes 420. To this end, the printed conductive layer 486 disposed on the upper side of the printed dielectric layer 484 is formed by using the screen 472 having such an aperture pattern that permits the thick-film conductive paste 480 to be applied also on a small area positioned on a radially inner side of the inner wall surface of each through-hole 420. In this instance, if the thick-film conductive paste 480 used for the formation of the printed conductive layer 482 does not provide a fluidity sufficient for the formation of the printed conductive layer 486, it is preferable to use a paste in which the particle size of the conductive particles is reduced or the amount of the solvent is increased, for the formation of the printed conductive layer 486.

After the printed thick-film layers 482–488 have been formed as described above, a drying step 490 is implemented to dry the layers so as to remove the solvent. The drying step 490 is followed by a firing step 492 in which the substrate 462 is disposed in a furnace chamber of a firing furnace (not shown) so that the substrate 462 is subjected to a heat treatment which is carried out at a firing temperature of about 550(° C.) that is suitable for kinds of the thick-film dielectric paste 478 and thick-film conductive paste 480.

In the process of the heat treatment, the resin component of each of the printed thick-film layers 482–488 is burnt, while the dielectric material, conductive material and glass frit are sintered since the sintering temperature is about 550(° C.), so that the dielectric core body 412, conductive body layer 418 and reinforcing layers 422, 426 are formed whereby the above-described thick-film sheet 410 is obtained. FIG. 46(*f*) shows this state. In this instance, since the inorganic component particles of the peel layer 468 have the softening point of 550(° C.) or higher, the high-melting-point particles (glass powders and ceramic filler) are not sintered while the resin component is burnt in the peel layer 468. Therefore, after the burning of the resin component as a result of progress of the heat treatment, the peel layer 468 converts into a particle layer 496 consisting of only high-melting-point particles 494 (see FIG. 47).

Figure 47:
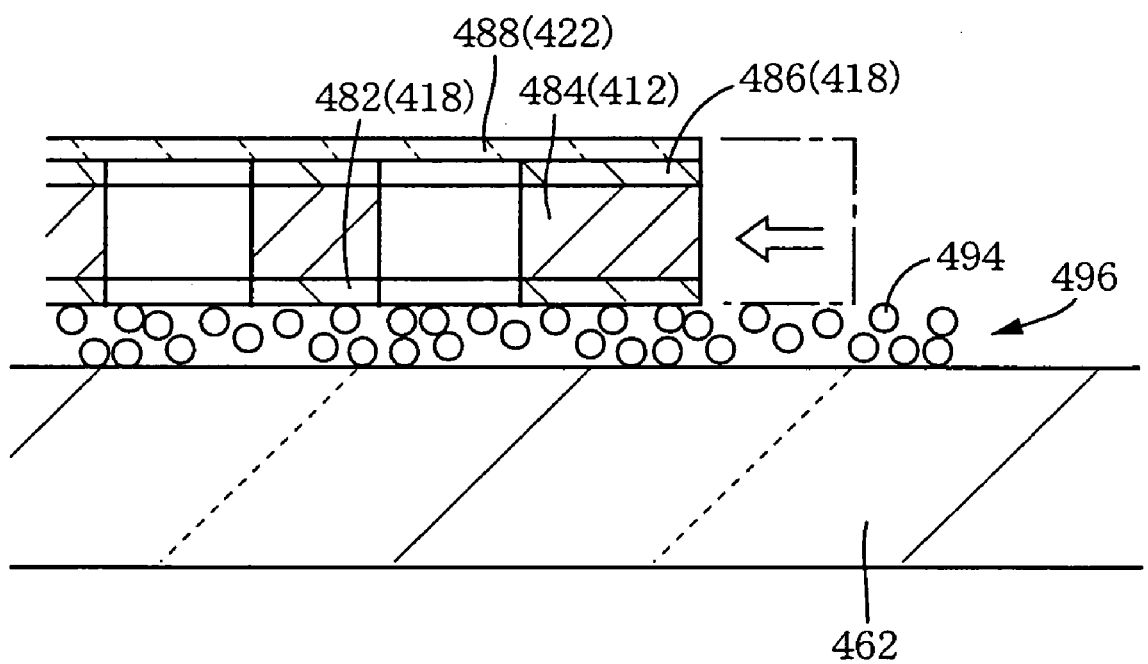
FIG. 47 is a view for explaining a shrinkage behavior in a firing step of FIG. 45.

FIG. 47 is an enlarged view of a part of a right end of FIG. 46(*f*), schematically showing a state in progress of the sintering in the above-described heat treatment. The particle layer 496, which has been formed as a result of burning of the resin component of the peel layer 468, is a layer constituted by the high-melting-point particles 494 which are merely superposed on each other and which are not bound to each other. Therefore, when the printed thick-film layers 482–488 shrink as indicated in FIG. 47 in which their end portions before the sintering are represented by one-dot chain line, the high-melting-point particles 494 function as rollers. Owing to the roller function of the particles 494, between a lower portion of a set of the printed thick-film layers 482–488 and the substrate 462, there is not generated a force impeding the shrinkage of the layers 482–488. Thus, the lower and upper portions of the set of the layers 482–488 equally shrink, so that the set of the layers 482–488 is free from density variation and warp arising from difference in the shrinkage amount.

In the above-described heat treatment, the formed dielectric core body 412 and conductive body layers 418 shrink, for example, in a cooling stage in which the sintering of the thick film is progressed. In this instance, a stress could act between the dielectric core body 412 and conductive body layers 418, due to difference in coefficient of thermal expansion. However, in the present embodiment, the shrinkage of the conductive body layers 418 is restrained by the belt-like reinforcing layers 422 which are provided to straddle the dielectric core body 412 and conductive body layers 418. Therefore, the above-described stress does not cause a crack or other damage in boundary portions between the dielectric core body 412 and the conductive body layers 418, thereby making it possible to produce the thick-film sheet 410 at a high yield rate.

In the present embodiment, when the sintering of the printed thick-film layers 482–488 is initiated, the firing shrinkage of the layers 482–488 is not impeded by the substrate 462 owing to the above-described function of the particle layer 496. Therefore, the quality of the formed thick film is not practically affected by the thermal expansion of the substrate 462. It is noted that the substrate 462 may be provided by a heat resistant glass having a further high distortion point (for example, a borosilicate glass which has a coefficient of thermal expansion of about $32 \times 10^{-7}$(/° C.) and a softening point of about 820(° C.), or a quartz glass having a coefficient of thermal expansion of about $5 \times 10^{-7}$(/° C.) and a softening point of about 1580(° C.)), where the substrate 462 is repeatedly used, or where the heat treatment temperature is considerably high. In this case, too, the thermal expansion amount of the substrate 462 is extremely small in the temperature range in which the dielectric material powders have a small bonding strength. That is, in this case, either, the quality of the formed thick film is not affected by the thermal expansion of the substrate 462.

Referring back to FIG. 45, a peeling step 498 is implemented to peel the formed thick-film sheet 410 from the substrate 462. Since the particle layer 496 interposed therebetween is constituted by the high-melting-point particles 494 which are merely superposed on each other, the peeling can be easily made without using any chemical and device. In this instance, some of the high-melting-point particles 494 cooperating to have a thickness corresponding to that of one layer might adhere to a bottom surface of the thick-film sheet. The adhering particles are removed by using an adhesive tape or an air blow as needed in a particle removing step 500 following to the peeling step 498. It is noted that the substrate 462 from which the thick film has been peeled is repeatedly used for the similar purpose since the substrate 462 is not easily deformed or deteriorated at the above-described sintering temperature.

The thus produced thick-film sheet 410 is fixed onto the back face plate 438 on which the cathode electrodes 452 and emitters 454 have been provided, and then the back face plate 438 is superposed on the front face plate 436 on which the anodes 444, black matrix 448, fluorescent layers 446 and metal back 450 have been provided, so that the FED 430 is produced. In a process of the production, since the lattice-shaped reinforcing layer 426 is disposed in the peripheral portion of the thick-film sheet 410 in the present embodiment, there is not a high risk of breakage or other damage in the peripheral portion of the thick-film sheet 410 even when the sheet 410 is handled during transferring, assembling or other operation made after the production of the sheet 410. That is, the lattice-shaped reinforcing layer 426 is provided to prevent the thick-film sheet 410 from being broken in the handling of the sheet 410.

In a word, in the present embodiment, after the printed dielectric layers 484, 488 and printed conductive layers 482, 486 have been formed in the predetermined patterns on the film formation surface which is constituted by the peel layer 468 having the melting point higher than the sintering temperature of the thick-film dielectric paste 478 and thick-film conductive paste 480, the printed dielectric layers 484, 488 and printed conductive layers 482, 486 are subjected to the heat treatment at the temperature enabling them to be sintered, so that the thick-film dielectric body and thick-film conductive body are formed, whereby the conductive body layers 418 are disposed on the surfaces 414, 416 of the dielectric core body 412 while the belt-like reinforcing layers 422 continuously extending and straddling the boundary portions between the conductive body layers 418 and the dielectric core body 412 are also disposed on the surfaces 414, 416 of the dielectric core body 412, namely, whereby the thick-film sheet 410 is obtained. In this instance, the peel layer 468, which is not sintered at the heat treatment temperature, converts into the particle layer 496 constituted by only the high-melting-point particles 494, as a result of burning of the resin. Therefore, the formed thick film is not fixed to the substrate 462, whereby the thick film can be easily peeled from the surface 464 of the substrate 462. The thus obtained thick-film sheet 410 can be advantageously used in the production of the FED 430. Further, in addition to its mechanical property based on the construction in which the conductive body layers 418 are disposed on the dielectric core body 412, the thick-film sheet 410 has an advantage that a crack in the boundary portions between the dielectric core body 412 and the conductive body layers 418 is restrained by the belt-like reinforcing layers 422. It is therefore possible to obtain the thick-film sheet 410 which can be used, in place of a sheet metal, to constitute the gate electrodes, and which is easy to handle and produce.

Further, in the present embodiment in which the support body is constituted by forming the peel layer 468 on the surface of the substrate 462, the support body maintains its shape even after the heat treatment. Thus, the present embodiment is advantageous over an arrangement in which the support body is constituted by only the peel layer 468, in that the formed thick-film sheet 410 can be easily handled. Further, since the peel layer 468 is interposed between the printed thick-film layers 482–488 and the substrate 462, the printed thick-film layers 482–488 are not bound by the substrate 462 during the heat treatment, it is not problematic even if the substrate 462 does not have high degrees of flatness and surface smoothness.

Further, in the present embodiment, since the printed thick-film layers 482–488 are formed with the thick-film screen printing method, the formation can be made by a simple device without waste of large amount of material, thereby resulting in advantageous reduction in the producing cost.

In the above-described sixteenth embodiment, the second invention is applied to the thick-film sheet 410 designed for constituting the gate electrodes 418 of the FED 430. However, the second invention is useful for replacing a sheet metal in various devices in which the sheet metal is used as an electrode or the like. For example, the second invention is advantageously applicable to electrodes or grid electrodes of a flat CRT, an inorganic EL or the like.

Further, in the sixteenth embodiment, the thick-film sheet 410 of the sixteenth embodiment is provided with the belt-like reinforcing layer 422 and also the lattice-shaped reinforcing layer 426 which serves to reinforce the peripheral portion. However, the reinforcing layer 426 of the peripheral portion is not essential but may be provided in the thick-film sheet 410, as needed, depending upon, for example, a strength of the dielectric core body 412 per se and a required mechanical character of the thick-film sheet 410. Further, where the reinforcing layer 426 is provided in the sheet 410, the reinforcing layer 426 does not necessarily have to take a lattice shape but may take any shape which is suitable for its reinforcing function.

Further, while the conductive body layers 418 and the reinforcing layers 422, 426 are provided on both of the opposite surfaces 414, 416 of the dielectric core body 412 in the sixteenth embodiment, the second invention is applicable also to a case where the layers 418, 422, 426 are provided on only one of the surfaces 414, 416. Further, even where the conductive body layers 418 are provided on both of the surfaces 414, 416 of the dielectric core body 412, it is possible to provide the reinforcing layers 422, 426 on only one of the surfaces 414, 416, in view of a required strength for preventing a crack. Further, even where the conductive body layers 418 are provided on only one of the surfaces 414, 416 of the dielectric core body 412, it is possible to provide the reinforcing layers 422, 426 on both of the surfaces 414, 416.

Further, while the belt-like and lattice-shaped reinforcing layers 422, 426 are arranged to be contiguous to each other in the sixteenth embodiment, the belt-like and lattice-shaped reinforcing layers 422, 426 may be arranged to be independent of each other. However, if a crack is caused in a portion in which the reinforcing layers 422, 426 are spaced apart from each other, the contiguous arrangement as shown in the embodiment is necessary.

Further, in the sixteenth embodiment, each of the belt-like reinforcing layers 422 continuously extends to straddle the plurality of gate electrodes 418. However, each of the belt-like reinforcing layers 422 may be provided by a plurality of mutually independent portions each of which straddles a corresponding one of the plurality of gate electrodes 418.

Further, in the sixteenth embodiment, the reinforcing layers 422, 426 are constituted by the thick-film material having the softening point equal to or lower than the material of the dielectric core body 412. However, the reinforcing layers 422, 426 may be constituted by a thick-film material having a softening point higher than the material of the dielectric core body 412, as long as the material can exhibit a sufficient strength for the reinforcement.

SEVENTEENTH EMBODIMENT

Figure 48:
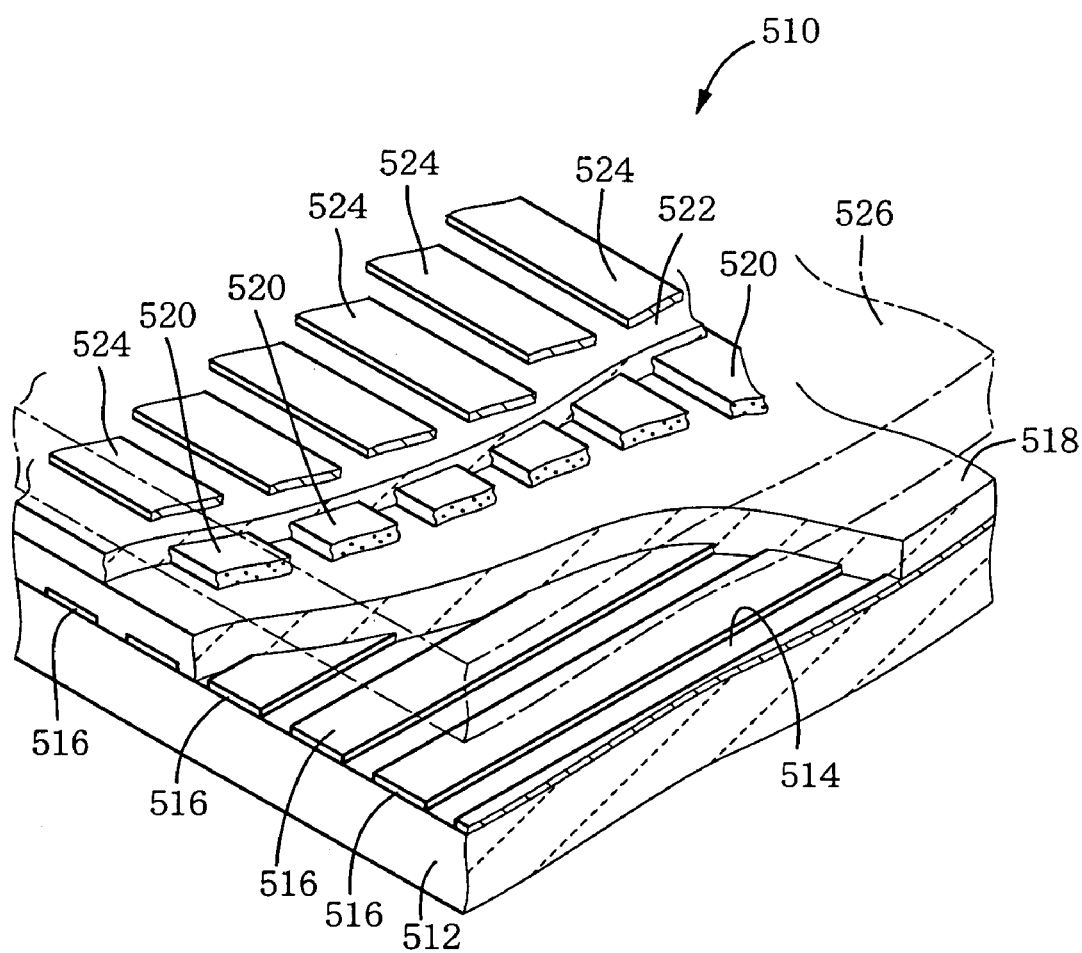
FIG. 48 is a perspective view partially in cross section of an EL display device which is produced with application of a producing method of a sixth invention.

FIG. 48 is a perspective view partially in cross section of an EL display device 510 which is produced with application of a producing method of a sixth invention. As shown in the figure, the EL display device 510 is constructed to have a substrate 512, a back face electrode layer consisting of a plurality of back face electrodes 516, a second dielectric layer 518, a luminous layer consisting of a plurality of luminous portions 520, a first dielectric layer 522, and a transparent electrode layer consisting of a plurality of transparent electrodes 524. The back face electrode layer, the second dielectric layer 518, the luminous layer, the first dielectric layer 522 and the transparent electrode layer are laminated on the surface 514 of the substrate 512. On the transparent electrode layer, as needed, there are disposed a transparent protector plate 526 made of a glass, resin or the like, and a color filter (not shown) or the like. In the present embodiment, the above-described back face electrode layer corresponds to a second electrode layer.

The above-described substrate 512 is constituted by, for example, a glass, ceramics or the like having such a degree of heat resistance that avoids substantial deformation or deterioration of the substrate 512 during a heat treatment which is effected at a temperature of about 300–400(° C.). The substrate 512 is provided by a rectangular thin plate having a size of about 250×200×1.8 (mm). Soda lime glass, borosilicate glass or the like is preferably used, where the substrate 512 is constituted by a glass. Alumina, zirconia, forsterite or the like is preferably used, where the substrate 512 is constituted by ceramics.

The above-described back face electrodes 516 are formed from, for example, thick-film silver which contains silver as its conductive component. The plurality of back face electrodes 516, each having a width of about 0.23 (mm) and a thickness of about 10 (μm), extend along a predetermined direction and are parallel with each other. A distance between centers of each adjacent pair of the back face electrodes 516 is about 110 (μm).

The above-described second dielectric layer 518 is provided by, for example, a thick-film dielectric body, such as barium titanate ($BaTiO_3$) and lead titanate ($PbTiO_3$), which has a high specific inductive capacity ∈ of about 1500. The second dielectric layer 518 has a constant thickness of about 5–20 (μm), for example, 20 (μm), and is provided to cover the surface 514 of the substrate 512 and the back face electrodes 516.

Each of the above-described luminous portions 520 is provided by, for example, a thin-film fluorescent body which is activated by an electron excitation, to emit a light having one of three colors, i.e., red, green and blue colors. The thin-film fluorescent body is made of EL material, i.e., a fluorescent body which is formed by doping manganese (Mn) or the like onto zinc sulfide (ZnS), strontium sulfide (SrS) or the like. Each of the luminous portions 520 has a width of about 100 (μm) and a thickness which ranges from 0.3 to 1.0 (μm) and which varies depending upon the color of the light emitted by the luminous portion 520. The luminous portions 520 extend in a direction substantially perpendicular to the longitudinal direction of the back face electrodes 516, and are parallel with each other. A distance between centers of each adjacent pair of the luminous portions 520, which are adapted to emit the lights having respective different colors, is about 110 (μm).

The above-described first dielectric layer 522 is made of, for example, a transparent dielectric material such as $Y_2O_3$ and $Si_3O_4$, and has a thickness of about 0.3–1.0 (μm). The first dielectric layer 522 is provided to cover the entire surface of the second dielectric layer 518 and the entire surface of each of the luminous portions 520 which are disposed on the surface of the second dielectric layer 518.

The above-described transparent electrodes 524 are formed from, for example, indium tin oxide (ITO), and are positioned right above the luminous portions 520. The transparent electrodes 524 extend along the luminous portions 520, and are parallel with each other. Each of the transparent electrodes 524 has a width of about 100 (μm) and a thickness of about 0.3–0.5 (μm). A distance between centers of each adjacent pair of the transparent electrodes 524 is about 110 (μm).

Figure 49:
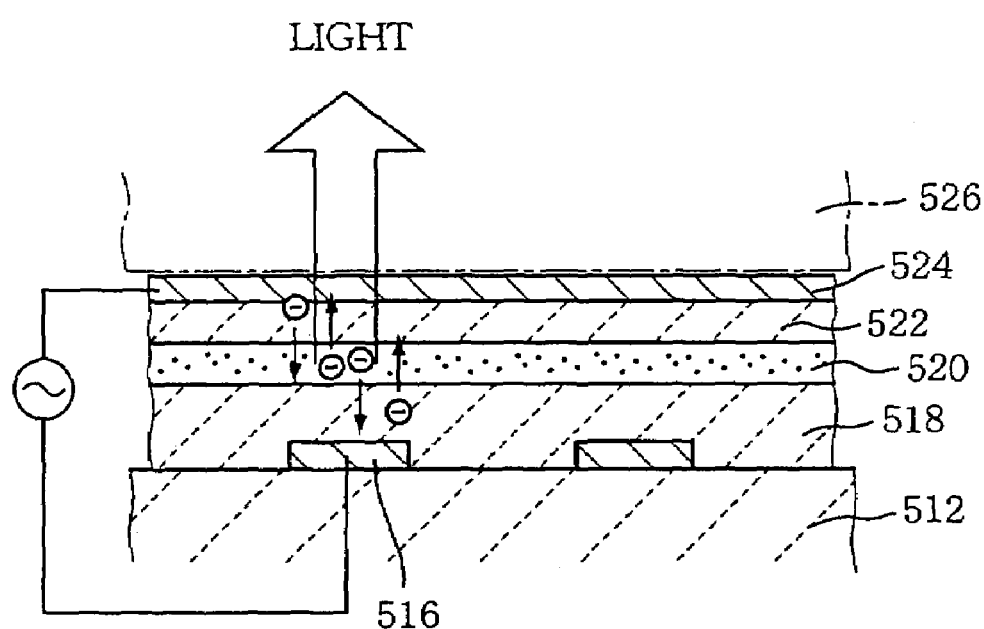
FIG. 49 is a cross sectional view for explaining a light emission function of the EL display device of FIG. 48.

FIG. 49 is a cross sectional view for explaining a light emission function of the EL display device 510. The back face electrodes 516 are connected to a control circuit, independently of each other, and the transparent electrodes 524 are connected to the control circuit, independently of each other, too, so that an alternating voltage is applied between a selected pair of the electrodes 516, 524. In the EL display device 510, each pair of the electrodes 516, 524 are insulated from each other by the first and second dielectric layers 522, 518, thereby constituting a condenser. With application of the alternating voltage between each pair of the electrodes 516, 524, electron movement based on an electrostatic capacity Q between the electrodes 516, 524 is caused in an area of intersection of the electrodes 516, 524, as shown in FIG. 49. Since the luminous portion 520 provided by a fluorescent body is located between the electrodes 516, 524, the moved electrons excite the fluorescent body, so that the excited fluorescent body emits a light. The thus emitted light advances toward one of opposite sides of the luminous portion 520 in which any shading object is not present, namely, toward the first dielectric layer 522, so as to be ejected through the transparent electrode 524. A desired pattern of image is displayed, by line-sequentially scanning the electrodes 516 (or the electrodes 524) and applying the voltage to the electrodes 516 (or the electrodes 524), while applying the voltage to ones of the electrodes 524 (or the electrodes 516) corresponding to input data.

In this instance, the electrostatic capacity Q is an extremely large value in the present embodiment in which the second dielectric layer 518 having the relatively large thickness of about 20 (μm) has the extremely high specific inductive capacity ∈. It is therefore possible to obtain a high luminance even if a threshold voltage, i.e., a starting voltage is low and the applied voltage is low.

Figure 50:
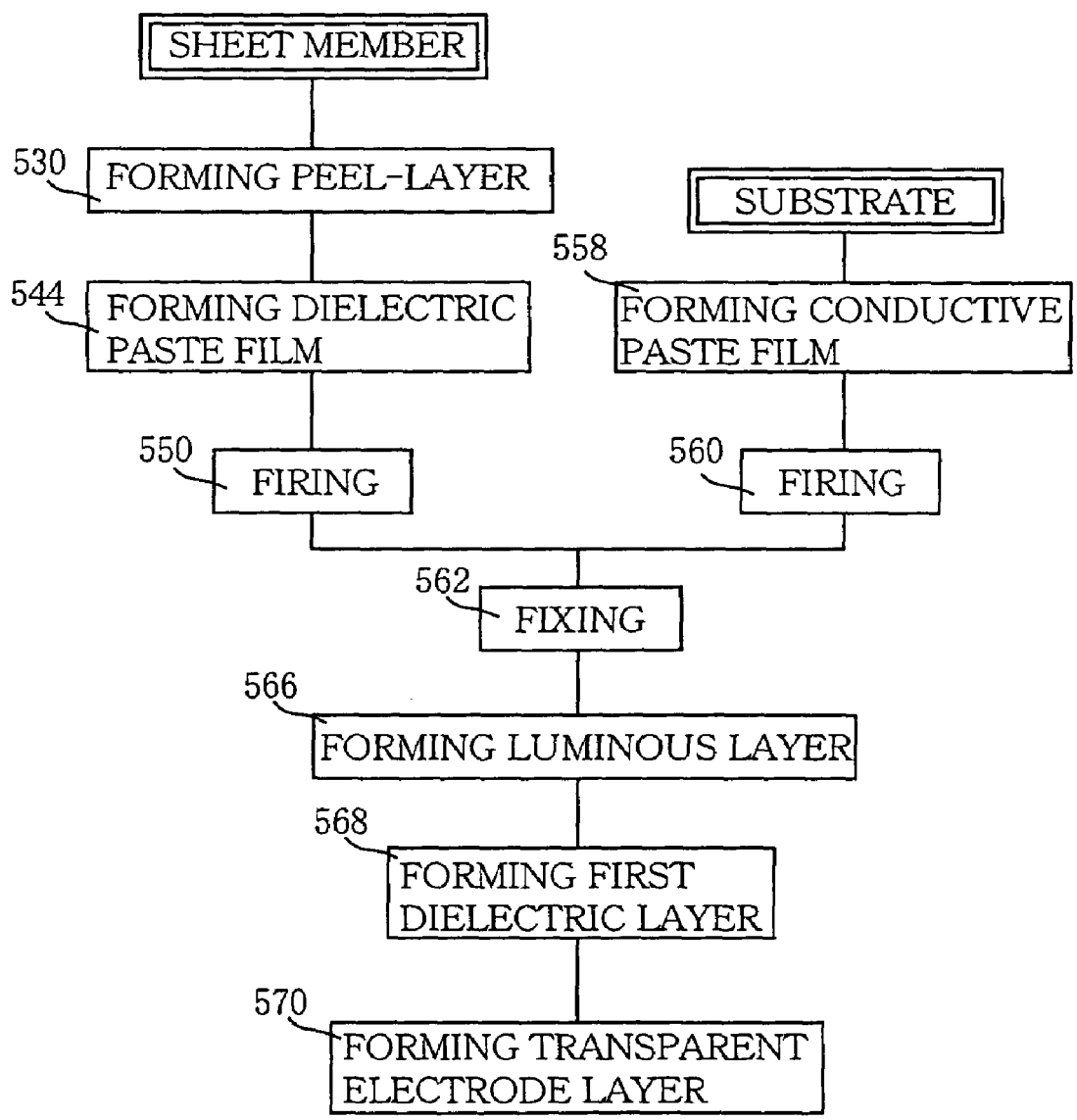
FIG. 50 is a process chart for explaining a method of producing the EL display device of FIG. 48.

The EL display device 510 exhibiting such a high performance is produced by, for example, a producing method whose main portions are shown in FIG. 50. The producing method will be described based on FIG. 50, with reference to FIGS. 51(*a*)–(*e*) and 52(*a*)–(*d*) which represent a cross section in main stages of the production process.

The producing method of the present embodiment is sectioned into a process of producing a sheet member, a process of processing a substrate, and a process of fixing the sheet member and the substrate and processing them. In the process of producing the sheet member, the sheet member for constituting the second dielectric layer 518 is produced, by using a well-known thick-film printing technique, in a state in which the sheet member is not fixed to the above-described substrate 512 so as to be independent of the substrate 512. That is, a peel-layer forming step 530 is implemented to prepare a substrate 534 whose surface 532 has been subjected to a suitable cleaning treatment, and then form a peel layer 536 on the surface 532 of the prepared substrate 534 (see FIGS. 51(*a*),(*b*)). In this instance, the peel layer 536, which is constituted by high-melting-point particles bonded together by a resin, is formed to have a thickness of about 5–50 (μm), preferably, 10–20 (μm).

Figure 51:
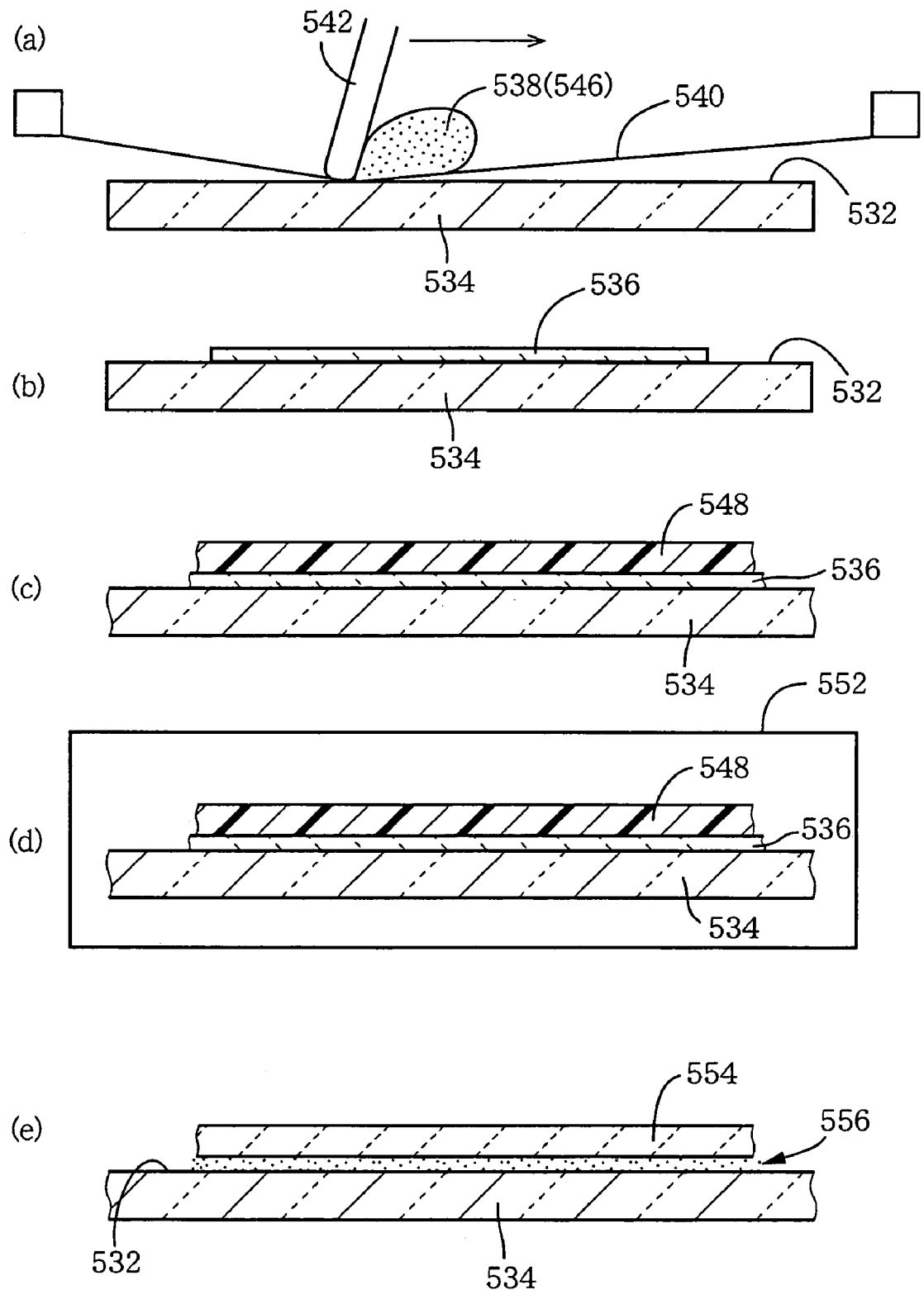
FIGS. 51(a)–(e) are views for explaining production steps of a second dielectric layer in the production process of FIG. 50.

The above-described substrate 534 is provided by a member which does not suffer from considerable deformation and deterioration in a heat treatment which is described below. For example, it is preferable to use, as this substrate 534, a member formed from zirconia. The above-described high-melting-point particles are provided by ceramic particles, such as alumina and zirconia, having an average particle size of about 0.01–5 (μm), e.g., about 1 (μm) and a melting point equal to or higher than 1900 (° C.). It is preferable that the ceramic particles are formed from zirconia or other material which has a poor wettability with respect to the material (barium titanate or the like) forming the second dielectric layer 518. The resin is provided by ethyl cellulose resin or the like which is burnt at about 350 (° C.). The peel layer 536 is disposed on the surface 532 of the substrate 534, for example, by applying an inorganic material paste 538 which is constituted by the above-described high-melting-point particles and resin which are dispersed in an organic solvent such as butyl carbitol acetate (BCA) and terpineol, onto substantially the entire surface of the substrate 534 with a screen printing method as shown in FIG. 51(*a*), and then drying the applied paste 538 in a drying furnace or at a room temperature. However, the peel layer 536 may be disposed on the surface 532 of the substrate 534, by sticking a coater or film laminate onto the surface of the substrate 534. It is preferable to use, as the drying furnace, a far infrared radiation drying furnace which is capable of sufficiently supplying and exhausting air into and from the furnace, for providing the film with an excellent surface smoothness and enabling the resin to be evenly dispersed. FIG. 51(*b*) shows a stage in which the peel layer 536 is formed as described above. It is noted that reference signs 540 and 542 denote a screen and a squeegee, respectively, in FIG. 51(*a*). In the present embodiment, the substrate 534 provided with the peel layer 536 corresponds to a support body. A surface of the peel layer 536 corresponds to a film formation surface. The peel layer forming step 530 corresponds to a support-body preparing step.

A dielectric-paste-film forming step 544 is then implemented to apply a thick-film dielectric paste 546 on a substantially entire surface of the peel layer 536 and then drying the applied paste 546 in the same manner as the application of the inorganic material paste 538, namely, with the screen printing method (see FIG. 51(*a*)), for thereby forming a dielectric paste film 548. The thick-film dielectric paste 546 is constituted by high dielectric material powders, such as barium titanate and lead titanate, which are dispersed in a solvent containing a resin dissolved therein, or constituted by inorganic powders which containing the high dielectric material powders and an additive in the form of glass frit and which are dispersed in the solvent containing the resin dissolved therein. The above-described solvent and resin are substantially the same as those used for the inorganic paste 538. The above-described glass frit as the additive is of $SiO_2$—$Al_2O_3$—$B_2O_3$—$MgO$—$CaO$, and has a softening point of about 900(° C).

The dielectric-paste-film forming step 544 is followed by a firing step 550 in which the substrate 534 is disposed in a furnace chamber 552 of a predetermined firing device so that the substrate 534 is subjected to a heat treatment which is carried out at a firing temperature of about 1200(° C.) that is suitable for kinds of the thick-film dielectric paste 546. FIG. 51(*d*) shows a state in a process of the heat treatment.

In the process of the heat treatment, the resin component of the dielectric paste film 548 is burnt, while the dielectric material and glass frit are sintered since the sintering temperature is about 1200(° C.), so that a sheet member 554 constituted by a dielectric body is formed. FIG. 51(*e*) shows this state. In this instance, since the inorganic component particles of the peel layer 536 have the softening point of 1900(° C.) or higher, the high-melting-point particles are not sintered while the resin component is burnt in the peel layer 536. Further, since the high-melting-point particles contained in the peel layer 536 is made of the selected material which has a poor wettability with respect to the dielectric material contained in the dielectric paste film 548, as described above, the sheet member 554 constituted by the dielectric body is not substantially fixed to the material composing the peel layer 548, although the dielectric body tends to be fixed to the material of the peel layer 548 in presence of impurity therebetween since the surface of the dielectric body is activated in the neighborhood of the sintering temperature. Therefore, after the burning of the resin component as a result of progress of the heat treatment, the peel layer 536 converts into a particle layer 556 consisting of only the high-melting-point particles, i.e., ceramic particles. This particle layer 556 is a layer constituted by the high-melting-point particles which are merely superposed on each other and which are not bound to each other. Therefore, when the dielectric paste film 548 shrinks, the high-melting-point particles function as rollers. Owing to the roller function of the high-melting-point particles, between a lower portion of the dielectric paste film 548 and the substrate 534, there is not generated a force impeding the shrinkage of the dielectric paste film 548. Thus, the lower and upper portions of the dielectric paste film 548 equally shrink, so that the sheet member 554 is free from density variation and warp arising from difference in the shrinkage amount.

In the present embodiment, when the sintering of the dielectric paste film 548 is initiated, its firing shrinkage is not impeded by the substrate 534 owing to the above-described function of the particle layer 556. Therefore, the quality of the formed thick film is not practically affected by the thermal expansion of the substrate 534.

The process of processing the substrate, shown in FIG. 50, is initiated with a conductive-paste-film forming step 558. In this conductive-paste-film forming step 558, the above-described substrate 512 is first prepared, and the prepared substrate 512 is then subjected to a suitable cleaning treatment. A thick-film conductive paste is applied onto a surface of the substrate 512 in a predetermined pattern, by using, for example, a thick-film screen printing method, and the applied conductive paste is dried, so that a conductive paste film is formed for constituting the above-described back face electrodes 516. That is, the above-described predetermined pattern corresponds to configuration of the back face electrodes 516. The above-described thick-film conductive paste is constituted by conductive material powders such as silver powders, glass frit and resin which are dispersed in an organic solvent. As the glass frit, for example, a PbO—$B_2O_3$—$SiO_2$—$Al_2O_3$—$TiO_2$ based low-softening-point glass or the like is used. As the resin and solvent, for example, material similar to the inorganic material paste 538 is used. Next, in a firing step 560, the substrate 512 is subjected to a heat treatment at a predetermined temperature suitable for the composition of the thick-film conductive paste, whereby the above-described back face electrodes 516 are formed from the conductive paste film. In the present embodiment, the conductive-paste-film forming step 558 and firing step 560 correspond to a second-electrode-layer forming step.

After the sheet member 554 and the substrate 512 have been processed as described above, a fixing step 562 is implemented to fix the back face electrodes 516 and the sheet member 554 to each other. This step is implemented as follows.

Figure 52:
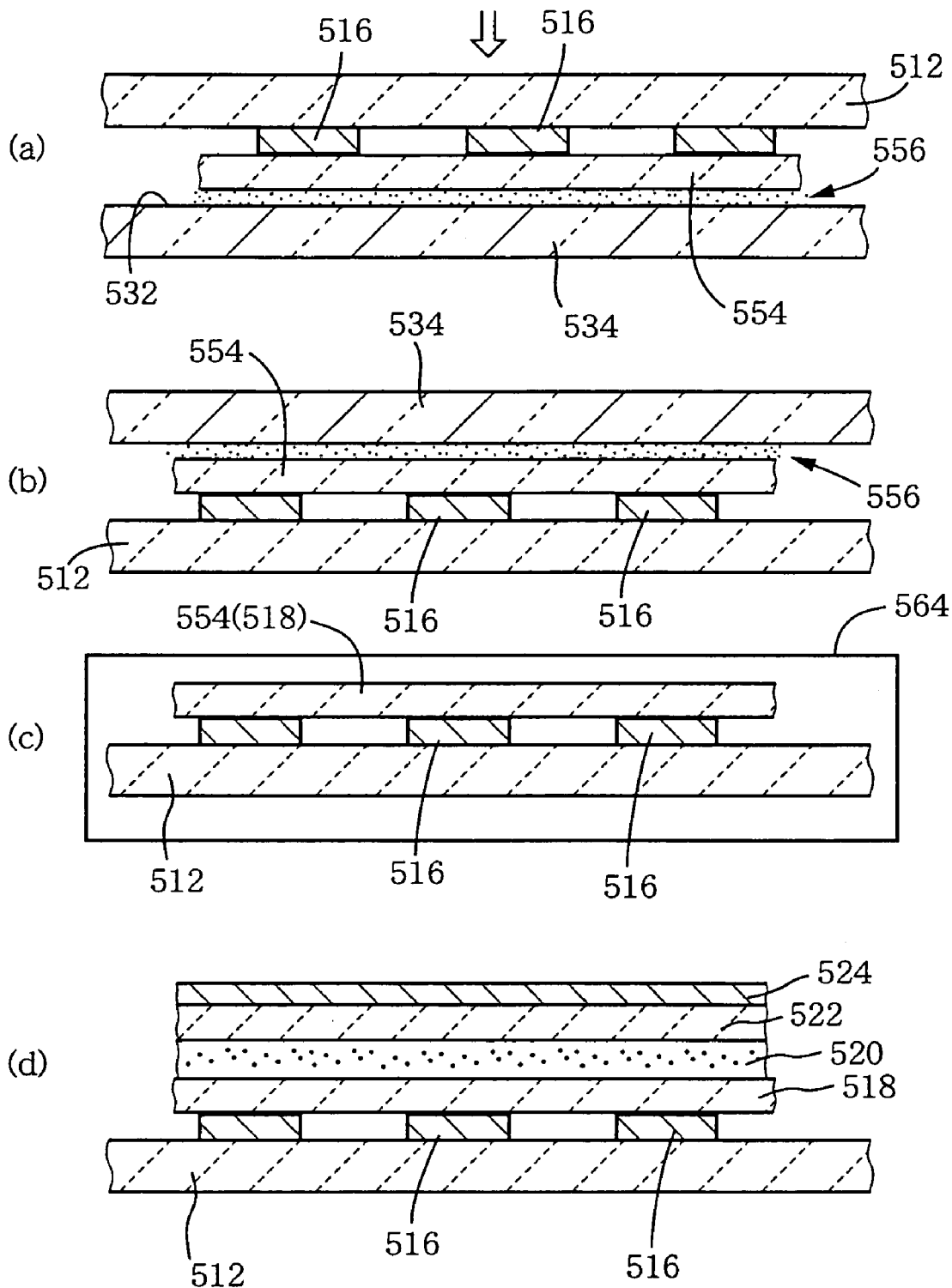
FIGS. 52(a)–(d) are views for explaining a fixing step and steps following to the fixing step in the production process of FIG. 50.

The substrate 512 is first disposed on the substrate 534 having the surface 532 on which the sheet member 554 is positioned, as shown in FIG. 52(a), such that the back face electrodes 516 face the sheet member 554. The substrates 512, 534 are then turned over, as shown in FIG. 52(b). Next, after removing the substrate 534 upwardly, the relative position of the back face electrodes 516 and the sheet member 554 are adjusted, and the back face electrodes 516 and the sheet member 554 are then subjected to a heat treatment at a relatively low temperature of about 300(° C.) in a furnace chamber 564 (see FIG. 52(c)). In this instance, a weight or the like is disposed on the sheet member 554, as needed, for increasing adhesiveness between the back face electrodes 516 and the sheet member 554. By this firing treatment, activity of the silver contained in the back face electrodes 516 is increased, so that the electrodes 516 and the sheet member 554 react with each other so as to be fixed to each other. The second dielectric layer 518 is thus disposed on the back face electrodes 516. In other words, the back face electrodes 516 are disposed on one surface of the second dielectric layer 518. In the present embodiment, the above-described fixing step 562 corresponds to a one-surface-side film forming step.

The particle layer 556 interposed between the substrate 534 and the sheet member 554 is constituted by the high-melting-point particles which are merely superposed on each other. Therefore, in the above-described fixing step 562, the removal of the substrate 534 can be easily made without using any chemical and device, after the substrates 512, 534 are turned over. In this instance, some of the high-melting-point particles cooperating to have a thickness corresponding to that of one layer might adhere to a bottom surface of the laminated body. The adhering particles are removed by using an adhesive tape or an air blow as needed. It is noted that the substrate 534 from which the thick film has been peeled is repeatedly used for the similar purpose since the substrate 534 is not easily deformed or deteriorated at the above-described sintering temperature. That is, there is an advantage that the substrate 534 serving to prepare the sheet member 554 can be repeatedly used.

Next, in a luminous-layer forming step 566, the fluorescent body material corresponding to the three colors is fixed onto the second dielectric layer 518 in a predetermined pattern, whereby the luminous layer consisting of the plurality of luminous portions 520 is formed on the second dielectric layer 518. A first-dielectric-layer forming step 568 is then implemented to dispose the above-described first dielectric layer 522 on an entire surface of the luminous layer. The first-dielectric-layer forming step 568 is followed by a transparent-electrode-layer forming step 570 which is implemented to fix the transparent electrode material such as ITO on the first dielectric layer 522 in a predetermined pattern, whereby the transparent electrode layer consisting of the plurality of transparent electrodes 524 is disposed on the first dielectric layer 522. The above-described EL display device 510 is thus produced. FIG. 52(d) shows a stage in which the transparent electrodes 524 are formed. Any one of the forming steps 566, 568 and 570 is implemented by using a thin-film technique such as deposition. Where the EL display device 510 is equipped with the color filter, protector plate 526 or the like, it is formed in a suitable method after the implementation of the transparent-electrode-layer forming step 570. For example, the protector plate 526 is formed, by fixing the protector plate 526 to the substrate 512 with a resin or the like interposed between their peripheral portions, and then making its internal pressure slightly lower than the atmospheric pressure.

As described above, the conductive-paste-film forming step 558, firing step 560 and fixing step 562 are implemented to provide the back face electrode layer consisting of the plurality of back face electrodes 516, on one of opposite surfaces of the sheet member 554 which has been produced in the sheet-member producing process consisting of the peel-layer forming step 530, dielectric-paste-film forming step 544 and firing step 550, while the luminous layer consisting of the plurality of luminous portions 520 is provided on the other of the opposite surfaces of the sheet member 554, whereby the inorganic EL display device 510 is obtained. Therefore, the second dielectric layer 518 is not disposed on the substrate 512 constituting the inorganic EL display device 510, when its film is formed. Rather, the second dielectric layer 518 is provided by the sheet member 554 which is constituted by the thick-film dielectric body prepared independently of the other components such as the back face electrode layer and luminous layer. Thus, the material composing the inorganic EL display device 510 is not required to have a heat resistance corresponding to the composition material of the second dielectric layer 518. Therefore, the second dielectric layer 518 can be made of the above-described material, such as barium titanate and lead titanate, which has a high specific inductive capacity and which is required to be fired at a high temperature, whereby the inorganic EL display device 510 is given a large electrostatic capacity and a high performance. Further, there is another advantage that the substrate 512 which is a component of the inorganic EL display device 510 is not required to have a high heat resistance.

Further, in the present embodiment, after the dielectric paste film 548 has been formed on the film formation surface which is provided by the peel layer 536 constituted by the high-melting-point particles whose melting point is higher than the sintering temperature of the thick-film dielectric material, the dielectric paste film 548 is subjected to a heat treatment at a such a temperature that enables the thick-film dielectric material to be sintered, whereby the sheet member 554 constituted by the thick-film dielectric body is formed. The peel layer 536, which is not sintered at the heat treatment temperature, converts into the particle layer 556 constituted by only the high-melting-point particles, as a result of burning of the resin. Therefore, the formed thick film is not fixed to the support body, whereby the thick film can be easily peeled from the substrate 534. This feature makes it possible to easily produce the sheet member 554 which constitutes the second dielectric layer 518 and which is used in the production of the inorganic EL display device 510.

Further, in the present embodiment, the dielectric paste film 548 is formed on the substrate 534, so that the shape of the support body supporting the sheet member 554 is maintained even after the heat treatment. This arrangement provides an advantage that the formed sheet member 554 can be handled easier than an arrangement in which the support body is constituted by only the peel layer 536.

EIGHTEENTH EMBODIMENT

Next, there will be described an embodiment of a producing method of the above-described seventh invention. In the following description, description of parts which are common to the above-described embodiments will not be provided.

Figure 53:
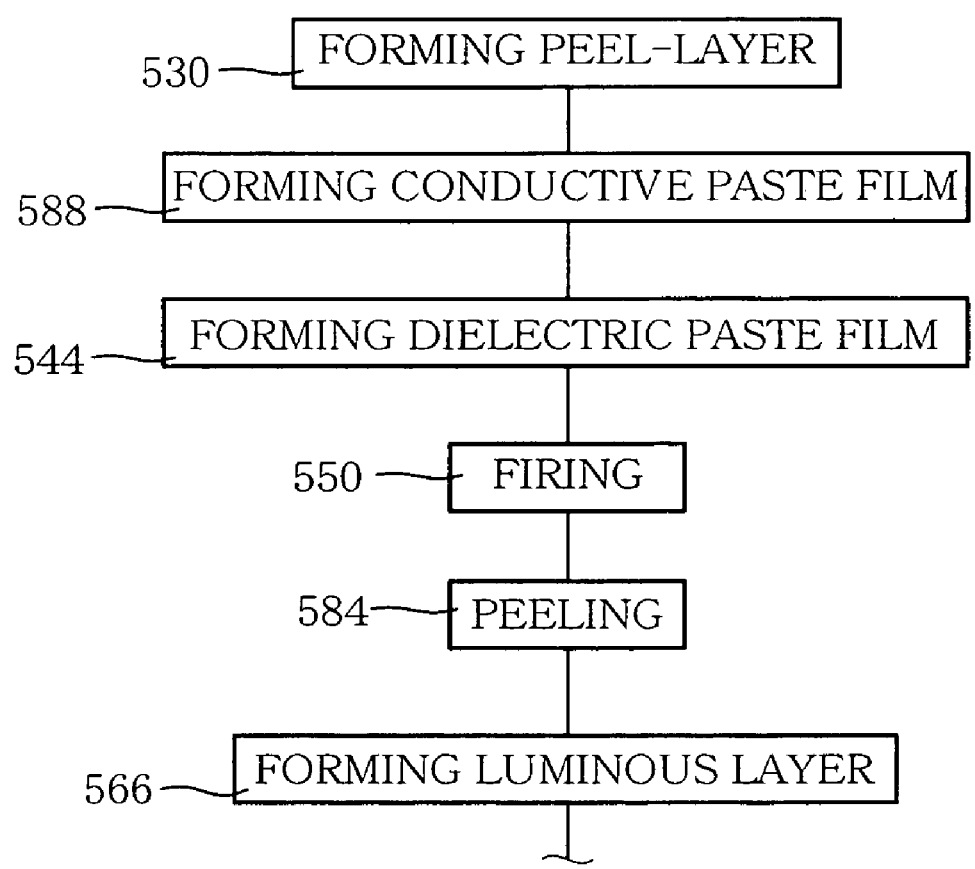
FIG. 53 is a view for explaining a production process which is one embodiment of a producing method of a seventh invention.

FIG. 53 is a process chart for explaining another production process of the EL display device 510. In this embodiment, a conductive-paste-film forming step 580 is provided between the peel-layer forming step 530 and dielectric-paste-film forming step 544 of the sheet-member processing process. In this conductive-paste-film forming step 580, a thick-film conductive paste is applied on the peel layer 536 in a pattern corresponding to the above-described back face electrodes 516, whereby a conductive paste layer 582 is formed on the peel layer 536, as shown in FIG. 54(a). Since the dielectric-paste-film forming step 544 is implemented after the implementation of the conductive-paste-film forming step 580, the dielectric paste film 548 is formed to cover the conductive paste film 582, as shown in FIG. 54(b).

The above-described thick-film conductive paste contains, for example, nickel powders as its main component, and additives such as silicon (Si) and boron (B) which are added to the main component to lower its melting temperature. The thick-film conductive paste is sintered at a sintering temperature of about 1200(° C.), so as to form a film. In the firing step 550 in which the thick-film conductive paste is thus fired at the above-described temperature, a thick-film dielectric body constituting the second dielectric layer 518 is formed from the dielectric paste film 548, while at the same time a thick-film conductive body constituting the back face electrodes 516 is formed from the conductive paste film 582. The thick-film conductive paste is applied to have a thickness of about 20 (μm). Each of the electrodes formed as a result of the firing treatment has a thickness of about 5–15 (μm). The firing step 550 is followed by a peeling step 584 which is implemented to peel the sheet member, i.e., the thick-film dielectric body having one surface on which the thick-film conductive layer is disposed, from the particle layer 556 which is formed from the peel layer 536 in the firing process (see FIG. 51(e)). In the luminous-layer forming step 566 and other steps following to the peeling step 584, the peeled sheet member is subjected to a thin-film process as in the above-described embodiments, whereby the EL display device 510 is obtained. In the present embodiment, since the sheet member is constituted by the thick-film dielectric layer for constituting the second dielectric layer 518, and the back face electrodes 516 fixed to the thick-film dielectric layer, the substrate processing process shown in FIG. 50 is not carried out. In the present embodiment, a sheet-member preparing process is constituted by the peel-layer forming step 530, conductive-paste-film forming step 580, dielectric-paste-film forming step 544, firing step 550 and peeling step 584.

That is, in the present embodiment, the EL display device 510 is obtained by disposing the luminous layer on the above-described other of the opposite surfaces of the sheet member which is prepared in the sheet-member preparing process. Therefore, the second dielectric layer 518 is not disposed on the substrate 512 constituting the inorganic EL display device 510, when its film is formed. Rather, the second dielectric layer 518 is provided by the sheet member which is constituted by the thick-film dielectric body and back face electrode layer prepared independently of the other components such as the luminous layer. Thus, the material composing the inorganic EL display device 510 except the back face electrodes 516 is not required to have a heat resistance corresponding to the composition material of the second dielectric layer 518. Therefore, the second dielectric layer 518 can be made of the material which has a high specific inductive capacity and which is required to be fired at a high temperature, whereby the inorganic EL display device 510 is given a large electrostatic capacity and a high performance.

NINETEENTH EMBODIMENT

Figure 55:
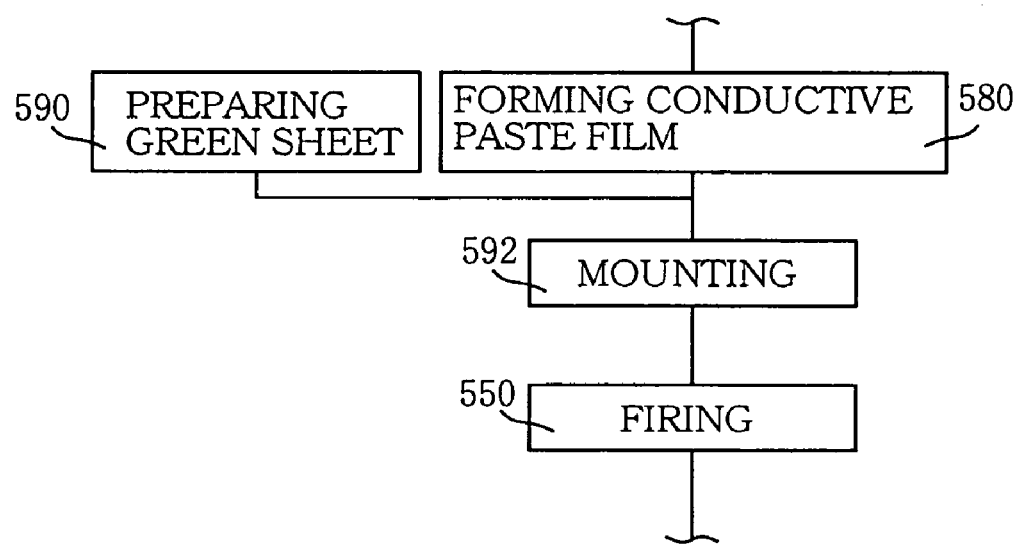
FIG. 55 is a view for explaining a production process which is another embodiment of a sixth invention.

FIG. 55 is a view for explaining still another method of producing the EL display device 510. In the producing method of this embodiment, the conductive-paste-film forming step 580 is implemented to form the conductive paste film 582 on the peel layer 536, as in the method shown in FIG. 53. The material composing the conductive paste film 582 and the thickness of the applied paste are substantially the same as those in the method of FIG. 53. On the other hand, a green-sheet preparing step 590 is implemented to prepare a green sheet (unfired ceramic sheet) 598 (see FIG. 56), by using paste or slurry which is constituted by a mixture of components of the thick-film dielectric paste 546 in the form of the dielectric powders, rein and solvent. This green sheet 598 has a thickness of about 30 (μm). The green sheet 598 is preferably prepared by a tape casting method such as doctor blade method, although it may be prepared by various methods.

Figure 54:
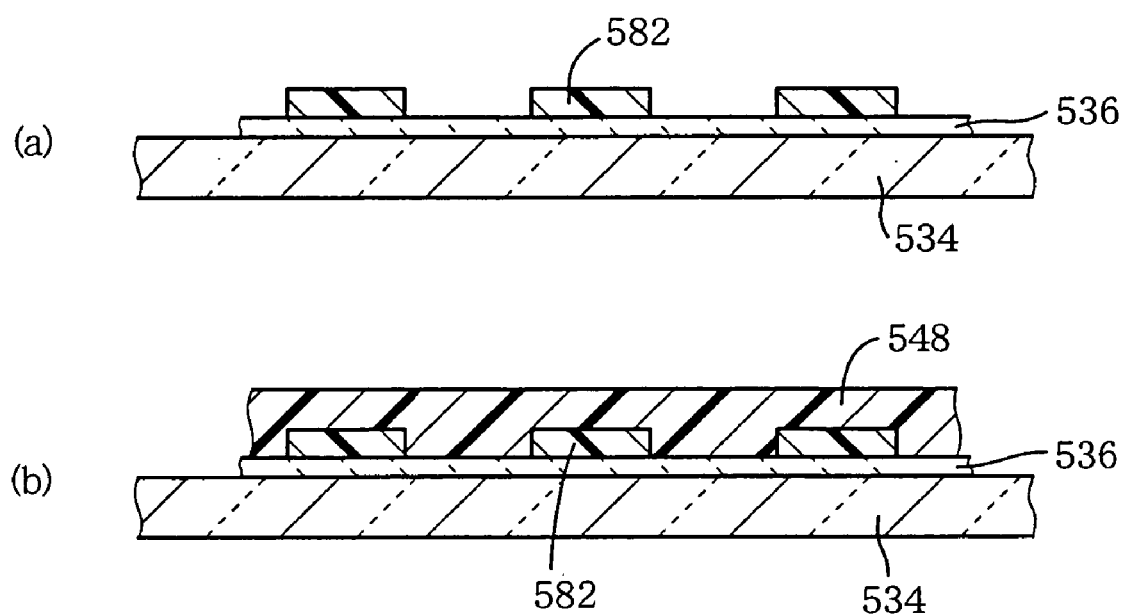
FIGS. 54(a),(b) are views for explaining a cross section in main stages of the production process of FIG. 53.
Figure 56:
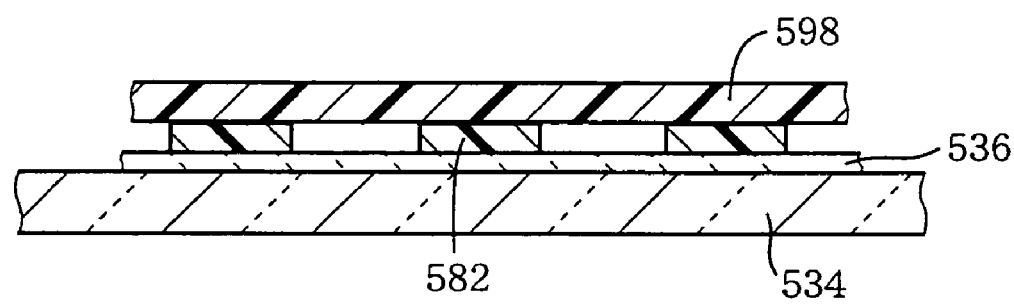
FIG. 56 is a view for explaining a state in implementation of a mounting step of FIG. 55.

A mounting step 592 is then implemented to mount the green sheet 598 in a predetermined position on the conductive paste film 582. FIG. 56 shows a state in which the green sheet 598 is thus mounted on the conductive paste film 582. In this embodiment, unlike the case as shown in FIG. 54(*b*) in which the dielectric paste is applied onto the conductive paste film 582, the green sheet 598 does not cover the conductive paste film 582.

In the firing step 550, the substrate 534 on which the green sheet 598 is mounted is disposed in a firing furnace so that the substrate 534 is subjected to a heat treatment which is carried out at a firing temperature of about 1200(° C.) that is suitable for the materials of the green sheet and the conductive film. The state in this instance is substantially the same as that in the above-described embodiment shown in FIG. 52(*c*). As a result of the implementation of the firing step 550, a dielectric film and a conductive film are formed from the green sheet and the conductive paste film, respectively, while at the same time the conductive film is fixed to a lower surface of the dielectric film. Thus, as in the producing method shown in FIG. 53, it is possible to obtain a sheet member in which the conductive film for constituting the back face electrodes 516 is fixed to the thick-film dielectric layer for constituting the second dielectric layer 518. That is, the conductive-paste-film forming step 580, the firing step 550 and other steps preceding the forming step 580 or following the firing step 550 are substantially the same as those in the embodiment shown in FIG. 53.

That is, in the present embodiment, the green sheet 598 is mounted on the conductive paste film 582 which is disposed on the substrate 534 with the peel layer 536 being interposed therebetween, and the green sheet 598 and the conductive paste film 582 are then fired, whereby the sheet member in which the thick-film conductive body is formed on one of opposite surfaces of the thick-film dielectric body is formed. Thus, as in the embodiment shown in FIG. 53, the EL display device is obtained by disposing the luminous layer on the other of the opposite surfaces of the formed sheet member. Therefore, in the present embodiment, either, the second dielectric layer 518 is not disposed on the substrate 512 constituting the inorganic EL display device 510, when its film is formed. Rather, the second dielectric layer 518 is provided by the sheet member which is constituted by the thick-film dielectric body and back face electrode layer prepared independently of the other components such as the luminous layer. Thus, in the present embodiment, too, there is obtained an advantage that the material composing the inorganic EL display device 510 except the back face electrodes 516 is not required to have a heat resistance corresponding to the composition material of the second dielectric layer 518.

Further, in the present embodiment, since the thick-film dielectric body constituting the second dielectric layer 518 is formed from the green sheet 598 which is prepared independently of the other components, the dielectric film can be formed with a higher degree of uniformity in its thickness and a higher degree of surface smoothness, as compared with a case where the dielectric paste film 548 is formed by a screen printing method or the like as in the embodiments shown in FIGS. 50 and 53. Further, it is possible to easily prevent the dielectric film from being contaminated by foreign matters, as compared with the case where the dielectric paste film 548 is formed by the screen printing method or the like. It is noted that the higher degree of surface smoothness of the dielectric film serves to advantageously increase adhesiveness of the dielectric film to the fluorescent layer when the dielectric film is posteriorly fixed to the fluorescent layer.

While the back face electrodes 516 are disposed on the substrate 512 in the seventeenth through nineteenth embodiments, the substrate 512 does not have to be necessarily provided, for example, where the production process as shown in FIG. 53 is adopted.

While the three-color fluorescent bodies are provided in the fluorescent layers to enable full-color display in the seventeenth through nineteenth embodiments, the present invention is equally applicable to a case where the fluorescent layers are constituted by only a single-color or two-color fluorescent bodies, or constituted by fluorescent bodies of four or more colors.

In the seventeenth through nineteenth embodiments, the producing method of the present invention is applied to the EL display device 510 capable of displaying a desired image owing to the provision of the plurality of back face electrodes 516 and transparent electrodes 524 which extend in the direction perpendicular to each other. However, the present invention is applicable irrespective of number of the back face electrodes 516 and transparent electrodes 524. That is, the present invention is applicable also to a simple light emitting device equipped with a single back face electrode and a single transparent electrode.

While the thickness of the second dielectric layer 518 is adapted to be abut 20 (μm) in the seventeenth through nineteenth embodiments, the thickness value may be suitably changed depending upon required electrical properties of the EL display device 510.

The material and dimensions of each of the layers constituting the EL display device 510 are not limited to the details of the illustrated embodiments, but may by suitably changed depending upon desired luminous characteristics.

In the seventeenth through nineteenth embodiments, the transparent electrodes 524 are provided on the side of the first dielectric layer 522, i.e., on a light emission side. However, the transparent electrodes 524 may be replaced by electrodes each made of a metallic material or other non-transparent material and having a small width, as long as a sufficient amount of light can pass through such non-transparent electrodes.

Further, in the seventeenth through nineteenth embodiments, the second dielectric layer 518 is fixed to the luminous portion 520 and the back face electrodes 516, and the first dielectric layer 522 is fixed to the luminous portion 520 and the transparent electrodes 524. However, the layers do not have to be necessarily fixed to each other, as long as they are positioned close to each other, since the light emission by the luminous portion 520 is based on a condenser structure which is formed between the back face electrodes 516 and the transparent electrodes 524.

TWENTIETH EMBODIMENT

Figure 57:
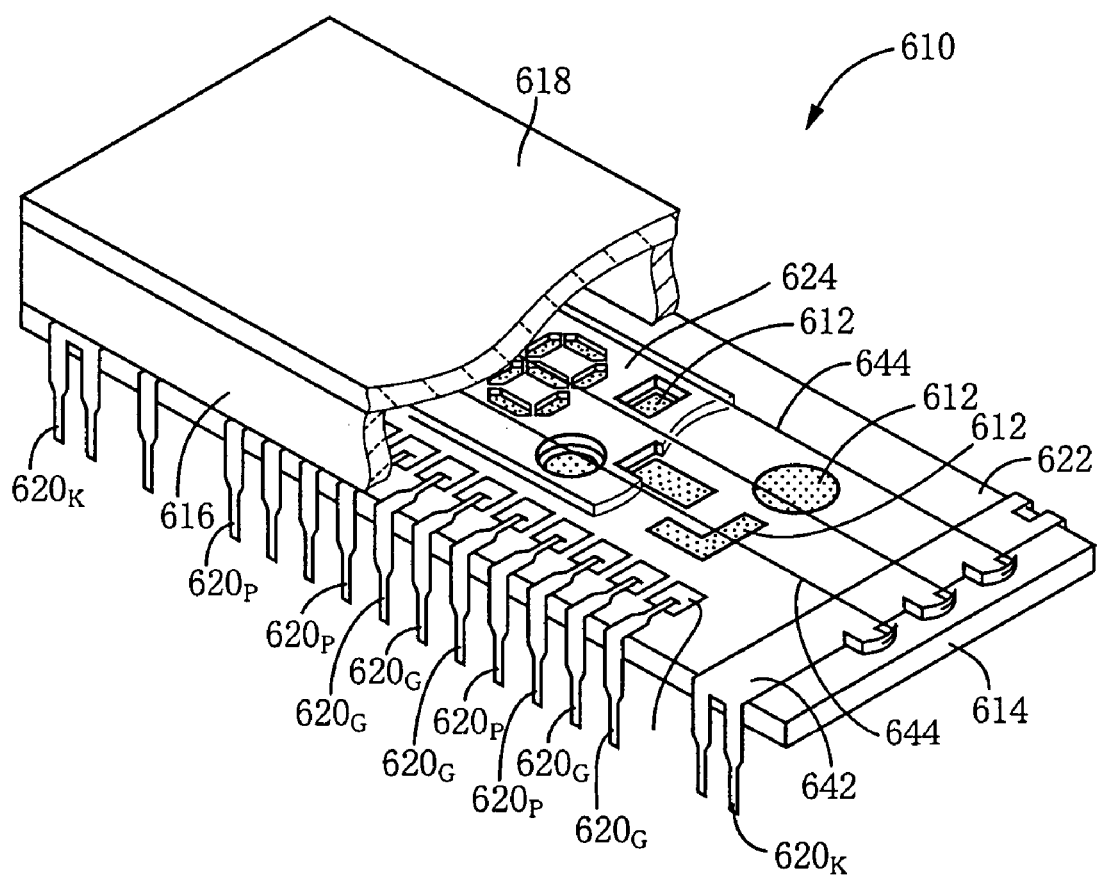
FIG. 57 is a perspective view partially in cross section of a fluorescent display tube which is one embodiment of an eighth invention, so as to explain its construction.

FIG. 57 is a perspective view partially in cross section of an entirety of a fluorescent display tube 610 which is one embodiment of an eighth invention, so as to explain its construction. As shown in the figure, the fluorescent display tube 610 is equipped with a substrate 614 made of an insulating material such as glass, ceramics and porcelain enamel; a glass spacer 616 provided by a rectangular-frame-shaped member; a cover glass plate 618 provided by a transparent flat plate; and a plurality of anode terminals 620$_P$, grid terminals 620$_G$ and cathode terminals 620$_K$ which are arranged to pass through the substrate 614 and the spacer 616. The substrate 614 has a surface on which a multiplicity of fluorescent layers 612 are disposed. The substrate 614, the glass spacer 616 and the cover glass plate 618 are connected to one another by a glass sealing, and cooperate to constitute an elongated-box-shaped gastight vessel in which a vacuum space defined by these members 614, 616, 618 is formed.

The surface 622 of the substrate 614 covered by the vacuum space, and serves as a display surface. The fluorescent layers 612 disposed on the display surface 622 are constituted by fluorescent bodies adapted to emit various colors, such as $(Zn_xCd_{(1-x)})S:Ag,Cl$ for emitting red color, ZnS:Cu,Al for emitting green color, ZnS:Cl for emitting blue color and $(Zn_xCd_{(1-x)})S:Ag,Cl$ for emitting yellow color. The fluorescent layers 612 consist of, for example, a total of seven segments having respective different shapes such as an eight-shaped segment, a rectangular segment and a circular segment.

Figure 58:
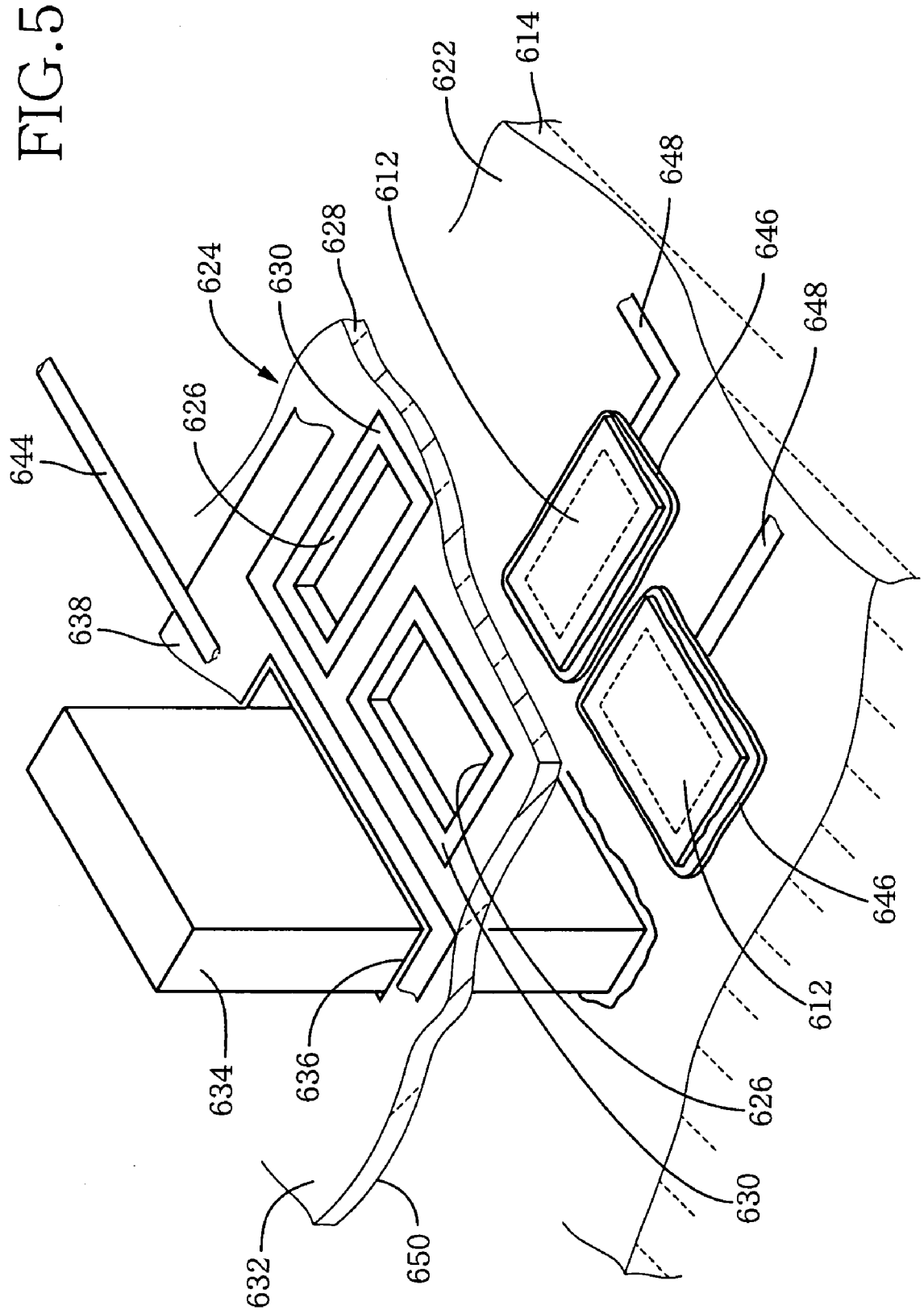
FIG. 58 is a view in enlargement showing a part of the vicinity of a display surface of a substrate of the fluorescent display tube of FIG. 57, and explaining its construction.

Further, a sheet member 624 is fixed onto the display surface 622 such that the plurality of fluorescent layers 612 are covered with the sheet member 614. As shown in FIG. 58 which shows in enlargement a part of the display surface 622, the sheet member 624 is equipped with a thin-plate-like thick-film dielectric body 628 having opening portions 626 provided in its plurality of portions, and thick-film conductive electrodes 630 fixed to peripheral portions of the opening portions 626. The thin-plate-like thick-film dielectric body has a thickness of about 20–30 (μm), and is made of a thick-film dielectric material constituted by a low-melting-point glass and a ceramic filler such as an alumina, wherein the low-melting-point glass is a $PbO—B_2O_3—SiO_2—Al_2O_3—ZnO—TiO_2$ based glass or a glass containing combination of selected ones of PbO, $B_2O_3$, $SiO_2$, $Al_2O_3$, ZnO and $TiO_2$. Each of the thick-film conductive electrodes 630 is a thick-film conductive body containing conductive components in the form of, for example, silver (Ag), nickel (Ni), aluminum (Al), copper (Cu) and carbon (C), and has a thickness of about 5–20 (μm) and a width of about 50–500 (μm) as measured along an upper surface 632 of the thin-plate-like thick-film dielectric body 628.

Figure 59:
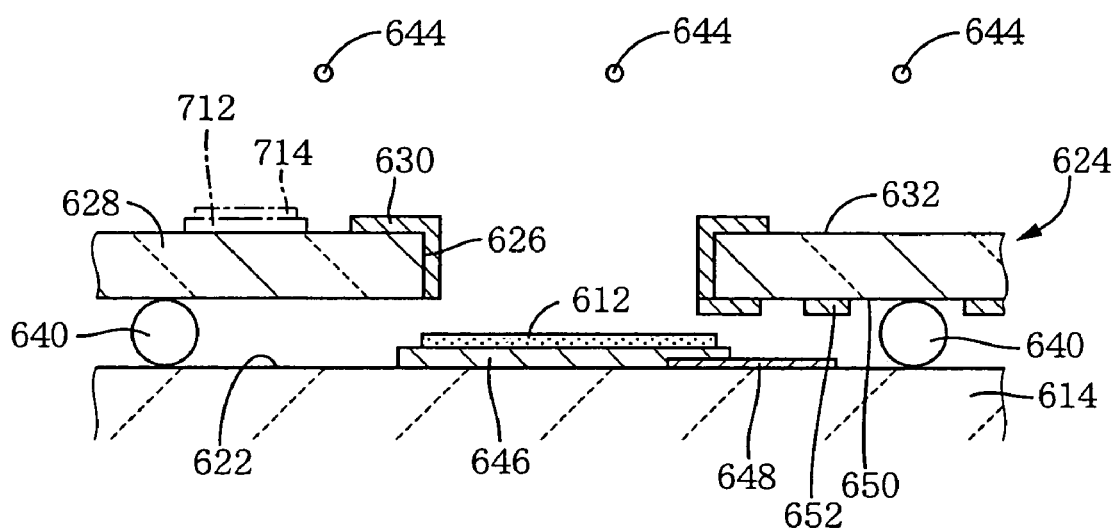
FIG. 59 is a cross sectional view for explaining a main portion of the fluorescent display tube of FIG. 57.
Figure 60:
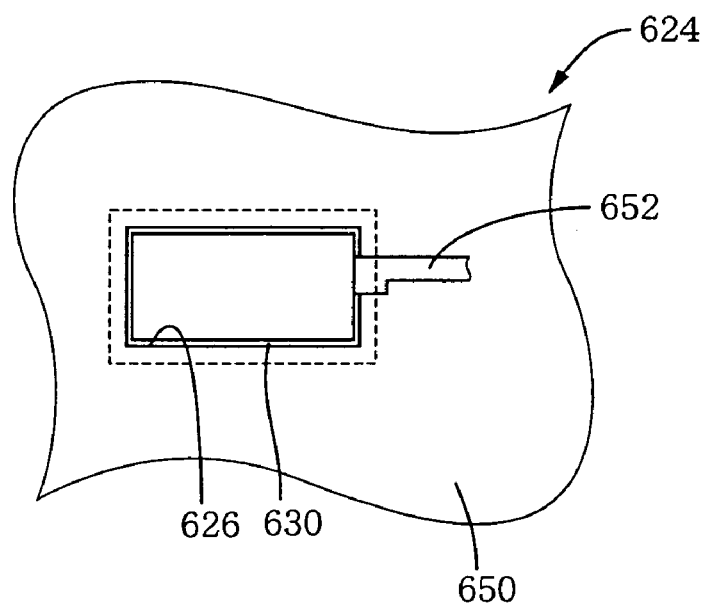
FIG. 60 is a view for explaining a bottom surface of a sheet member which is provided in the fluorescent display tube of FIG. 57.

As is apparent from FIG. 59 which shows a main portion of cross sectional structure of the fluorescent display tube 610, the opening portions 626 are positioned upwardly of (or positioned right above) the respective fluorescent layers 612. Each of the opening portions 626 has an opening shape which is substantially identical with a contour of the corresponding fluorescent layer 612 but is slightly smaller than the contour of the fluorescent layer 612. That is, each fluorescent layer 612 is formed to have an area which is slightly larger than an opening area of the corresponding opening portion 626, and is positioned relative to the corresponding opening portion 626 such that substantially the entirety of each fluorescent layer 612 except its peripheral portion can be seen through the corresponding opening portion 626.

Each of the thick-film conductive electrodes 630, which is located in the peripheral portion of the corresponding opening portion 626 having the above-described shape, is positioned upwardly of the corresponding fluorescent layer 612, in such a position that permits the conductive electrode 630 to substantially surround the fluorescent layer 612. Each conductive electrode 630 serves as a grid electrode (control electrode) for controlling light emission of the corresponding fluorescent layer 612, as described below. It is noted that each conductive electrode 630 extends from the upper surface 632 throughout an inner circumferential surface of the corresponding opening portion 626, as shown in FIG. 59.

In FIG. 58, a reference sign 634 denotes a supporter 634 which extends upright from the substrate 614 and supports the cover glass plate 618. The sheet member 624 has supporter-receiving through-holes 636 which are positioned in suitable positions, for permitting the supporters 634 to pass through the respective supporter-receiving through-holes 636. The arrangement of the supporters 634 is effective to restrain deflection or other deformation of a portion of the cover glass plate 618 which portion corresponds to an inner portion of the display surface 622, although the sheet member 624 is provided to cover substantially the entirety of the display surface 622. It is noted that each of the supporters 634 has a surface covered with a conductive film which is formed from, for example, ITO (indium tin oxide), ATO (antimony tin oxide) and inorganic metallic material such as silver (Ag) and gold (Au). Further, a conductive film 638 is provided on the upper surface 632 of the sheet member 624. The conductive film 638, which is insulated from the thick-film conductive electrodes 630, are formed on substantially the entirety of the upper surface 632 of the sheet member 624 except the peripheral portions of the respective opening portions 626, although FIG. 58 illustrates only a part of the conductive film 638 which is located around the supporter-receiving through-holes 636.

As shown in FIG. 59, an extremely large number of spherical spacers 640 are interposed between the substrate 614 and the sheet member 624. Each of the spherical spacers 286 is provided by a glass bead, ceramic ball or the like whose maximum diameter is adjusted to have a substantially constant value that is about 150–300 (μm), preferably about 200–250 (μm), and is fixed to the substrate 614 and the sheet member 624 by glass frit or the like (not shown). That is, in the present embodiment, the sheet member 624 is fixed to the display surface 622 of the substrate 614 through the spherical spacers 640. It is noted that a height position of the sheet member 624, i.e., a gap between the fluorescent layers 612 and the thick-film conductive electrodes 630 is substantially defined by the maximum diameter of the spherical spacers 640 interposed between the substrate 614 and the sheet member 624. This arrangement provides a constant spacing distance between the fluorescent layers 612 and the thick-film conductive electrodes 630 which serves as grid electrodes, thereby preventing the grid electrodes 630 and the fluorescent layers 612 from being shorted to each other while permitting the spacing distance to have the above-described value. The spherical spacers 640 can be obtained from a group of glass beads or ceramic balls which has a suitable particle size distribution. That is, large particles contained in the group are removed by using a filter (mesh) which has perforations whose size corresponds to the predetermined maximum diameter, so that non-removed particles are used as the spherical spacers 640. Thus, it is possible to prevent particles larger than the predetermined maximum diameter, from being used as the spherical spacers 640, and also possible to increase the percentage of ones having the predetermined maximum diameter, in all of the spherical spacers 640.

Referring back to FIG. 57, in opposite end portions of the substrate 614, there are fixedly provided a pair of filament support frames 642 each of which is equipped with the above-described cathode terminals $620_K$. A plurality of fine wire filaments (filament cathodes) 644 serving as directly-heated-type cathodes (negative electrodes) are provided to be supported by and extend between the pair of filament support frames 642, such that the filaments 644 are parallel with a longitudinal direction of the substrate 614 and are positioned in a predetermined height position so as to be spaced apart from the display surface 622. The sheet member 624 equipped with the grid electrodes 630 is positioned in a height position between the filaments 644 and the fluorescent layers 612. Although the fluorescent display tube 610 is equipped with an evacuation hole and a getter or the like, they are not illustrated in the figure. The evacuation hole serves to evacuate a gas from the vacuum vessel, and to seal the vacuum vessel. The getter or the like serves to maintain a vacuum state within the vacuum vessel after the vessel is sealed. Although the getter can be attached to, for example, the filament support frames 642, it may be provided in a portion of the upper surface 632 of the sheet member 624 without interfering with the grid electrodes 630 and the conductive film 638.

As shown in FIGS. 58 and 59, a plurality of anodes 646 are disposed on the display surface 622. Each of the anodes 646 is located under a corresponding one of the fluorescent layers 612, and has a shape substantially identical with that of the corresponding fluorescent layer 612, and an area substantially equal to or slightly larger than that of the corresponding fluorescent layer 612. Each anode 646 is provided by a graphite layer having a thickness of about 20–40 (μm), and is connected to a corresponding one of anode connection wires 648. Each of the anode connecting wires 648 is formed from a thick-film conductive paste which is printed with a screen printing method or the like so as to have a thickness of about 15 (μm) and which is then fired, or alternatively, is formed from an aluminum thin film which is deposited and is then subjected to an etching treatment or the like. Each anode 646 is disposed such that its part overlaps with an end portion of the corresponding wire 648. Each wire 648 is arranged to extend to an edge of the substrate 614 in which the above-described anode terminals $620_P$ are positioned, and is connected to a unit of the terminals $620_P$ which is determined according to a drive method. It is noted that each wire 648 may be covered with a thick-film insulating layer although it is exposed in illustration of the figure.

On the other hand, each of the thick-film conductive electrodes, i.e., each of the grid electrodes 630, which are disposed on the sheet member 624, is connected to a unit of the grid terminals $620_G$ which is determined according to the drive method. The connections between the grid electrodes 630 and the grid terminals $620_G$ are established by utilizing a lower surface 650 of the sheet member 624. On the lower surface 650, there are disposed grid connection wires 652 each of which is provided by a thick-film conductive body as the grind electrodes 630 and has a thickness of about 2–20 (μm). The thickness of each grid connection wire 652 is made as small as several μm or less where the wire 652 is formed from a thick-film conductive paste containing fine powders of silver (Ag) as its conductive component. The thickness of each grid connection wire 652 is made as large as ten-odd μm or more where the wire 652 is formed from a thick-film conductive paste containing powders of aluminum (Al) as its conductive component. Each grid connection wire 652 is formed such that its end portion is positioned in a periphery of the corresponding opening portion 626, and is connected to the corresponding grid electrode 630 which is formed on the inner circumferential surface of the opening portion 626. The sheet member 624, which is fixed to the substrate 614 through the spherical spacers 640 so as to be distant from the display surface 622 as described, is provided by a sheet-like thick film formed by a production process as described below. The sheet member 624 provided by the sheet-like thick film is so flexible that the sheet member 624 is in contact, at portions of its peripheral portion at which portions are not supported by the spherical spacers 640, with the display surface 622. In view of this, by positioning the contact portions of the peripheral portion on the grid terminals $620_G$ or on wires connected to the grid terminals $620_G$ and disposed on the display surface 622, it is possible to easily connect the grid connection wires 652 to the grid terminals $620_G$.

In operation of the fluorescent display tube 610 constructed as described above, while a predetermined amount of heat current is constantly applied to the above-described filaments 644, an accelerating voltage (positive voltage) of about 20V with respect to the filaments 644 of 0V is applied to the grid electrodes 630 in a predetermined order such that a scanning is effected. Further, in synchronization with the scanning, a driving voltage of about 20V, which is equal to the above-described accelerating voltage, is applied to the anode connecting wires 648 with respect to the cathode potential according to input data. As a result, thermo-electrons emitted from the filaments 644 are accelerated by the grid electrodes 630 to which the accelerating voltage is being applied, and then strike the fluorescent layers 612 which are positioned inside the grid electrodes 630 (i.e., which are substantially surrounded by the grid electrodes 630) with the application of the positive voltage of the fluorescent layers 612 through the anodes 646, so that the fluorescent layers 612 emit light. However, no light is emitted from the fluorescent layers 612 even where the positive voltage is being applied to the fluorescent layers 612, if a cutoff bias voltage of about several volts with respect to the filaments 644 is being applied to the grid electrodes 630. This is because the application of the cutoff bias voltage to the grid electrodes 630 impedes arrival of the thermo-electrons to the fluorescent layers 612. That is, while the thermo-electrons are being emitted by application of the current to the filaments 644, the positive voltage is applied to desired ones of the fluorescent layers 612, in synchronization with the sequential application of the accelerating voltage to the grid electrodes 630, so that a luminous display is effected in a desired pattern by a so-called dynamic drive.

In the operation of the fluorescent display tube 610 of the present embodiment, each of the opening portions 626 is provided to have such a size that makes it possible to see substantially of an entirety of (a corresponding) one of the fluorescent layers 612 which is located right below each opening portion 626, through each opening portion 626, so that the lights emitted form the fluorescent layers are not blocked by the grid electrodes 630. Thus, it is possible to increase the luminous efficiency as compared with a case where mesh-like grid electrodes are used.

During the operation of the fluorescent display tube 610, the above-described conductive film 638 is held in substantially the same electric potential as the filaments 644. Thus, even if some of the thermo-electrons emitted from the filaments 644 advance toward to portion of the sheet member 624 in which the opening portions 626 are not provided, the advances of such thermo-electrons are impeded by the negative filed formed by the conductive film 638, like ones of the thermo-electrons advancing toward the grid electrodes 630 to which the cutoff bias voltage is applied. Thus, each generated thermo-electron passes through the opening portion 626 and strikes the fluorescent layer 612 with a high probability, thereby making it possible to increase the luminous efficiency. Further, the conductive body such as ITO covering the above-described supporters 634 serves to permit the surface of each supporter 634 to be electrified by the thermo-electrons, thereby preventing formation of a negative field impeding advances of the thermo-electrons toward the fluorescent layers 612.

Figure 61:
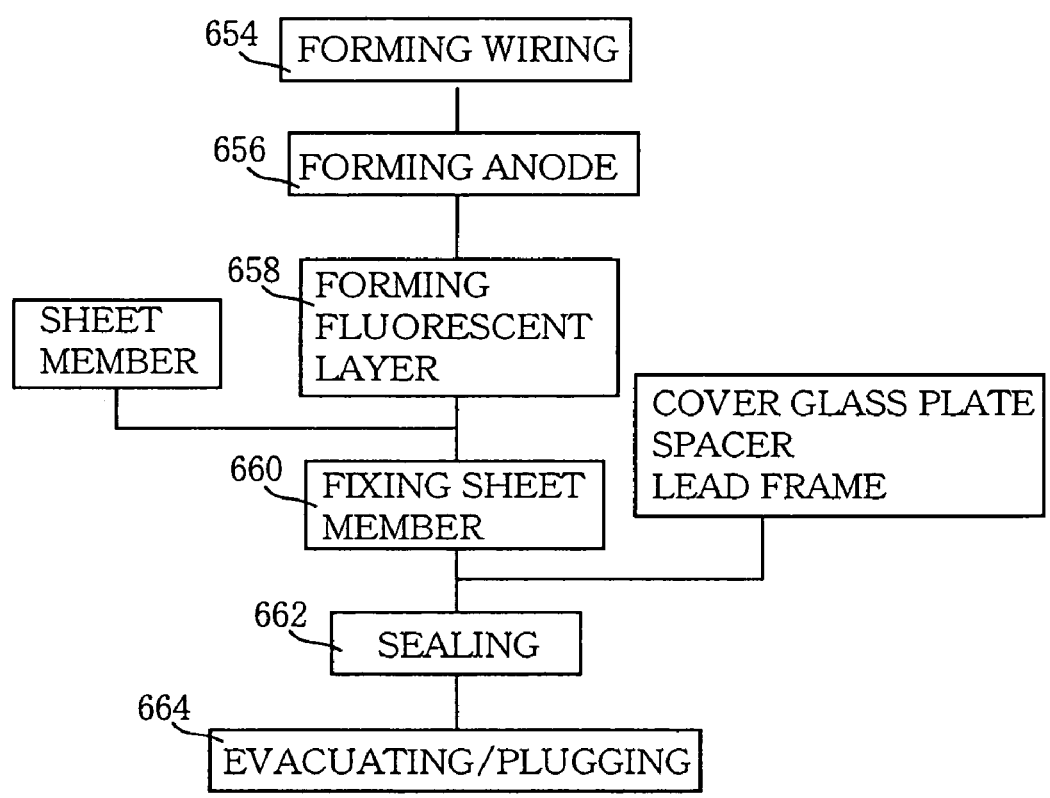
FIG. 61 is a process chart for explaining a production process of the fluorescent display tube of FIG. 57, which process is one embodiment of a ninth invention.

The above-described fluorescent display tube 610 is produced, for example, in accordance with a process, as shown in FIG. 61, which is one embodiment of a producing method of a ninth invention. That is, a wiring forming step 654 is first implemented to form the anode connecting wires 648 on the substrate 614 by using, for example, a thick-film screen printing method, a vapor deposition method or the like. Then, an anode forming step 656 is implemented to apply a graphite paste onto the anode connecting wires 648 so as to form the anodes 646, by using a thick-film screen printing method or the like. Then, a fluorescent-layer forming step 658 is implemented to apply a fluorescent paste on the anodes 646 so as to form the fluorescent layers 612, by using a thick-film screen printing method or the like.

Next, in a sheet-member fixing step 660, a glass pate or the like including the above-described spherical spacers 640 is applied onto portions of the substrate 614 on which the anode connection wires 648 and the fluorescent layers 612 are not formed, and the sheet member 624 which has been previously prepared is then fixed to the substrate 614 by a heat treatment, after the sheet member 624 is mounted on the substrate 614. Then, a lead frame, the spacer 616 and the cover glass plate 618, which have been previously prepared are sequentially mounted onto the substrate 614, and are subjected to a heat treatment in a sealing step 662. The lead frame is provided by the above-described terminals 620 and filament support frames 642 which are integral with each other. As a result of the implementation of the sealing step 662, the lead frame is fixed to the substrate 614 by a glass frit or the like which has been previously applied onto the substrate 614, while at the same time the glass plate 618 is fixed to the substrate 614 through the spacer 616, whereby a gastight space is formed between the cover glass plate 618 and the substrate 614. An evacuating/plugging step 664 is then implemented to evacuate a gas from the gas-tight space through the above-described evacuation hole (not shown) such that the gastight space has a reduced pressure. After the evacuation, the evacuation hole is plugged, whereby the fluorescent display tube 610 is obtained.

Figure 62:
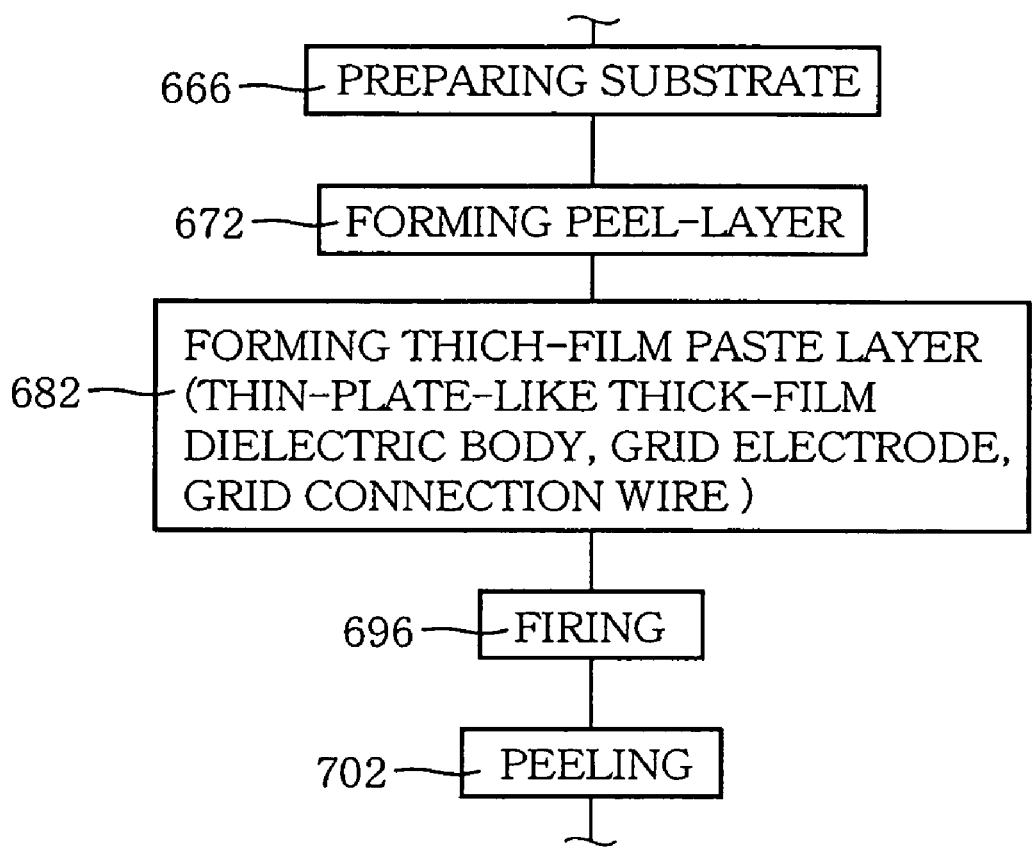
FIG. 62 is a process chart for explaining a method of producing a sheet member in the production process of FIG. 61.

In the above-described production process, the sheet member 624 is produced in accordance with a process shown in FIG. 62 to which a well-known thick-film printing technique is applied. There will be described a method of producing the sheet member 624, with reference to FIGS. 63(*a*)–(*g*) which represent states in main stages of the production process.

The process is initiated with a substrate preparing step 666 implemented to prepare a substrate 668 (see FIG. 63) which is to be subjected to a thick-film printing, and then effect a suitable cleaning treatment on a surface 670 of the substrate 668. This substrate 668 is provided by a member which does not suffer from considerable deformation and deterioration in a heat treatment which is described below. For example, it is preferable to use, as this substrate 668, a glass substrate or the like such as soda lime glass which has a coefficient of thermal expansion of about $87 \times 10^{-7}$(/° C.), a softening point of about 740(° C.) and a distortion point of about 510(° C.). It is noted that the substrate 668 has a thickness of about 2.8 (mm) and that its surface 670 has a size which is sufficiently larger than the above-described sheet member 624. In the present embodiment, the above-described substrate 668 corresponds to a predetermined substrate which is used for producing a sheet member.

Figure 63:
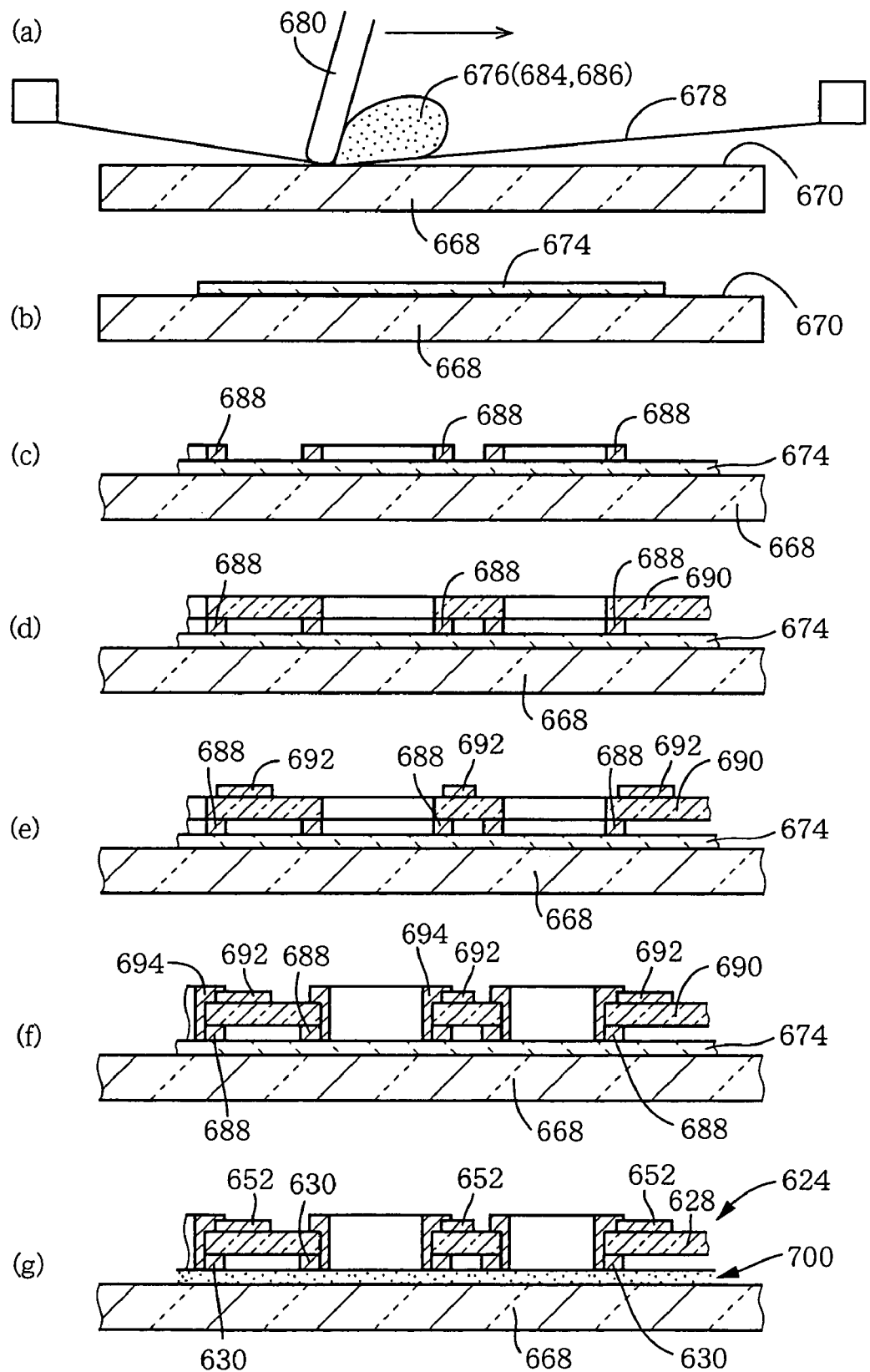
FIGS. 63(a)–(g) are views for explaining a cross section in main stages of the production process of FIG. 62.

A peel-layer forming step 672 is then implemented to dispose a peel layer 674 constituted by high-melting-point particles which are bonded together with a resin, on the surface 670 of the substrate 668 such that the peel layer 674 has a thickness of about 5–50 (μm). The high-melting-point particles are provided by a mixture of high-softening-point glass frit whose average particle size is about 0.5–3 (μm) and ceramic filler such as alumina and zirconia whose average particle size is about 0.01–5 (μm). The high-softening-point glass has a softening point of about 550(° C.) or higher. The high-melting-point particles consisting of the mixture has a softening point of about 550(° C.) or higher. The resin is provided by ethyl cellulose resin or the like which is burnt at about 350(° C.). The peel layer 674 is disposed on the surface 670 of the substrate 668, for example, by applying an inorganic material paste 676 which is constituted by the above-described high-melting-point particles and resin which are dispersed in an organic solvent such as butyl carbitol acetate (BCA), onto substantially the entire surface of the substrate 668 with a screen printing method as shown in FIG. 63(*a*), and then drying the applied paste 676 at a room temperature. However, the peel layer 674 may be disposed on the surface 670 of the substrate 668, by sticking a coater or film laminate onto the surface of the substrate 668. FIG. 63(*b*) shows a stage in which the peel layer 674 is formed as described above. It is noted that reference signs 678 and 680 denote a screen and a squeegee, respectively, in FIG. 63(*a*). In the present embodiment, the substrate 668 provided with the peel layer 674 corresponds to a support body. A surface of the peel layer 674 corresponds to a film formation surface. The substrate preparing step 660 and peel layer forming step 672 correspond to a support-body preparing step.

A thick-film-paste-layer forming step 682 is then implemented to sequentially apply a thick-film dielectric paste 684 forming the above-described thin-plate-like thick-film dielectric body 628 and a thick-film conductive paste 686 forming the above-described grid electrodes 630 and grid connection wires 652, in predetermined patterns on the peel layer 674, in the same manner as the application of the inorganic material paste 676, namely, with the screen printing method (see FIG. 63(*a*)). The applied pastes are then dried, whereby a printed conductive layer 688, a printed dielectric layer 690, and printed conductive layers 692, 694 are sequentially formed on the peel layer 674. The printed conductive layer 688 is formed to provide a portion of each of the grid electrodes 630 which is located on the upper surface 632 of the thin-plate-like thick-film dielectric body 628. The printed dielectric layer 690 is formed to provide the thin-plate-like thick-film dielectric body 628. The printed conductive layer 692 is formed to provide the grid connection wires 652. The printed conductive layer 694 is formed to provide a portion of each of the grid electrodes 630 which is located on the inner wall surface of the corresponding opening portion 626. The above-described thick-film conductive paste 686 is constituted by conductive material powders such as silver powders, glass frit and resin which are dispersed in an organic solvent. The thick-film dielectric paste 684 is constituted by dielectric material powders such as alumina and zirconia, glass frit and resin which are dispersed in an organic solvent. As the glass frit, for example, $PbO—B_2O_3—SiO_2—Al_2O_3—TiO_2$ based low-softening point glass is used. As the resin and solvent, for example, material similar to the inorganic material paste 676 is used.

The screen 678 used for the formation of the printed dielectric layer 690 has an aperture pattern corresponding to configuration of the thin-plate-like thick-film dielectric body 628 as shown in FIGS. 58 and 59. The screen 678 used for the formation of the printed conductive layer 688 has an aperture pattern corresponding to configuration of portions of the grid electrodes 630 located on the upper surface 632 of the thick-film dielectric body 628. The screen 678 used for the formation of the printed conductive layer 692 has an aperture pattern corresponding to configuration of the grid connection wires 652. The thick-film dielectric paste 684 and the thick-film conductive paste 686 are applied to have such thickness values that become the above-described thickness values after the firing shrinkage. As a result of the paste application, thick films (printed films) having configurations as shown in FIGS. 63(*c*)–(*e*) are formed. In the figures, the printed dielectric layer 690 and the peel layer 674 are illustrated as if there were formed a gap therebetween, for convenience of the explanation. However, since the applied thick-film dielectric paste 684 has a sufficiently high fluidity and a sufficiently small thickness, a lower surface of the printed dielectric layer 690 conforms to a paste applied surface, i.e., a surface of the peel layer 674 while an upper surface of the printed dielectric layer 690 is flat.

The screen 678 used for the formation of the printed conductive layer 694 has apertures each having a portion located inside the inner wall surface of the corresponding opening portion 626 of the thick-film dielectric body 628, so that the applied thick-film conductive paste 686 flows downward from the upper surface of the printed dielectric layer 690 along the inner wall surface of the opening portion. The thick-film conductive paste 686 used for the formation of the printed conductive layer 694 is provided by a paste whose conductive component is constituted by fine particles such as silver particles, so as to have a high fluidity. As a result of the downward flow of the applied thick-film conductive paste 686, a printed film extending along the inner wall surface of each opening portion 626 is formed as shown in FIG. 63(*f*). Each of the printed conductive layers 688, 692 whose thickness is about 5–10 (μm) is formed by one-time printing. However, the printed dielectric layer 690 whose thickness is about is about 30 (μm) is formed by repeating the printing and drying about three times, namely, is formed of the thus laminated layers. It is noted that the thickness of each of the thick-film printed layers 688–694 illustrated in FIGS. 63(*a*)–(*g*) is larger than the actual thickness value.

After the printed thick-film layers 688–694 have been formed as described above, the layers are dried so that the solvent is removed from the layers. In a firing step 696, the substrate 668 is disposed in a furnace chamber of a firing furnace (not shown) so that the substrate 668 is subjected to a heat treatment which is carried out at a firing temperature of about 550(° C.) that is suitable for kinds of the thick-film dielectric paste 684 and thick-film conductive paste 686.

In the process of the heat treatment, the resin component of each of the printed thick-film layers 688–694 is burnt, while the dielectric material, conductive material and glass frit are sintered since the sintering temperature is about 550(° C.), so that the thin-plate-like thick-film dielectric body 628, grid electrodes 630 and grid connection wires 652 are formed whereby the sheet member 624 is obtained. FIG. 63(*g*) shows this state. In this instance, since the inorganic component particles of the peel layer 674 have the softening point of 550(° C.) or higher, the high-melting-point particles (glass powders and ceramic filler) are not sintered while the resin component is burnt in the peel layer 674. Therefore, after the burning of the resin component as a result of progress of the heat treatment, the peel layer 674 converts into a particle layer 700 consisting of only high-melting-point particles 698, as shown in FIG. 64.

Figure 64:
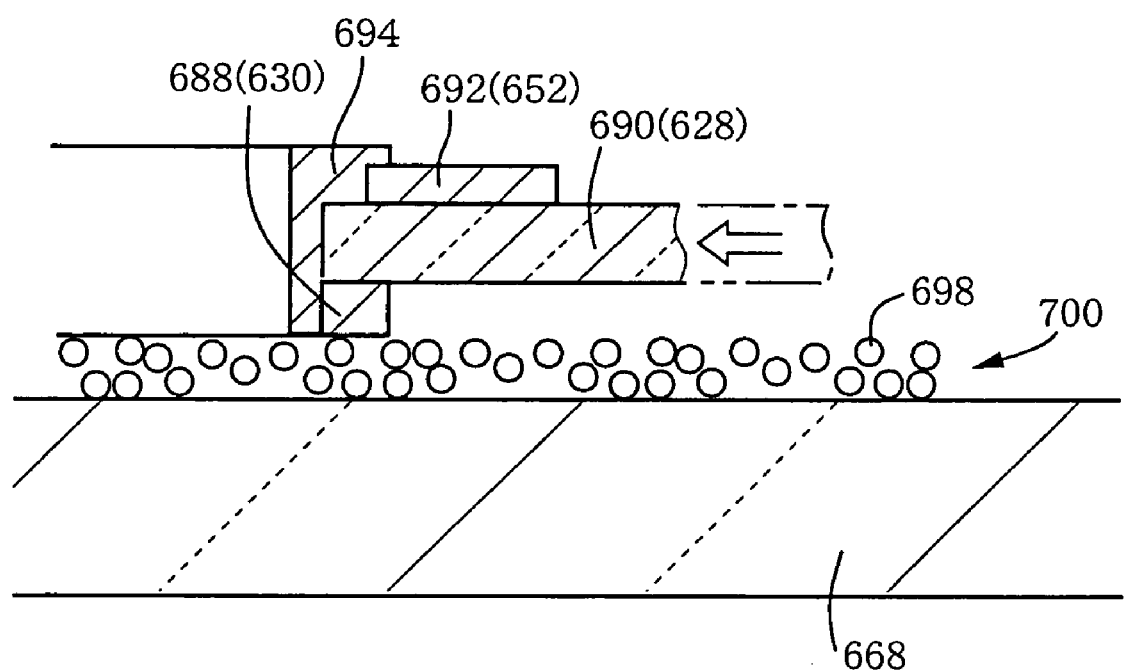
FIG. 64 is a view in enlargement showing a right end portion of FIG. 63(g), for explaining function of a peel layer.

FIG. 64 is an enlarged view of a part of a right end of FIG. 63(*g*), schematically showing a state in progress of the sintering in the above-described heat treatment. The particle layer 700, which has been formed as a result of burning of the resin component of the peel layer 674, is a layer constituted by the high-melting-point particles 698 which are merely superposed on each other and which are not bound to each other. Therefore, when the printed thick-film layers 688–694 shrink as indicated in FIG. 64 in which their end portions before the sintering are represented by one-dot chain line, the high-melting-point particles 698 function as rollers. Owing to the roller function of the particles 698, between a lower portion of a set of the printed thick-film layers 688–694 and the substrate 668, there is not generated a force impeding the shrinkage of the layers 688–694. Thus, the lower and upper portions of the set of the layers 688–694 equally shrink, so that the set of the layers 688–694 is free from density variation and warp arising from difference in the shrinkage amount.

In the present embodiment, when the sintering of the printed thick-film layers 688–694 is initiated, the firing shrinkage of the layers 688–694 is not impeded by the substrate 668 owing to the above-described function of the particle layer 700. Therefore, the quality of the formed thick film is not practically affected by the thermal expansion of the substrate 668. It is noted that the substrate 668 may be provided by a heat resistant glass having a further high distortion point (for example, a borosilicate glass which has a coefficient of thermal expansion of about $32 \times 10^{-7}$(/° C.) and a softening point of about 820(° C.), or a quartz glass having a coefficient of thermal expansion of about $5 \times 10^{-7}$(/° C.) and a softening point of about 1580(° C.)), where the substrate 668 is repeatedly used, or where the heat treatment temperature is considerably high. In this case, too, the thermal expansion amount of the substrate 668 is extremely small in the temperature range in which the dielectric material powders have a small bonding strength. That is, in this case, either, the quality of the formed thick film is not affected by the thermal expansion of the substrate 668.

Referring back to FIG. 62, a peeling step 702 is implemented to peel the formed thick-film, i.e., the sheet member 624 from the substrate 668. Since the particle layer 700 interposed therebetween is constituted by the high-melting-point particles 698 which are merely superposed on each other, the peeling can be easily made without using any chemical and device. In this instance, some of the high-melting-point particles 698 cooperating to have a thickness corresponding to that of one layer might adhere to a bottom surface of the sheet member 624. The adhering particles are removed by using an adhesive tape or an air blow as needed. It is noted that the substrate 668 from which the thick film has been peeled is repeatedly used for the similar purpose since the substrate 668 is not easily deformed or deteriorated at the above-described sintering temperature.

In the sheet-member fixing step 660 shown in FIG. 61, the sheet member 624 produced as described above is mounted on the substrate 614 such that a surface of the sheet member 624, on which the printed conductive layer 688 is provided, faces upwardly. In this instance, the peel surface of the sheet member 624, which has been positioned on the side of the peel layer 674, faces the filaments 644. The peel surface is made substantially flat, since it is formed through the above-described production process. Owing to the flatness of the peel surface, a spacing distance between the grid electrodes 630 and the filaments 644 is substantially constant throughout an entirety of the fluorescent display tube 610.

As described above, in the present embodiment, the thick-film conductive electrodes 630 are formed along the peripheries of the respective opening portions 626 in the sheet member 624, and the grid electrodes 630 are established by fixing the sheet member 624 onto the display surface 622 of the substrate 614. This arrangement advantageously solves drawbacks encountered in a case where the grid electrodes 630 are disposed on tops portions of rib walls, namely, inconveniences such as a increased length of time required for the production, an increased cost for the materials and a contamination of the fluorescent layers by the thick-film dielectric material which is disposed after the formation of the fluorescent layers. Further, since each of the opening portions 626 is adapted to have such a size that permits a corresponding one of the fluorescent layers 612 to be seen through the opening portion 626, light emitted from the fluorescent layer 612 is not blocked by the grid electrode 630, like in the case where the grid electrodes 630 are disposed on the tops portions of the rib walls. These features make it possible to obtain the fluorescent display tube 610 which has a large open area ratio and can be produced by a simple production process and in which the florescent layers 612 are not substantially contaminated.

Further, in the present embodiment, the grid connection wires 652 are provided on the lower surface of the sheet member 624, as described above. Since the grid connection wires 652 are made separate from the anode connection wires 648 as viewed in a vertical direction, the grid connection wires 652 and the anode connection wires 648 can be arranged relative to each other in a grade separated crossing manner, thereby facilitating the wiring installation.

Further, in the present embodiment, after the thick-film printed layers 688–694 have been formed on the peel layer 674, the layers are subjected to a heat treatment effected at a predetermined temperature, the sheet member 624 is produced wherein the sheet member 624 has the thin-plate-like thick-film dielectric body 628 and the grid electrodes 630 provided on the surface of the thick-film dielectric body 628. Therefore, the peel layer 674, which is not sintered at the heat treatment temperature, converts into the particle layer 700 in which only the high-melting-point particles 698 are arranged, as a result of burning of the resin, so that the formed thick film is not fixed to the film formation surface, whereby the formed thick film can be easily separated from the film formation surface.

TWENTY-FIRST EMBODIMENT

Next, there will be described other embodiments of the eighth invention. In the following embodiments, the same reference signs as used in the above-described embodiments will be used to identify the common parts, and description of these parts will not be provided.

Figure 65:
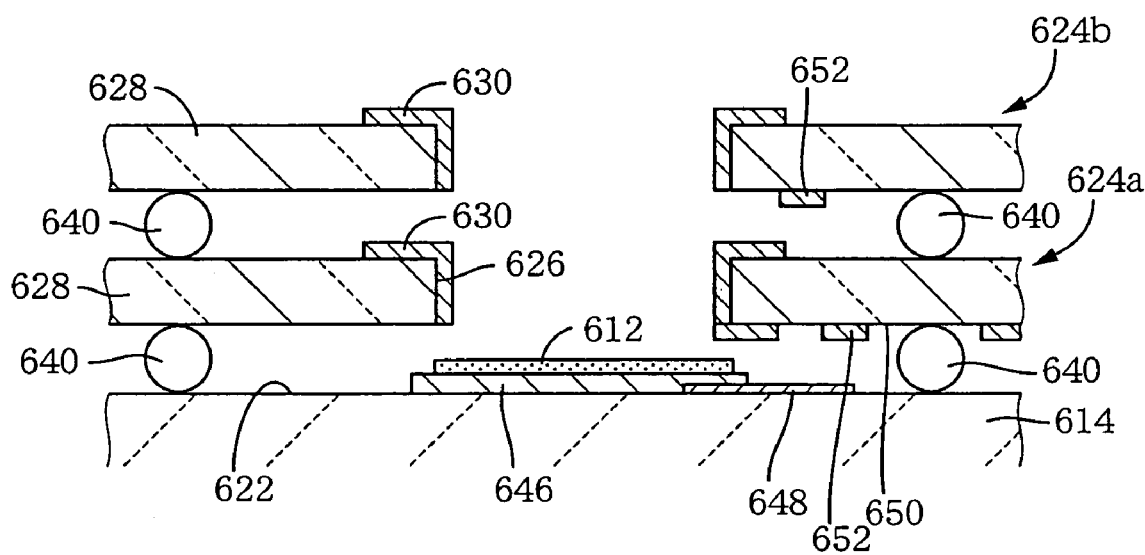
FIG. 65 is a cross sectional view corresponding to the view of FIG. 59, and explaining a main portion of a fluorescent display tube of another embodiment of the eighth invention.

In the embodiment shown in FIG. 65, a sheet member 624b is superposed on a sheet member 624a through the spherical spacers 640. The sheet member 624a is constructed to be substantially the same as the above-described sheet member 624 shown in FIG. 59. Each group of the grid electrodes 630 of the sheet member 624a are commonly connected to the corresponding grid terminal 620$_G$. On the other hand, the sheet member 624b is constructed to be also substantially the same as the above-described sheet member 624, namely, the sheet member 624a. Each group of the grid electrodes 630 of the sheet member 624b are commonly connected to the corresponding grid terminal 620$_G$, in a combination different from that of the grid electrodes 630 of the sheet member 624a, such that each grid electrode 630 of the sheet member 624b is electrically insulated from the corresponding grid electrode 630 of the sheet member 624a which is located right below the above-described each grid electrode 630 of the sheet member 624b. It is noted that the opening portions 626 of the sheet members 624a, 624b are positioned in the same position as viewed in a direction in which the corresponding fluorescent layer 612 is seen through the opening portions 626.

In the thus constructed fluorescent display tube, when an accelerating voltage is applied to the grid electrodes 630 of the sheet members 624a, 624b, the thermo electrons generated from the filaments 644 are directed toward the fluorescent layer 612 which is surrounded by the grid electrodes 630. Thus, the installation of the grid connection wires 652 on the two sheet members 624a, 624b is simplified, whereby a pattern formation for the grid connection wires 652 is facilitated. Thus, there is an advantage that it is easy to form a pattern for a matrix drive type which is driven with a reduced number of drivers.

Figure 66:
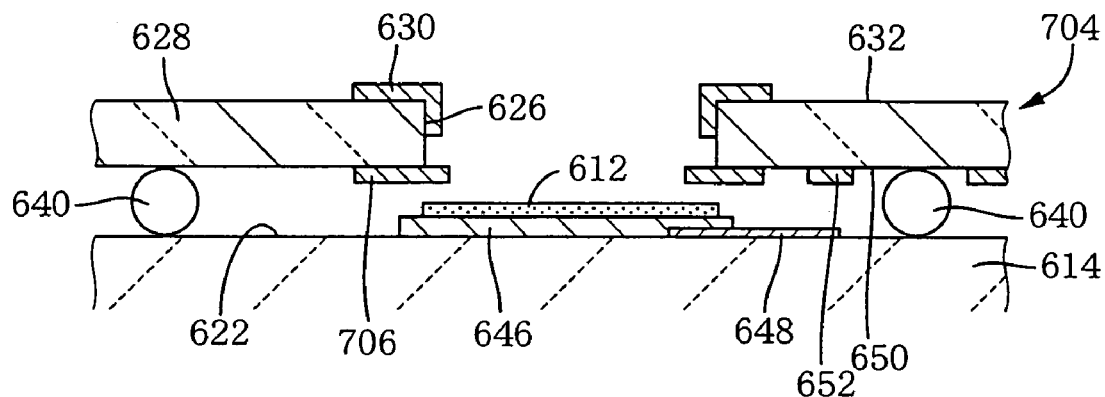
FIG. 66 is a cross sectional view corresponding to the view of FIG. 59, and explaining a main portion of a fluorescent display tube of still another embodiment of the eighth invention.

In the embodiment shown in FIG. 66, there is provided a sheet member 704 in place of the sheet member 624. The sheet member 704 is equipped with a plurality of thick-film conductive electrodes which are disposed on the lower surface 650 of the thin-plate-like thick-film dielectric body 628 and which serve as second grid electrodes 706. Each group of the grid electrodes 630 of the sheet member 704 are commonly connected to the corresponding grid terminal 620$_G$, while each group of the grid electrodes 706 are commonly connected to the corresponding grid terminal 620$_G$, in a combination different from that of the grid electrodes 630. Each of the grid electrodes 630 extends from the upper surface 832 to an intermediate portion of the inner wall surface of the corresponding opening portion 626, while each of the grid electrodes 706 disposed on the lower surface 650 inwardly protrudes from the periphery of the corresponding opening portion 626, so that a spacing gap is formed therebetween, so that the grid electrodes 630, 706 are electrically insulated from each other. Thus, in the present embodiment, too, like in the embodiment shown in FIG. 65, one or ones of the fluorescent layers 616 can be selected to emit light, by combination of the control electrodes 630, 706, thereby advantageously making it possible to simplify the configurations of the grid connection wires 652 disposed on the upper and lower surfaces 632, 650.

Figure 67:
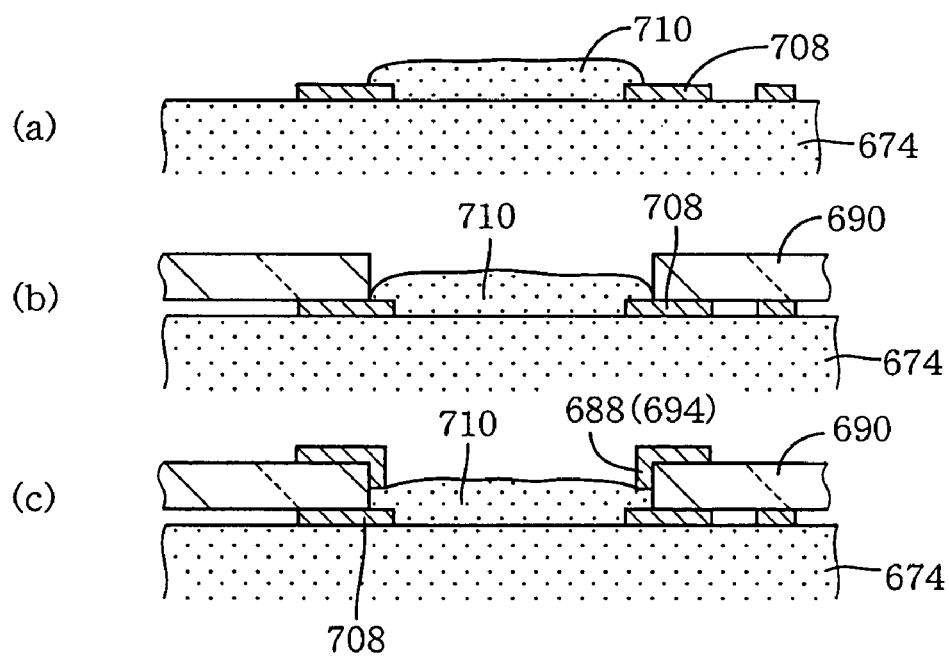
FIG. 67 is a view for explaining a method of producing a sheet member which is used in the embodiment of FIG. 66.

The above-described sheet member 704 can be produced, for example, by a method as shown in FIGS. 67(*a*)–(*c*). That is, a printed conductive layer 708 is first formed on the peel layer 674, to have an annular shape for constituting the grid electrodes 706 and the grid connection wires 652. Then, a second peel layer 710 is formed inside the annular-shaped printed conductive layer 708 such that a radially inner end portion of the printed conductive layer 708 is covered with the second peeling layer 710. Like the peel layer 674, the second peel layer 710 is formed from, for example, the inorganic material paste 676. FIG. 67(*b*) shows this state. Next, the printed dielectric layer 690 is formed on the printed conductive layer 708, for constituting the thin-plate-like thick-film dielectric body 628. In this instance, the printed dielectric layer 690 is held in contact at its radially inner end with the second peel layer 710, as shown in FIG. 67(*b*), so that the printed conductive layer 708 is completely covered. Then, the printed conductive layer 688 (694) is formed on the printed dielectric layer 690, for constituting the grid electrode 630. During the formation of the printed conductive layer 688 (694), the thick-film conductive paste 686 flows downwardly along the inner wall surface of the opening portion 626, but does not reach down to the printed conductive layer 708.

After the thick-film screen printing operation effected as described, the printed layers are subjected to a firing treatment, whereby the conductive and dielectric bodies are formed from the thick-film printed layers 708, 690, 688, while the second peel layer 710 is neither sintered nor burnt. Thus, the printed conductive layers 708, 694 are sintered without the layers 708, 694 being brought into contact with each other, whereby the layers 708, 694 are reliably insulated from each other. It is noted that the second peel layer 710 constituted by the inorganic material paste 676 is removed when the sheet member 704 is peeled from the peel layer 674.

In the present embodiment, the grid connection wires 652 to be connected to the grid electrodes 630 are disposed, for example, on the upper surface 632.

In the above-described example, only the grid electrodes 630 and the wires for the connection of the grid electrodes 630 are disposed on the sheet member 624. However, it is possible to provide an anode 712 and a fluorescent layer 714 on the sheet member 624, as indicated by one-dot chain line in FIG. 59. The anode 712 and fluorescent layer 714 may be formed by a thick-film screen printing method or the like, like the formation of the anode and fluorescent layer on the display surface 622 of the substrate 614, after completion of the production process of the sheet member 624, namely, after the peeling step 702. Further, the anode 712 and fluorescent layer 714 may be formed also in the thick-film-paste-layer forming step 682, if the fluorescent layer 714 together with the sheet member 624 can be subjected to the firing step 696, namely, if the function of the fluorescent layer 714 is not affected in the firing step 696. The anode 712 can be connected to the terminal 620, like the grid electrodes 630, for example, via a wire which is disposed on the upper surface 632 of the thin-plate-like thick-film dielectric body 628, for exclusively connecting the anode 712 and the terminal 620, or alternatively, via the grid connection wire 652 commonly with the particular grid electrode 630.

In the above-described construction which includes the fluorescent layer 714 disposed on the sheet member 624 in addition to the fluorescent layers 612 disposed on the substrate 614, it is possible to increase diversity on display without complicating arrangement of the wirings. The fluorescent layer 714 is activated to emit light at a point of time dependent on arrangement of wiring to the fluorescent layer 714. For example, where the fluorescent layer 714 is connected to a wire which is connected also to the grid electrode 630, the fluorescent layer 714 is activated together with the grid electrode 630, to emit light. Where the fluorescent layer 714 is connected to an independent wire, the fluorescent layer 714 is activated to emit light, independently of voltage application to the grid electrode 630, while voltage is being applied to the independent wire.

In the above-described fluorescent display tube 610 of the twentieth and twenty-first embodiments, the fluorescent layers 612 are formed in respective character patterns. However, the eighth and ninth inventions are equally applicable to a fluorescent display tube provided with dot-patterns as well as the character-patterns. In such a fluorescent display tube, a portion of the dot-patterns may be provided with a mesh-like grid electrode or a rib grid electrode, so as to be constructed in a conventional manner. However, where a spacing interval between adjacent dots is so large that the support body of the sheet member 624 such as the spherical spacer 640 can be disposed between the adjacent dots, the present invention can be applied also to the portion of the dot-pattern.

Further, while the anode connection wires 648 are provided to be exposed in the twentieth and twenty-first embodiments, the anode connection wires 648 may be covered with the dielectric layer which has the opening portions located in the fluorescent layers 612.

Further, the supporters 634 is provided in a case where deflection or other deformation of the cover glass plate 618 is expected. The supporters 634 are not necessary for a fluorescent display tube which is small enough to eliminate such a risk.

Further, while the grid connection wires 652 are disposed on the sheet member 624 in the twentieth and twenty-first embodiments, the grid connection wires may be disposed on the substrate 614. In this modified arrangement, the grid electrodes 630 can be brought into connection with the grid connection wires when the sheet member 624 is fixed to the substrate 614 by a conductive adhesive or the like.

Further, the conductive film 638 for increasing the luminous efficiency does not have to be necessarily provided.

Further, while each of the opening portions 626 has substantially the same shape as a corresponding one of the fluorescent layers 612, each opening portion 626 may be larger than and different from the shape of the corresponding fluorescent layer 612, as long as an entirety of the fluorescent layer 612 is sufficiently evenly activated to emit light. Further, each opening portion 626 may be smaller than the corresponding fluorescent layer 612, so that only a part of the fluorescent layer 612 can be seen through the opening portion 626.

Further, while the sheet member 624 is fixed to the substrate 614 through the spherical spacers 640, the sheet member 624 may be fixed directly to the substrate 614 as long as conductive bodies of the sheet member 624 and the substrate 614 are prevented from being shorted to each other.

Further, in the twentieth and twenty-first embodiments, each of the grid electrodes 630 is disposed on the upper surface 632 of the sheet member 624 and also on the inner circumferential surface of the corresponding opening portion 626. However, each grid electrode 630 may be disposed on only one of them.

TWENTY-SECOND EMBODIMENT

Figure 68:
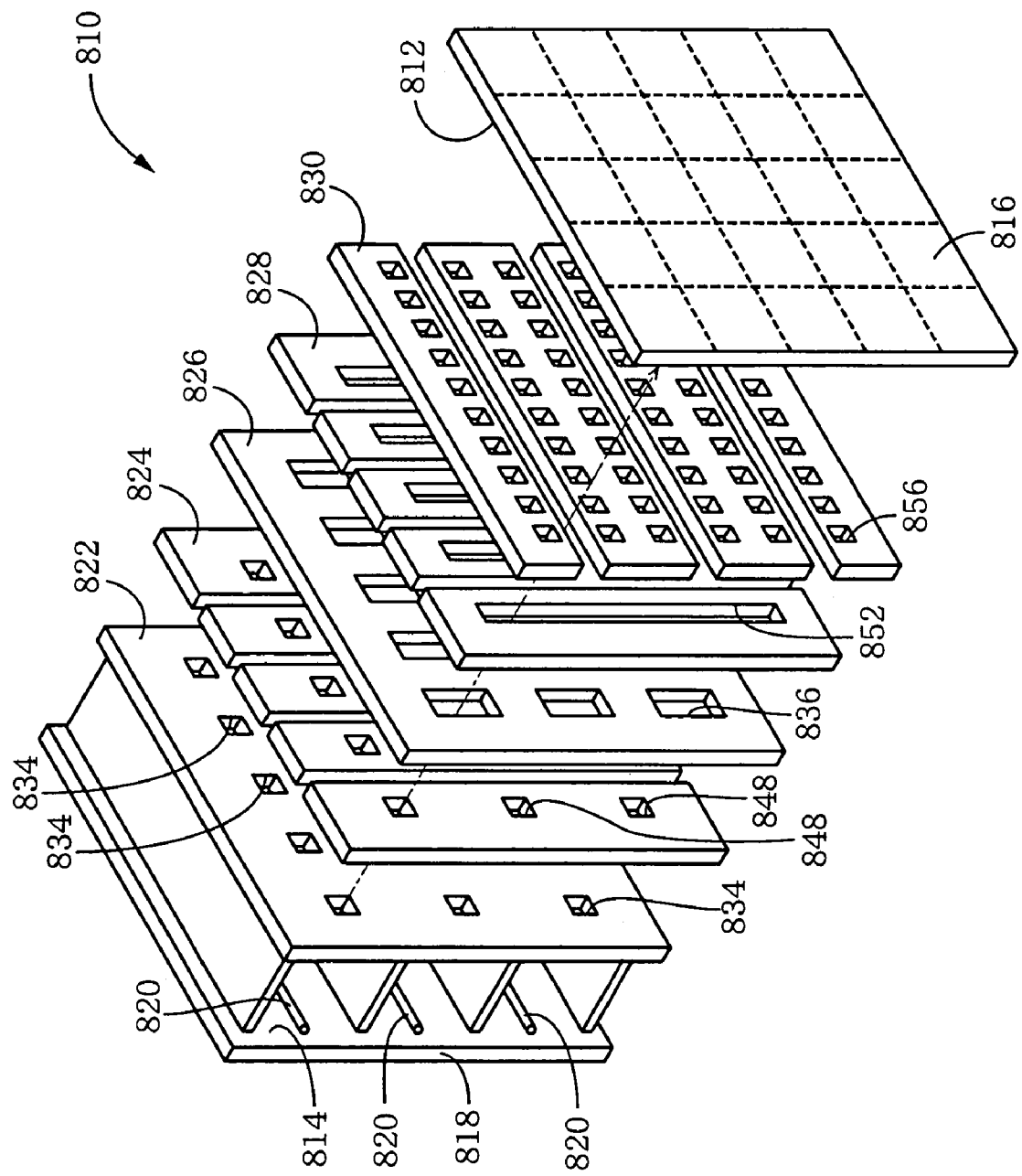
FIG. 68 is a perspective view for explaining a fundamental structure of one example of a thin CRT of a tenth invention.

FIG. 68 is a perspective view showing a fundamental structure of a thin CRT 810 which is one embodiment of a tenth invention, wherein its components are shown as if they were separated from each other. As shown in this FIG. 68, the thin CRT 810 is equipped with a front face plate 816 and a back face plate 818 which are positioned in parallel to each other with a predetermined spacing distance therebetween such that their substantially flat surfaces 812, 814 are opposed to each other. The front face plate 816 and back face plate 818 are gas-tightly sealed at their respective peripheral portions through a spacer glass or the like (not shown), whereby a gastight space is formed within the thin CRT 810. Each of the front face plate 816 and back face plate 818 is provided by BaO—SrO—SiO$_2$ based translucent glass or the like which has a size of about 450×550 (mm) that is slightly larger than a display portion having a size of about 350×450 (mm), a constant thickness of about 10–20 (mm) that is sufficient for atmospheric pressure, and a softening point of about 700(° C.).

Like a face glass of a conventional CRT in which electron guns are used, the inside surface 812 of the front face plate 816 is divided into sections in a lattice as represented by broken lines in FIG. 68, or is divided into stripe-shaped sections by a plurality of lines arranged along a single direction, so that fluorescent layers are disposed on the respective sections. The fluorescent layers are activated by electron beams, and consist of plural kinds, e.g., three kinds of fluorescent layers having luminescent colors of red, green, blue (RGB). In the present embodiment, the inside surface 812 of the front face plate 816 corresponds to a fluorescent screen. A size of each of the sections is determined depending upon a resolution of the CRT 810. Where the fluorescent layers take the form of stripe-shaped layers, for example, the fluorescent layers each having a width of about 50–100 (μm) and black stripe layers each having a width of about 30–50 (μm) are alternately arranged. Each of the fluorescent layers has a thickness which ranges from about 10 to 20 (μm) and which is determined depending upon its color, while each of the black stripe layers has a thickness of about 0.1–10 (μm).

On the other hand, on the inside surface 814 of the back face plate 818, there are disposed a plurality of filament cathodes 820 which extend along a single direction and which are parallel with each other with a suitable distance between centers of each adjacent pair of the filament cathodes 820. Although each of the cathodes 820 is illustrated in FIG. 68 as if it were disposed directly on the inside surface 814, each cathode 820 is actually fixed at its opposite ends to support members having a suitable height, for example, so that the cathodes 820 are positioned in a uniform height measured from the inside surface 814. In the present embodiment, the filament cathodes 820 correspond to an electron source.

Further, between the front face plate 816 and back face plate 818, there are a plurality of layers, e.g., a total of five electrode layers consisting of an electron-beam control electrode (ray control electrode) 822, a signal modulation electrode 824, a focus electrode (convergence electrode) 826, a vertical deflection electrode 828 and a horizontal deflection electrode 830 which are arranged in this order in a direction from the back face plate 818 toward the front face plate 816. The electrodes 822–830 are provided by respective thin plates having substantially the same outside dimensions. Although each of the signal modulation electrode 824, vertical deflection electrode 828 and horizontal deflection electrode 830 is illustrated in FIG. 68 as if it were provided by a plurality of component parts spaced apart from each other, each of the electrodes 824, 828, 830 is actually provided by a plurality of electrodes which are separately disposed on the single thin plate, as described below.

Among the five layers of electrodes 822–830, the electron-beam control electrode 822 and the focus electrode 826 are provided by sheet metals each of which is made of a metallic material such as cheap steel material and amber or other ferronickel-based alloy having a coefficient of thermal expansion substantially equal to that of glass material used to constitute the gas-tight vessel of the CRT 810, and each of which has a constant thickness of about 0.05–0.15 (mm). The electron-beam control electrode 822 has a multiplicity of through-holes 834 each having a circular cross section whose diameter is about 0.2–0.4 (mm) or a rectangular cross section whose side is about 0.25–0.35 (mm). The through-holes 834 are arranged along two directions, i.e., a X direction which is parallel with an upper side of the electron-beam control electrode 822 as seen in FIG. 68, and a Y direction which is perpendicular to the X direction. A spacing distance between centers of each adjacent pair of the holes 834 as measured in the X direction is about 1.0–2.0 (mm), while a spacing distance between centers of each adjacent pair of the holes 834 as measured in the Y direction is about 4–5 (mm). The focus electrode 826 has through-holes 836 each having a rectangular cross section whose side is about 0.5–1.0 (mm). The through-holes 836 are arranged with a spacing distance substantially equal to the spacing distance of the through-holes 834.

On the other hand, the other thee layers, i.e., the signal modulation electrode 824, vertical deflection electrode 828 and horizontal deflection electrode 830 are respectively provided by sheet members 840, 842, 844. Each of the sheet members 840, 842, 844 consists of a dielectric support layer constituted by a thick-film dielectric body, and a thick-film conductive body (conductive layer) disposed on (a surface or each of opposite surfaces of) the dielectric support layer (see FIGS. 69 and 70). Only the thick-film conductive body of each of the sheet members 840, 842, 844 substantially constitutes the electrode 824, 828 or 830, while the dielectric support layer serves as a support body for supporting the thick-film conductive body. In the present embodiment, the sheet member 844 for constituting the horizontal deflection electrode 830, the sheet member 842 for constituting the vertical deflection electrode 828 and the sheet member 840 for constituting the signal modulation electrode 824 correspond to a sheet member, a second sheet member and a third sheet member, respectively, which are defined in claims. It is noted that elements denoted by reference numerals 824, 828, 830 in FIG. 68 are the sheet members 840, 842, 844, rather than the electrodes, strictly speaking. It is also noted that portions associated with connection with an external circuit are illustrated in each of FIGS. 68–70.

Figure 69:
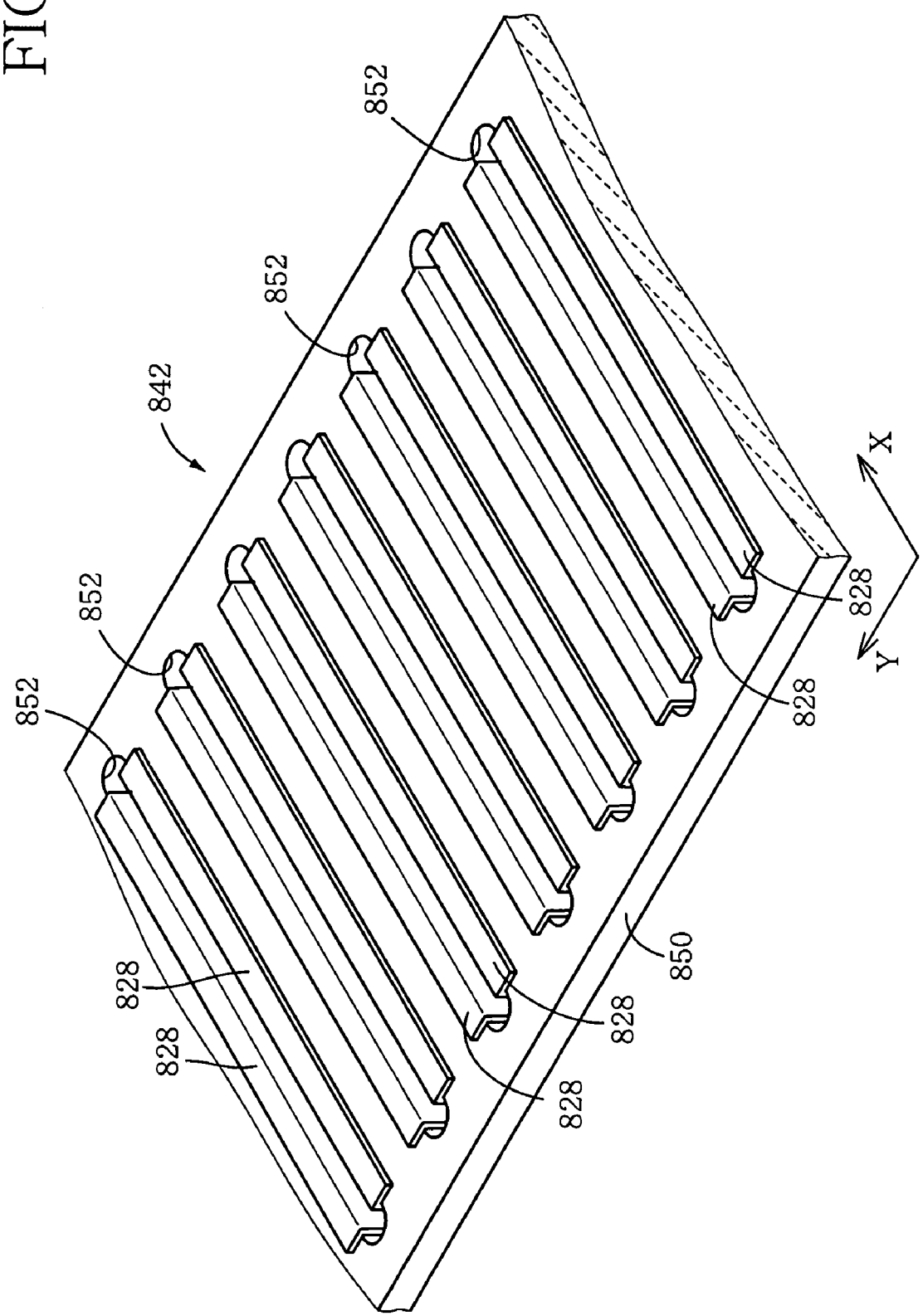
FIG. 69 is a perspective view for explaining structures of vertical deflection electrodes provided in the CRT of FIG. 68.

FIG. 69 is a perspective view in enlargement showing a main portion of the sheet member 842 for constituting the above-described vertical deflection electrode 828. The sheet member 842 has a dielectric support layer 850 taking the form of a thin plate having a thickness of about 20–50 (μm) which is determined depending upon its role in an electronic control. The dielectric support layer 850 has, in its inside portion, a multiplicity of mutually-parallel, elongated holes 852 each of which extends along the above-described X direction and is formed through in a thickness direction of the support layer 850. The elongated holes 852 are spaced apart from each other by a constant spacing distance between centers of each adjacent pair of the holes 852. Each of the elongated holes 852 is defined by a circumferential edge which includes a pair of long side portions extending along the X direction. The vertical deflection electrode 828 in the form of an elongated conductive film is disposed in each of the long side portions of the circumferential edge defining each elongated hole 852. The vertical deflection electrode 828 extends along a longitudinal direction of the long side portion, and covers an inner circumferential surface of the elongated hole 850 in the long side portion. In FIG. 69, longitudinal dimensions of the vertical deflection electrodes 828 and elongated holes 852 are illustrated to be shorter than actual dimensions, for convenience of the explanation.

The above-described dielectric support layer 850 is provided by a thick-film dielectric body having a thickness of about 50–150 (μm), e.g., about 100 (μm) and made of a thick-film dielectric material constituted by a low-melting-point glass and a ceramic filler such as an alumina, wherein the low-melting-point glass is a $PbO$—$B_2O_3$—$SiO_2$—$Al_2O_3$—$ZnO$—$TiO_2$ based glass or a glass containing combination of selected ones of $PbO$, $B_2O_3$, $SiO_2$, $Al_2O_3$, $ZnO$ and $TiO_2$. Each of the conductive films or vertical deflection electrodes 828 is a thick-film conductive body containing conductive components in the form of, for example, silver (Ag), nickel (Ni), aluminum (Al), copper (Cu) and carbon (C), and has a thickness of about 1–20 (μm).

The above-described vertical deflection electrodes 828 are disposed on the dielectric support layer 850 such that the electrodes 828 are insulated from each other by the dielectric support layer 850. The vertical deflection electrodes 828 are connected at their respective end portions with wires (no shown), so as to be supplied with a driving voltage independently of each other. The vertical deflection electrodes 828, which are thus independent of each other, are fixed to the single dielectric support layer 850 so as to be constituted integrally with each other. The signal modulation electrodes 824 and horizontal deflection electrodes 830, which are not shown in FIG. 69, have substantially the same constructions as the vertical deflection electrodes 828, although the signal modulation electrodes 824 and horizontal deflection electrodes 830 extend in the Y direction, i.e., in a direction perpendicular to the vertical deflection electrodes 828. In the present embodiment, the vertical deflection electrodes 828 and the horizontal deflection electrodes 830 correspond to first and second electrodes, respectively.

Figure 70:
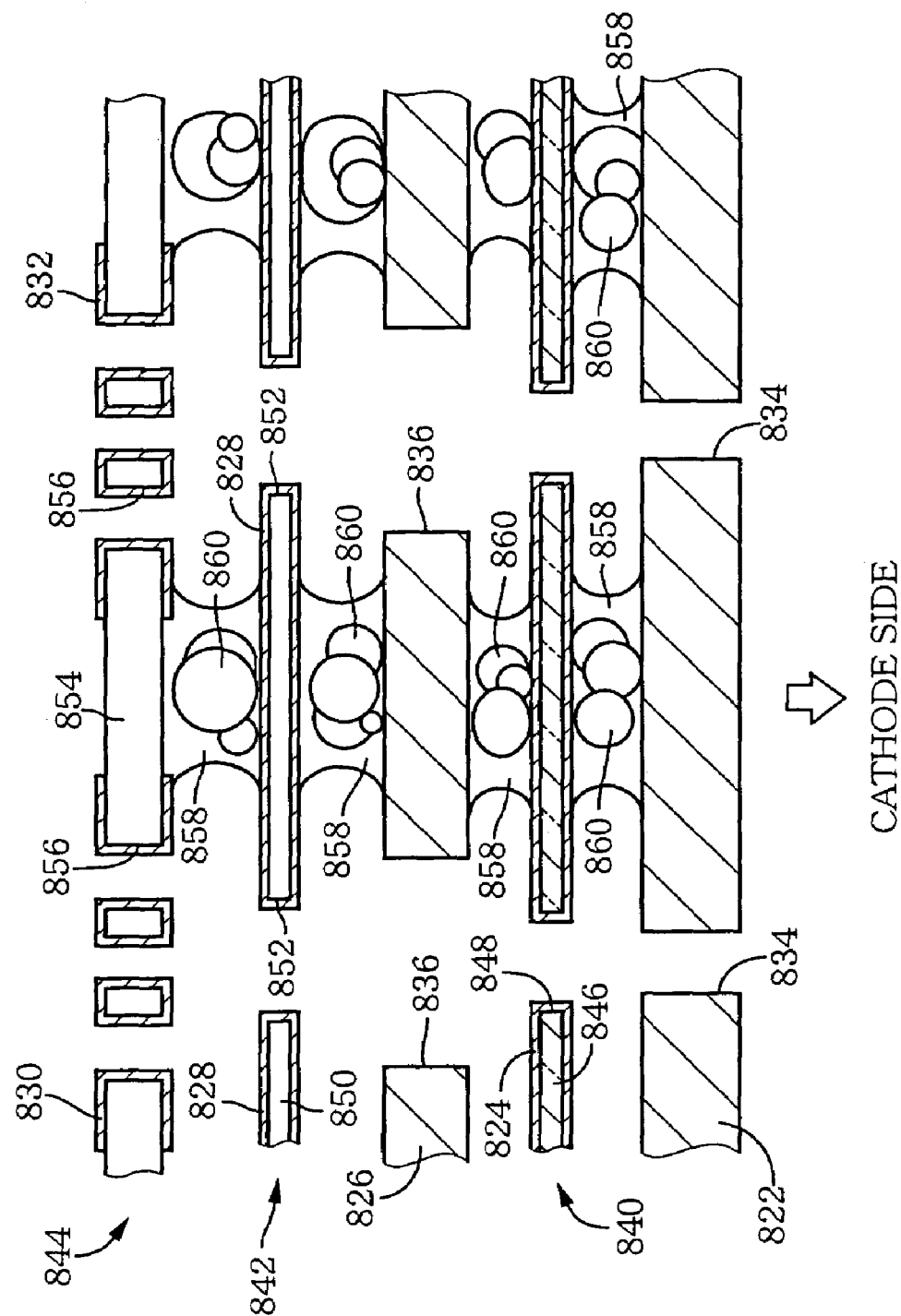
FIG. 70 is a view for explaining a main portion of a cross sectional structure of the CRT of FIG. 68.

FIG. 70 is a cross sectional view for explaining a construction of a part interposed between the filament cathodes 820 and the front face plate 816 in a cross section of the CRT 810, i.e., the electrodes of the plurality of layers in the cross section. As described above, the plurality of signal modulation electrodes 824, vertical deflection electrodes 828 and horizontal deflection electrodes 830 are provided by laminating the sheet members 840, 842, 844 through the electrodes 822, 826 which consists of respective sheet metals. The cross sectional view of FIG. 70 is taken along a line along the longitudinal direction of the vertical deflection electrodes 828 (i.e., along the X direction). Thus, each of the vertical deflection electrodes 828 continuously extends in the horizontal direction as seen in this figure. However, in convenience for the explanation, the vertical deflection electrode 828 is illustrated as if it extended in an intermittent manner, so that the elongated holes 852 are shown in the figure.

As shown in FIG. 70, the sheet member 840 interposed between the electron-beam control electrode 822 and the focus electrode 826 is provided by a thin-plate-like dielectric support layer 846 and a conductive film which constitutes the signal modulation electrode 824 and which is disposed on the support layer 846. The dielectric support layer 846 has a plurality of through-holes 848 which are arranged along the X direction. The conductive film, i.e., the signal modulation electrode 824 is disposed in circumferential edges of the through-holes 848, and extends along a longitudinal direction of the through-holes 848.

The sheet member 844 interposed between the vertical deflection electrode 828 and the front face plate 816 is provided by a thin-plate-like dielectric support layer 854 and a conductive film which constitutes the horizontal deflection electrode 830 and which is disposed on the support layer 854. The dielectric support layer 854 has a plurality of through-holes 856 which are arranged along the Y direction. The conductive film is disposed in circumferential edges of the through-holes 856, and extends along a longitudinal direction of the through-holes 856.

Further, each of the conductive films (electrodes 824, 828, 832) provided in the respective sheet members 840, 842, 844 is disposed on opposite surfaces (a surface on the side of the front face plate 816 and a surface on the side of the back face plate 818) of a corresponding one of the dielectric support layers 846, 850, 854. Each of the conductive films, which are disposed on the opposite surfaces of the corresponding dielectric support layer, is also disposed on inner circumferential surfaces of the elongated holes 852, through-holes 848 or through-holes 856, so that portions of each of the conductive films disposed on the respective opposite surfaces of the corresponding dielectric support layer are connected with each other through portions disposed on the inner circumferential surfaces of the holes 852, 848 or 856. Therefore, upon application of a driving voltage to each of the conductive films, i.e., each of the electrodes 824, 828, 832, the driving voltage is applied to its opposite side portions simultaneously with each other. It is noted that the opposite side portions of each of the conductive film disposed on the corresponding dielectric support layer 846, 850 or 854 have thickness values substantially equal to each other.

Further, the electrode layers 822–830 are fixed to one another by an inorganic adhesive 858 such as glass frit which is applied to a plurality of portions of each of the layers 822–830, such that the electrode layers 822–830 are spaced apart from one another by a predetermined spacing distance. The above-described plurality of portions correspond to portions of each of the sheet members 840, 842, 844 in which the conductive films are not disposed on the surface of a corresponding one of the dielectric support layers 846, 850, 854, namely, corresponds to portions located between the holes 852, 848 or 856. The above-described inorganic adhesive 858 includes spherical bodies 860 such as glass beads which are formed from an inorganic material. The spherical bodies 860 serve to make the above-described spacing distance constant. That is, the spacing distance between each adjacent pair of the electrode layers is a constant value that is defined by diameters of the spherical bodies 860. The spherical spacers 286 can be obtained from glass beads which are commercially available. By using a sieve or the like, it is possible to remove large ones of the glass beads which are larger than the predetermined diameter. The thus obtained spherical spacers 286 include ones smaller than a size of perforations of the used sieve. The presence of these smaller ones does not impede the spacing distance from being set to be a predetermined value.

The above-described spacing distance of the electrode layers is determined depending upon a construction of the CRT 810 such as construction of its control circuit and resolution. In the present embodiment, for example, the spacing distance between each adjacent pair of the electron-beam control electrode 822, signal modulation electrode 824, focus electrode 826, vertical deflection electrode 828 and horizontal deflection electrode 830 is set to be about 0.3–0.5 (mm).

The sheet metals constituting the respective electrode layers 822, 826 have the respective holes 834, 836 formed therethrough, while the sheet members 840, 842, 844 constituting the respective electrode layers 824, 828, 830 have the respective holes 848, 852, 856 formed therethrough. The holes 834, 836, 848, 852, 856 are arranged along lines which are parallel to a predetermined direction, or along lines which are perpendicular to the predetermined direction, such that intersections of the mutually perpendicular lines lie on straight lines which are substantially perpendicular to the surface 814 of the back face plate 818 and the surface 812 of the front face plate 816. A spacing distance between each adjacent pair of the intersections (lines) is a constant value that is dependent on a pixel density of the CRT 810. The holes 834, 836, 848, 852 serve as electron passing-through holes.

In operation of the CRT 810 constructed as described above, while a predetermined amount of heat current is constantly supplied to the above-described plurality of filament cathodes 820, a predetermined amount of voltage is applied between the electron-beam control electrode 822 and the focus electrode 826. Meanwhile, a positive voltage is applied to the plurality of signal modulation electrodes 824 in a predetermined order such that a scanning is effected. Further, in synchronization with the scanning, a predetermined amount of voltage is applied to selected ones of the vertical and horizontal deflection electrodes 828, 830. As a result, electrons generated from the filament cathodes 820 are deflected according to combination of the voltage applied electrodes and potential difference of the applied voltage, and then strike a desired portion of the surface 812 of the front face plate 816, i.e., the fluorescent surface. Thus, with the signal modulation electrodes 824 being sequentially scanned, and with the applied voltage being changed with the passage of time according to input data, portions of the fluorescent surface corresponding to the input data are sequentially activated to emit light, whereby a desired image is displayed. It is noted that no detailed description as to the drive method will be provided since it is not necessary for understanding of the present embodiment.

In the present embodiment, the signal modulation electrode 824, the vertical deflection electrode 828 and the horizontal deflection electrode 830 are provided by respective conductive films which are disposed on the surfaces of the sheet members 840, 842, 844 each having the multiplicity of through-holes (elongated holes 852 or through holes 848 or 856). Therefore, the electrodes (the signal modulation electrode 824, vertical deflection electrode 828 and horizontal deflection electrode 830) provided by the respective thick-film conductive layers are established by simply disposing the sheet members 840, 842, 844 between the electron-beam control electrodes 822 and the surface 812 (fluorescent surface) of the front face plate 816. Thus, the electrodes 824, 828, 830 are easily assembled, and are unlikely to be distorted, unlike a case where they are provided by sheet metals. Theses features are effective to alleviate difficulty in handling and assembling operations for the formation of the electrodes and to facilitate an appropriate control of the electron beam in the CRT 810.

Further, in the CRT 810 of the present embodiment, the plurality of vertical deflection electrodes 828 and horizontal deflection electrodes 830 which are mutually perpendicular are provided by thick-film conductive bodies disposed on the sheet members 842, 844, and the signal modulation electrodes 824 are provided by the sheet member 840 that is similar to the sheet members 842, 844. Therefore, the vertical deflection electrodes 828 and the horizontal deflection electrodes 830 are established by simply disposing the sheet members 842, 844 between the filament cathodes 820 and the horizontal deflection electrodes 830. Thus, such a construction is effective to alleviate difficulty in handling and assembling operations for the formation of the electrodes and to facilitate an appropriate control of the electron beam in the thin CRT 810 of MDS type or the like equipped with the plurality of mutually perpendicular electrodes (the signal modulation electrodes 824, vertical deflection electrodes 828 and horizontal deflection electrodes 830) which extend along the mutually perpendicular directions and which are disposed between the filament cathodes 820 and the front face plate 812.

Further, in the present embodiment in which the reed-screen-like electrodes 824, 828, 830 are provided by the thick-film conductive bodies, the electrodes are not likely to be deformed due to their thermal expansions even if they are heated to have a high temperature during operation of the CRT 810, so that it is possible to restrain the control of the electron beam from being impeded.

Further, in the present embodiment, the electrodes common to the entirety of the display surface of the CRT 810, i.e., the electron beam control electrode 822 and focus electrode 826 are provided by respective sheet metals having the through-holes 834, 836 positioned in respective portions thereof, and the sheet metals and the sheet members 840, 842, 844 are laminated and fixed to one another. Therefore, as compared with a case where all the electrodes are provided by the sheet members, the electrodes are given relatively high mechanical strengths, whereby handling of the electrodes is further facilitated. That is, the electrodes common to the entirety of the display surface can be constructed by a single sheet metal, and such a construction is preferable from the point of view of the strength.

Figure 71:
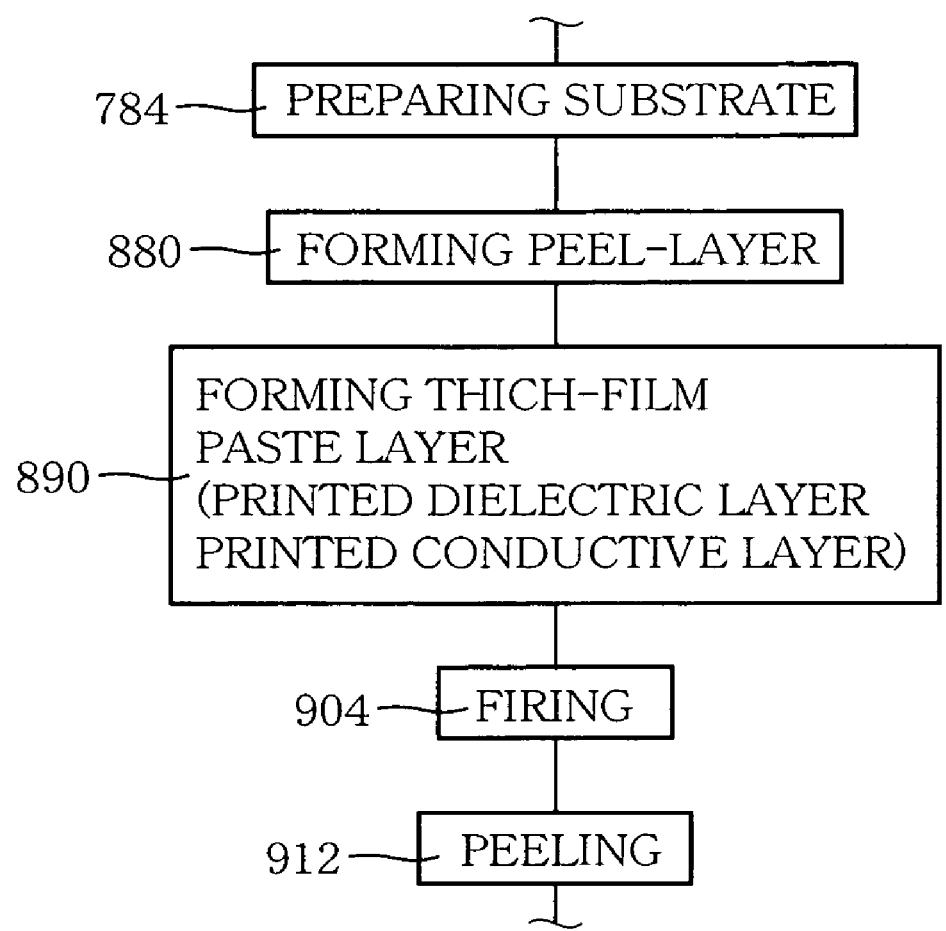
FIG. 71 is a process chart for explaining a production process of a sheet member used in the CRT of FIG. 68, which process is one embodiment of an eleventh invention.

The above-described CRT 810 can be produced, for example, by connecting the front face plate 816, back face plate 818, filament cathodes 820 and electrodes 822–830, which are prepared or processed independently of each other, to one another, by the inorganic adhesive 858 containing the spherical bodies 860 having predetermined sizes. In the production or processing process, the fluorescent layers are provided on the inside surface 812 of the front face plate 816 while the front face plate 816 is being processed. Further, the filament cathodes 820 are provided on the inside surface 814 of the back face plate 818 while the back face plate 818 is being processed. The electrodes, such as the electron-beam control electrode 822, provided by the sheet metals are produced by a well-known etching treatment or stamping operating using a press machine, for example. On the other hand, the sheet members 840, 842, 844 providing the signal modulation electrodes 824, vertical deflection electrodes 828 and horizontal deflection electrodes 830 are produced by using a well-known thick-film printing technique, for example, according to a process chart shown in FIG. 71. There will be described a method of producing the sheet member 840, with reference to FIGS. 72(a)–(e) and FIGS. 73(f)–(h) showing states in main stages of the production process. It is noted that the process of production of each of the sheet members 842, 844 is substantially the same as the process of production of the sheet member 840 which is described below, although the thick film of each of the sheet members 842, 844 is printed in a pattern different from that of the sheet member 840.

The process is initiated with a substrate preparing step 874 implemented to prepare a substrate 876 (see FIG. 72) which is to be subjected to a thick-film printing, and then effect a suitable cleaning treatment on a surface 878 of the substrate 876. This substrate 876 is provided by a member which does not suffer from considerable deformation and deterioration in a heat treatment which is described below. For example, it is preferable to use, as this substrate 876, a glass substrate or the like such as soda lime glass which has a coefficient of thermal expansion of about $87 \times 10^{-7}$(/° C.), a softening point of about 740(° C.) and a distortion point of about 510(° C.). It is noted that the substrate 876 has a thickness of about 2.8 (mm) and that its surface 878 has a size which is sufficiently larger than the sheet member 840.

Figure 72:
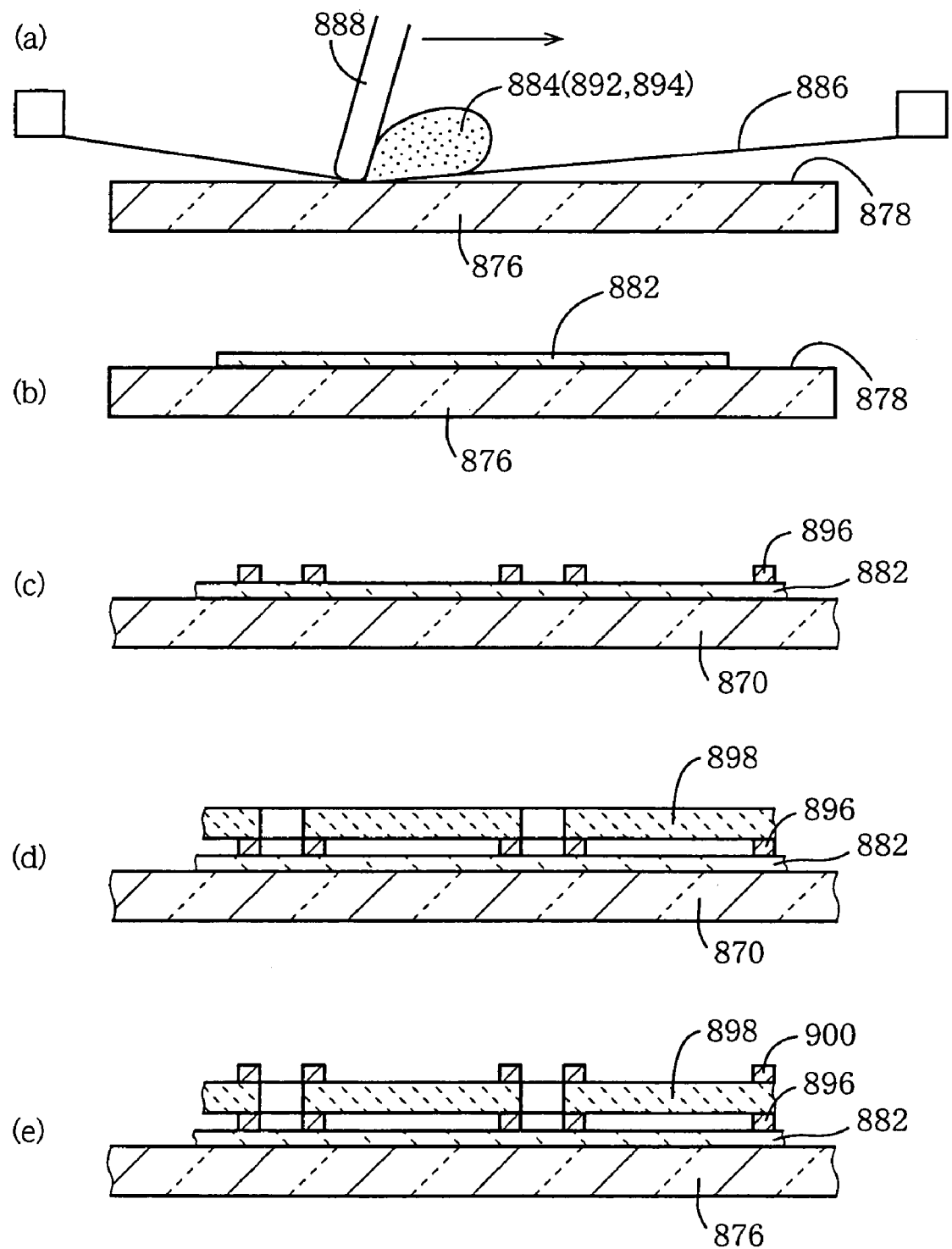
FIGS. 72(a)–(e) are views showing states of the substrate and thick film in main stages of the production process of FIG. 71

A peel-layer forming step 880 is then implemented to dispose a peel layer 882 constituted by high-melting-point particles which are bonded together with a resin, on the surface 878 of the substrate 876 such that the peel layer 882 has a thickness of about 5–50 (μm). The high-melting-point particles are provided by a mixture of high-softening-point glass frit whose average particle size is about 0.5–3 (μm) and ceramic filler such as alumina and zirconia whose average particle size is about 0.01–5 (μm). The high-softening-point glass has a softening point of about 550(° C.) or higher. The high-melting-point particles consisting of the mixture has a softening point of about 550(° C.) or higher. The resin is provided by ethyl cellulose resin or the like which is burnt at about 350(° C.). The peel layer 882 is disposed on the surface 878 of the substrate 876, for example, by applying an inorganic material paste 884 which is constituted by the above-described high-melting-point particles and resin which are dispersed in an organic solvent such as butyl carbitol acetate (BCA), onto substantially the entire surface of the substrate 876 with a screen printing method as shown in FIG. 72(*a*), and then drying the applied paste 884 at a room temperature. However, the peel layer 882 may be disposed on the surface 878 of the substrate 876, by sticking a coater or film laminate onto the surface of the substrate 876. FIG. 72(*b*) shows a stage in which the peel layer 882 is formed as described above. It is noted that reference signs 886 and 888 denote a screen and a squeegee, respectively, in FIG. 72(*a*). In the present embodiment, the substrate 876 provided with the peel layer 882 corresponds to a support body. A surface of the peel layer 882 corresponds to a film formation surface. The substrate preparing step 874 and peel layer forming step 880 correspond to a support-body preparing step.

A thick-film-paste-layer forming step 890 is then implemented to sequentially apply a thick-film conductive paste 892 forming the above-described conductive film, i.e., the signal modulation electrodes 824 and a thick-film dielectric paste 894 forming the above-described dielectric support layer 846, in predetermined patterns on the peel layer 882, in the same manner as the application of the inorganic material paste 884, namely, with the screen printing method (see FIG. 72(*a*)). The applied pastes are then dried, whereby a printed conductive layer 896, a printed dielectric layer 898, and printed conductive layers 900, 902 are sequentially formed on the peel layer 882. The printed conductive layer 896 is formed to provide a portion of each of the signal modulation electrodes 824 which is located on the side of the bottom surface of the dielectric support layer 846. The printed dielectric layer 898 is formed to provide the dielectric support layer 846. The printed conductive layer 900 is formed to provide a portion of each of the signal modulation electrodes 824 which is located on the side of the top surface of the dielectric support layer 846. The printed conductive layer 902 is formed to provide a portion of each of the signal modulation electrodes 824 which is located on the inner wall surface of the corresponding through-hole 848. The above-described thick-film conductive paste 892 is constituted by conductive material powders such as silver powders, glass frit and resin which are dispersed in an organic solvent. The thick-film dielectric paste 894 is constituted by dielectric material powders such as alumina and zirconia, glass frit and resin which are dispersed in an organic solvent. As the glass frit, for example, PbO—$B_2O_3$—$SiO_2$—$Al_2O_3$—$TiO_2$ based low-softening point glass is used. As the resin and solvent, for example, material similar to the inorganic material paste 884 is used.

The screen 886 used for the formation of the printed conductive layer 896 has an aperture pattern corresponding to configuration of a portion of each signal modulation electrode 824, shown in FIGS. 68 and 69, which portion is located on one side of the dielectric support layer 846. The screen 886 used for the formation of the printed dielectric layer 898 has an aperture pattern corresponding to configuration of the dielectric support layer 846 shown in FIGS. 68 and 69. The screen 886 used for the formation of the printed conductive layer 900 has an aperture pattern corresponding to configuration of a portion of each signal modulation electrode 824 which portion is located on another side of the dielectric support layer 846. The thick-film conductive paste 892 and the thick-film dielectric paste 894 are applied to have such thickness values that become the above-described thickness values after the firing shrinkage. On the other hand, the screen 886 used for the formation of the printed conductive layer 902 has apertures each having a portion located inside the inner wall surface of the corresponding through-hole 848 of the dielectric support layer 846, so that the applied thick-film conductive paste 892 flows downward from the upper surface of the dielectric support layer 846 along the inner wall surface of the through-hole 848. FIGS. 72(*c*)–(*f*) show stages in which the printed conductive layer 896, printed dielectric layer 898, printed conductive layer 900 and printed conductive layer 902 are respectively formed. Each of the printed conductive layers 896, 900, 902 whose thickness is about 5–10 (μm) is formed by one-time printing. However, the printed dielectric layer 898 whose thickness is about is about 30 (μm) is formed by repeating the printing and drying about three times, namely, is formed of the thus laminated layers.

Figure 73:
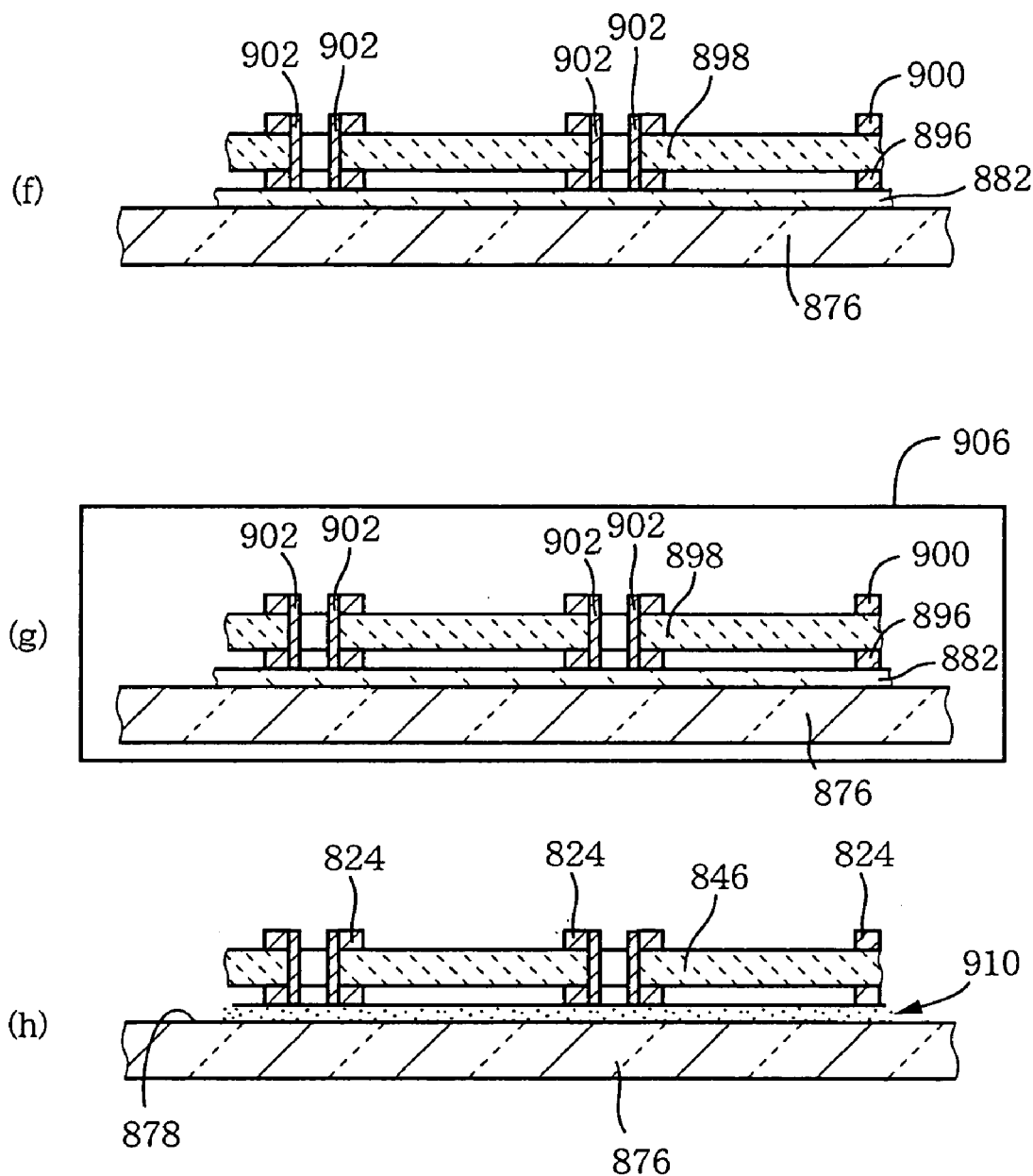
FIGS. 73(f)–(h) are views following to FIGS. 72(a)–(e), and showing states of the substrate and thick film in main stages of the production process of FIG. 71.

After the printed thick-film layers 896–902 have been formed as described above, the layers are dried so that the solvent is removed from the layers. In a firing step 904, the substrate 876 is disposed in a furnace chamber 906 of a predetermined firing furnace so that the substrate 876 is subjected to a heat treatment which is carried out at a firing temperature of about 550(° C.) that is suitable for kinds of the thick-film conductive paste 892 and thick-film dielectric paste 894. FIG. 73(*g*) shows a state during the heat treatment.

In the process of the heat treatment, the resin component of each of the printed thick-film layers 896–902 is burnt, while the dielectric material, conductive material and glass frit are sintered since the sintering temperature is about 550(° C.), so that the dielectric support layer 846 and the signal modulation electrodes 824 are formed whereby the sheet member 840 is obtained. FIG. 73(*h*) shows this state. In this instance, since the inorganic component particles of the peel layer 882 have the softening point of 550(° C.) or higher, the high-melting-point particles (glass powders and ceramic filler) are not sintered while the resin component is burnt in the peel layer 882. Therefore, after the burning of the resin component as a result of progress of the heat treatment, the peel layer 882 converts into a particle layer 910 consisting of only high-melting-point particles 908 (see FIG. 74).

Figure 74:
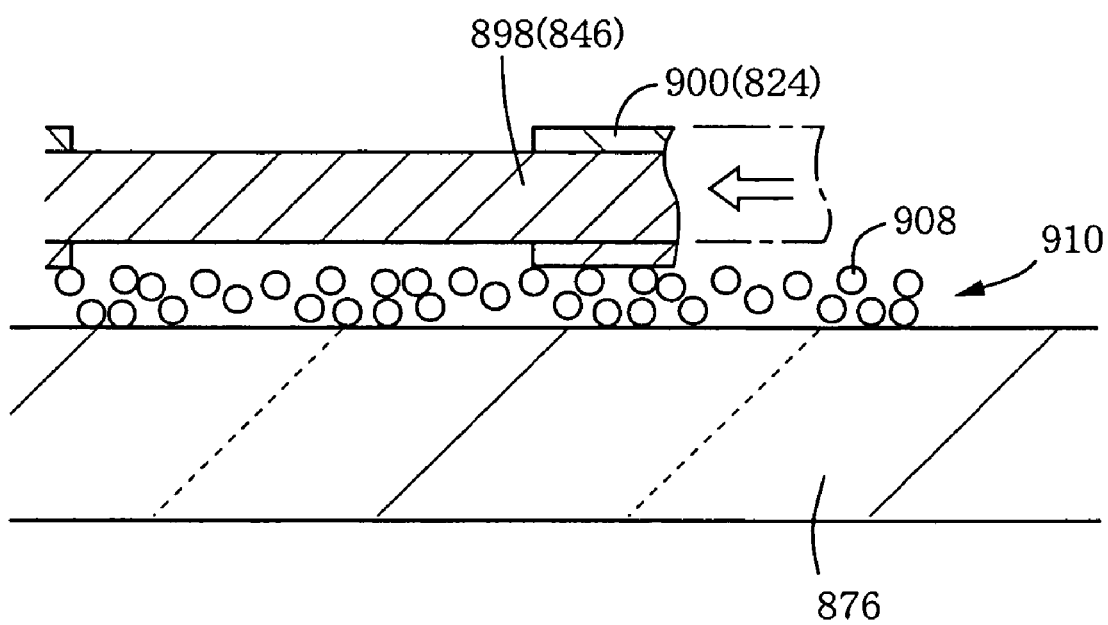
FIG. 74 is a view for explaining a shrinkage behavior in a firing step of FIG. 73.

FIG. 74 is an enlarged view of a part of a right end of FIG. 73(*h*), schematically showing a state in progress of the sintering in the above-described heat treatment. The particle layer 910, which has been formed as a result of burning of the resin component of the peel layer 882, is a layer constituted by the high-melting-point particles 908 which are merely superposed on each other and which are not bound to each other. Therefore, when the printed thick-film layers 896–902 shrink as indicated in FIG. 74 in which their end portions before the sintering are represented by one-dot chain line, the high-melting-point particles 908 function as rollers. Owing to the roller function of the particles 908, between a lower portion of a set of the printed thick-film layers 896–902 and the substrate 876, there is not generated a force impeding the shrinkage of the layers 896–902. Thus, the lower and upper portions of the set of the layers 896–902 equally shrink, so that the set of the layers 896–902 is free from density variation and warp arising from difference in the shrinkage amount.

In the present embodiment, when the sintering of the printed thick-film layers 896–902 is initiated, the firing shrinkage of the layers 896–902 is not impeded by the substrate 876 owing to the above-described function of the particle layer 910. Therefore, the quality of the formed thick film is not practically affected by the thermal expansion of the substrate 876. It is noted that the substrate 876 may be provided by a heat resistant glass having a further high distortion point (for example, a borosilicate glass which has a coefficient of thermal expansion of about $32 \times 10^{-7}(/° C.)$ and a softening point of about 820(° C.), or a quartz glass having a coefficient of thermal expansion of about $5 \times 10^{-7}(/° C.)$ and a softening point of about 1580(° C.)), where the substrate 876 is repeatedly used, or where the heat treatment temperature is considerably high. In this case, too, the thermal expansion amount of the substrate 876 is extremely small in the temperature range in which the dielectric material powders have a small bonding strength. That is, in this case, either, the quality of the formed thick film is not affected by the thermal expansion of the substrate 876.

Referring back to FIG. 71, a peeling step 912 is implemented to peel the formed thick-film, i.e., a laminated body (sheet member) of the dielectric support layer 840 and the conductive film 844, from the substrate 876. Since the particle layer 910 interposed therebetween is constituted by the high-melting-point particles 908 which are merely superposed on each other, the peeling can be easily made without using any chemical and device. In this instance, some of the high-melting-point particles 908 cooperating to have a thickness corresponding to that of one layer might adhere to a bottom surface of the laminated body. The adhering particles are removed by using an adhesive tape or an air blow as needed. It is noted that the substrate 876 from which the thick film has been peeled is repeatedly used for the similar purpose since the substrate 876 is not easily deformed or deteriorated at the above-described sintering temperature. The above-described sheet member, i.e., the signal modulation electrodes 824 are thus produced.

In the present embodiment, in the production of the thin CRT 810 which is produced by laminating a plurality of layers in the form of the electrodes 822–830 including the horizontal deflection electrodes 830 and the signal modulation electrodes 824, the horizontal deflection electrodes 830 are provided within the vacuum space, by fixing the sheet member 844, in which the thick-film conductive body is disposed on the surface of the dielectric support layer 854, to the focus electrode 826. That is, since the thick-film conductive layer constituting the horizontal deflection electrodes 830 is disposed on the sheet member 844, the horizontal deflection electrodes 830 can be established by simply disposing the sheet member between the signal modulation electrodes 824 and the fluorescent surface. As compared with a case where all the electrodes are constituted by sheet metals, it is possible to advantageously restrain distortion of the horizontal deflection electrodes 830 arising from a heat treatment which is effected for fixing the horizontal deflection electrodes 830 in predetermined positions, and also possible to simplify the production process.

Further, in the present embodiment, like the horizontal deflection electrodes 830, the signal modulation electrodes 824 are provided by the conductive film disposed on the dielectric support layer 846. Thus, there is another advantage that the signal modulation electrodes 824 can be provided by simply fixing the sheet member 840 between the filament cathodes 820 and the sheet member 844.

Further, in the present embodiment, after the printed dielectric layer 898 and the printed conductive layer 896 have been formed in the predetermined patterns on the film formation surface which is provided by the peel layer 882 constituted by the high-melting-point particles 908 bonded together with a resin and whose melting point is higher than a sintering temperature of the thick-film dielectric and conductive materials, the layers 898, 896 are subjected to the heat treatment at the sintering temperature, so that the sheet member 844 in which the conductive film is disposed on a surface of the dielectric support layer 854 is formed. Therefore, the peel layer 882, which is not sintered at the heat treatment temperature, converts into the particle layer 910 in which only the high-melting-point particles 908 are arranged, as a result of burning of the resin, so that the formed thick film is not fixed to the substrate 876, whereby the formed thick film can be easily separated from the substrate 876. This feature makes it possible to easily produce the sheet member 840 and other sheet members which constitute the signal modulation electrodes 824, horizontal deflection electrodes 830 and other electrodes, and which are used in the production of the thin CRT 810.

Further, in the present embodiment, the support body, which is used for the producing the sheet member 840 and other sheet members, is prepared by forming the peel layer 882 on the surface of the substrate 876. That is, the printed dielectric layer 898 and other layers are formed on the substrate 876. The shape of the support body or the peel layer 882 is maintained even after the heat treatment. This arrangement provides an advantage that the formed sheet members can be handled easier than an arrangement in which the support body is constituted by only the peel layer 882.

Further, in the present embodiment, since the printed thick-film layers 896–902 are formed with the thick-film screen printing method, the formation can be made by a simple device without waste of large amount of material, thereby resulting in advantageous reduction in the producing cost.

In the above-described twenty-second embodiment, there have been described cases where the tenth and eleventh inventions are applied to the thin CRT 810 of MDS type and the method of producing the same. However, the inventions are equally applicable also for a thin CRT of other type, as long as the CRT is equipped with a multiplicity of mutually independent electrodes which have a reed-screen-like shape and which can be provided by a sheet member. For example, the inventions are applicable also for a thin CRT of Gabor tube, Aiken tube, flat tube or electron multiplier system using a single electron source; sheet beam, beam guide or CRP system using a linear electron source; or digiplay or hybrid plasma system using a sheet electron source.

While the thin CRT 810 is of a type equipped with the three-color fluorescent layers to achieve full-color display, the present invention is equally applicable to a thin CRT equipped with a single-color or two-color fluorescent layers, or four or more fluorescent layers.

The thickness values of the sheet members 840, 842, 844 and those of the dielectric support layers 846, 850, 854 and the conductive films (electrodes 824, 828, 830) are not limited to values indicated in the embodiment, but may be suitably determined depending upon required degrees of mechanical strengths of the sheet members 840, 842, 844 which are determined in view of the construction of the CRT 810 and its handling, and also depending upon required degrees of conductivities of the electrodes 824, 828, 830.

While the sheet members 840, 842, 844 are produced by using the thick-film screen printing method in the embodiment, the thick-film paste layer can be formed in a simple solid form without being particularly patterned, on the film formation surface by using a coater, film laminate or the like. The thus formed paste layer can be posteriorly patterned in a photo processing.

Further, in the twenty-second embodiment, the support body used for producing the sheet members 840, 842, 844 is provided by the substrate 876 and the peel layer 882 which is disposed on the surface 878 of the substrate 876. However, it is also possible to use a raw ceramic sheet (sheet-like unfired ceramics) as the support body. In this case, a composition of the raw ceramic sheet can be determined such that the raw ceramic sheet is not sintered while a resin contained therein is burnt at the heat treatment temperature of the firing step 904.

Further, in the twenty-second embodiment, the conducive film for constituting the signal modulation electrodes 824 includes portions which are disposed on opposite side surfaces of the sheet member 840, and also a portion which is disposed on the inner wall surface of each through-hole 848, so that the portions disposed on the opposite side surfaces are connected with each other through the portion disposed on the inner wall surface of the through-hole. However, the sheet member 840 may be replaced by a sheet member in which the conducive film consists of a portion disposed on only one of the opposite side surfaces of the sheet member, a sheet member in which the conductive film consists of a portion disposed on only one of the opposite side surfaces of the sheet member and a portion disposed on the inner wall surface of each through-hole, or a sheet member in which the conducive film consists of portions disposed on the respective opposite side surfaces of the sheet member.

Further, while the CRT 810 of the embodiment is equipped with the three sheet members 840, 842, 844 for providing the three layers in the form of the reed-screen-like electrodes, a number of the sheet members may be suitably changed depending upon the construction of the CRT. Further, all of the layers of the reed-screen-like electrodes do not have to be necessarily provided by sheet members. That is, it is possible to determine whether each layer is provided by a sheet metal or a sheet member, in view of required functions of the electrodes and the production process.

Further, all the electrodes, including the electrodes common to the entirety of the display surface such as the electron beam control electrode 822, may be provided by respective sheet members each of which is substantially the same as the sheet members 840, 842, 844.

It is to be understood that what have been described above are merely embodiments of the present invention, and that the present invention may be embodied with various modifications, without departing from its gist.

The invention claimed is:

1. A method of producing a thick-film sheet member, comprising:
   preparing a support body having a film formation surface including a particle layer which is constituted by inorganic particles held together with a resin, said inorganic particles having a melting point higher than a heating temperature;
   forming a paste film on said film formation surface in a pattern, by applying a paste onto said film formation surface, said paste film being constituted by a thick-film material including particles which are bonded together with a resin and which are sintered at said heating temperature; and
   subjecting said support body on which said paste film has been formed, to a heat treatment effected at said heating temperature, so as to burn said resin included in said particle layer, whereby said inorganic particles become unbound from each other in the absence of said resin that has been burned,
   wherein said paste film is sintered in said subjecting step, whereby a thick film is formed of the sintered paste film.

2. A method according to claim 1, wherein said preparing step is implemented to form said particle layer on a surface of a substrate.

3. A method according to claim 2, wherein said substrate is provided by a member which is not deformed at said heating temperature.

4. A method according to claim 1,
   wherein said forming step is implemented to form a plurality of paste films constituted by respective kinds of thick-film materials, in patterns which are determined depending upon the kinds of thick-film materials, such that said plurality of paste films are sequentially stacked on said film formation surface,
   and wherein said heating temperature is a temperature at which all of said plurality of paste films constituted by the respective kinds of thick-film materials are sintered.

5. A method according to claim 4, wherein said forming step includes:
   forming step of forming a dielectric core paste film on said film formation surface such that the formed dielectric core paste film has a configuration, said dielectric core paste film being constituted by a thick-film dielectric material including particles which are bonded together with a resin and which are sintered at said heating temperature,
   forming step of forming a conductive paste film on said film formation surface such that the formed conductive paste film has such a configuration that permits said formed conductive paste film to overlap with a part of said formed dielectric core paste film, said conductive paste film being constituted by a thick-film conductive material including particles which are bonded together with a resin and which are sintered at said heating temperature, and
   forming step of forming a reinforcing dielectric paste film on said film formation surface such that the formed reinforcing dielectric paste film has such a configuration that permits said formed reinforcing dielectric paste film to continuously extend and straddle a boundary between said dielectric core paste film and said conductive paste film, said reinforcing dielectric paste film being constituted by a thick-film dielectric material including particles which are bonded together with a resin and which are sintered at said heating temperature.

6. A method according to claim 1, wherein said forming step is implemented to form said paste film by using a thick-film screen printing method.

7. A method according to claim 1, further including a post-peeling film-forming step which is implemented after implementation of said subjecting step, to form a film on an outer circumferential surface of said thick film which has been peeled from said support body.

* * * * *